(12) United States Patent
Nakaya

(10) Patent No.: US 6,188,240 B1
(45) Date of Patent: Feb. 13, 2001

(54) PROGRAMMABLE FUNCTION BLOCK

(75) Inventor: Shogo Nakaya, Tokyo (JP)

(73) Assignees: NEC Corporation; Real World Computing Partnership, both of Tokyo (JP)

(*) Notice: Under 35 U.S.C. 154(b), the term of this patent shall be extended for 0 days.

(21) Appl. No.: 09/325,339

(22) Filed: Jun. 4, 1999

(30) Foreign Application Priority Data

Jun. 4, 1998 (JP) .................................. 10-156313

(51) Int. Cl.[7] .................................... H03K 19/20
(52) U.S. Cl. ................. 326/39; 708/703; 708/710; 708/711; 708/230; 708/232; 708/518; 708/514; 708/524; 708/525; 708/552; 708/707; 326/38; 326/41
(58) Field of Search ................... 326/38, 39, 41; 708/230, 232, 514, 518, 524, 525, 552, 707, 711, 703, 710

(56) References Cited

U.S. PATENT DOCUMENTS

| | | | |
|---|---|---|---|
| 5,481,206 | * | 1/1996 | New et al. ............................ 326/38 |
| 6,016,538 | * | 1/2000 | Guttag et al. ........................ 712/32 |
| 6,058,473 | * | 5/2000 | Guttag et al. ....................... 712/225 |
| 6,097,212 | * | 8/2000 | Agrawa et al. ...................... 326/41 |
| 6,098,163 | * | 8/2000 | Guttag et al. ........................ 712/20 |

FOREIGN PATENT DOCUMENTS

406139051A * 5/1994 (JP) .
411353152A * 12/1999 (JP) .

* cited by examiner

Primary Examiner—Viet Q. Nguyen
(74) Attorney, Agent, or Firm—Sughrue, Mion, Zinn, Macpeak & Seas, PLLC

(57) ABSTRACT

A programmable function block comprises a core logic circuit having a first argument input group consisting of first through fourth argument input terminals, a second argument input group consisting of first through fourth argument input terminals, first through third configuration input terminals, a core logic carry output terminal, a core logic carry generation output terminal, a core logic carry propagation output terminal, a ripple-core logic carry input terminal, and a sum output terminal. Connected to interconnection wires and the first and the second argument input groups, an input block includes eighth input selection units for selecting, as eight input selected signals, eight ones of signals on the interconnection wires, a fixed logic value of "1", and a fixed logic value of "0". Connected to the first through the third configuration input terminals, respectively, first through third memory circuits stores, as first through third stored logic values, a logic value of one bit. A carry logic circuit has a ripple carry input terminal, a ripple carry output terminal, a ripple-core logic carry output terminal, a core logic carry generation input terminal, and a core logic carry propagation input terminal.

110 Claims, 43 Drawing Sheets

| INPUT SETTING | | | EQUIVALENT LOGIC CKT |
|---|---|---|---|
| B0 | B1 | B2 | |
| B0 | × | 0 | B0 ─────────── B |
| 0 | B1 | B2 | B2, B1 → AND → B |
| B0 | 1 | B2 | B2, B0 → OR → B |
| 1 | B1 | B2 | B2 (inverted), B1 → OR → B |
| B0 | 0 | B2 | B2 (inverted), B0 → AND → B |
| B0 | B1 | B2 | MUX: B1 (sel=1), B0 (sel=0), select=B2 → B |

FIG.12

| INPUT SETTING | | | | EQUIVALENT LOGIC CKT |
|---|---|---|---|---|
| A0 | A1 | A2 | A3 | |
| A0 | × | 0 | 0 | A0 ─────── A |
| A0 | × | 0 | 1 | A0 ─▷∘─ A |
| 0 | A1 | A2 | 0 | A2, A1 ─AND─ A |
| 0 | A1 | A2 | 1 | A2, A1 ─NAND─ A |
| 1 | A1 | A2 | 0 | A2, A1 ─OR(inv A2)─ A |
| 1 | A1 | A2 | 1 | A2, A1 ─NAND(inv A1)─ A |
| A0 | 1 | A2 | 0 | A2, A0 ─OR─ A |
| A0 | 1 | A2 | 1 | A2, A0 ─NOR─ A |
| A0 | 0 | A2 | 0 | A2, A0 ─NAND(inv A2)─ A |
| A0 | 0 | A2 | 1 | A2, A0 ─OR(inv A0)─ A |
| A0 | × | 0 | A3 | A3, A0 ─XOR─ A |
| 1 | 0 | A2 | A3 | A3, A2 ─XNOR─ A |
| A0 | A1 | A2 | 0 | MUX: A2 sel, A1→1, A0→0, out A |
| A0 | A1 | A2 | 1 | MUX: A2 sel, A1→1, A0→0, out ∘─ A |

FIG.13

|  | PRIOR ART | ARITMMETIC MODE OF THIS INVENTION | LOGIC MODE OF THIS INVENTION |
|---|---|---|---|
| DELAY UP TO OUTPUT S | 0 | -1 | -1 |
| DELAY UP TO OUTPUT C | -1 | -1 | 0 |

FIG.19

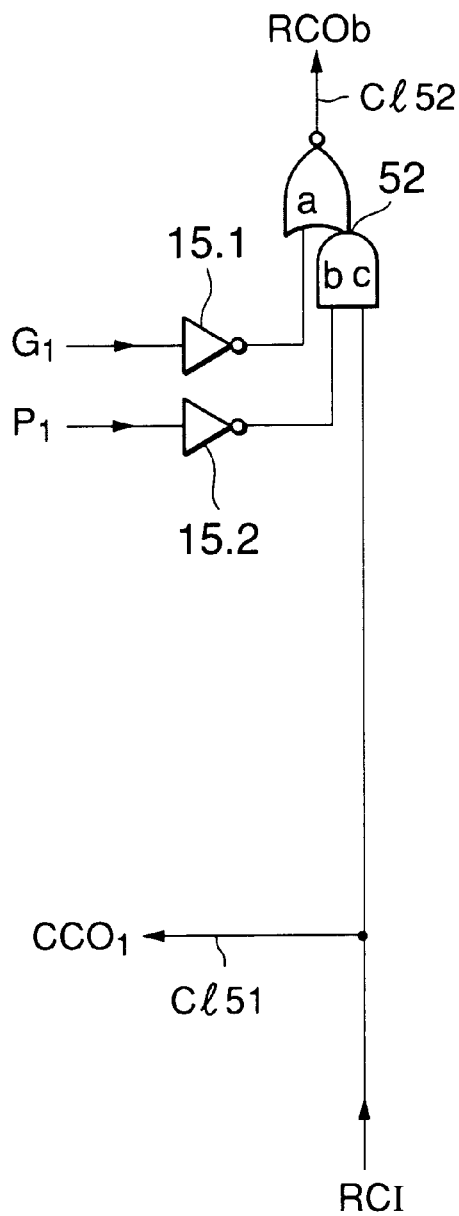
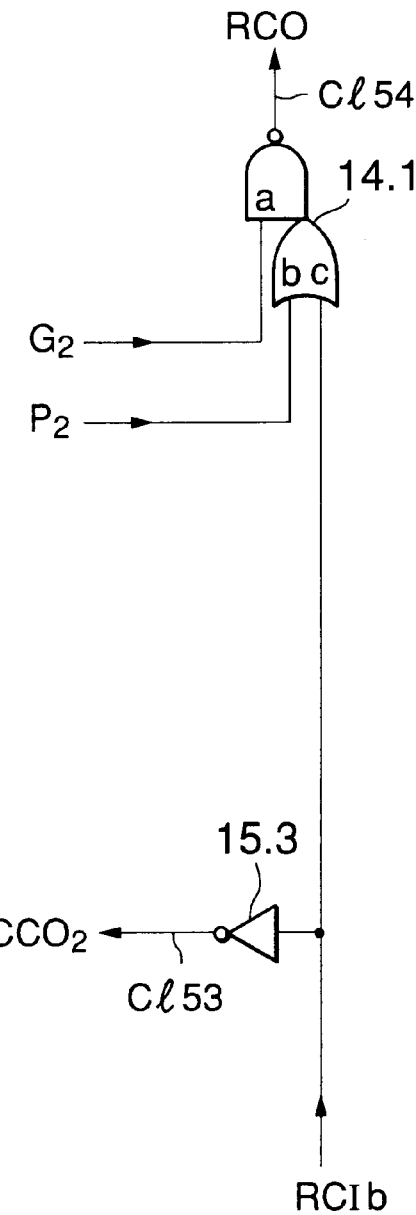
ODD CARRY LOGIC CKT
FIG.39(A)
EVEN CARRY LOGIC CKT
FIG.39(B)

PROGRAMMABLE FUNCTION BLOCK

BACKGROUND OF THE INVENTION

This invention relates to a programmable function block, which is a logic building unit in a logic device that can implement a various functions depending on user programs.

In recent years, the logic devices such as programmable logic devices (PLDs), field programmable gate arrays (FPGAs) or the like have been developing rapidly. By improving of integration density and speed, use of the logic devices has been elaborated not only to emulation on designing of application specific integrated circuits (ASICs) and replacing of simple peripheral circuits, but also to a reconfigurable computer which is able to change hardware configuration in accordance with applications.

In order to implement a wide variety of logic functions, combined multiplexer circuits or look-up tables (LUT) are used in the programmable function blocks of the conventional PLDs or FPGAs. As a result, the PLDs or FPGAs is disadvantageous in that performance diminishes in arithmetic operations, which are frequently used in the computer.

On the other hand, an arithmetic and logic unit (ALU) comprising a full adder as a main component, that is used in general-purpose processors up to now, is superior in performance of arithmetic operation. However, the ALU is not suitable to use as the programmable function block for PLDs or FPGAS. This is because the ALU has a poor function to use as a logic circuit.

In order to overcome the above-mentioned problems, another programmable function block is proposed in the manner which will later be described in conjunction with FIG. 1 (U.S. patent application Ser. No. 09/169,948). The prior art programmable function block acquires high functionality by adding a pre-logic circuit having a rich logic function to a full adder.

However, two problems still remain in the prior art programmable function block. A first problem is a large delay. A second problem is a large occupied area.

SUMMARY OF THE INVENTION

It is therefore an object of this invention to provide a programmable function block which has various logic functions and performance of high-speed operation.

It is another object of this invention to provide a programmable function block of the type described, which has a small occupied area.

Other objects of this invention will become clear as the description proceeds.

According to an aspect of this invention, a programmable function block comprises a core logic circuit having a first argument input group consisting of first through fourth argument input terminals, a second argument input group consisting of first through fourth argument input terminals, first through third configuration input terminals, a core logic carry output terminal for outputting a core logic carry output signal, a core logic carry generation output terminal for outputting a core logic carry generation output signal, a core logic carry propagation output terminal for outputting a core logic carry propagation output signal, a ripple-core logic carry input terminal for inputting a ripple-core logic carry input terminal, and a sum output terminal for outputting a summed output signal. Connected to interconnection wires and the first and the second argument input groups, an input block includes eighth input selection units for selecting, as eight input selected signals, eight ones of signals on the interconnection wires, a fixed logic value of "1", and a fixed logic value of "0" The input selection units supplies the eight input selected signals to the first through the fourth argument input terminals of the first and the second argument input groups. Connected to the first through the third configuration input terminals, respectively, first through third memory circuits stores, as first through third stored logic values, a logic value of one bit. The first through the third memory circuits supplies the first through the third stored logic values to the first through the third configuration input terminals, respectively. A carry logic circuit has a ripple carry input terminal for inputting a ripple carry input signal from a ripple carry propagation path, a ripple carry output terminal for outputting a ripple carry output signal to the ripple carry propagation path, a ripple-core logic carry output terminal for supplying the ripple-core logic carry input terminal with a ripple-core logic carry output signal as the ripple-core logic carry input signal, a core logic carry generation input terminal for inputting the core logic carry generation output signal as a core logic carry generation input signal from the core logic carry output terminal, and a core logic carry propagation input terminal for inputting the core logic carry propagation output signal as a core logic carry propagation input signal from the core logic carry propagation output terminal.

In the above-mentioned programmable function block, the core logic circuit uses one of first through fourth aspects which will presently be described.

According to a first aspect of this invention, the core logic circuit comprises a first two-input one-output multiplexer (10.0) having a first input terminal connected to the first argument input terminal of the first argument input group, a second input terminal connected to the second argument input terminal of the first argument input group, and a control input terminal connected to the third argument input terminal of the first argument input group. The first two-input one-output multiplexer produces, as a first selected output signal, an input signal supplied to the first input terminal thereof when the control input terminal thereof is supplied with a control signal having a logic value of "0". The first two-input one-output multiplexer produces, as the first selected output signal, an input signal supplied to the second input terminal thereof when the control input terminal thereof is supplied with the control signal having a logic value of "1". A second two-input one-output multiplexer has a first input terminal connected to the first argument input terminal of the second argument input group, a second input terminal connected to the second argument input terminal of the second argument input group, and a control input terminal connected to the third argument input terminal of the second argument input group. The second two-input one-output multiplexer produces, as a second selected output signal, an input signal supplied to the first input terminal thereof when the control input terminal thereof is supplied with a control signal having a logic value of "0". The second two-input one-output multiplexer produces, as the second selected output signal, an input signal supplied to the second input terminal thereof when the control input terminal thereof is supplied with the control signal having a logic value of "1". A third two-input one-output multiplexer has first input terminal connected to the fourth argument input terminal of the second argument input group, a second input terminal connected to the ripple-core logic carry input terminal, and a control input terminal connected to the first configuration input terminal. The third two-input one-output multiplexer produces, as a third selected output signal, an input signal supplied to the first input terminal thereof when the control input terminal thereof is supplied with a control signal having a logic value of "0". The third two-input one-output multiplexer produces, as the third selected output signal, an input signal supplied to the second input terminal thereof when the control input terminal thereof is supplied with the control signal having a logic value of "1". A first exclusive OR circuit has a first input terminal connected to the fourth argument input terminal of the first argument input group and a second input terminal connected to an output terminal of the first two-input one-output multiplexer. The first exclusive OR circuit exclusively ORs an input signal supplied to the first input terminal thereof and the first selected output signal supplied to the second input terminal thereof to produce a first exclusively ORed output signal. A second exclusive OR circuit has a first input terminal connected to an output terminal of the second two-input one-output multiplexer and a second input terminal connected to an output terminal of the third two-input one-output multiplexer. The second exclusive OR circuit exclusively ORs the second selected output signal supplied to the first input terminal thereof and the third selected output signal supplied to the second input terminal thereof to produce a second exclusively ORed output signal. A fourth two-input one-output multiplexer has a first input terminal connected to the output terminal of the second two-input one-output multiplexer, a second input terminal connected to an output terminal of the second exclusive OR circuit (11.1), and a control input terminal connected to the second configuration input terminal. The fourth two-input one-output multiplexer produces, as a fourth selected output signal, the second selected output signal supplied to the first input terminal thereof when the control input terminal thereof is supplied with a control signal having a logic value of "0". The fourth two-input one-output multiplexer produces, as the fourth selected output signal, the second exclusively ORed output signal when the control input terminal thereof is supplied with the control signal having the logic value of "1". A fifth two-input one-output multiplexer has a first input terminal connected to the output terminal of the third two-input one-output multiplexer, a second input terminal connected to the third configuration input terminal, and a control input terminal connected to the second configuration input terminal. The fifth two-input one-output multiplexer produces, as a fifth selected output signal, the third selected output signal supplied to the first input terminal thereof when the control input terminal thereof is supplied with a control signal having a logic value of "0". The fifth two-input one-output multiplexer produces, as the fifth selected output signal, an input signal supplied to the second input terminal thereof when the control input terminal thereof is supplied with the control signal having the logic value of "1". A NAND circuit has a first input terminal connected to an output terminal of the first exclusive OR circuit and a second input terminal connected to an output terminal of the fourth two-input one-output multiplexer. The NAND circuit NANDs the first exclusively ORed output signal supplied to the first input terminal thereof and the fourth selected output signal supplied to the second input terminal thereof to produce a NANDed output signal. A NOR circuit has a first input terminal connected to the output terminal of the first exclusive OR circuit and a second input terminal connected to the output terminal of the fourth two-input one-output multiplexer. The NOR circuit NORs the first exclusively ORed output signal supplied to the first input terminal thereof and the fourth selected output signal supplied to the second input terminal thereof to produce a NORed output signal. A third exclusive OR circuit has a first input terminal connected to an output terminal of the first exclusive OR circuit and a second input terminal connected to an output terminal of the second exclusive OR circuit. The third exclusive OR circuit exclusively ORs the first exclusively ORed output signal supplied to the first input terminal thereof and the second exclusively ORed output signal supplied to the second input terminal thereof to produce a third exclusively ORed output signal. An inverter has an input terminal connected to an output terminal of the fifth two-input one-output multiplexer. The inverter inverts the fifth selected output signal supplied to the input terminal thereof to produce an inverted output signal. A NAND-OR circuit has a first input terminal connected to an output terminal of the NAND circuit, a second input terminal connected to an output terminal of the NOR circuit, and a third input terminal connected to an output terminal of the inverter. The NAND-OR circuit ORs the NORed output signal supplied to the second input terminal thereof and the inverted output signal supplied to the third input terminal thereof to obtain an ORed result signal and NANDs the ORed result signal and the NANDed output signal supplied to the first input terminal thereof to produce an ORed and NANDed output signal. A first connecting arrangement connects an output terminal of the NAND circuit with the core logic carry generation output terminal to make the core logic carry generation output terminal produce the NANDed output signal as the core logic carry generation output signal. A second connecting arrangement connects an output terminal of the NOR circuit with the core logic carry propagation output terminal to make the core logic carry propagation output terminal produce the NORed output signal as the core logic carry propagation output signal. A third connecting arrangement connects an output terminal of the NAND-OR circuit with the core logic carry output terminal to make the core logic carry output terminal produce the ORed and NANDed output signal as the core logic carry output signal. A fourth connecting arrangement connects an output terminal of the third exclusive OR circuit with the sum output terminal to make the sum output terminal produce the third exclusively ORed output signal as the summed output signal.

According a second aspect of this invention, the core logic circuit comprises a first two-input one-output multiplexer having a first input terminal connected to the first argument input terminal of the first argument input group, a second input terminal connected to the second argument input terminal of the first argument input group, and a control input terminal connected to the third argument input terminal of the first argument input group. The first two-input one-output multiplexer produces, as a first selected output signal, an input signal supplied to the first input terminal thereof when the control input terminal thereof is supplied with a control signal having a logic value of "0". The first two-input one-output multiplexer produces, as the first selected output signal, an input signal supplied to the second input terminal thereof when the control input terminal thereof is supplied with the control signal having a logic value of "1". A second two-input one-output multiplexer has a first input terminal connected to the first argument input terminal of the second argument input group, a second input terminal connected to the second argument input terminal of the second argument input group, and a control input terminal connected to the third argument input terminal of the second argument input group. The second two-input one-output multiplexer produces, as a second selected output signal, an input signal supplied with the first input terminal thereof when the control input terminal thereof is supplied with a control signal having a logic value of "0". The second two-input one-output multiplexer produces, as the second selected output signal, an input signal supplied with the second input terminal thereof when the control input terminal thereof is supplied with the control signal having a logic value of "1". A third two-input one-output multiplexer has a first input terminal connected to the fourth argument input terminal of the second argument input group, a second input terminal connected to the ripple-core logic carry input terminal, and a control input terminal connected to the first configuration input terminal. The third two-input one-output multiplexer produces, as a third selected output terminal, an input signal supplied to the first input terminal thereof when the control input terminal thereof is supplied with a control signal having a logic value of "0". The third two-input one-output multiplexer produces, as the third selected output terminal, an input signal supplied to the second input terminal thereof when the control input terminal thereof is supplied with the control signal having a logic value of "1". A first exclusive OR circuit has a first input terminal connected to the fourth argument input terminal of the first argument input group and a second input terminal connected to an output terminal of the first two-input one-output multiplexer. The first exclusive OR circuit exclusively ORs an input signal supplied with the first input terminal thereof and the first selected output signal supplied with the second input terminal thereof to produce a first exclusively ORed output signal. A second exclusive OR circuit has a first input terminal connected to an output terminal of the second two-input one-output multiplexer and a second input terminal connected to an output terminal of the third two-input one-output multiplexer. The second exclusive OR circuit exclusively ORs the second selected output signal supplied to the first input terminal thereof and the third selected output signal supplied to the second input terminal thereof to produce a second exclusively ORed output signal. A fourth two-input one-output multiplexer has a first input terminal connected to the output terminal of the second two-input one-output multiplexer, a second input terminal connected to an output terminal of the second exclusive OR circuit, and a control input terminal connected to the second configuration input terminal. The fourth two-input one-output multiplexer produces, as a fourth selected output signal, the second selected output signal supplied to the first input terminal thereof when the control input terminal thereof is supplied with a control signal having a logic value of "0". The fourth two-input one-output multiplexer produces, as the fourth selected output signal, the second exclusive ORed signal supplied to the second input terminal thereof when the control input terminal thereof is supplied with the control signal having the logic value of "11". A fifth two-input one-output multiplexer has a first input terminal connected to an output terminal of the third two-input one-output multiplexer, a second input terminal connected to the third configuration input terminal, and a control input terminal connected to the second configuration input terminal. The fifth two-input one-output multiplexer produces, as a fifth selected output signal, the third selected output signal supplied to the first input terminal thereof when the control input terminal thereof is supplied with a control signal having a logic value of "0". The fifth two-input one-output multiplexer produces, as the fifth selected output signal, an input signal supplied to the second input terminal thereof when the control input terminal thereof is supplied with the control signal having the logic value of "1". A NAND circuit has a first input terminal connected to an output terminal of the first exclusive OR circuit and a second input terminal connected to an output terminal of the fourth two-input one-output multiplexer. The NAND circuit NANDs the first exclusively ORed output signal supplied to the first input terminal thereof and the fourth selected output signal supplied to the second input terminal thereof to produce a NANDed output signal. A NOR circuit has a first input terminal connected to the output terminal of the first exclusive OR circuit and a second input terminal connected to the output terminal of the fourth two-input one-output multiplexer. The NOR circuit NORs the first exclusively ORed output signal supplied to the first input terminal thereof and the fourth selected output signal supplied to the second input terminal thereof to produce a NORed output signal. A third exclusive OR circuit has a first input terminal connected to the output terminal of the first exclusive OR circuit and a second input terminal connected to the output terminal of the second exclusive OR circuit. The third exclusive OR circuit exclusively ORs the first exclusively ORed output signal supplied to the first input terminal thereof and the second exclusively ORed output signal supplied to the second input terminal thereof to produce a third exclusively ORed output signal. A two-input one-output inverting multiplexer has a first input terminal connected to an output terminal of the NAND circuit, a second input terminal connected to an output terminal of the NOR circuit, and a control input terminal connected to an output terminal of the fifth two-input one-output multiplexer. The two-input one-output inverting multiplexer produces, as an inverted selected output signal, a signal obtaining by inverting the NANDed output signal supplied to the first input terminal thereof when the control input terminal thereof is supplied with a control signal having a logic value of "0". The two-input one-output inverting multiplexer produces, as the inverted selected output signal, a Ssignal obtained by inverting the NORed output signal supplied to the second input terminal thereof when the control input terminal thereof is supplied with the control signal having the logic value "1". A first connecting arrangement connects the output terminal of the NAND circuit with the core logic carry generation output terminal to make the core logic carry generation output terminal produce the NANDed output signal as the core logic carry generation output signal. A second connecting arrangement connects the output terminal of the NOR circuit with the core logic carry propagation output terminal to make the core logic carry propagation output terminal produce the NORed output signal as the core logic carry propagation output signal. A third connecting arrangement connects an output terminal of the two-input one-output inverting multiplexer with the core logic carry output terminal (C) to make the core logic carry output terminal (C) produce the inverted selected output signal as the core logic carry output signal. A fourth connecting arrangement connects an output terminal of the third exclusive OR circuit with the sum output terminal to make the sum output terminal produce the third exclusively ORed output signal as the summed output signal.

According to a third aspect of this invention, the core logic circuit comprises a first two-input one-output multiplexer has a first input terminal connected to the first argument input terminal of the first argument input group, a second input terminal connected to the second argument input terminal of the first argument input group, and a control input terminal connected to the third argument input terminal of the first argument input group. The first two-input one-output multiplexer produces, as a first selected output signal, an input signal supplied to the first input terminal thereof when the control input terminal thereof is supplied with a control signal having a logic value of "0". The first two-input one-output multiplexer produces, as the first selected output signal, an input signal supplied to the second input terminal thereof when the control input terminal thereof is supplied with the control signal having a logic value of "1". A second two-input one-output multiplexer has a first input terminal connected to the first argument input terminal of the second argument input group, a second input terminal connected to the second argument input terminal of the second argument input group, and a control input terminal connected to the third argument input terminal of the second argument input group. The second two-input one-output multiplexer produces, as a second selected output signal, an input signal supplied to the first input terminal thereof when the control input terminal thereof is supplied with a control signal having a logic value of "0". The second two-input one-output multiplexer produces, as the second selected output signal, an input signal supplied to the second input terminal thereof when the control input terminal thereof is supplied with the control signal having a logic value of "1". A third two-input one-output multiplexer has a first input terminal connected to the fourth argument input terminal of the second argument input group, a second input terminal connected to the ripple-core logic carry input terminal, and a control input terminal connected to the first configuration input terminal. The third two-input one-output multiplexer produces, as a third selected output signal, an input signal supplied to the first input terminal thereof when the control input terminal thereof is supplied with a control signal having a logic value of "1". The third two-input one-output multiplexer produces, as the third selected output signal, an input signal supplied to the second input terminal thereof when the control input terminal thereof is supplied with the control signal having a logic value of "1". A first exclusive OR circuit has a first input terminal connected to the fourth argument input terminal of the first argument input group and a second input terminal connected to an output terminal of the first two-input one-output multiplexer. The first exclusive OR circuit exclusively ORs an input signal supplied to the first input terminal thereof and the first selected output signal supplied to the second input terminal thereof to produce a first exclusively ORed output signal. A second exclusive OR circuit has a first input terminal connected to an output terminal of the second two-input one-output multiplexer and a second input terminal connected to an output terminal of the third two-input one-output multiplexer. The second exclusive OR circuit exclusively ORs the second selected output signal supplied to the first input terminal thereof and the third selected output signal supplied to the second input terminal thereof to produce a second exclusively ORed output signal. A fourth two-input one-output multiplexer has a first input terminal connected to an output terminal of the second exclusive OR circuit, a second input terminal connected to the output terminal of the second two-input one-output multiplexer, and a control input terminal connected to the second configuration input terminal. The fourth two-input one-output multiplexer produces, as a fourth selected output signal, the second exclusively ORed output signal supplied to the first input terminal thereof when the control input terminal thereof is supplied with a control signal having a logic value of "0". The fourth two-input one-output multiplexer produces, as the fourth selected output signal, the second selected output signal supplied to the second input terminal thereof when the control input terminal thereof is supplied with the control signal having the logic value of "1". A fifth two-input one-output multiplexer has a first input terminal connected to the third configuration input terminal, a second input terminal connected to the output terminal of the third two-input one-output multiplexer, and a control input terminal connected to the second configuration input terminal. The fifth two-input one-output multiplexer produces, as a fifth selected output signal, an input signal supplied to the first input terminal thereof when the control input terminal thereof is supplied with a control signal having a logic value of "0". The fifth two-input one-output multiplexer produces, as the fifth selected output signal, the third selected output signal supplied to the second input terminal thereof when the control input terminal thereof is supplied with the control signal having the logic value of "1". A NAND circuit has a first input terminal connected to an output terminal of the first exclusive OR circuit and a second input terminal connected to an output terminal of the fourth two-input one-output multiplexer. The NAND circuit NANDs the first exclusively ORed output signal supplied to the first input terminal thereof and the fourth selected output signal supplied to the second input terminal thereof to produce a NANDed output signal. A NOR circuit has a first input terminal connected to the output terminal of the first exclusive OR circuit and a second input terminal connected to the output terminal of the fourth two-input one-output multiplexer. The NOR circuit NORs the first exclusively ORed output signal supplied to the first input terminal thereof and the fourth selected output signal supplied to the second input terminal thereof to produce a NORed output signal. A third exclusive OR circuit has a first input terminal connected to the output terminal of the first exclusive OR circuit and a second input terminal connected to the output terminal of the second exclusive OR circuit. The third exclusive OR circuit exclusively ORs the first exclusively ORed output signal supplied to the first input terminal thereof and the second exclusively ORed output signal supplied to the second input terminal thereof to produce a third exclusively ORed output signal. An inverter has an input terminal connected to an output terminal of the fifth two-input one-output multiplexer. The inverter inverts the fifth selected output signal supplied to the input terminal thereof to produce an inverted output signal. A NAND-OR circuit has a first input terminal connected to the output terminal of the NAND circuit, a second input terminal connected to the output terminal of the NOR circuit, and a third input terminal connected to an output terminal of the inverter. The NAND-OR circuit ORs the NORed output signal supplied to the second input terminal thereof and the inverted output signal supplied to the third input terminal thereof to obtain an ORed result signal and NANDs the ORed result signal and the NANDed output signal supplied to the first input terminal thereof to produce an ORed and NANDed output signal. A first connecting arrangement connects the output terminal of the NAND circuit with the core logic carry generation output terminal to make the core logic carry generation output terminal produce the NANDed output signal as the core logic carry generation output signal. A second connecting arrangement connects the output terminal of the NOR circuit with the core logic carry propagation output terminal to make the core logic carry propagation output terminal produce the NORed output signal as the core logic carry propagation output signal. A third connecting arrangement connects an output terminal of the NAND-OR circuit with the core logic carry output terminal to make the core logic carry output terminal produce the ORed and NANDed output signal as the core logic carry output signal. A fourth connecting arrangement connects an output terminal of the third exclusive OR circuit with the sum output terminal to make the sum output terminal produce the third exclusively ORed output signal as the summed output signal.

According to a fourth aspect of this invention, the core logic circuit comprises a first two-input one-output multiplexer having a first input terminal connected to the first argument input terminal of the first argument input group, a second input terminal connected to the second argument input terminal of the first argument input group, and a control input terminal connected to the third argument input terminal of the first argument input group. The first two-input one-output multiplexer produces, as a first selected output signal, an input signal supplied to the first input terminal thereof when the control input terminal thereof is supplied with a control signal having a logic value of "0". The first two-input one-output multiplexer produces, as the first selected output signal, an input signal supplied to the second input terminal thereof when the control input terminal thereof is supplied with the control signal having a logic value of "1". A second two-input one-output multiplexer has a first input terminal connected to the first argument input terminal of the second argument input group, a second input terminal connected to the second argument input terminal of the second argument input group, and a control input terminal connected to the third argument input terminal of the second argument input group. The second two-input one-output multiplexer produces, as a second selected output signal, an input signal supplied to the first input terminal thereof when the control input terminal thereof is supplied with a control signal having a logic value of "0". The second two-input one-output multiplexer produces, as the second selected output signal, an input signal supplied to the second input terminal thereof when the control input terminal thereof is supplied with the control signal having a logic value of "1". A third two-input one-output multiplexer has a first input terminal connected to the fourth argument input terminal of the second argument input group, a second input terminal connected to the ripple-core logic carry input terminal, and a control input terminal connected to the first configuration input terminal. The third two-input one-output multiplexer produces, as a third selected output terminal, an input signal supplied to the first input terminal thereof when the control input terminal thereof is supplied with a control signal having a logic value of "0". The third two-input one-output multiplexer produces, as the third selected output terminal, an input signal supplied to the second input terminal thereof when the control input terminal thereof is supplied with the control signal having a logic value of "1". A first exclusive OR circuit has a first input terminal connected to the fourth argument input terminal of the first argument input group and a second input terminal connected to an output terminal of the first two-input one-output multiplexer. The first exclusive OR circuit exclusively ORs an input signal supplied to the first input terminal thereof and the first selected output signal supplied to the second input terminal thereof to produce a first exclusively ORed output signal. A second exclusive OR circuit has a first input terminal connected to an output terminal of the second two-input one-output multiplexer and a second input terminal connected to an output terminal of the third two-input one-output multiplexer. The second exclusive OR circuit exclusively ORs the second selected output signal supplied to the first input terminal thereof and the third selected output signal supplied to the second input terminal thereof to produce a second exclusively ORed output signal. A fourth two-input one-output multiplexer has a first input terminal connected to an output terminal of the second exclusive OR circuit, a second input terminal connected to the output terminal of the second two-input one-output multiplexer, and a control input terminal connected to the second configuration input terminal. The fourth two-input one-output multiplexer produces, as a fourth selected output signal, the second exclusively ORed output signal supplied to the first input terminal thereof when the control input terminal thereof is supplied with a control signal having a logic value of "0". The fourth two-input one-output multiplexer produces, as the fourth selected output signal, the second selected output signal supplied to the second input terminal thereof when the control input terminal thereof is supplied with the control signal having the logic value of "1". A fifth two-input one-output multiplexer has a first input terminal connected to the third configuration input terminal, a second input terminal connected to the output terminal of the third two-input one-output multiplexer, and a control input terminal connected to the second configuration input terminal. The fifth two-input one-output multiplexer produces, as a fifth selected output signal, an input signal supplied to the first input terminal thereof when the control input terminal thereof is supplied with a control signal having a logic value of "0". The fifth two-input one-output multiplexer produces, as the fifth selected output signal, the third selected output signal supplied to the second input terminal thereof when the control input terminal thereof is supplied with the control signal having the logic value of "1". A NAND circuit has a first input terminal connected to an output terminal of the first exclusive OR circuit and a second input terminal connected to an output terminal of the fourth two-input one-output multiplexer. The NAND circuit NANDs the first exclusively ORed output signal supplied to the first input terminal thereof and the fourth selected output signal supplied to the second input terminal thereof to produce a NANDed output signal. A NOR circuit has a first input terminal connected to the output terminal of the first exclusive OR circuit and a second input terminal connected to the output terminal of the fourth two-input one-output multiplexer. The NOR circuit NORs the first exclusively ORed output signal supplied to the first input terminal thereof and the fourth selected output signal supplied to the second input terminal thereof to produce a NORed output signal. A third exclusive OR circuit has a first input terminal connected to the output terminal of the first exclusive OR circuit and a second input terminal connected to the output terminal of the second exclusive OR circuit. The third exclusive OR circuit exclusively ORs the first exclusively ORed output signal supplied to the first input terminal thereof and the second exclusively ORed output signal supplied to the second input terminal thereof to produce a third exclusively ORed output signal. A two-input one-output inverting multiplexer has a first input terminal connected to an output terminal of the NAND circuit, a second input terminal connected to an output terminal of the NOR circuit, and a control input terminal connected to an output terminal of the fifth two-input one-output multiplexer. The two-input one-output inverting multiplexer produces, as an inverted selected output signal, a signal obtaining by inverting the NANDed output signal supplied to the first input terminal thereof when the control input terminal thereof is supplied with a control signal having a logic value of "0". The two-input one-output inverting multiplexer produces, as the inverted selected output signal, a signal obtained by inverting the NORed output signal supplied to the second input terminal thereof when the control input terminal thereof is supplied with the control signal having the logic value "1". A first connecting arrangement connects the output terminal of the NAND circuit with the core logic carry generation output terminal to make the core logic carry generation output terminal produce the NANDed output signal as the core logic carry generation output signal. A second connecting arrangement connects the output terminal of the NOR circuit with the core logic carry propagation output terminal to make the core logic carry propagation output terminal produce the NORed output signal as the core logic carry propagation output signal. A third connecting arrangement connects an output terminal of the two-input one-output inverting multiplexer with the core logic carry output terminal to make the core logic carry output terminal produce the inverted selected output signal as the core logic carry output signal. A fourth connecting arrangement connects an output terminal of the third exclusive OR circuit with the sum output terminal to make the sum output terminal produce the third exclusively ORed output signal as the summed output signal.

BRIEF DESCRIPTION OF THE DRAWING

FIG. 12 is a view showing variable logic functions in the 2-1MUX for use in the equivalent circuit illustrated in FIG. 11;

FIG. 13 is a view showing variable logic functions in a pre-logic circuit for use in the equivalent circuit illustrated in FIG. 11;

FIG. 19 shows delays in the prior art programmable function block and the programmable function block according to this invention;

FIGS. 39(A) and 39 (B) are circuit diagrams of an odd carry logic circuit and an even carry logic circuit which are used in the programmable function device illustrated in FIG. 38, respectively;

DESCRIPTION OF THE PREFERRED EMBODIMENTS

Figure 1:
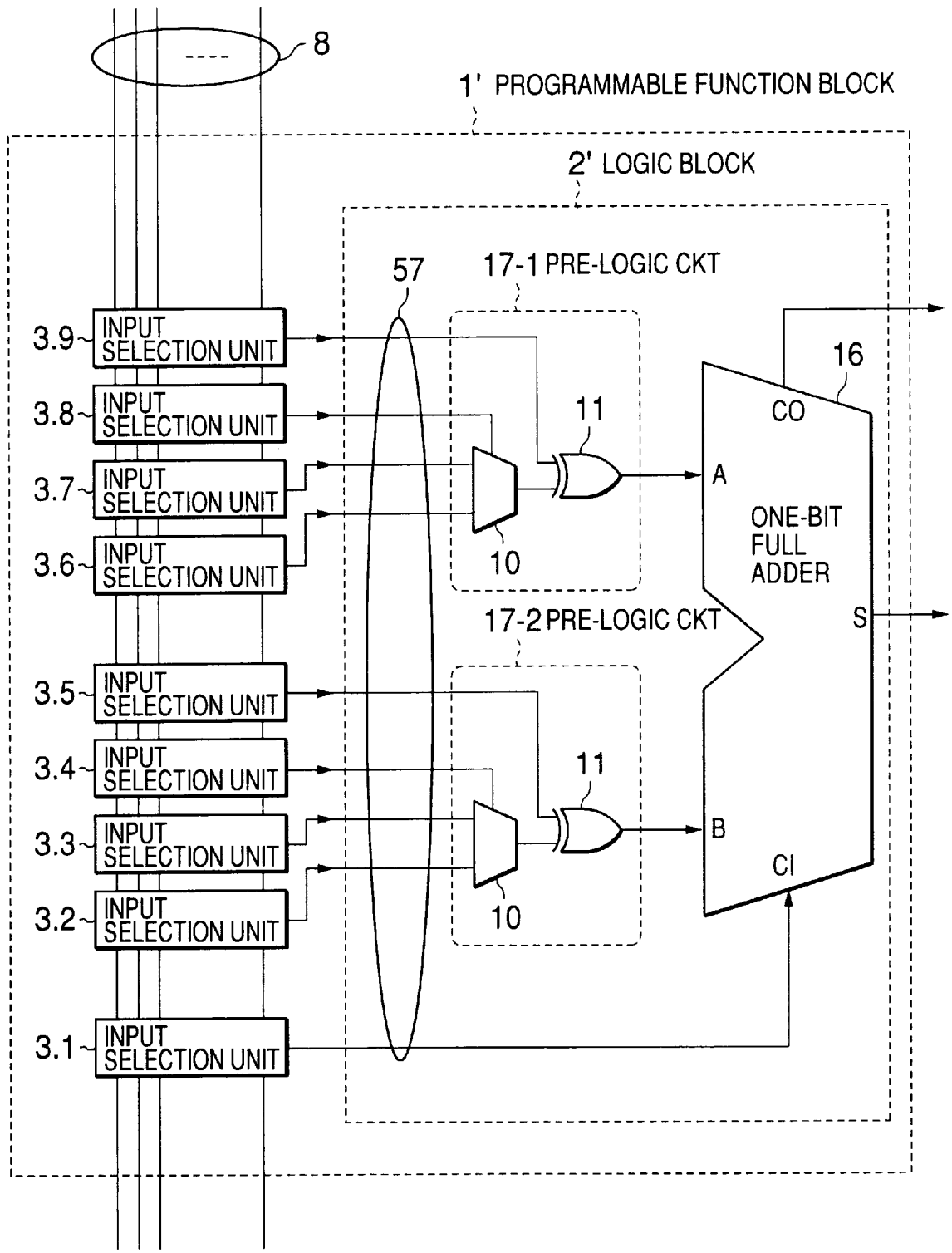
FIG. 1 is a block diagram of a prior art programmable function block.

Referring to FIG. 1, a prior art programmable function block 1' (U.S. patent application Ser. No. 09/169,948) will be described at first in order to facilitate an understanding of the present invention.

As shown in FIG. 1, the prior art programmable function block 1 comprises a logic block 2' and first through ninth input selection units 3.i (i=1, 2, 3, 4, 5, 6, 7, 8, 9). The logic block 21 comprises a one-bit full adder 16 and first and second pre-logic circuits 17-1 and 17-2. The one-bit full adder 16 has argument input terminals A and B which are connected to output terminals of the first and the second pre-logic circuits 17-1 and 17-2. The one-bit full adder 16 has a carry input terminal CI, a carry output terminal CO, and a sum output terminal S. Each input selection unit 3.i selects one of signals on interconnecting wires, fixed logic values "0" and "1" as an input selected signal which is supplied to one of input lines 57 in the logic block 2'.

Each of the first and the second pre-logic circuits 17-1 and 17-2 comprises a two-input one-output multiplexer 10 and an exclusive OR circuit 11. The two-input one-output multiplexer 10 has an output terminal which is connected to a first input terminal of the exclusive OR circuit 11. With this structure, the pre-logic circuit 17 is operable as various logic circuits in accordance with input setting.

A signal selection in the input selection unit 3.i is set by a configuration memory (not shown) arranged in the input selection unit 3.i.

The first input selection unit 3.1 produces a first input selected signal which is supplied to the carry input terminal CI of the one-bit full adder 16 as a carry input signal. The second and the third input selection units 3.2 and 3.3 produce second and third input selected signals which are supplied to two input terminals of the two-input one-output multiplexer 10 in the second pre-logic circuit 17-2. The fourth input selection unit 3.4 produces a fourth input selected signal which is supplied to a control input terminal of the two-input one-output multiplexer 10 in the second pre-logic circuit 17-2. The fifth input selection unit 3.5 produces a fifth input selected signal which is supplied to a second input terminal of the exclusive OR circuit 11 in the second pre-logic circuit 17-2. The sixth and the seventh input selection units 3.6 and 3.7 produce sixth and seventh input selected signals which are supplied to two input terminals of the two-input one-output multiplexer 10 in the first pre-logic circuit 17-1. The eighth input selection unit 3.8 produces an eighth input selected signal which is supplied to a control input terminal of the two-input one-output multiplexer 10 in the first pre-logic circuit 17-1. The ninth input selection unit 3.9 produces a ninth input selected signal which is supplied to a second input terminal of the exclusive OR circuit 11 in the first pre-logic circuit 17-1.

Figure 2:
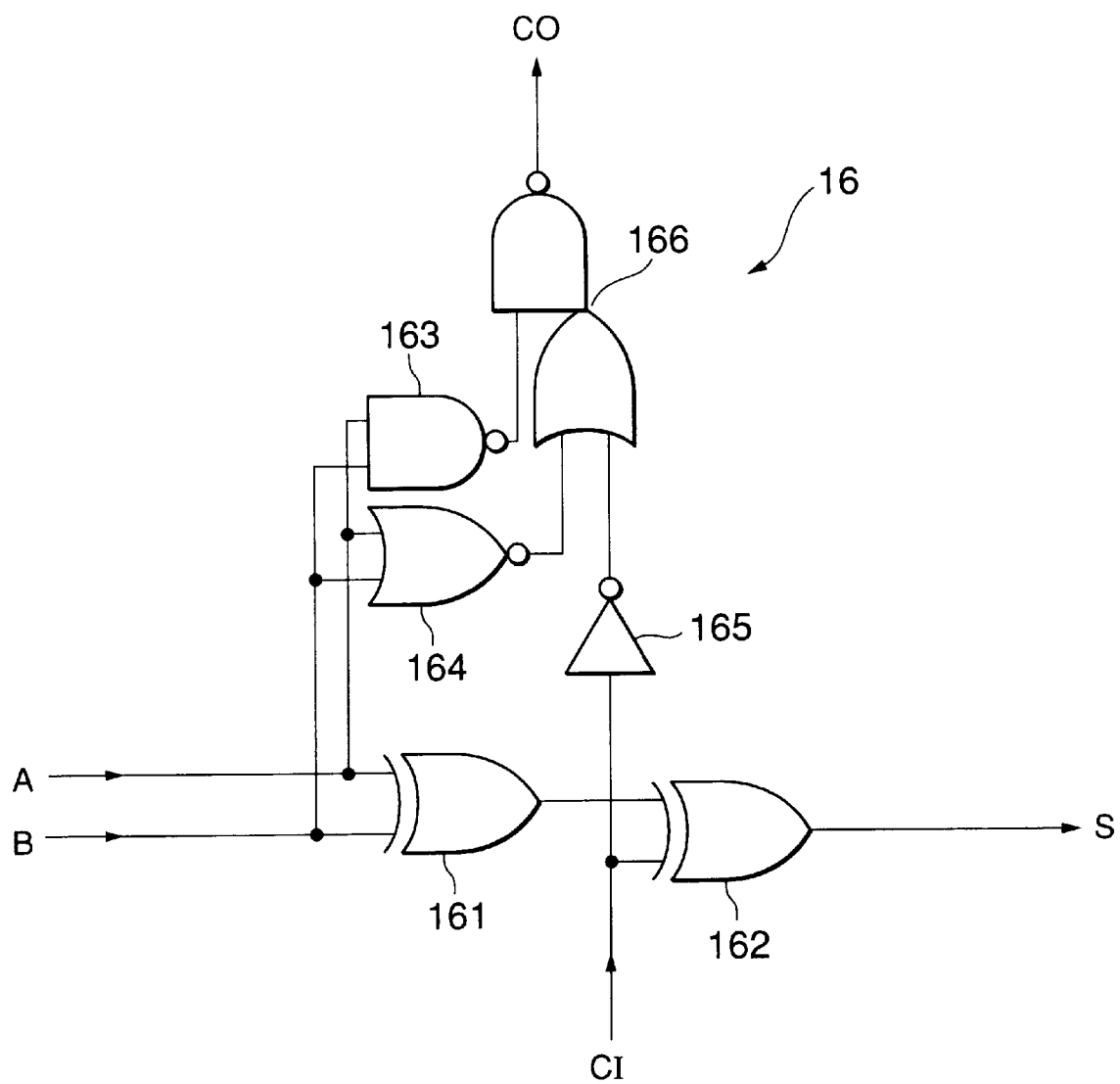
FIG. 2 is a circuit diagram of a conventional one-bit full adder for use in the programmable function block illustrated in FIG. 1.

Turning to FIG. 2, description will proceed to the one-bit full adder 16. In the one-bit full adder 16 illustrated in FIGS. 1 and 2, the one-bit full adder 16 has the argument input terminals A and B, a carry input terminal CI, a carry output terminal CO, and a sum output terminal S.

As illustrated in FIG. 2, the one-bit full adder 16 comprises first and second exclusive OR circuits 161 and 162, a NAND circuit 163, a NOR circuit 164, an inverter 165, and a NAND-OR circuit 166. The first exclusive OR circuit 161 has a pair of input terminals which are connected to the argument input terminals A and B. The first exclusive OR circuit 161 has an output terminal which is connected to an input terminal of the second exclusive OR circuit 162. The second exclusive OR circuit 162 has another input terminal which is connected to the carry input terminal CI. The second exclusive OR circuit 162 has an output terminal which is connected to the sum output terminal S.

In addition, the argument input terminals A and B are connected to a pair of input terminals of the NAND circuit 163 and the NOR circuit 164. The NAND circuit 163 has an output terminal which is connected to a first input terminal of the NAND-OR circuit 166 while the NOR circuit 164 has an output terminal which is connected to a second input terminal of the NAND-OR circuit 166. The carry input terminal IC is connected to an input terminal of the inverter 165. The inverter 165 has an output terminal which is connected to a third input terminal of the NAND-OR circuit 166. The NAND-OR circuit 166 has an output terminal which is connected to the carry output terminal CO.

Description will be made as regards operation of the one-bit full adder 16. The argument input terminals A and B are supplied with first and second argument input signals. The first exclusive OR circuit 161 exclusively ORs the first and the second argument input signals to produce a first exclusively ORed output signal. The first exclusively ORed output signal is supplied to the second exclusive OR circuit 162. The second exclusive OR circuit 162 exclusively ORs the first exclusively ORed output signal and the carry input signal to produce a second exclusively ORed output signal. The second exclusively ORed output signal is produced by the sum output terminal S as a summed output signal.

The NAND circuit 163 NANDs the first and the second argument input signals to produce a NANDed output signal which is supplied to the first input terminal of the NAND-OR circuit 166. The NOR circuit 164 NORs the first and the second argument input signals to produce a NORed output signal which is supplied to the second input terminal of the NAND-OR circuit 166. The inverter 165 inverts the carry input signal to produce an inverted output signal which is supplied to the third input terminal of the NAND-OR circuit 166. The NAND-OR circuit 166 ORs the NORed output signal and the inverted output signal to obtain an ORed result signal and NANDs the ORed result signal and the NANDed output signal to produce an ORed and NANDed output signal. The ORed and NANDed output signal is produced by the carry output terminal CO as a carry output signal.

As described above, the prior art programmable function block 1' acquires logical multifunctionality by adding the first and the second pre-logic circuits 17-1 and 17-2 each having rich logic functions to the full adder 16 suitable for high speed arithmetic operation.

However, the prior art programmable function block 1' has the following problems.

A first problem is a large delay, as mentioned in the preamble of the instant specification. This is because the exclusive OR circuit is a logic circuit having a large delay. The one-bit full adder 16 comprises two exclusive OR circuits 161 and 162. Each of the first and the second pre-logic circuit 17-1 and 17-2 comprises one exclusive OR circuit 11. That is, three exclusive OR circuits are connected in series with each other. Specifically, the exclusive OR circuit 11 in each pre-logic circuit and the two exclusive OR circuits 161 and 162 are connected in series with each other.

A second problem is a large occupied area, as mentioned also in the preamble of the instant specification. This is because the prior art programmable block 1' comprises many input selection units 3.i required to obtain desired functions. In addition, inasmuch as the input selection unit 3.i comprises a lot of configuration memories, each input selection unit 3.i has a large occupied area.

Figure 3:
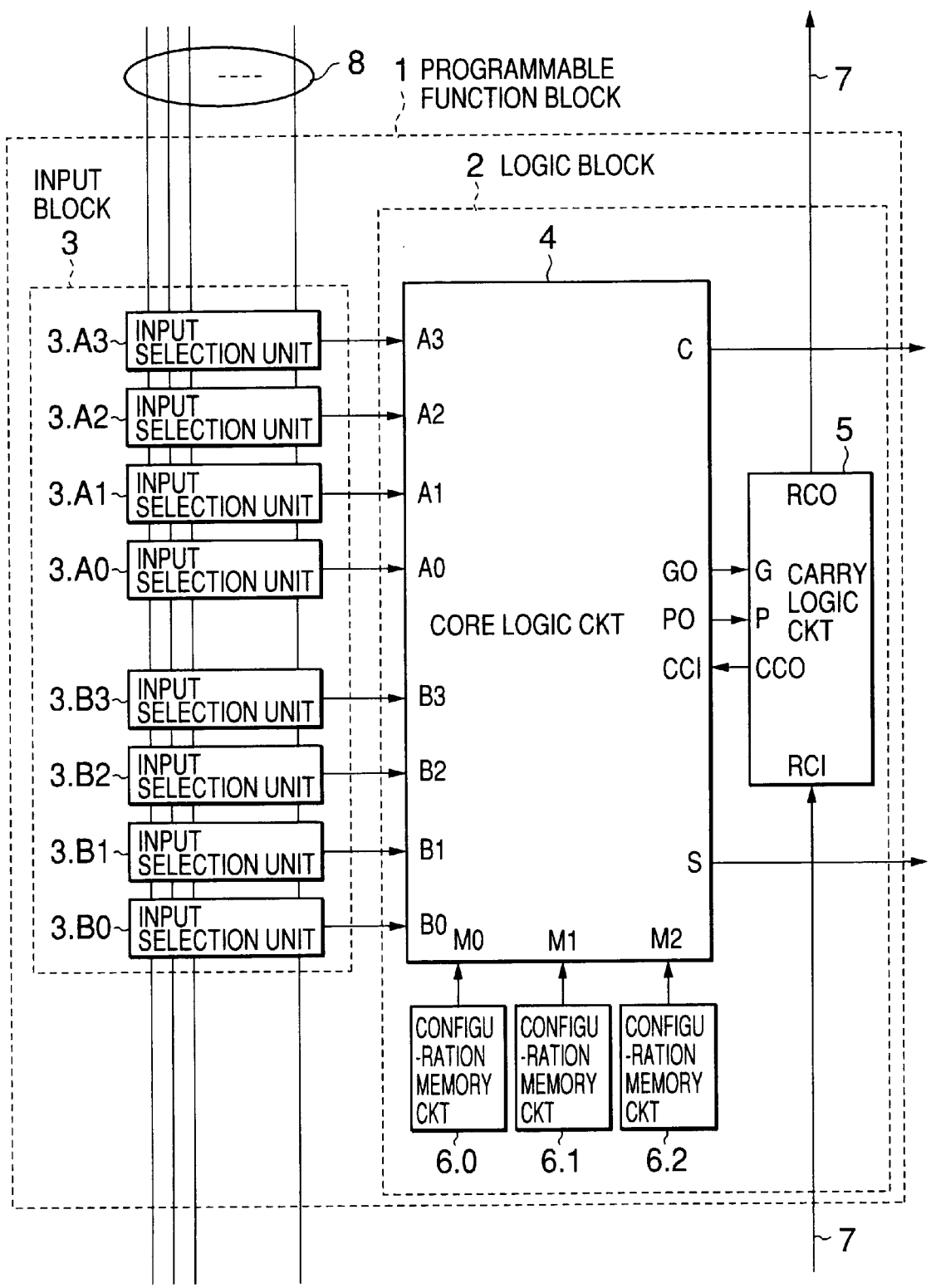
FIG. 3 is a block diagram of a programmable function block according to a first embodiment of this invention.

Referring to FIG. 3, the description will proceed to a programmable function block 1 according to a first embodiment of this invention. The illustrated programmable function block 1 comprises a logic block 2 and an input block 3. The logic block 2 comprises a core logic circuit 4, a carry logic circuit 5, and first through third configuration memory circuits 6.0, 6.1, and 6.2.

The core logic circuit 4 has, as input terminals, a first argument input group consisting of first through fourth argument input terminals A0, A1, A2, and A4, a second argument input group consisting of first through fourth argument input terminals B1, B1, B2, and B3, first through third configuration input terminals M0, M1, and M2, and a ripple-core logic carry input terminal CCI for inputting a ripple-core logic carry input signal. In addition, the core logic circuit 4 has, as output terminals, a core logic carry output terminal C for outputting a core logic carry output signal, a core logic carry generation output terminal GO for outputting a core logic carry generation output signal, a core logic carry propagation output terminal PO for outputting a core logic carry propagation output signal, and a sum output terminal S for outputting a summed output signal. The first through the third configuration input terminals M0, M1, and M2 are connected to output terminals of the first through the third configuration memory circuits 6.0, 6.1, and 6.2, respectively.

The first through the third configuration memory circuits 6.0, 6.1, and 6.3 store, as first through third stored logic values, a logic value of one bit. The first through the third configuration memory circuits 6.0, 6.1, and 6.2 supply the first through the third stored logic values to the first through the third configuration input terminals M0, M1, and M3, respectively.

The carry logic circuit 5 has, as input terminals, a ripple carry input terminal RCI for inputting a ripple carry input signal, a core logic carry generation input terminal G for inputting a core logic carry generation input signal, and a core logic carry propagation input terminal P for inputting a core logic carry propagation input signal. The carry logic circuit 5 has, as output terminals, a ripple carry output terminal RCO for outputting a ripple carry output signal to the ripple carry propagation path 7, and a ripple-core logic carry output terminal CCO for outputting a ripple-core logic carry output signal.

The core logic carry generation input terminal G is connected to the core logic carry generation output terminal GO. The core logic carry propagation input terminal P is connected to the core logic carry propagation output terminal PO. The ripple-core logic carry output terminal CCO is connected to the ripple-core logic carry input terminal CCI. Each of the ripple carry input terminal RCI and the ripple carry output terminal RCO is connected to a ripple carry propagation path 7.

Specifically, the core logic carry generation input terminal G inputs the core logic carry generation output signal as the core logic carry generation input signal from the core logic carry output terminal GO. The core logic carry propagation input terminal P inputs the core logic carry propagation output signal as the core logic carry propagation input signal from the core logic carry propagation output terminal PO. The ripple-core logic carry output terminal CCO supplies the ripple-core logic carry input terminal CCI with the ripple-core logic carry output signal as the ripple-core logic carry input signal.

The input block 3 is connected to interconnection wires 8 and the first and the second argument input groups. The input block 3 includes eighth input selection units for selecting, as eight input selected signals, eight ones of signals on the interconnection wires 8, a fixed logic value of "1", and a fixed logic value of "0". The input selection units 3 supply the eight input selected signals to the first through the fourth argument input terminals of the first and the second argument input groups.

Specifically, the input block 3 comprises first through fourth input selection units 3.A.0, 3.A.1, 3.A.2, and 3.A.3 and fifth through eighth input selection units 3.B.0, 3.B.1, 3.B.2, and 3.B.3. The first through the fourth input selection units 3.A.0, 3.A.1, 3.A.2, and 3.A.3 have output terminals connected to the first through the fourth argument input terminals A0, A1, A2, and A3 of the first argument input group, respectively. The fifth through the eighth input selection units 3.B.0, 3.B.1, 3.B.2, and 3.B.3 have output terminals connected to the first through the fourth argument input terminals B0, B1, B2, and B3 of the second argument input group, respectively. The first through the fourth input selection units 3.A.0, 3.A.1, 3.A.2, and 3.A.3 supply first through fourth input selected signals to the first through the fourth argument input terminals A0, A1, A2, and A3 of the first argument input group, respectively. The fifth through the eighth input selection units 3.B.0, 3.B.1, 3.B.2, and 3.B.3 supply fifth through eighth input selected signals to the first through the fourth argument input terminals B0, B1, B2, and B3 of the second argument input group, respectively.

Now, the description will proceed to the core logic circuit 4 in the first embodiment of this invention in detail. The description will first proceed to two-input one-output multiplexer 10 (which will be called 2-1MUX for short).

Figure 4:
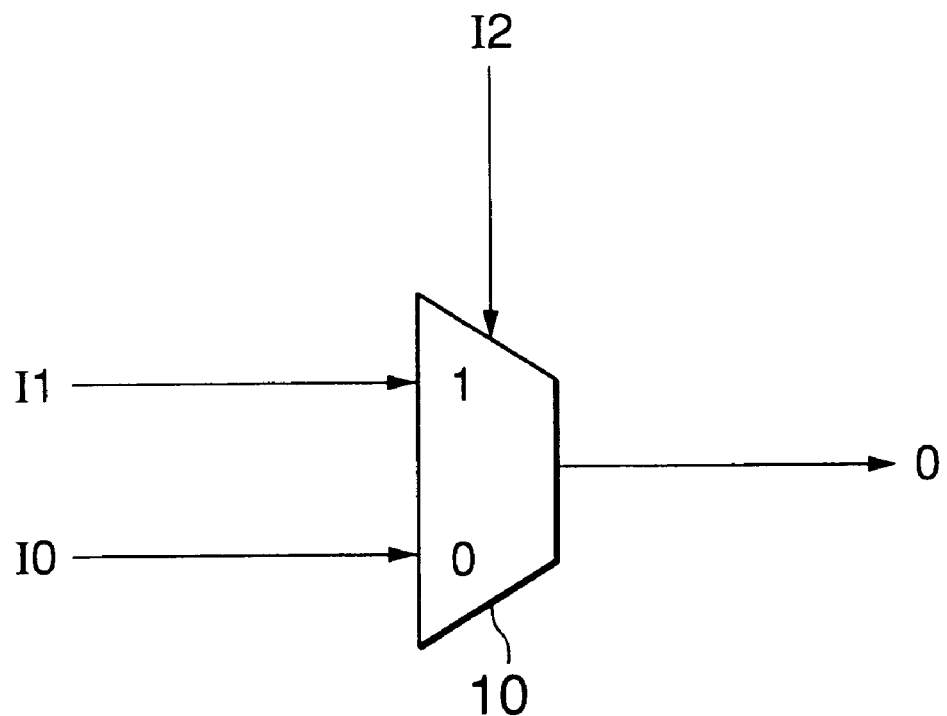
FIG. 4 is a block diagram of a two-input one-output multiplexer (2-1MUX) for use in the programmable function block illustrated in FIG. 3.

FIG. 4 shows a symbol of the 2-1MUX 10. The 2-1MUX 10 has first and second input terminals I0 and I1, a control input terminal I2, and an output terminal O. The first input terminal I0 is called a 0-input terminal while the second input terminal I1 is called a 1-input terminal. The 0-input terminal I0 is depicted at 0 in the symbol 10 of FIG. 4 while the 1-input terminal I1 is depicted at 1 in the symbol 10 of FIG. 4.

The 2-1MUX 10 is a multiplexer where a signal on the 0-input terminal I0 is transferred to the output terminal O when the control input terminal I2 is supplied with a control signal having a logic value of "0" and a signal on the 1-input terminal I1 is transferred to the output terminal 0 when the control input terminal I2 is supplied with the control signal having a logic value of "1". The o-input terminal and the 1-input terminal are collectively called argument input terminals for the 2-1MUX.

Figure 5:
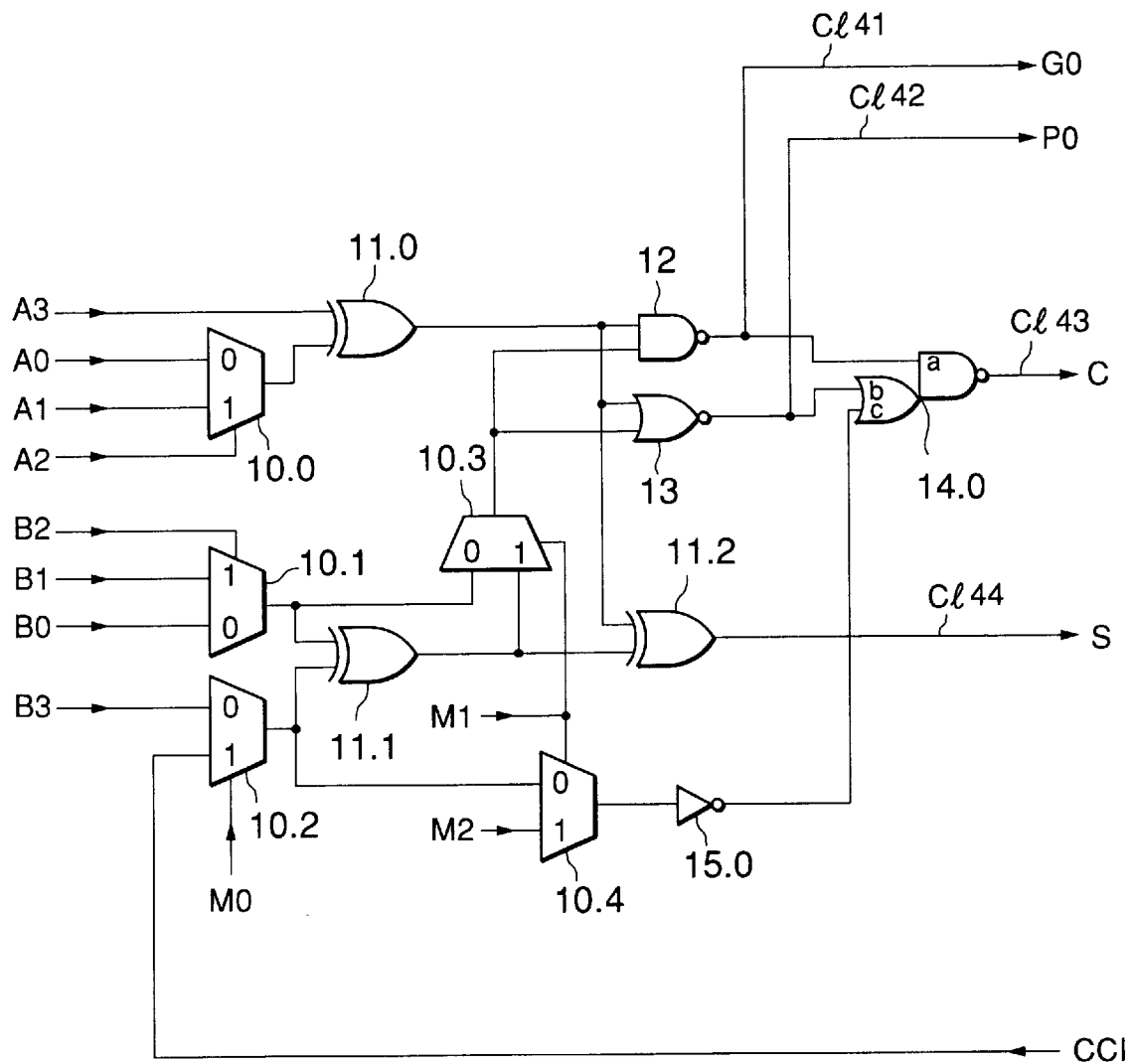
FIG. 5 is a circuit diagram of a first example of a core logic circuit for use in the programmable function block illustrated in FIG. 3.

Turning to FIG. 5, the description will proceed to an example of the core logic circuit 4 for use in the programmable function block 1 illustrated in FIG. 3. The core logic circuit 4 comprises first through fifth 2-1MUX 10.0, 10.1, 10.2, 10.3, and 10.4, first through third exclusive OR circuit 11.0, 11.1, and 11.2, a NAND circuit 12, a NOR circuit 13, a NAND-OR circuit 14.0, and an inverter 15.0.

The first 2-1MUX 10.0 has a 0-input terminal, a 1-input terminal, and a control input terminal which are connected to the first through the third argument input terminals A0, A1, and A3 of the first argument input group in the core logic circuit 4, respectively. The first exclusive OR circuit 11.0 has a first input terminal connected to the fourth argument input terminal A3 of the first argument input group in the core logic circuit 4. The first 2-1MUX 10.0 has an output terminal connected to a second input terminal of the first exclusive OR circuit 11.0. The first exclusive OR circuit 11.0 has an output terminal which is connected to first input terminals of the NAND circuit 12, of the NOR circuit 13, and of the third exclusive OR circuit 11.2.

The second 2-1MUX 10.1 has a 0-input terminal, a 1-input terminal, and a control input terminal which are connected to the first through the third argument input terminals B0, B1, and B2 of the second argument input group in the core logic circuit 4, respectively. The second 2-1MUX 10.1 has an output terminal which is connected to a first input terminal of the second exclusive OR circuit 11.1 and to a 0-input terminal of the fourth 2-1MUX 10.3.

The third 2-1MuX 10.2 has a 0-input terminal and a 1-input terminal which are connected to the fourth argument input terminal B3 of the second argument input group in the core logic circuit 4 and the ripple-core logic carry input terminal CCI, respectively. Although the fourth argument input terminal B3 of the second argument input group is connected to the 0-input terminal of the third 2-1MUX 10.2 and the ripple-core logic carry input terminal CCI is connected to the 1-input terminal of the third 2-1MUX 10.2 in the example being illustrated in FIG. 5, these connections may be reversed. That is, the fourth argument input terminal B3 of the second argument input group may be connected to the 1-input terminal of the third 2-1MUX 10.2 and the ripple-core logic carry input terminal CCI may be connected to the 0-input terminal of the third 2-1MUX 10.2. The third 2-1MUX 10.2 has a control input terminal connected to the first configuration input terminal M0. The third 1-2MUX 10.2 has an output terminal connected to a second input terminal of the second exclusive OR circuit 11.1 ant to a 0-input terminal of the fifth 2-1MUX 10.4.

The fifth 2-1MUX 10.4 has a 1-input terminal connected to the third configuration input terminal M2. Each of the fifth and the fourth 2-1MUX 10.4 and 10.3 has a control input terminal connected to the second configuration input terminal M1. The fourth 2-1MUX 10.3 has an output terminal which is connected to second input terminals of the NAND circuit 12 and of the NOR circuit 13. The fifth 2-1MUX 10.4 has an output terminal connected to an output terminal of the inverter 15.0. The inverter 15.0 has an output terminal connected to a c-input terminal (a third input terminal) of the NAND-OR circuit 14.0. The second exclusive OR circuit 11.1 has an output terminal which is connected to a 1-input terminal of the fourth 2-1MUX 10.3 and to a second input terminal of the third exclusive OR circuit 11.2.

The NAND circuit 12 has an output terminal connected to an a-input terminal (a first input terminal) of the NAND-OR circuit 14.0. The output terminal of the NAND circuit 12 is also connected via a first connecting line cl1 to the core logic carry generation output terminal GO from which the core logic carry generation output signal is taken out to the exterior of the core logic circuit 4. The NOR circuit 13 has an output terminal connected to a b-input terminal (a second input terminal) of the NAND-OR circuit 14.0. The output terminal of the NOR circuit 13 is also connected via a second connecting line c12 to the core logic carry propagation output terminal PO from which the core logic carry propagation output signal is taken out to the exterior of the core logic circuit 4. The NAND-OR circuit 14.0 has an output terminal which is connected via a third connecting line c13 to the core logic carry output terminal C from which the core logic carry output signal is taken out to the exterior of the core logic circuit 4. In addition, the third exclusive OR circuit 11.2 has an output terminal which is connected via a fourth connecting line c14 to the sum output terminal S from which the summed output signal is taken out to the exterior of the core logic circuit 4.

As is well known in the art, the NAND circuit is a logic circuit for NANDing a first input signal and a second input signal to produce a NANDed output signal. In addition, the NOR circuit is a logic circuit for NORing a first input signal and a second input signal to produce a NORed output signal. The exclusive OR circuit is a logic circuit for exclusively ORing a first input signal and a second input signal to produce an exclusively ORed output signal. In addition, the NAND-OR circuit is a logic circuit for ORing a signal supplied to the b-input terminal thereof and a signal supplied to the c-input terminal thereof to obtain an ORed result signal and for NANDing the ORed output signal and a signal supplied to the a-input terminal thereof to produce an ORed and NANDed output signal.

Operation of the core logic circuit 4 will be described. The first 2-1MUX 10.0 produces, as a first selected output signal, an input signal supplied to the o-input terminal thereof when the control input terminal thereof is supplied with the control signal having the logic value of "0". The first 2-1MUX 10.1 produces, as the first selected output signal, an input signal supplied to the 1-input terminal thereof when the control input terminal thereof is supplied with the control signal having the logic value of "1". The second 2-1MUX 10.1 produces, as a second selected output signal, an input signal supplied to the 0-input terminal thereof when the control input terminal thereof is supplied with the control signal having the logic value of "0". The second 2-1MUX 10.1 produces, as the second selected output signal, an input signal supplied to the 1-input terminal thereof when the control input terminal thereof is supplied with the control signal having the logic value of "1". The third 2-1MUX 10.2 produces, as a third selected output signal, an input signal supplied to the 0-input terminal thereof when the control input terminal thereof is supplied with the control signal having the logic value of "0". The third 2-1MUX 10.2 produces, as the third selected output signal, an input signal supplied to the 1-input terminal thereof when the control input terminal thereof is supplied with the control signal having the logic value of "1".

The first exclusive OR circuit 11.0 exclusively ORs an input signal supplied to the first input terminal thereof and the first selected output signal supplied to the second input terminal thereof to produce a first exclusively ORed output signal. The second exclusive OR circuit 11.1 exclusively ORs the second selected output signal supplied to the first input terminal thereof and the third selected output signal supplied to the second input terminal thereof to produce a second exclusively ORed output signal.

The fourth 2-1MUX 10.3 produces, as a fourth selected output signal, the second selected output signal supplied to the 0-input terminal thereof when the control input terminal thereof is supplied with the control signal having the logic value of "0". THe fourth 2-1Mux 10.3 produces, as the fourth selected output signal, the second exclusively ORed output signal supplied to the 1-input terminal thereof when the control input terminal thereof is supplied with the control signal having the logic value of "1". The fifth 2-1MUX 10.4 produces, as a fifth selected output signal, the third selected output signal supplied to the 0-input terminal thereof when the control input terminal thereof is supplied with the control signal having the logic value of "0". The fifth 2-1MUX 10.4 produces, as the fifth selected output signal, an input signal supplied to the 1-input terminal thereof when the control input terminal thereof is supplied with the control signal having the logic value of "1".

The NAND circuit 12 NANDs the first exclusively ORed output signal supplied to the first input terminal thereof and the fourth selected output signal supplied to the second input terminal thereof to produce a NANDed output signal. The NOR circuit 13 NORs the first exclusively ORed output signal supplied to the first input terminal thereof and the fourth selected output signal supplied to the second input terminal thereof to produce a NORed output signal. The third exclusive OR circuit 11.2 exclusively ORs the first exclusively ORed output signal supplied to the first input terminal thereof and the second exclusively ORed output signal supplied to the second input terminal thereof to produce a third exclusively ORed output signal. The inverter 15.0 inverts the fifth selected output signal supplied to the input terminal thereof to produce an inverted output signal. The NAND-OR circuit 14.0 ORs the NORed output signal supplied to the b-input terminal thereof and the inverted output signal supplied to the c-input terminal thereof to obtain an ORed result signal and NANDs the ORed result signal and the NANDed output signal supplied to the a-input terminal thereof to produce an ORed and NANDed output signal.

The first connecting line cl1 serves as a first connecting arrangement for connecting the output terminal of the NAND circuit 12 with the core logic carry generation output terminal GO to make the core logic carry generation output terminal Go produce the NANDed output signal as the core logic carry generation output signal. The second connecting line cl2 acts as a second connecting arrangement for connecting the output terminal of the NOR circuit 13 with the core logic carry propagation output terminal PO to make the core logic carry propagation output terminal PO produce the NORed output signal as the core logic carry propagation output signal. The third connecting line c13 is operable as a third connecting arrangement for connecting the output terminal of the NAND-OR circuit 14.0 with the core logic carry output terminal C to make the core logic carry output terminal C produce the ORed and NANDed output signal as the core logic carry output signal. The fourth connecting lien c14 serves as a fourth connecting arrangement for connecting the output terminal of the third exclusive OR circuit 11.2 with the sum output terminal S to make the sum output terminal S produce the third exclusively ORed output signal as the summed output signal.

Figure 6:
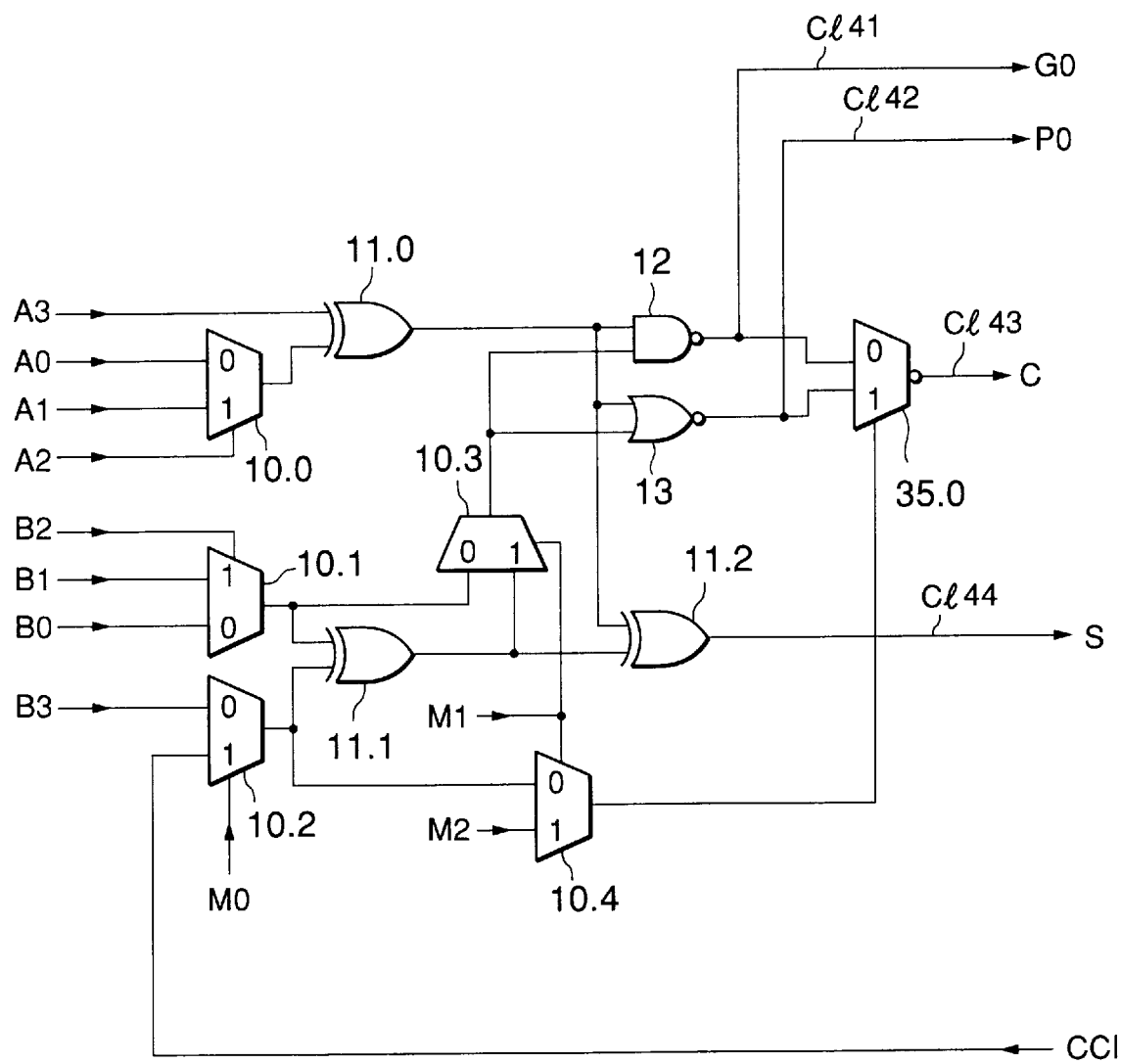
FIG. 6 is a circuit diagram of a second example of a core logic circuit for use in the programmable function block illustrated in FIG. 3.

Turning to FIG. 6, the description will proceed to another example of the core logic circuit for use in the programmable function block 1 illustrated in FIG. 3. The illustrated core logic circuit is depicted at 4A. The core logic circuit 4A is similar in structure and operation to the core logic circuit 4 illustrated in FIG. 5 except that the core logic circuit 4A comprises a two-input one-output inverting multiplexer 35.0 in lieu of the NAND-OR circuit 14.0 and the inverter 15.0 in the core logic circuit 4.

The two-input one-output inverting multiplexer 35.0 is a 2-1MUX having an inverting output terminal. The two-input one-output inverting multiplexer 35.0 has a 0-input terminal, a 1-input terminal, and a control input terminal which are connected to the output terminals of the NAND circuit 12, of the NOR circuit 13, and of the fifth 2-1MUX 10.4, respectively. The two-input one-output inverting multiplexer 35.0 has the inverting output terminal which is connected via the third connecting line cl3 to the core logic carry output terminal C.

The two-input one-output inverting multiplexer 35.0 produces, as an inverted selected output signal, a signal obtaining by inverting the NANDed output signal supplied to the 0-input terminal thereof when the control input terminal thereof is supplied with the control signal having the logic value of "0". The two-input one-output inverting multiplexer 35.0 produces, as the inverted selected output signal, a signal obtained by inverting the NORed output signal supplied to the 1-input terminal thereof when the control input terminal thereof is supplied with the control signal having the logic value "1". The third connecting line cl3 acts as a third connecting arrangement for connecting the inverting output terminal of the two-input one-output inverting multiplexer 35.0 with the core logic carry output terminal C to make the core logic carry output terminal C produce the inverted selected output signal as the core logic carry output signal.

The core logic circuit 4A illustrated in FIG. 6 has a similar function to that of the core logic circuit 4 illustrated W in FIG. 5.

Figure 7:
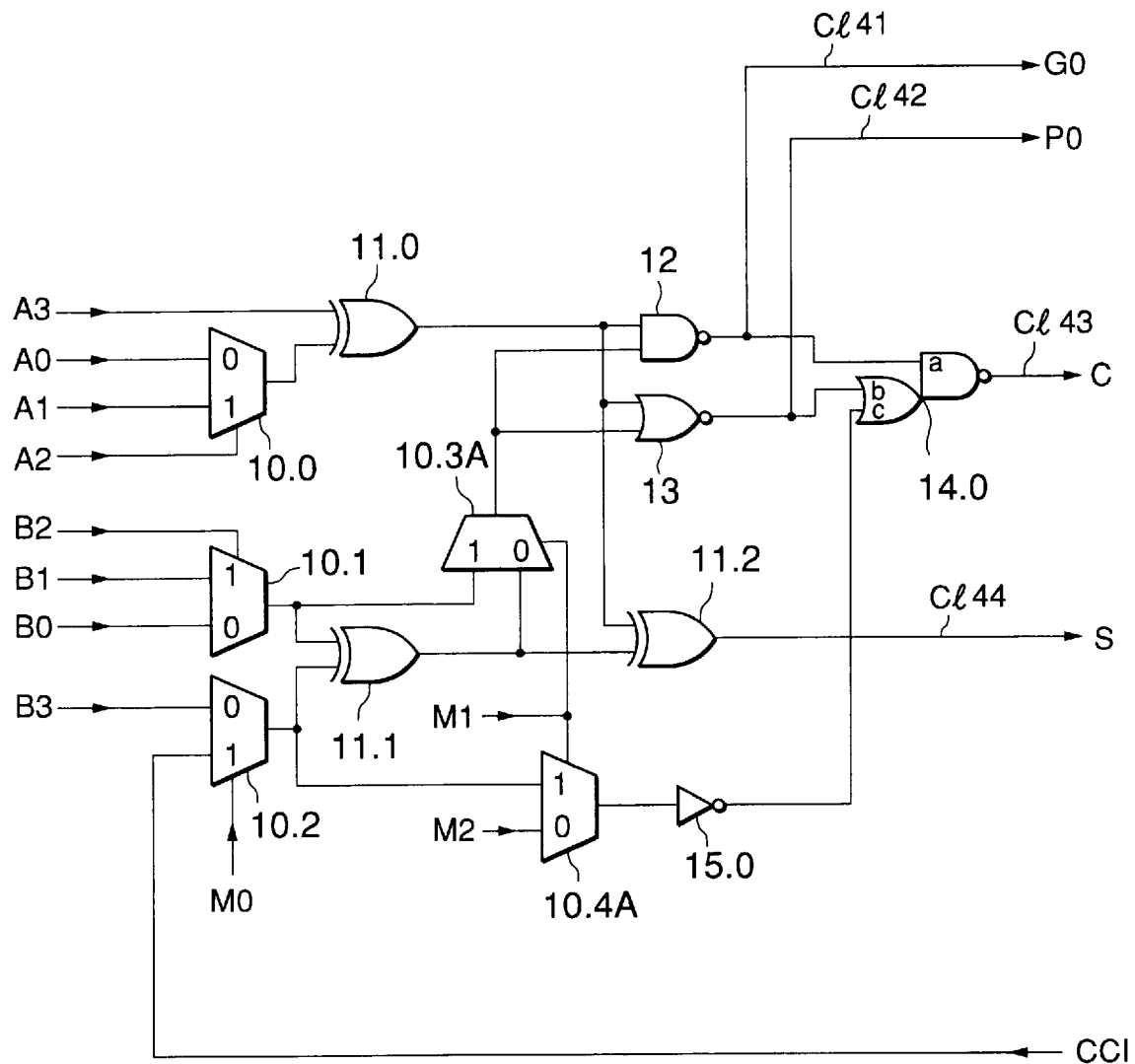
FIG. 7 is a circuit diagram of a third example of a core logic circuit for use in the programmable function block illustrated in FIG. 3.

Turning to FIG. 7, the description will proceed to still another example of the core logic circuit for use in the I programmable function block 1 illustrated in FIG. 3. The illustrated core logic circuit is depicted at 4B. The core logic circuit 4B is similar in structure and operation to the core logic circuit 4 illustrated in FIG. 5 except that the fourth and the fifth 2-1MUXs are modified from those illustrated in FIG. 5 as will later become clear. The fourth and the fifth 2-1MUXs are therefore depicted at 10.3A and 10.4A, respectively.

The fourth 2-1MUX 10.3A has a 0-input terminal connected to the output terminal of the second exclusive OR circuit 11.1, a 1-input terminal connected to the output terminal of the second 2-1MUX 10.1, and a control input terminal connected to the second configuration input terminal MI. That is, signals supplied to the 0-input and 1-input terminals of the fourth 2-1MUX 10.3A are replaced with those supplied to the 0-input and 1-input terminals of the fourth 2-1MUX 10.3 in FIG. 5. The fourth 2-1MUX 10.3A produces, as the fourth selected output signal, the second exclusively ORed output signal supplied to the 0-input terminal thereof when the control input terminal thereof is supplied with the control signal having the logic value of "0". The fourth 2-1MUX 10. 2A produces, as the fourth selected output signal, the second selected output signal supplied to the 1-input terminal thereof when the control input terminal thereof is supplied with the control signal having the logic value of "1". The fourth 2-1MUX 10.3A has an output terminal which is connected to the second input terminals of the NAND circuit 12 and of the NOR circuit 13.

The fifth 2-1MUX 10.4A has a 0-input terminal connected to the third configuration input terminal M2, a 1-input terminal connected to the output terminal of the third 2-1MUX 10.2, and a control input terminal connected to the second configuration input terminal M1. That is, signals supplied to the 0-input and 1-input terminals of the fifth 2-1MUX 10.4A are replaced with those supplied to the 0-input and 1-input terminals of the fifth 2-1MUX 10.4 in FIG. 5. The fifth 2-1MUX 10.4A produces, as a fifth selected output signal, an input signal supplied to the 0-input terminal thereof when the control input terminal thereof is supplied with the control signal having the logic value of "0". The fifth 2-1MUX 10.4A produces, as the fifth selected output signal, the third selected output signal supplied to the 1-input terminal thereof when the control input terminal thereof is supplied with the control signal having the logic value of "1". The fifth 2-1MUX 10.4A has an output terminal connected to the input terminal of the inverter 15.0.

The core logic circuit 4B illustrated in FIG. 7 has a similar function to that of the core logic circuit 4 illustrated in FIG. 5.

Figure 8:
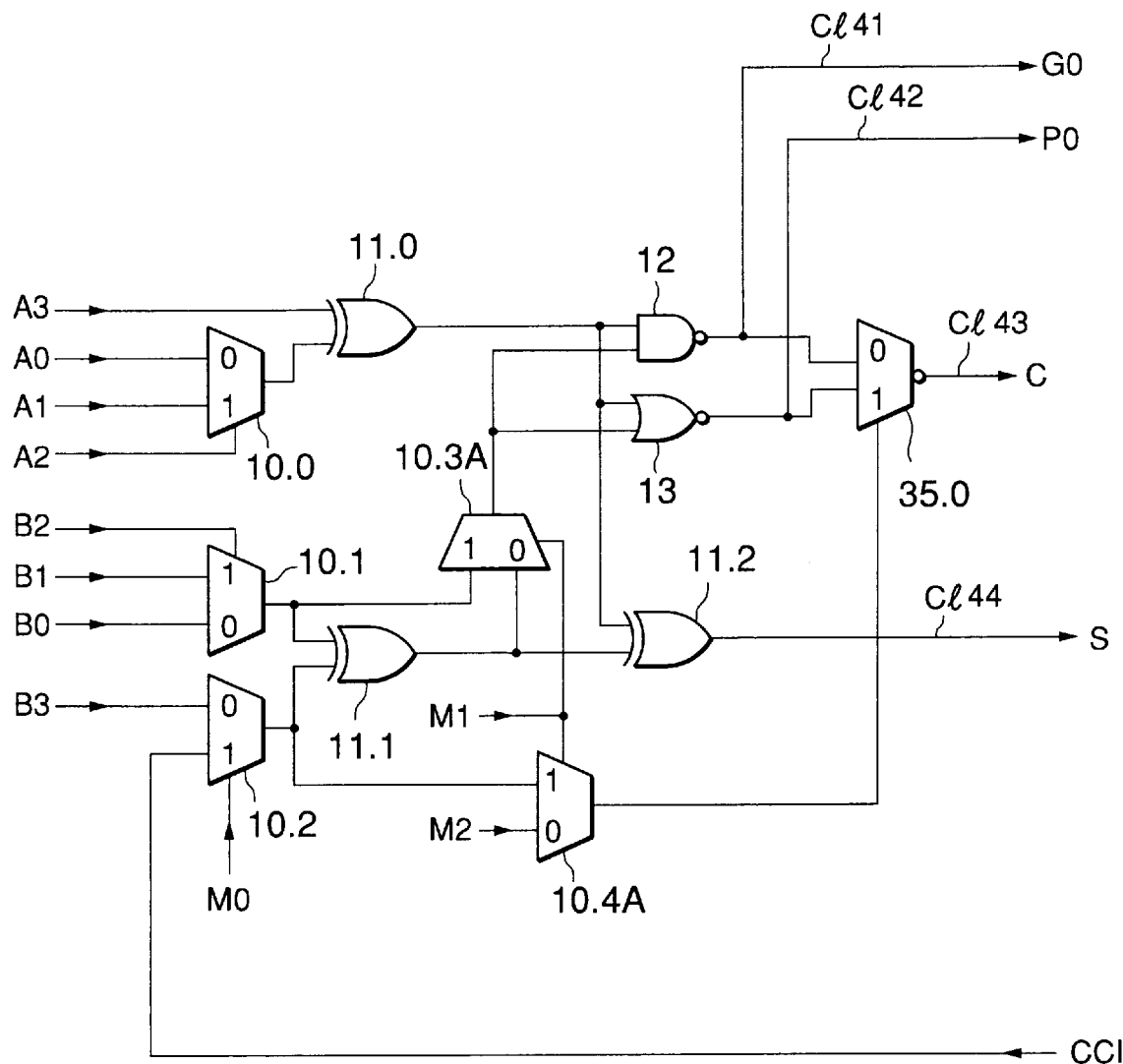
FIG. 8 is a circuit diagram of a fourth example of a core logic circuit for use in the programmable function block illustrated in FIG. 3.

Turning to FIG. 8, the description will proceed to yet another example of the core logic circuit for use in the programmable function block 1 illustrated in FIG. 3. The illustrated core logic circuit is depicted at 4C. The core logic circuit 4C is similar in structure and operation to the core logic circuit 4A illustrated in FIG. 6 except that the core logic circuit 4C comprises the fourth and the fifth 2-1MUXs 10.3A and 10.4A which are modified from those illustrated in FIG. 6.

The core logic circuit 4C illustrated in FIG. 8 has a similar function to that of the core logic circuit 4A illustrated in FIG. 6.

Figure 9:
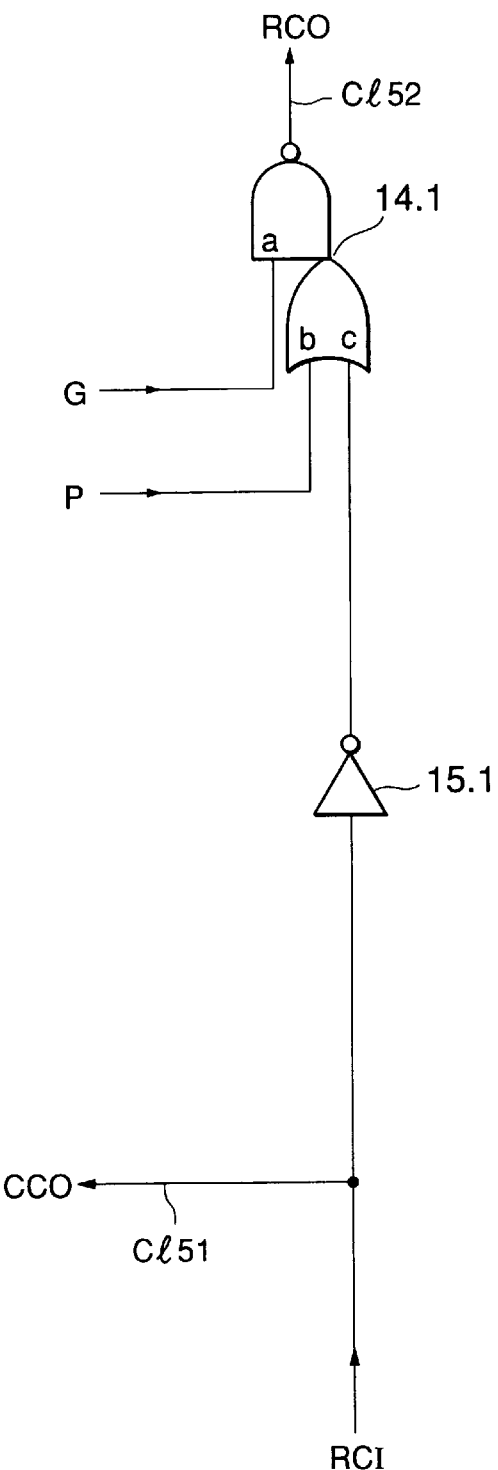
FIG. 9 is a circuit diagram of a first example of a carry logic circuit for use in the programmable function block illustrated in FIG. 3.

Turning to FIG. 9, the description will proceed to an example of the carry logic circuit 5 for use in the programmable function block 1 illustrated in FIG. 3. The carry logic circuit 5 comprises a NAND-OR circuit 14.1 and an inverter 15.1.

The ripple carry input terminal RCI is connected to an input terminal of the inverter 15.1. The inverter 15.1 inverts the ripple carry input signal to produce an inverted ripple carry signal. The ripple carry input terminal RCI is also connected via a first connection line c151 to the ripple-core logic carry output terminal CCO to make the ripple-core logic carry output terminal CCO produce the ripple carry input signal as the ripple-core logic carry output signal. That is, the first connection line c151 is operable as a first connection arrangement for connecting the ripple carry input terminal RCI with the ripple-core logic carry output terminal CCO to make the ripple-core logic carry output terminal CCO produce the ripple carry input signal as the ripple-core logic carry output signal.

The inverter 15.1 has an output terminal connected to a c-input terminal (a third input terminal) of the NAND-OR circuit 14.1. The core logic carry generation input terminal G and the core logic carry propagation input terminal P are connected to an a-input terminal (a first input terminal) and a b-input terminal (a second input terminal) of the NAND-OR circuit 14.1. The NAND-OR circuit 14.1 ORs the core logic carry propagation input signal supplied to the b-input terminal thereof and the inverted ripple carry signal supplied to the c-input terminal thereof to obtain an ORed result signal and NANDs the ORed result 5 signal and the core logic carry generation input signal supplied to the a-input terminal thereof to produce an ORed and NANDed output signal. The NAND-OR circuit 14.1 has an output terminal which is connected via a second connection line c152 to the ripple carry output terminal RCO. That is, the second connection line c152 serves as a second connection arrangement for connecting the output terminal of said NAND-OR circuit 14.1 with the ripple carry output terminal RCO to make the ripple carry output terminal RCO produce the ORed and NANDed output signal as the ripple carry output signal.

Figure 10:
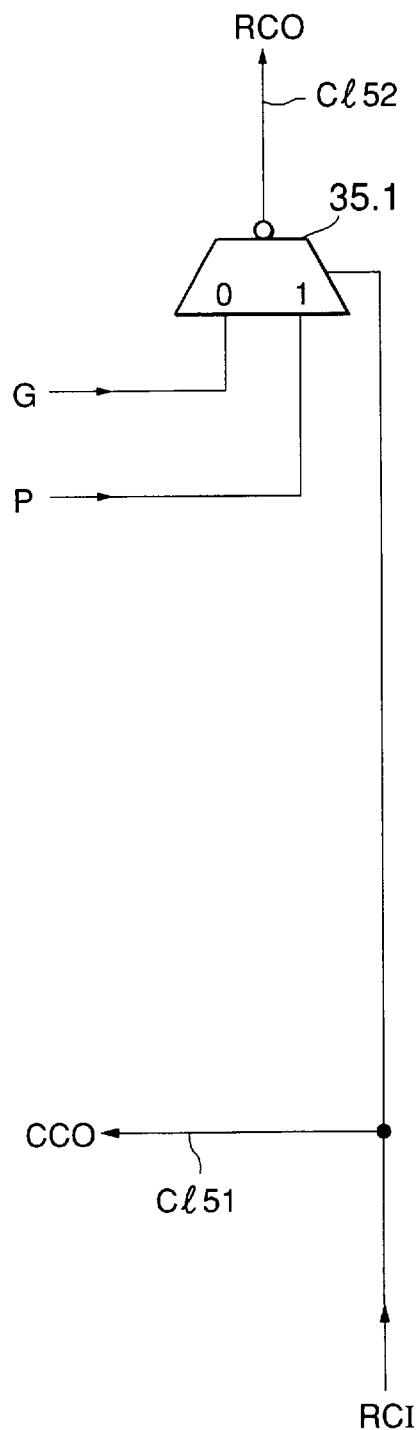
FIG. 10 is a circuit diagram of a second example of a carry logic circuit for use in the programmable function block illustrated in FIG. 3.

Turning to FIG. 10, the description will proceed to another example of the carry logic circuit for use in the programmable function block 1 illustrated in FIG. 3. The illustrated carry logic circuit is depicted at 5A. The carry logic circuit 5A comprises a two-input one-output inverting multiplexer 35.1 or a 2-1MUX having an inverting output terminal.

The two-input one-output inverting multiplexer 35.1 has a 0-input terminal connected to the core logic carry generation input terminal G, a 1-input terminal connected to the core logic carry propagation input terminal P, and a control input terminal connected to the ripple carry input terminal RCI. The two-input one-output inverting multiplexer 35.1 produces, as an inverted selected output signal, a signal obtaining by inverting the core logic carry generation input signal supplied to the 0-input terminal thereof when the control input terminal thereof is supplied with the control signal (the ripple carry input signal) having the logic value of "0". The two-input one-output inverting multiplexer 35.0 produces, as the inverted selected output signal, a signal obtained by inverting the core logic carry propagation input signal supplied to the 1-input terminal thereof when the control input terminal thereof is supplied with the control signal (the ripple carry input signal) having the logic value "1". The two-input one-output inverting multiplexer 35.1 has the inverting output terminal which is connected via the second connection line c152 to the ripple carry output terminal ROC. That is, the second connection line c152 acts as a second connection arrangement for connecting the output terminal of the two-input one-output inverting multiplexer 35.1 with the ripple carry output terminal RCO to make the ripple carry output terminal RCO produce the inverted selected output signal as the ripple carry output signal.

The carry logic circuit 5A illustrated in FIG. 10 has a similar function to that of the carry logic circuit 5 illustrated in FIG. 9.

Turning back to FIG. 3, the first through the third configuration memory circuits 6.0, 6.1, and 6.2 are memory circuits for storing, as first through third stored values, either logic value of "1" or "0". Each configuration memory circuit may be implemented by a one-bit static random access memory (SRAM), a one-bit dynamic random access memory (DRAM), a one-bit flash memory, a one-bit read-only memory (ROM), or the like.

It will be assumed that the logic value of "0" is stored in the second configuration memory circuit 6.1. This is called an "arithmetic mode". In this event, the logic block 2 illustrated in FIG. 3 is operable as a circuit illustrated in FIG. 11.

Figure 11:
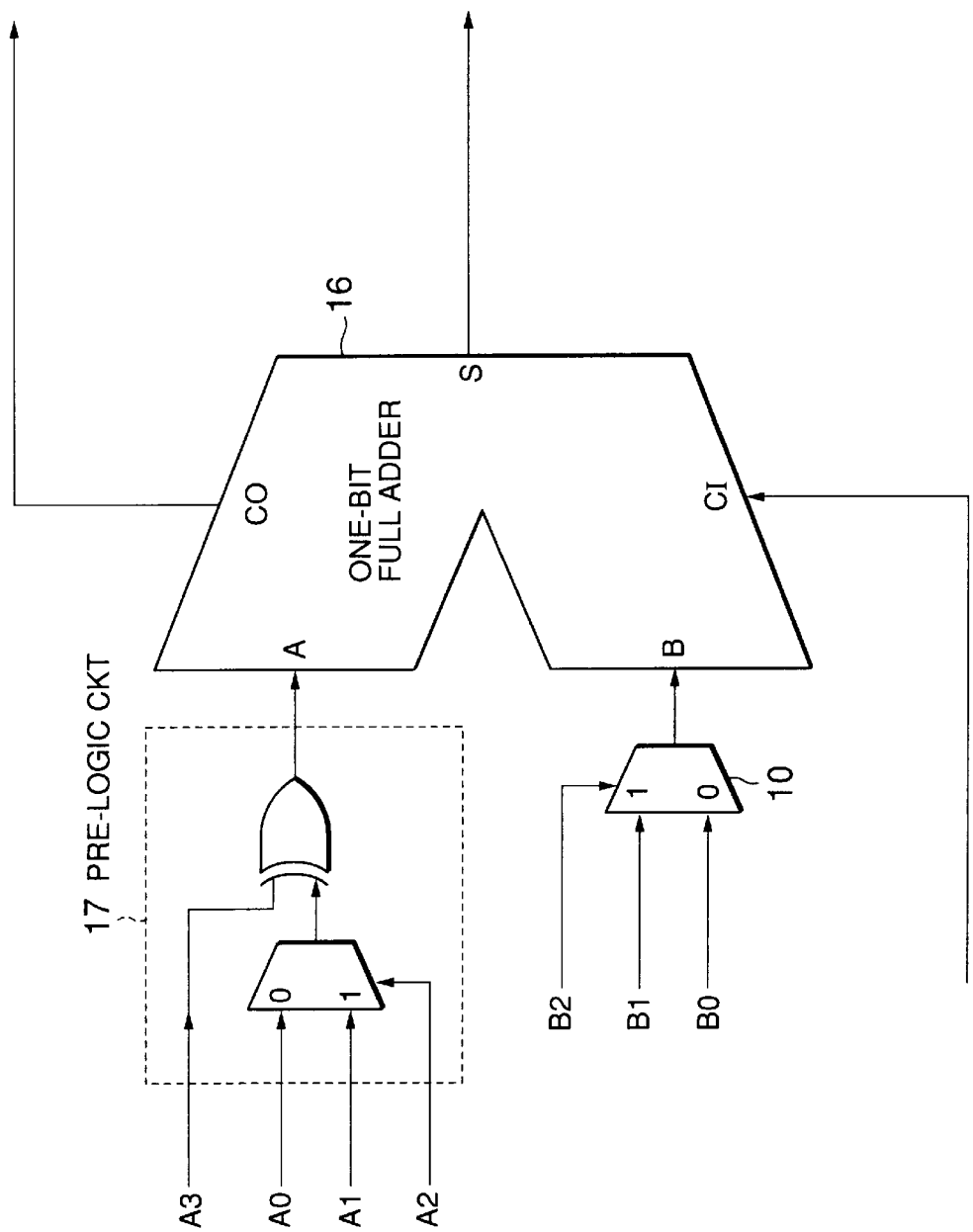
FIG. 11 is a block diagram showing an equivalent circuit in an arithmetic mode of the logic block illustrated in FIG. 3.

The circuit illustrated in FIG. 11 comprises a one-bit full adder 16, a pre-logic circuit 17 having an output terminal connected to a first argument input terminal A of the one-bit full adder 16, and a 2-1MUX 10 having an output terminal connected to a second argument input terminal B of the one-bit full adder 16. The one-bit full adder 16 has a carry input terminal CI and a carry output terminal CO. In the circuit illustrated in FIG. 11, input terminals A0, A1, A2, A3, B0, B1, B2, and an output terminal S correspond to the input terminals having the same symbols and the output terminal of the same symbol in FIG. 3, respectively.

In the arithmetic mode, it will be presumed that the logic value of "1" is stored in the first configuration memory circuit 6.0. This is referred to as a "ripple carry mode". In the ripple carry mode, the carry input terminal CI and the carry output terminal CO in the one-bit full adder 16 in FIG. 11 correspond to the ripple carry input terminal RCI and the ripple carry output terminal RCO in FIG. 3, respectively. In addition, the core logic carry output signal produced by the core logic carry output terminal C in FIG. 3 is equal to the ripple carry output signal produced by the ripple carry output terminal RCO.

In addition, in the arithmetic mode, it will be presumed that the logic value of "0" is stored in the first configuration memory circuit 6.0. This is referred to as a "carry-save mode". In the carry-save mode, the carry input terminal CI and the carry output terminal CO in the one-bit full adder 16 in FIG. 11 correspond to the fourth argument input terminal B2 of the second argument group and the core logic carry output terminal C in FIG. 3, respectively.

In the arithmetic mode, operation of the core logic circuit 4 in FIG. 3 is independent from the contents stored in the third configuration memory circuit 6.2.

Added to the second and the first argument input terminals B and A of the one-bit full adder 16 in FIG. 11, the 2-1MUX 10 and the pre-logic circuit 17 are operable as various logic circuits in accordance with input setting.

FIG. 12 shows a list of equivalent logic circuits in a case of setting various inputs in the 2-1MUX 10. In FIG. 12, symbols of input/output correspond to those attached to the 2-1MUX 10 in FIG. 11. In addition, among the input setting of FIG. 12, asymbol of x means a don't care (a result is independent from it's value).

Turning to FIG. 13, the pre-logic circuit 17 in FIG. 11 where an input terminal of a 2-1MUX is connected to an input terminal of an exclusive OR circuit is operable in accordance with input setting as various logic circuits illustrated in FIG. 13. In FIG. 13, symbols in input/output correspond to those attached to the pre-logic circuit 17 in FIG. 11. In a list of FIG. 13, a symbol of x means a don't care. As apparent from FIG. 13, the pre-logic circuit 17 can implement all kinds of one-input one-output logic functions and of two-input one-output logic functions. In addition, FIG. 13 shows only main functions in the pre-logic circuit 17 and therefore this is not all.

Figure 14B:
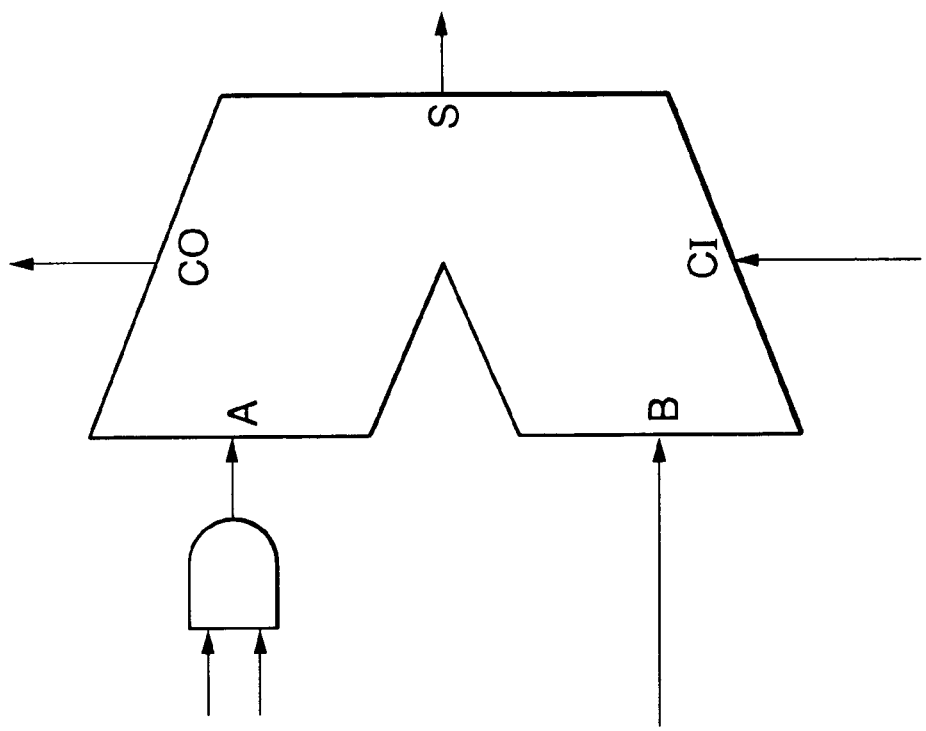
FIGS. 14 (A) and 14(B) are block diagrams of an one-bit adder and subtracter and a component of a multiplier, respectively.
Figure 14A:
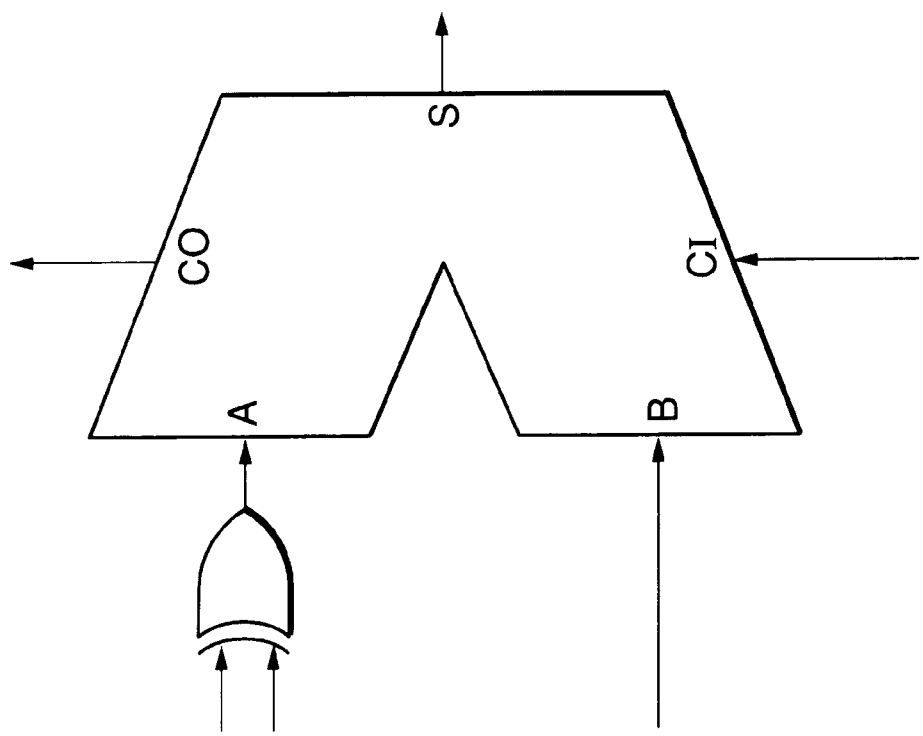

As described above, when the logic block 2 illustrated in FIG. 3 is used at the arithmetic mode, the equivalent circuit illustrated in FIG. 11 can function as circuits where very various logic circuit are added to the argument input terminals of the full adder. For example, the equivalent circuit can be utilized as an adder-subtracter (FIG. 14(A)) and a component (FIG. 14(B)) of a multiplier which have high frequency of use as arithmetic operations.

It will be assumed that the logic value of "1" is stored in the second configuration memory circuit 6.1. This is called a "logic mode". In this event, the logic block 2 illustrated in FIG. 3 is operable as a circuit illustrated in FIG. 15.

Figure 15:
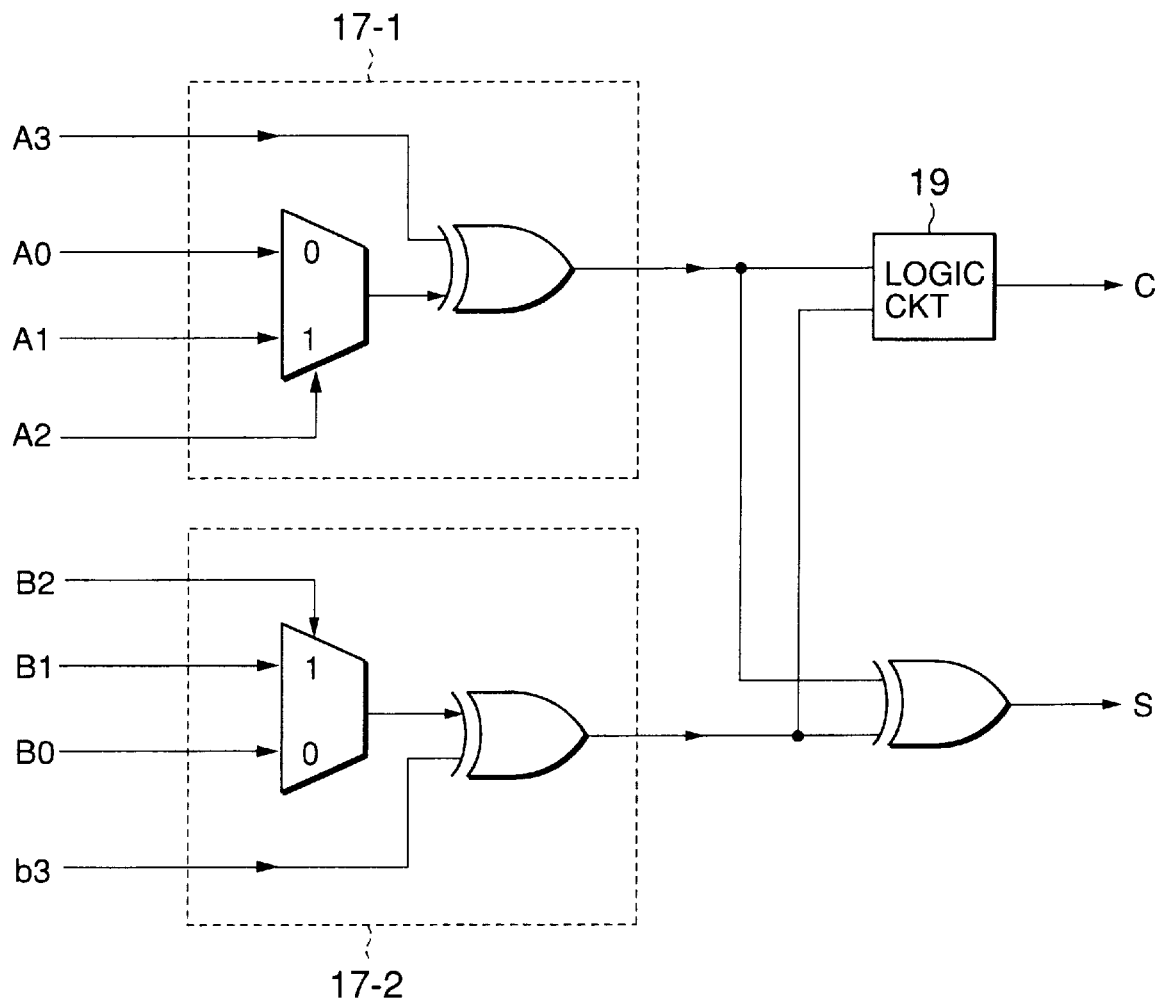
FIG. 15 is a block diagram showing an equivalent circuit in a logic mode of the logic block illustrated in FIG. 3.

In FIG. 15, a logic circuit 19 serves as an AND circuit when the logic value of "0" is stored in the third configuration memory circuit 6.2. In addition, the logic circuit 19 acts as an OR circuit when the logic value of "1" is stored in the third configuration memory circuit 6.2. In the circuit illustrated in FIG. 15, input terminals A0, A1, A2, A3, B0, B1, B2 and an output terminals C and S correspond to the input terminals having the same reference symbols and the output terminals having the same reference symbols in FIG. 3. In addition, an input terminal b3 corresponds to the fourth argument input terminal B3 of the second argument group in FIG. 3 when the logic value of "0" is stored in the first configuration memory circuit 6.0. The input terminal b3 corresponds to the ripple carry input terminal RCI in FIG. 3 when the logic value of "1" is store in the first configuration memory circuit 6.0.

Figure 16A:
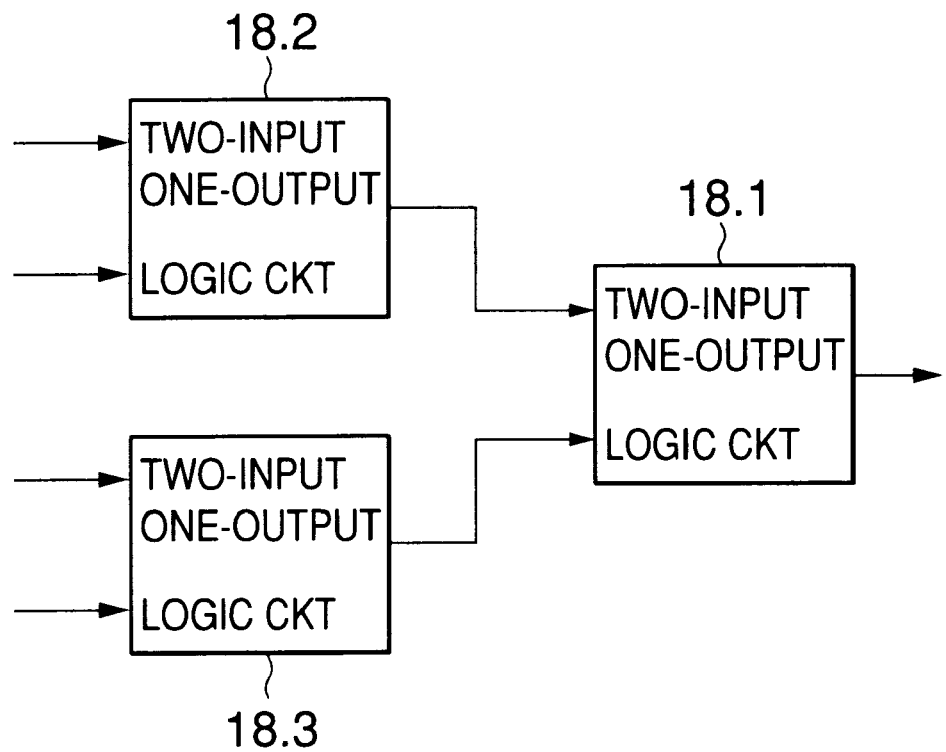
FIGS. 16(A) and 16(B) are block diagrams of examples of a four-input one-output logic function and a three-input one-output logic function which the equivalent circuit illustrated in FIG. 15 has, respectively.

In FIG. 15, inasmuch as the first and the second pre-logic circuits 17-1 and 17-2 are operable as various logic circuits as mentioned before in detail, the circuit illustrated in FIG. 15 can function as extremely various logic circuits by suitably using the output terminals C and S in FIG. 15. For example, the circuit illustrated in FIG. 15 can function as a four-input one-output logic circuit which comprises a combination of first through third two-input one-output logic circuit 18.1, 18.2, and 18.3 in a tree fashion, as illustrated in FIG. 16 (A) and this is an especially useful fact on constituting a complicated random logic using the present invention. In addition, the four-input one-output logic circuit illustrated in FIG. 16(A) includes, as a special case, a three-input one-output logic circuit which comprises a combination of the first and the second two-input one-output logic circuits 18.1 and 18.2 in a tree fashion.

Figure 16B:
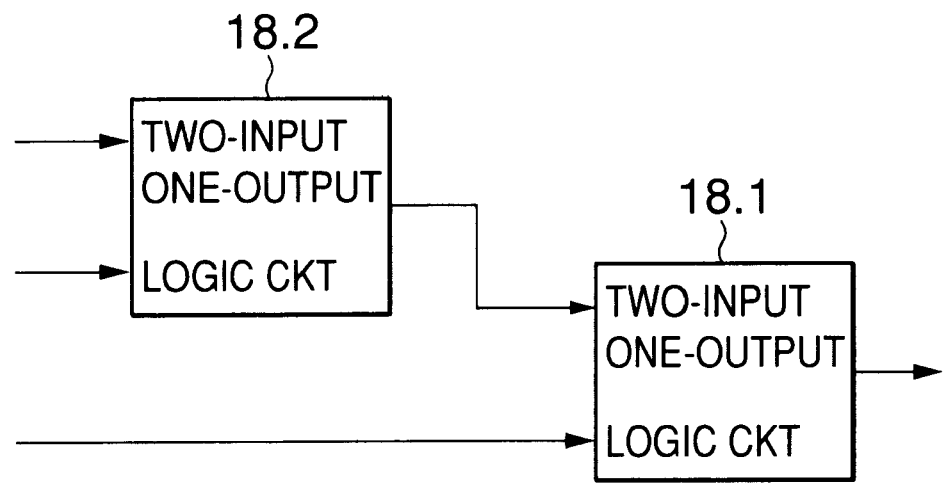

In order to implement the logic functions as illustrated in FIGS. 16(A) and 16(B), the prior art programmable function block 1' illustrated in FIG. 1 must connect the carry input terminal CI of the full adder 16 with the input selection unit in addition to a total of eight inputs for the first and the second pre-logic circuits 17-1 and 17-2.

In contrast with this, in the programmable function block 1 according to this invention illustrated in FIG. 3, only the first through the fourth argument input terminals A0, A1, A2, and A3 of the first argument input group and the first through the fourth argument input terminals B0, B1, B2, and B3 are connected to the eight input selection units. That is, the programmable function block 1 according to this invention comprises the eight input selection units which are in number less than those of the prior art programmable function block 1I by one. Inasmuch as the input selection unit has a large occupied area, that the number of the input selection units is less in comparison with the prior art is an important merit in the present invention.

Figure 17:
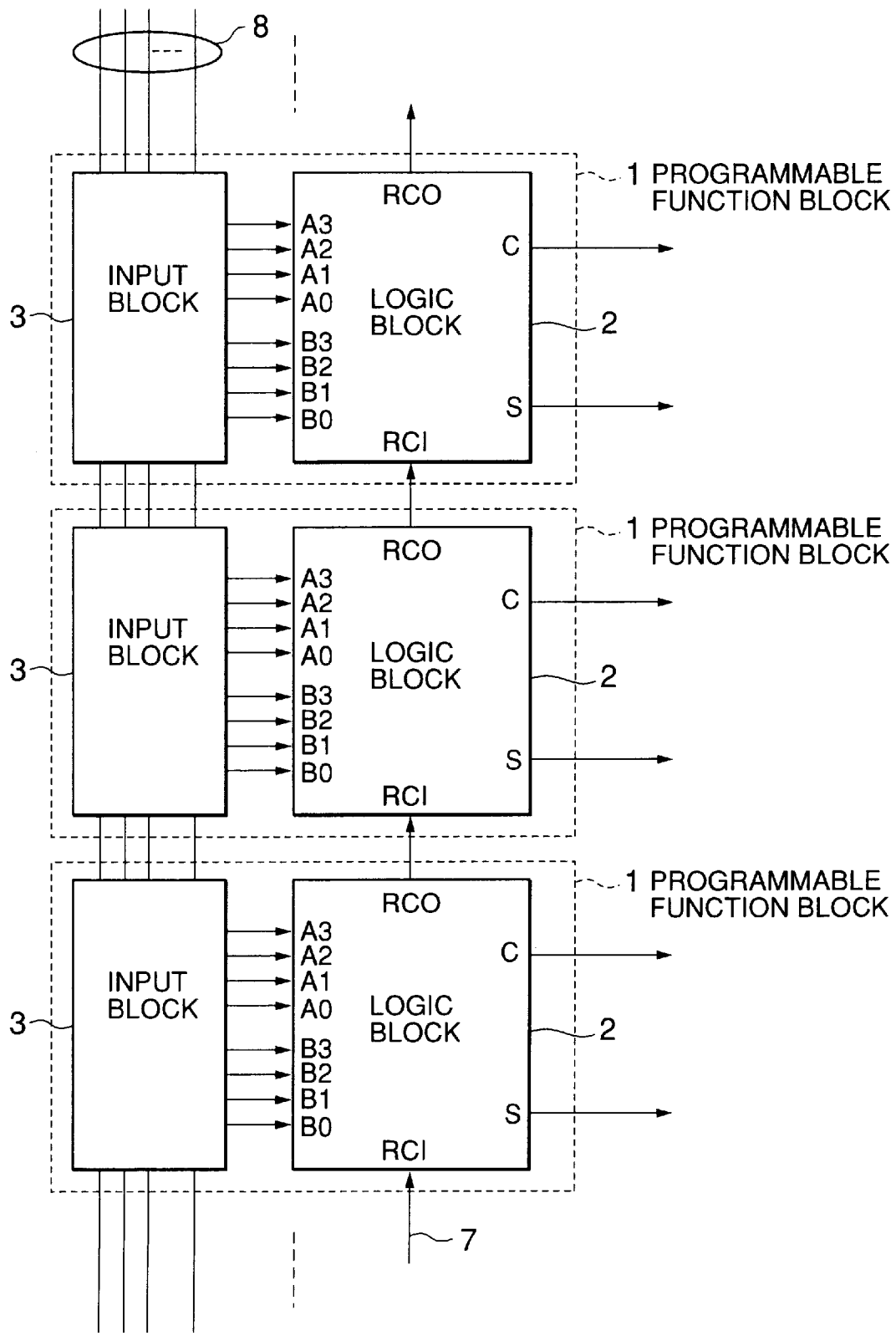
FIG. 17 is a block diagram of a multi-bit programmable function block comprising programmable function blocks illustrated in FIG. 3 which are connected at a ripple carry.

FIG. 17 shows a multi-bit arithmetic unit comprising a plurality of programmable function blocks each of which is illustrated in FIG. 3. In the multi-bit arithmetic unit, each programmable function block 1 corresponds to one bit and the logic block 2 of each programmable function block 1 has the ripple carry output terminal RCO which is connected to the ripple carry input terminal RCI of the logic block 2 in an adjacent programmable function block 1. Under the circumstances, in the above-described ripple carry mode, the ripple carry signal propagating between the logic blocks 2 passes through the carry logic circuits (5 in FIG. 3) alone.

As a result, the multi-bit arithmetic unit illustrated in FIG. 17 has drastically high speed ripple carry propagation in comparison with the prior art programmable block 1I (FIG. 1). This is because the carry signal must pass through the input selection unit in the prior art programmable block 1'. In addition, in the ripple carry mode, the same signal is produced by the ripple carry output terminal RCI and the core logic carry output terminal C. Accordingly, the core logic carry output terminal C is available in a case of performing any arithmetic processing on the ripple carry. As a result, any circuit for other processings needs not connect to the ripple carry output terminal RCO and the ripple carry output terminal RCO has a load for a minimum next stage carry logic. Therefore, the load is light and the high speed ripple carry propagation is possible. Inasmuch as a logic circuit (a combination of the NAND-OR circuit 14.0 and the inverter 15.0 in FIGS. 5 and 7 or the two-input one-output inverting multiplexer 35.0 in FIGS. 6 and 8) added to obtain the core logic carry output signal is not connected to the ripple carry propagation path (7 in FIG. 3), increasing of the load in the ripple carry propagation path is not at all caused by this addition.

Figure 18:
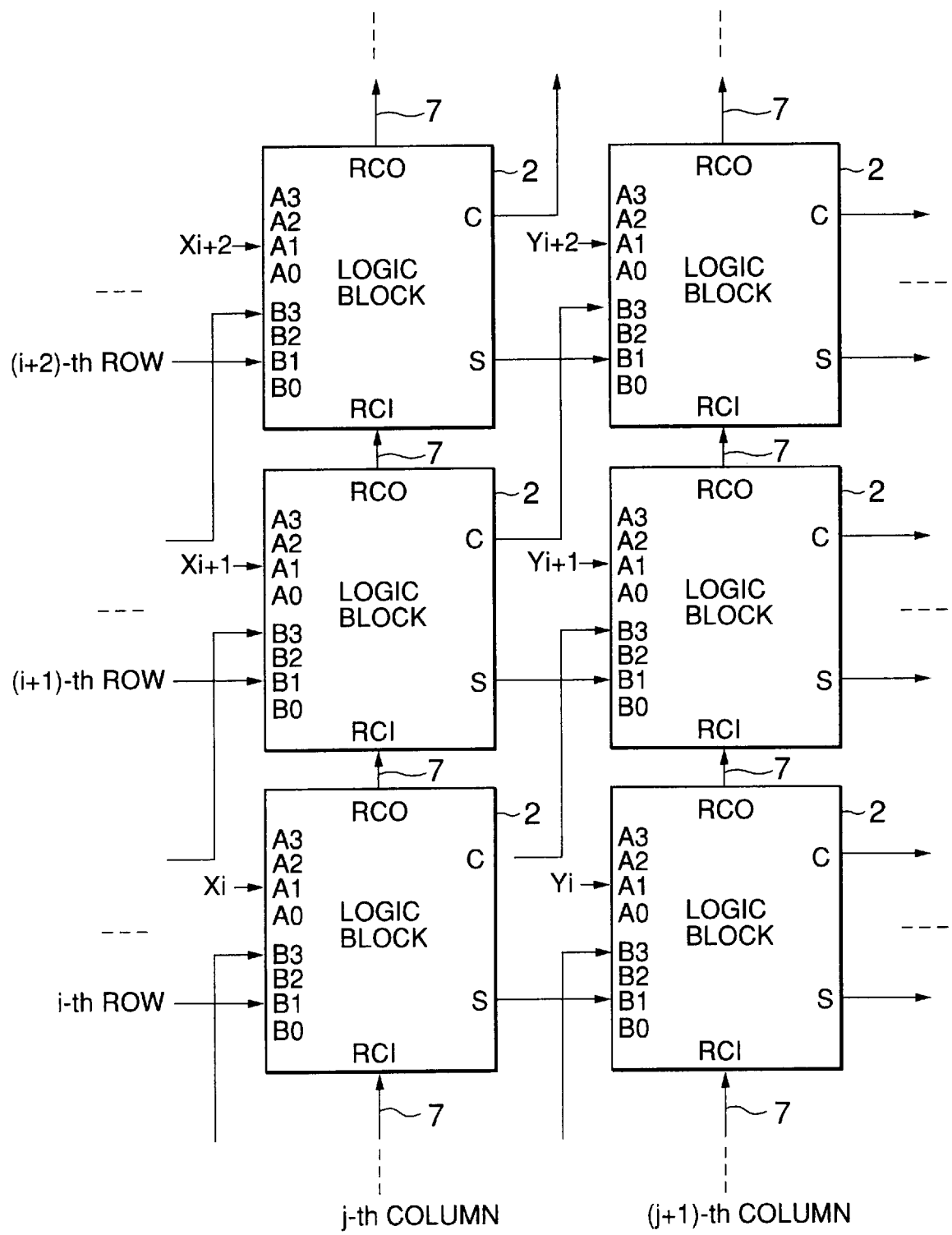
FIG. 18 is a block diagram of a carry-save adder using a plurality of programmable function blocks illustrated in FIG. 3.

FIG. 18 shows a carry-save adder comprising a plurality of programmable function blocks 1 each of which is used at the carry-save mode. The carry-save adder has a structure where similar components are arranged periodically and FIG. 18 shows a part of a repetition structure. For the simplification, the input blocks and the interconnecting wires are omitted from the figure and only a connection state between the logic blocks necessary to the carry-save adder is illustrated in FIG. 18. In FIG. 18, reference symbols of Xi and Yi represent an i-th bit of an addend. As shown in FIG. 18, the carry-save adder comprises the logic blocks 2 which are arranged in a matrix fashion. The logic block 2 with an i-th row and a j-th column is herein called an (i, j) logic block. The (i, j) logic block has the sum output terminal S and the core logic carry output terminal C which are connected to the second argument input terminal B1 in the second argument input group of an (i, j+1) logic block and the fourth argument input terminal B3 in the second argument input group of an (i+1, j+1) logic block. Under the circumstances, the ripple carry propagation path 7 is not used, the carry signal propagates using the core logic carry output terminal C in a different direction from the ripple carry.

Logic building units of the conventional FPGAs have only one output in the manner, for example, as a typical four-input one-output lookup table. As a result, two logic building units of FPGA are required to implement a component of the carry-cave adder.

In contrast with this, according to this invention, it is possible to efficiently construct the carry-save adder with a small area in comparison with the conventional FPGAs. This is because necessary two outputs are obtained by only one logic block 2. Inasmuch as the carry-save adder constitutes a high-speed multi-input adder, the carry-save adder according to this invention is particularly useful for a high-speed multiplier.

As described above, the logic block 2 according to this present can efficiently constitute various arithmetic operation circuits. This is because the logic block 2 has two carry output terminals, namely, the ripple carry output terminal RCO and the core logic carry output terminal C. In addition, as described above, the core logic carry output terminal C is effectively used in the logic mode for implementing various logic functions, as well as the arithmetic operation.

FIG. 19 shows a comparison result of delays in the logic block 2 illustrated in FIG. 3 and in the prior art logic block 21 illustrated in FIG. 1. This compares delays in a critical path from the argument input terminals A0, A1, A2, A3, B0, B1, B2, and B3 to the output terminals S and C in the logic block 2 with delays in a critical path from the argument input terminals A0, A1, A2, A3, B0, B1, B2, and B3 to the output terminals S and CO in the prior art logic block 2'. The delay for the output terminal S in the prior art logic block 2' has a reference value of 0. A value of −1 represents a case of being faster than the reference value by a part corresponding to one stage of the exclusive OR circuit.

It will be assumed that a critical path delay is defined by a later one in the delays for the output terminals S and C (CO) of the logic block as a whole. The logic block 2 according to this invention has the critical path delay at the logic mode that is equal to that in the prior art logic block 2' but the logic block 2 according to this invention has the critical path delay at the arithmetic mode that is faster than that in the prior art logic block 2' by the part corresponding to one stage of the exclusive OR circuit. This is because the prior art logic block 2' illustrated in FIG. 1 has a part where three exclusive OR circuits are connected in series to each other as apparent from the structure of the one-bit full adder 16 illustrated in FIG. 2 while the logic block 2 illustrated in FIG. 3 has a part where two exclusive OR circuits are connected in series to each other as apparent from the core logic circuits 4 through 4C illustrated in FIGS. 5 through 8.

In addition, in order to estimate the delays in FIG. 19, it will be presumed as follows. A combination of the NOR circuit 13 and the NAND-OR circuit 14 on the critical path for the output terminal C in FIG. 5 has a total of delays which is substantially equal to the delay in the exclusive OR circuit. In addition, a combination of the NOR circuit 13 and the two-input one-output inverting multiplexer 35.0 on the critical path for the output terminal C in FIG. 6 has a total of delays which is substantially equal to the delay in the exclusive OR circuit. Furthermore, the 2-1MUX 10.3 has a delay which is substantially equal to the delay in the exclusive OR circuit.

In order to implement various functions in the logic block 2 according to this invention illustrated in FIG. 3, it is necessary not only to set the first through the third configuration memory circuits 6.0, 6.1, and 6.2 but also to set the argument input terminals A0, A1, A2, A3, B0, Bi, B2, and B3. Actually, the input setting must be carried out in the manner which is illustrated in FIGS. 12 and 13 to make the 2-1MUX 10 and the pre-logic circuits 17, 17-1, and 17-2 as an input section operable as various logic circuits in FIGS. 11 and 15 showing the equivalent circuits for the respective modes.

Now, the description will proceed to the input selection unit for carrying out the input setting. In FIG. 3, the first through the fourth input selection units 3.A0, 3.A1, 3.A2, and 3.A3 select, as first through fourth input selected signals, respective four ones from signals on the interconnecting wires 8, fixed logic values of "0" and "1" to supply the first through the fourth input selected signals to the first through the fourth argument input terminals A0, A1, A2, and A3 of the first argument input group in the core logic circuit 4. In addition, the fifth through the eighth input selection units 3.B0, 3.B1, 3.B2, and 3.B3 select, as fifth through eighth input selected signals, respective four ones from the signals on the interconnecting wires 8, the fixed logic values of "0" and "1" to supply the fifth through the eighth input selected signals to the first through the fourth argument input terminals B0, B1, B2, and B3 of the second argument input group in the core logic circuit 4.

Figure 20:
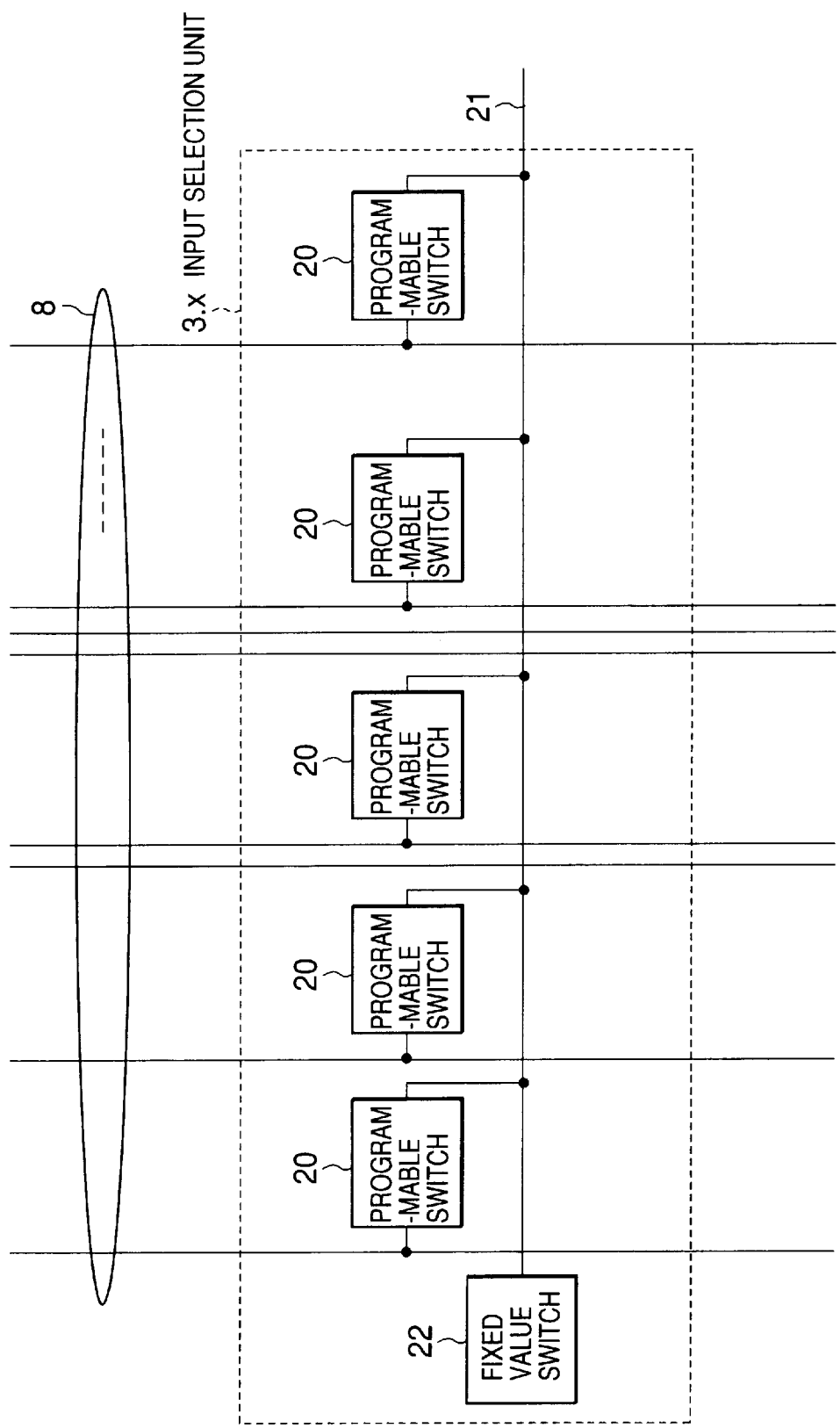
FIG. 20 is a block diagram of a first example of an input selection unit for use in the programmable function block illustrated in FIG. 3.

FIG. 20 illustrates a first example of the input selection unit 3.x, where x represents an arbitrary symbol. The input L, selection unit 3.x has one output line 21. The output line 21 is connected to one or more lines in the interconnecting wires 8 via programmable switches 20 and is connected to an output terminal of a fixed value switch 22. Each programmable switch 20 is a circuit which is enable to set either a connected state or a disconnected state between two terminals. The fixed value switch 22 has the output terminal for outputting an output signal and a circuit which is enable to set, as the output signal, one of the fixed value of "1", the fixed value of "0", and a high impedance by a program.

Figure 21:
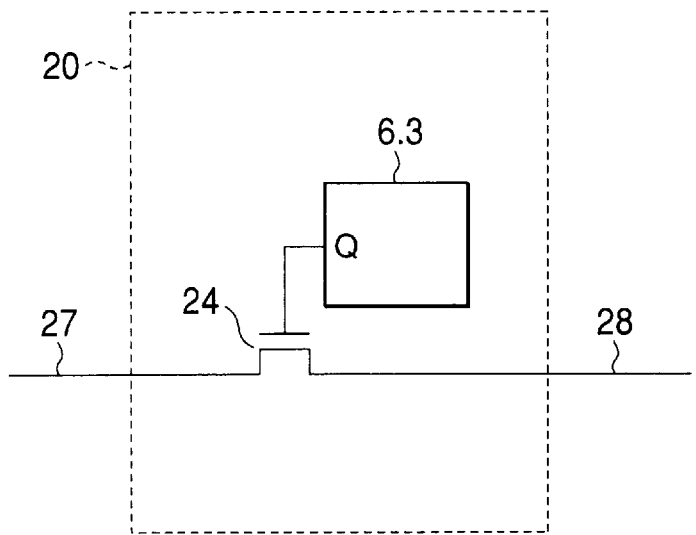
FIG. 21 is a block diagram of a first example of a programmable switch for use in the input selection unit illustrated in FIG. 20.

FIG. 21 illustrates a first example of the programmable switch 20. The illustrated programmable switch 20 comprises a one-bit configuration memory circuit 6.3 enable to set its contents by a program and an N-channel metal oxide semiconductor (NMOS) transistor 24 having a gate electrode connected to an output terminal Q of the one-bit configuration memory circuit 6.3. In accordance with the logic value of "1" or "0" in the output terminal Q of the one-bit configuration memory 6.3, between both terminals 27 and 28 of the programmable switch 20 is put into either the connected state or the disconnected state.

Figure 22:
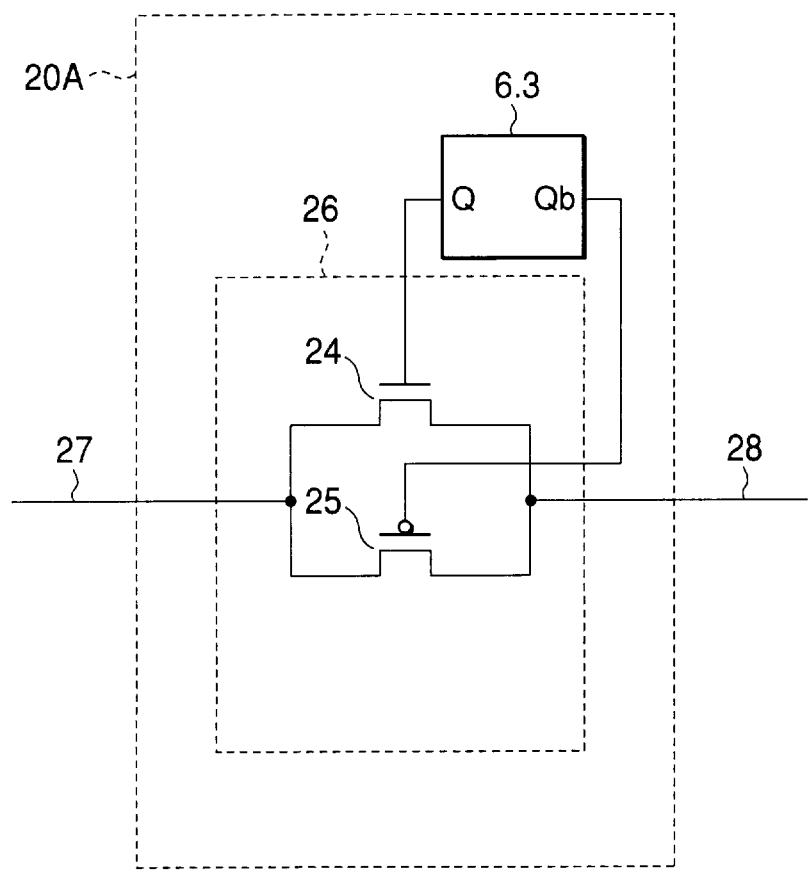
FIG. 22 is a block diagram of a second example of a programmable switch for use in the input selection unit illustrated in FIG. 20.

FIG. 22 illustrates a second example of a programmable switch 20A. The illustrated programmable switch 20A comprises the one-bit configuration memory circuit 6.3 enable to set its contents by the program and a transmission gate 26. The transmission gate 26 comprises the NMOS transistor 24 and a P-channel metal oxide semiconductor (PMOS) transistor 25. The one-bit configuration memory circuit 6.3 has the output terminal connected to the gate electrode of the NMOS transistor 24 and an inverting output terminal Qb connected to a gate electrode of the PMOS transistor 25. In accordance with the logic value of "1" or "0" in the output terminal Q of the one-bit configuration memory 6.3, between the both terminals 27 and 28 of the programmable switch 20A is put into either the connected state or the disconnected state.

Figure 23:
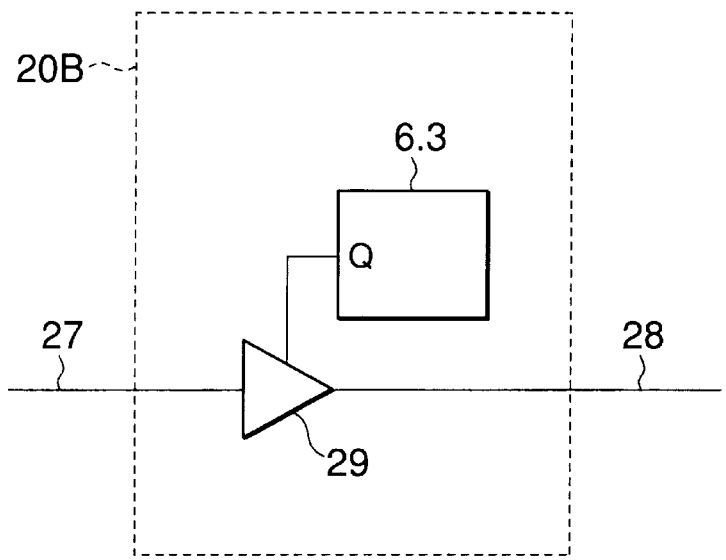
FIG. 23 is a block diagram of a third example of a programmable switch for use in the input selection unit illustrated in FIG. 20.

FIG. 23 illustrates a third example of a programmable switch 20B. The illustrated programmable switch 20A comprises the one-bit configuration memory circuit 6.3 enable to set its contents by the program and a tri-state buffer 29 having a control terminal connected to the output terminal Q of the one-bit configuration memory circuit 6.3. The tri-state buffer 29 has an input terminal 27 connected to one of the interconnecting wires 8 and an output terminal 28 connected to the output line 21 (FIG. 20) of the input selection unit. In accordance with the logic value of "1" or "0" in the output terminal Q of the one-bit configuration memory 6.3, a signal is transmitted from the input terminal 27 to the output terminal 28 or between the both terminals 27 and 28 is put into the disconnected state.

Besides the above-mentioned examples, the programmable switch may be a fuse or an anti-fuse.

Figure 24:
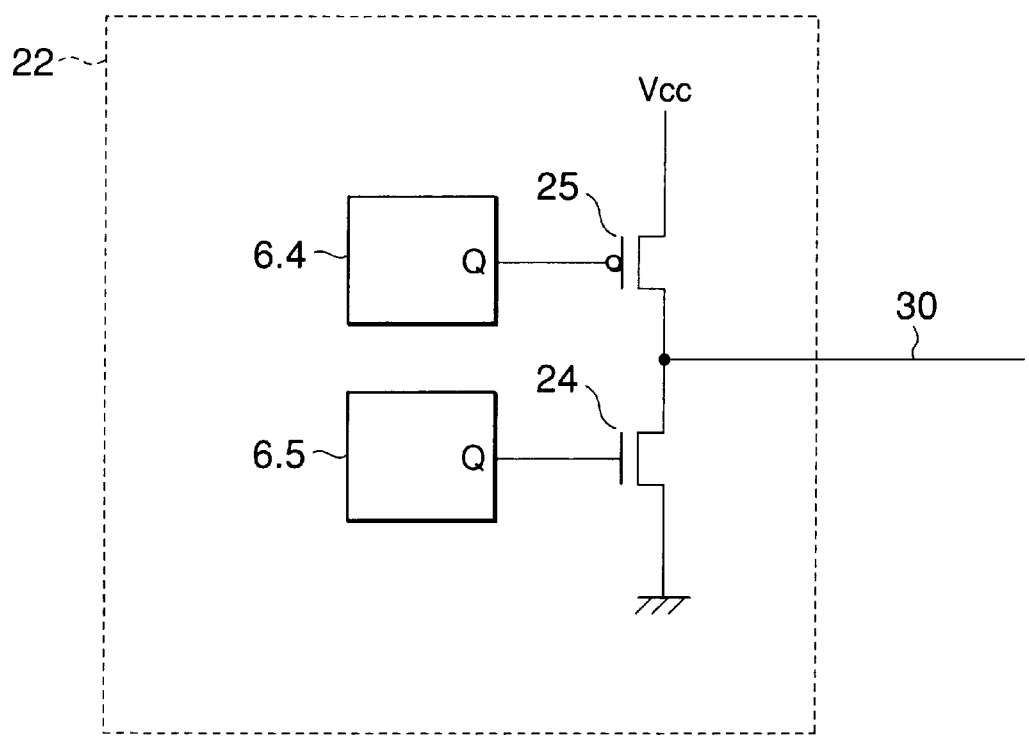
FIG. 24 is a block diagram of a first example of a fixed value switch for use in the input selection unit illustrated in FIG. 20.

FIG. 24 illustrates a first example of the fixed value switch 22. The illustrated fixed value switch 22 comprises first and second one-bit configuration memory circuits 6.4 and 6.5, an NMOS transistor 24, and a PMOS transistor 25.

The NMOS transistor 24 has a source electrode connected to a grounding terminal while the PMOS transistor 25 has a source =electrode connected a power source terminal supplied with a power source voltage Vcc. The NMOS transistor 24 has a drain electrode connected to a drain electrode of the PMOS transistor 25 and the drain electrodes of the NMOS transistor 24 and the PMOS transistor 25 are connected to an output terminal 30 of the fixed value switch 22. The first one-bit configuration memory circuit 6.4 has an output terminal Q connected to a gate electrode of the PMOS transistor 25 while the second one-bit configuration memory circuit 6.5 has an output terminal Q connected to a gate electrode of the NMOS transistor 24.

When the output terminal Q of the first one-bit configuration memory circuit 6.4 takes the logic value of "1" and when the output terminal Q of the second one-bit configuration memory circuit 6.5 takes the logic value of "0", the output terminal 30 of the fixed value switch 22 is put into a high impedance state. In addition, when the output terminal Q of the first one-bit configuration memory circuit 6.4 takes the logic value of "0" and when the output terminal Q of the second one-bit configuration memory circuit 6.5 takes the logic value of "0", the output terminal 30 of the fixed value switch 22 takes the logic value of "1". Furthermore, when the output terminal Q of the first one-bit configuration memory circuit 6.4 takes the logic value of "1" and when the output terminal Q of the second one-bit configuration memory circuit 6.5 takes the logic value of "1", the output terminal 30 of the fixed value switch 22 takes the logic value of "0". Inasmuch as a pull-up resistor or a pull-down resistor is not used in the fixed value switch 22, the fixed value switch 22 has little consumed current and is operable at a high operating speed.

Figure 25:
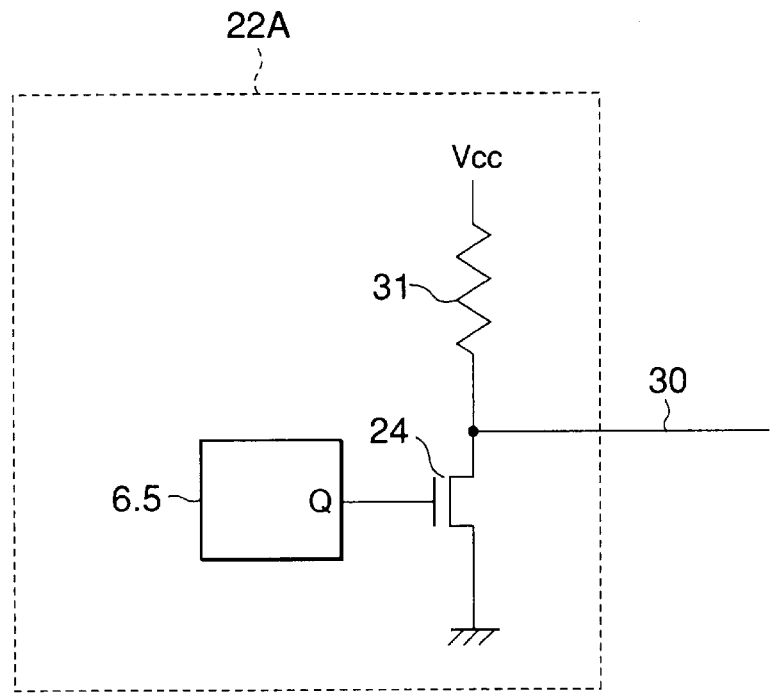
FIG. 25 is a block diagram of a second example of a fixed value switch for use in the input selection unit illustrated in FIG. 20.

FIG. 25 illustrates a second example of a fixed value switch 22A. The fixed value switch 22A comprises the one-bit configuration memory circuit 6.5, the NMOS transistor 24, and a pull-up resistor 31.

The NMOS transistor 24 has the source electrode connected to the grounding terminal and the drain electrode which is connected to an end of the pull-up resistor 31 and to the output terminal 30 of the fixed value switch 22A. The NMOS transistor 24 has the gate electrode connected to the output terminal Q of the one-bit configuration memory circuit 6.5.

When the output terminal Q of the one-bit configuration memory circuit 6.5 takes the logic value of "1", the output terminal 30 of the fixed value switch 22A takes the logic value of "0". When the output terminal Q of the one-bit configuration memory circuit 6.5 takes the logic value of "0", the output terminal 30 of the fixed value switch 22A takes the logic value of "1". Inasmuch as the fixed value switch 22A comprises the pull-up resistor 31, the fixed value switch 22A has demerits where the fixed value switch 22A is operable at a low operating speed in comparison with the fixed value switch 22 and has much consumed current in comparison with the fixed value switch 22. However, the fixed value switch 22A has a merit where it has a saved area in comparison with the fixed switch 22. This is because the fixed value switch 22A comprises one one-bit configuration memory circuit 6.5 and one transistor 24.

Figure 26:
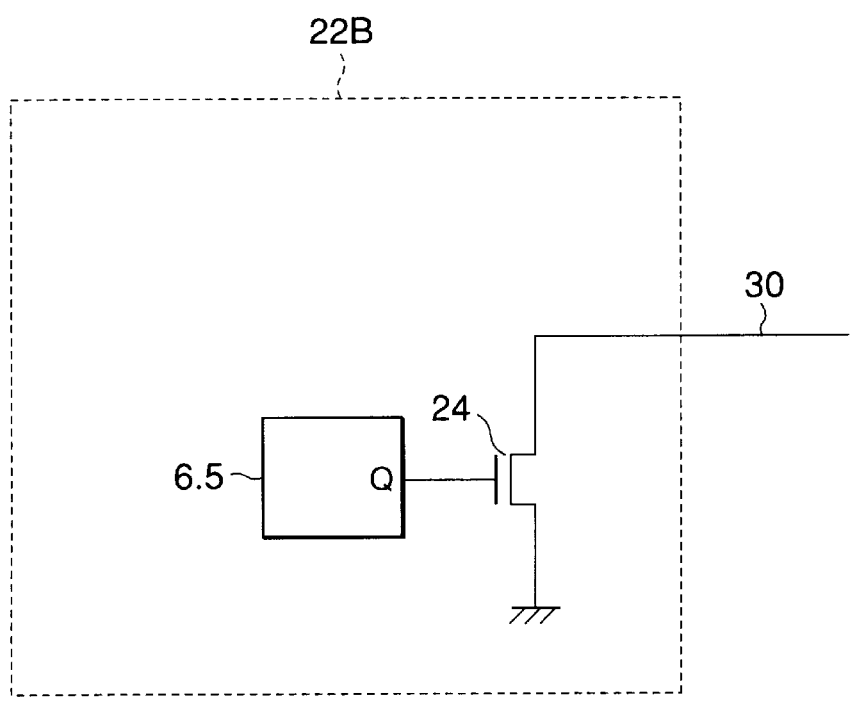
FIG. 26 is a block diagram of a third example of a fixed value switch for use in the input selection unit illustrated in FIG. 20.

FIG. 26 illustrates a third example of a fixed value switch 22B. The fixed value switch 22B comprises the one-bit configuration memory circuit 6.5 and the NMOS transistor 24. The NMOS transistor 24 has the source electrode connected to the grounding terminal, the gate electrode connected to the output terminal Q of the one-bit configuration memory circuit 6.5, and the drain electrode connected to the output terminal 30 of the fixed value switch 22B.

When the output terminal Q of the one-bit configuration memory circuit 6.5 takes the logic value of "1", the output terminal 30 of the fixed value switch 22B takes the logic value of "0". When the output terminal Q of the one-bit configuration memory circuit 6.5 takes the logic value of "0", the output terminal 30 of the fixed value switch 22B is put into the high impedance state.

Figure 27:
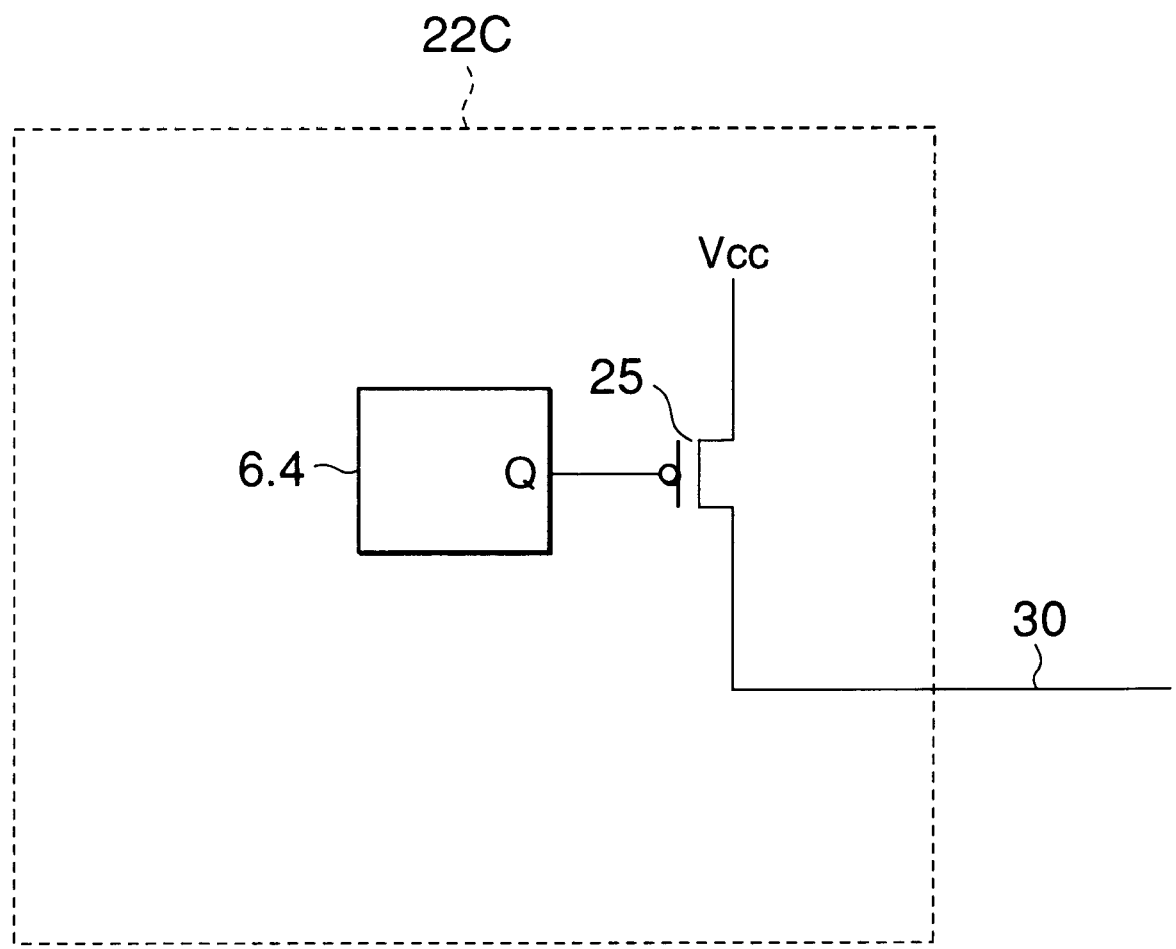
FIG. 27 is a block diagram of a fourth example of a fixed value switch for use in the input selection unit illustrated in FIG. 20.

FIG. 27 illustrates a fourth example of a fixed value switch 22C. The fixed value switch 22C comprises the one-bit configuration memory circuit 6.4 and the PMOS transistor 25. The PMOS transistor 25 has the source electrode connected to the power source terminal supplied with the power source voltage Vcc, the gate electrode connected to the output terminal Q of the onebit configuration memory circuit 6.4, and the drain electrode connected to the output terminal 30 of the fixed value switch 22C.

When the output terminal Q of the one-bit configuration memory circuit 6.4 takes the logic value of "0", the output terminal 30 of the fixed value switch 22C takes the logic value of "1". When the output terminal Q of the one-bit configuration memory circuit 6.4 takes the logic value of "1", the output terminal 30 of the fixed value switch 22C is put into the high impedance state.

Each of the fixed value switches 22B and 22C can produce only one of the logic values "0" and "1". If only a part of the functions of the equivalent circuits illustrated in FIGS. 11 and 15 is needed, it is possible to reduce an occupied area by using the fixed value switch 22B or 22C as the fixed value switches in a part of the input selection units.

Figure 28:
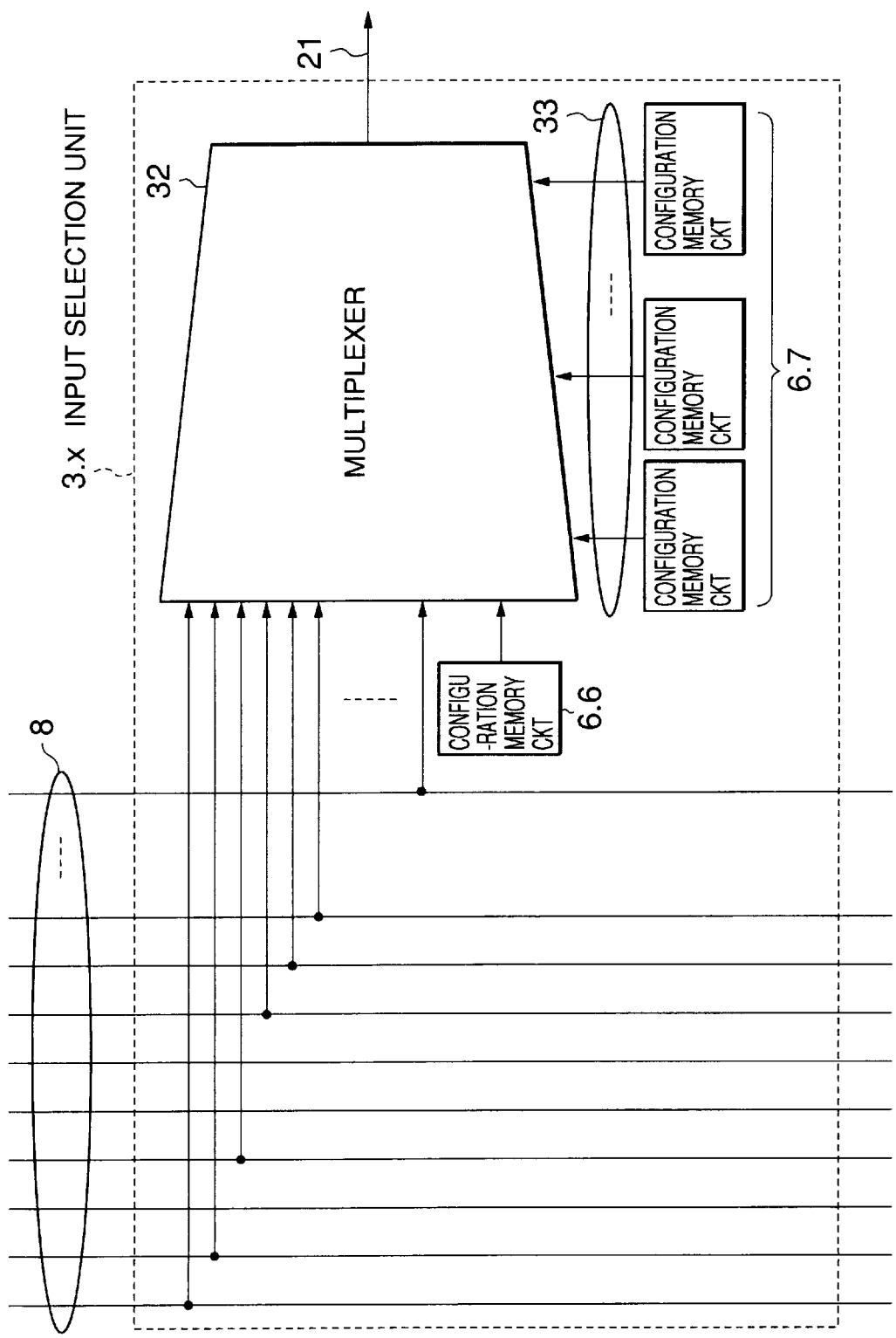
FIG. 28 is a block diagram of a second example of an input selection unit for use in the programmable function block illustrated in FIG. 3.

FIG. 28 illustrates a second example of the input selection unit 3. x. The illustrated input selection unit 3. x comprises an input one-bit configuration memory circuit 6.6, a plurality of control one-bit configuration memory circuits 6.7, and a multiplexer 32. One or more lines in the interconnecting wires 6 and an output terminal of the input one-bit configuration memory circuit 6.6 are connected to respective input terminals of the multiplexer 32. The multiplexer 32 has a plurality of control input terminals 33 each of which is connected to a corresponding output terminal of each of the control one-bit configuration memory circuit 6.7.

Figure 29:
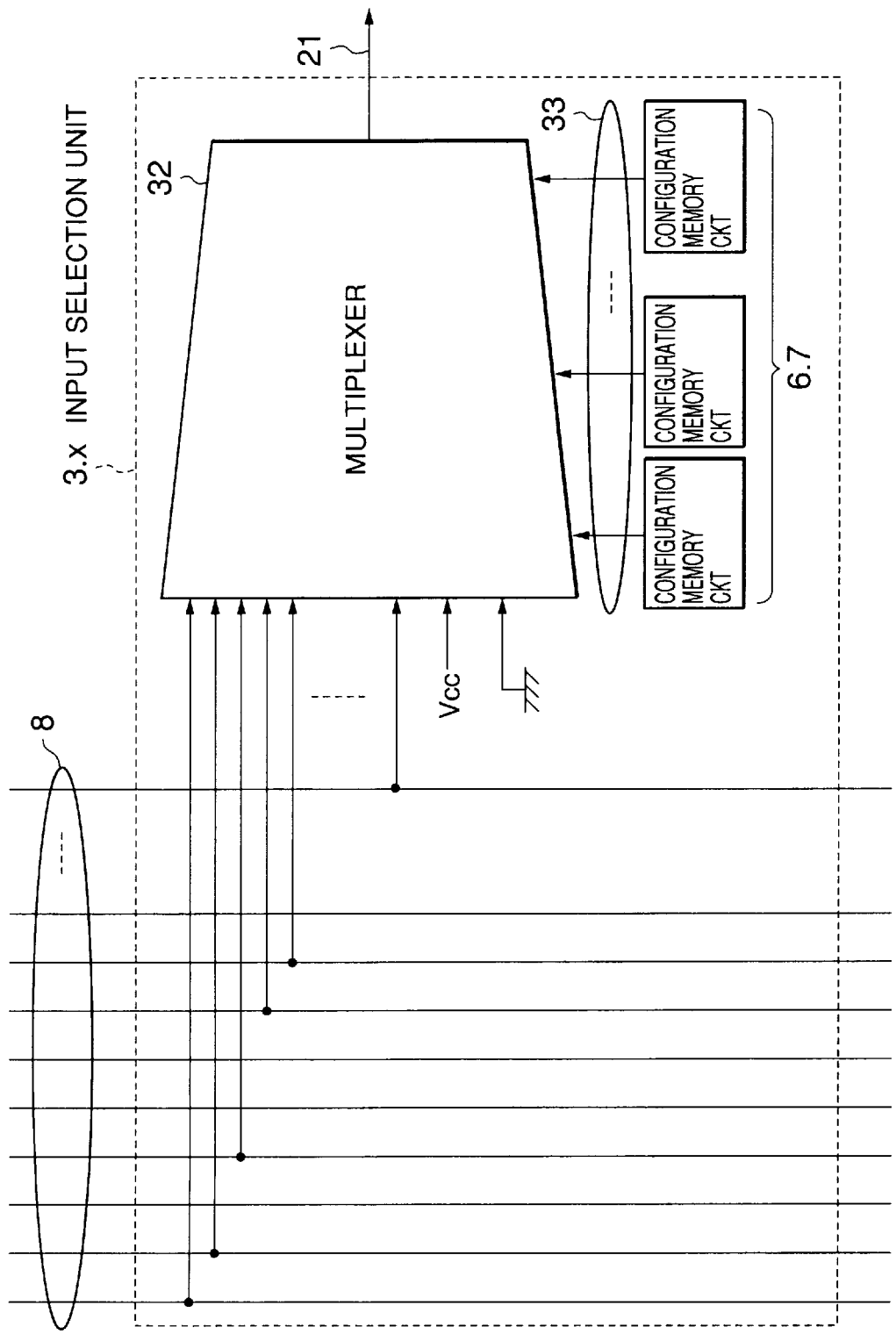
FIG. 29 is a block diagram of a third example of an input selection unit for use in the programmable function block illustrated in FIG. 3.

In accordance with contents stored in the control one-bit configuration memory circuits 6.7 set by a program, one of signals supplied to the input terminals of the multiplexer 32 is transferred to the output terminal 21 of the input selection unit 3.x. The input one-bit configuration memory circuit 6.6 is for supplying the input terminal of the multiplexer 32 with one of the fixed logic values of "0" and "1" and contents in the input one-bit configuration memory circuit 6.6 is preliminarily set by a program. FIG. 29 illustrates a third example of the input selection unit 3.x. The illustrated input selection unit 3.x comprises the plurality of control one-bit configuration memory circuits 6.7, and the multiplexer 32. One or more lines in the interconnecting wires 6, the power source line supplied with the power source voltage Vcc, and the grounding terminal are connected to respective input terminals of the multiplexer 32. The multiplexer 32 has the plurality of control input terminals 33 each of which is connected to the corresponding output terminal of each of the control one-bit configuration memory circuit 6.7.

In accordance with contents stored in the control one-bit configuration memory circuits 6.7 set by a program, one of signals supplied to the input terminals of the multiplexer 32 is transferred to the output terminal 21 of the input selection unit 3.x.

In addition, in FIG. 3, which lines in the interconnecting wires 8 are connected the input selection units may be different from each input selection units.

Figure 30:
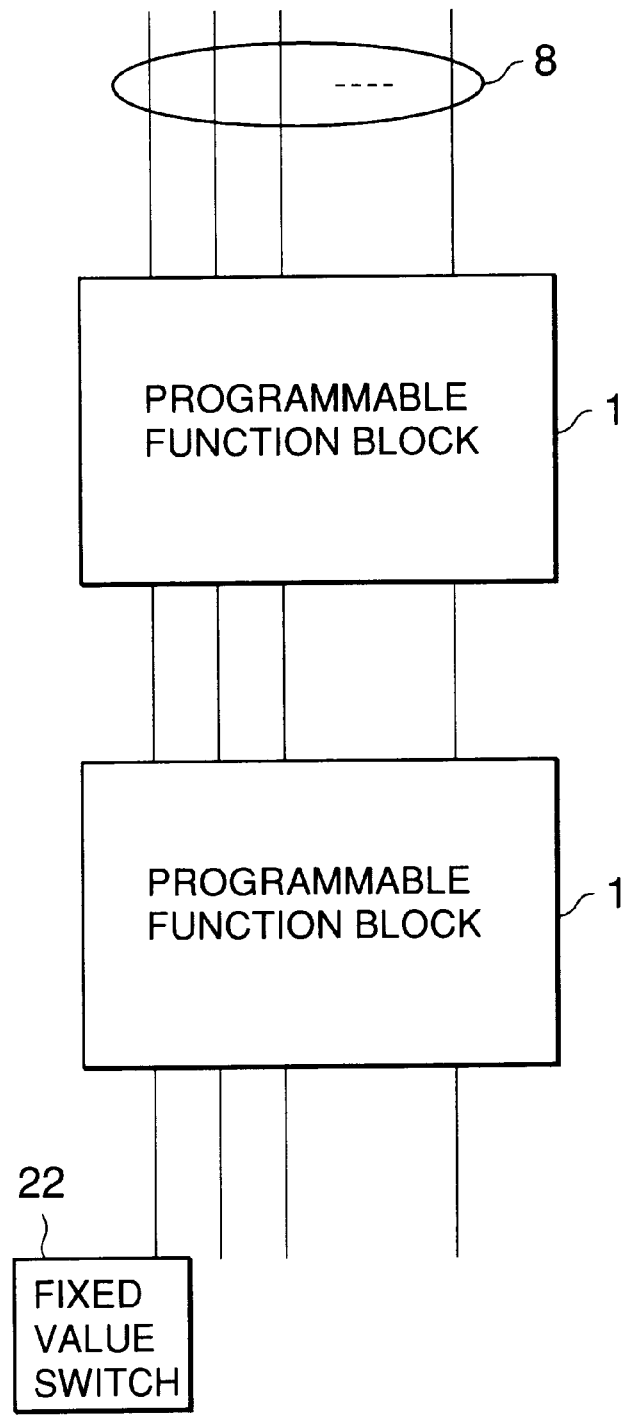
FIG. 30 is a block diagram showing an example where a fixed value switch is shared in a plurality of programmable function blocks illustrated in FIG. 3.

FIG. 30 illustrates another example of a fixed logic value supplying arrangement. The illustrated logic value supplying arrangement comprises the fixed value switch 22 which is connected to at least one of the interconnecting wires 8 without providing each input selection unit with the fixed logic value supplying arrangement. Specifically, each programmable function block 1 comprises the input selection units each of which does not comprise the fixed value switch 22 in FIG. 20 or the input one-bit configuration memory circuit 6.6 in FIG. 28.

Connected to the fixed value switch 22, the least one of the interconnecting wires 8 is connected to the plurality of input selection units. In this example, it is possible to drastically decrease the number of the fixed logic value supplying arrangements in comparison with a case where each of the input selection units is provided with the fixed value supplying unit and it results in reducing the occupied area. In addition, it is possible to use the at least one of the interconnecting wires 8 connected to the fixed value switch 22 at a normal interconnecting wire enable to pass through another signal by putting the fixed value switch 22 into the high impedance state.

Now, the description will proceed to a typical example of a programmable logic device comprising the programmable function block according to this invention.

Figure 31:
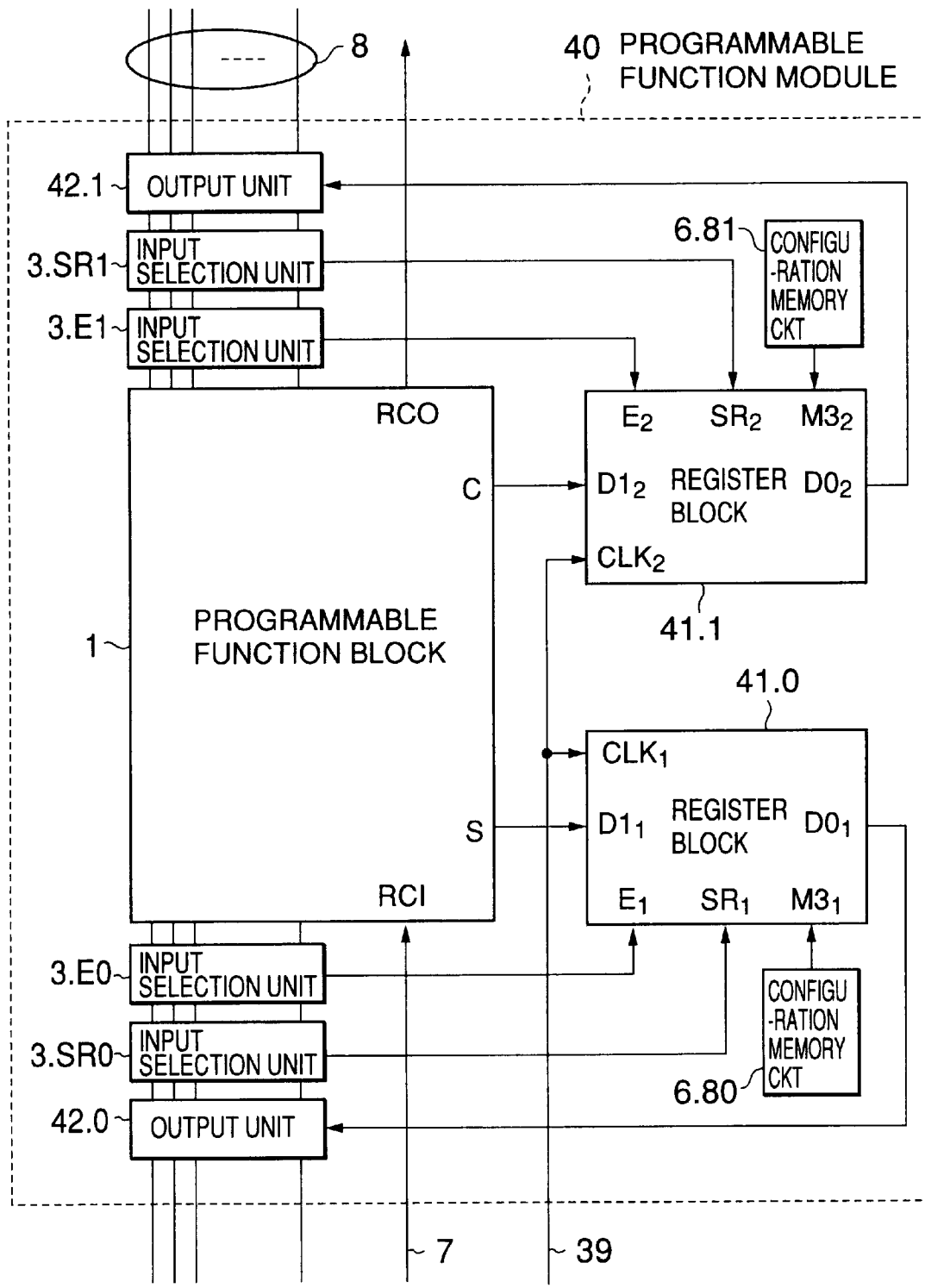
FIG. 31 is a block diagram of a programmable function module using the programmable function block illustrated in FIG. 3.

FIG. 31 illustrates the typical example of a programmable function module 40 which comprises the programmable function block 1, register blocks, and output sections for the interconnecting wires 8.

Specifically, the illustrated programmable function module 40 comprises the programmable function block 1, first and second register blocks 41.0 and 41.2, fourth and fifth configuration memory circuits 6.80 and 6.81, first and second clock enable input selection units 3.E0 and 3.E1, first and second set/reset input selection unit 3.SR0 and 3.SR1, and first and second output unit 42.0 and 42.1.

The first register block 41.0 has a first date input terminal D11 connected to the sum output terminal S of the programmable function block 1 while the second register block 41.1 has a second date input terminal D12 connected to the core logic carry output terminal C of the programmable function block 1. The first register block 41.0 has a first data output terminal DO1 connected to the first output unit 42.0 through which a first data output signal is transmitted to the interconnecting wires 8 while the second register block 41.1 has a second data output terminal D02 connected to the second output unit 42.1 through with a second data output signal is transmitted to the interconnecting wires 8. The first register block 41.0 has a first clock input terminal CLK1 supplied with a clock signal through a clock signal line 39 while the second register block 41.1 has a second clock input terminal CLK2 supplied with the clock signal through the clock signal line 39.

In addition, the first register block 41.0 has a first clock enable input terminal E1 supplied with a first clock enable signal from the first clock enable input selection unit 3.E0 while the second register block 41.1 has a second clock enable input terminal E2 supplied with a second clock enable signal from the second clock enable input selection unit 3.E1. The first register block 41.0 has a first set/reset input terminal SRI supplied with a first set/reset input signal from the first set/reset input selection unit 3.SR0 while the second register block 41.1 has a second set/reset input terminal SR2 supplied with a second set/reset input signal from the second set/reset selection unit 3.SR1. The first register block 41.0 has a fourth configuration input terminal M31 connected to an output terminal of the fourth configuration memory circuit 6.80 while the second register block 41.1 has a fifth configuration input terminal M32 connected to an output terminal of the fifth configuration memory circuit 6.81.

Connected to the interconnecting wires 8 and the first clock enable input terminal E1 of the first register block 41.0, the first clock enable input selection circuit 3.E0 supplies the first clock enable signal to the first clock enable input terminal E1. Connected to the interconnecting wires 8 and the second clock enable input terminal E2 of the second register block 41.1, the second clock enable input selection circuit 3.E1 supplies the second clock enable signal to the second clock enable input terminal E2. Connected to the interconnecting wires 8 and the first set/reset input terminal SR1 of the first register block 41.0, the first set/reset input selection circuit 3.SR0 supplies the first set/reset input signal to the first set/reset input terminal SR1. Connected to the interconnecting wires 8 and the second set/reset input terminal SR2 of the second register block 41.1, the second set/reset input selection circuit 3. SR1 supplies the second set/reset input signal to the second set/reset input terminal SR2. Connected to the first data output terminal DO1 of the first register block 41.0 and the interconnecting wires 8, the first output unit 42.0 supplies the first data output signal from the first data output terminal DO1 to the interconnecting wires 8. Connected to the second data output terminal DO2 of the second register block 41.1 and the interconnecting wires 8, the second output unit 42.1 supplies the second data output signal from the second data output terminal DO2 to the interconnecting wires 8.

Figure 32:
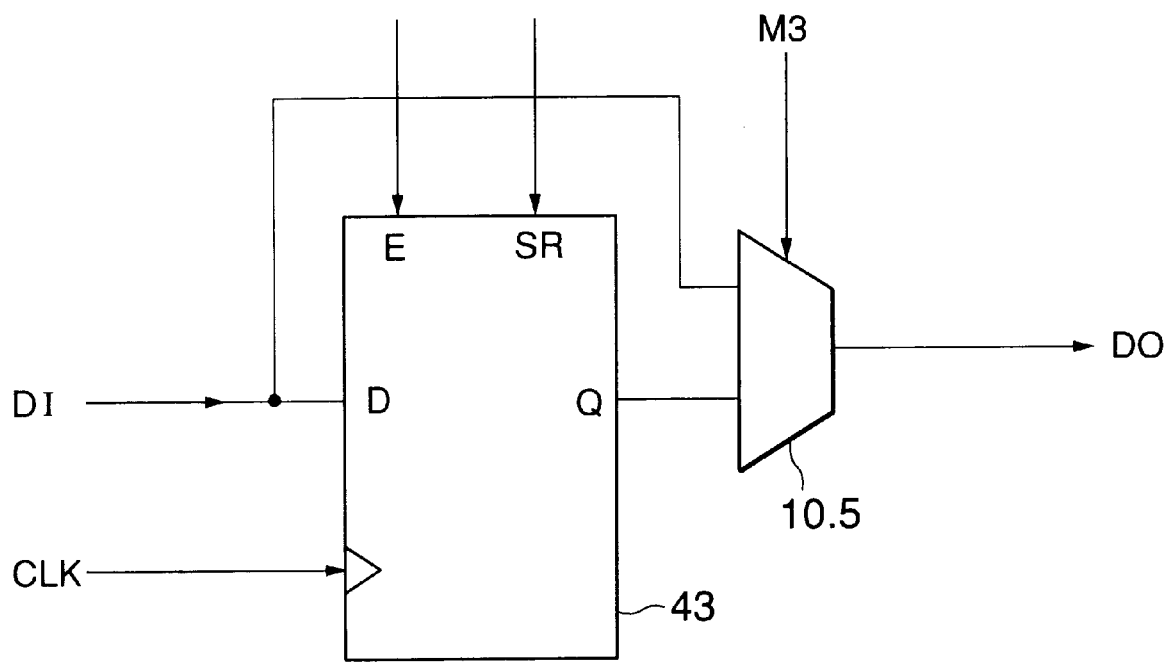
FIG. 32 is a block diagram of a register block for use in the programmable function module illustrated in FIG. 31.

FIG. 32 is a circuit diagram of the register block 41 (suffix omitted) for use in the programmable function module 40 illustrated in FIG. 31. The register block 41 comprises a D-type flip-flop (D-FF) 43 and a 2-2MUX 10.5. The data input terminal DI (suffix omitted) is connected to an input terminal D of the D-type flip-flop 43 and to an input terminal of the 2-1MUX 10.5. The 2-1MUX has another input terminal connected to an output terminal Q of the D-type flop-flop 43. The configuration input terminal M3 (suffix omitted) is connected to a control input terminal of the 2-1MWX 10.5. In accordance with a logic value supplied with the configuration input terminal M3, determination is made whether a data input signal on the data input terminal DI is transmitted to a data output terminal DO (suffix omitted) as a data output signal as it is or the data input signal on the data input terminal DI is transmitted via the D-type flip-flop 43 to the data output terminal DO as the data output signal. The D-type flip-flop 43 is driven by the clock signal supplied to the clock input terminal CLK (suffix omitted). In addition, the D-type flip-flop 43 has the clock enable input terminal E (suffix omitted) for controlling validity/invalidity of the clock signal and the set/reset input terminal SR (suffix omitted) for setting or resetting a held value in the D-type flip-flop 43.

Figure 33:
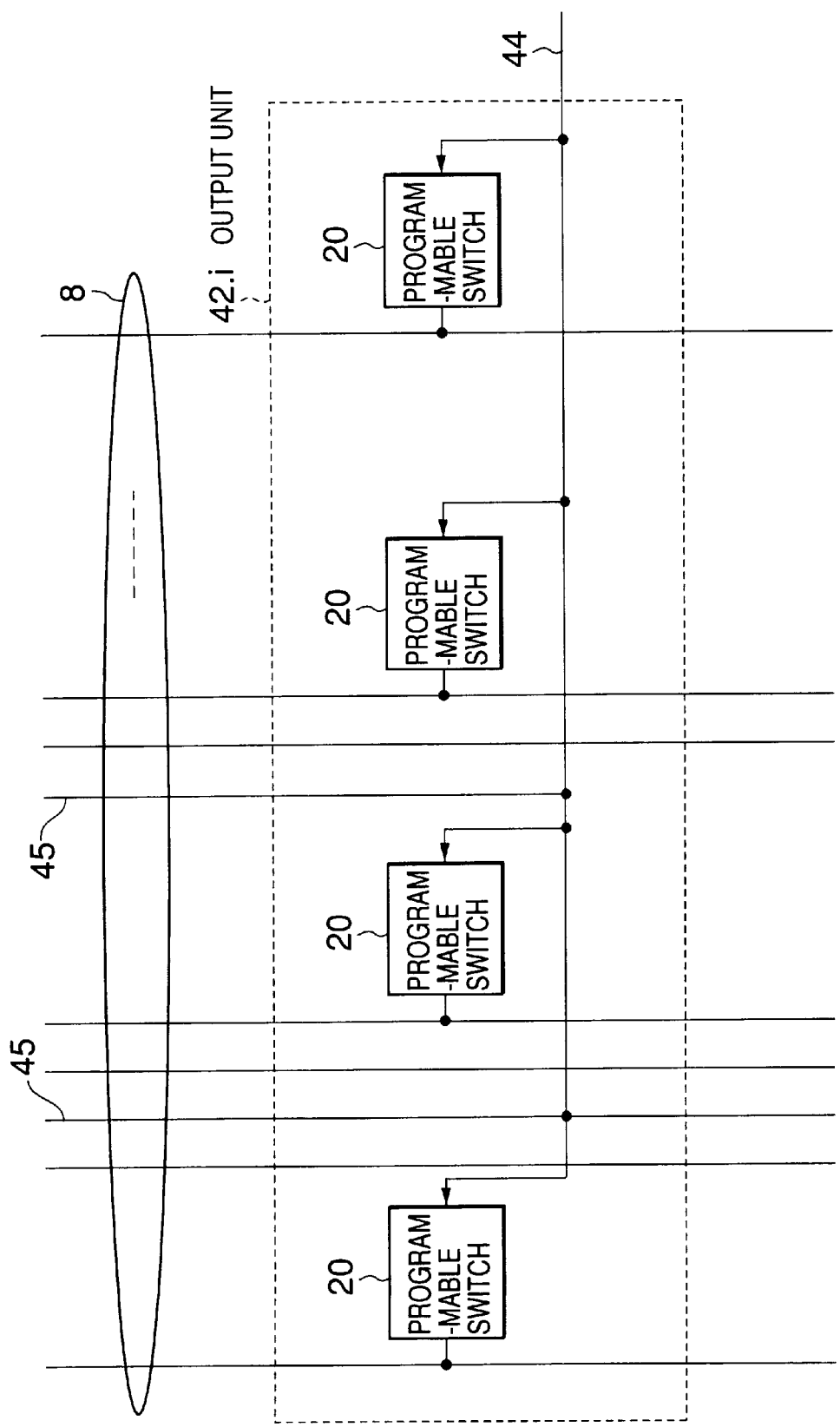
FIG. 33 is a block diagram of an output unit for use in the programmable function module illustrated in FIG. 31.

FIG. 33 illustrates a typical example of the output units 42.i (i=0, 1) for use in the programmable function module 40 illustrated in FIG. 31. Each output unit 42.i has an input line 44 which is connected to the interconnecting wires 8 via programmable switches 22. In addition, each output unit 42.i may comprise wires 45 which are directly connected to the input line 44 of the output unit 42. i without via the programmable switches. Such direct connection wires 45 are effective to form high speed signal transmission paths.

The programmable switch 22 is a circuit which is enable to set between two terminals in a connected state or a disconnected state by a program and may use those illustrated in FIGS. 21 through 23. In a case of using the programmable switch 20B illustrated in FIG. 23, the terminal 27 is connected to the input line 44 and the terminal 28 is connected to one of the interconnecting wires 8. In FIG. 33, which lines in the interconnecting wires 8 are connected to the input line 44 of the output unit via the programmable switch 20 or directly may be different from each output unit.

Figure 34:
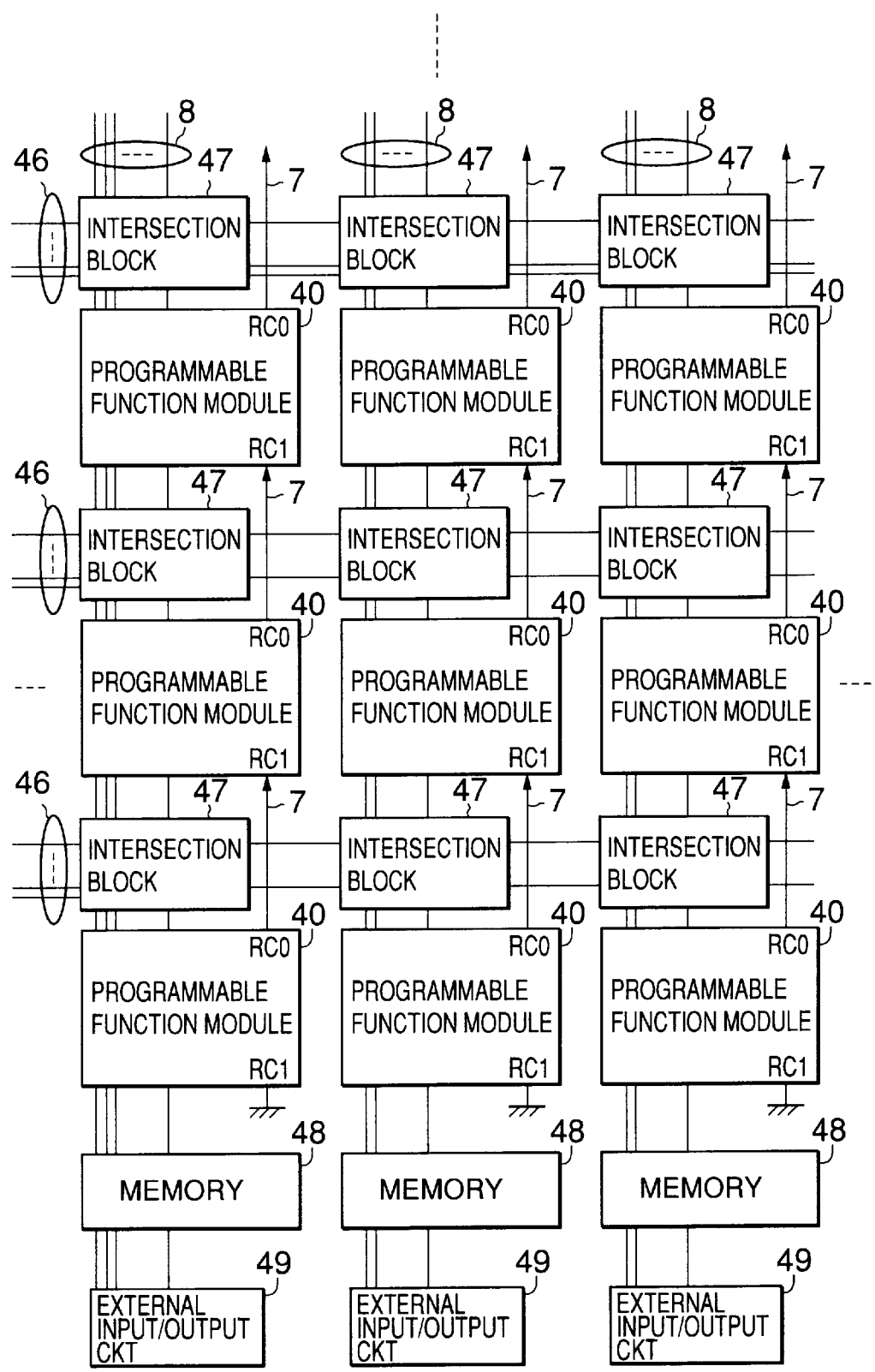
FIG. 34 is a block diagram of a programmable logic device comprising a lot of programmable function modules illustrated in FIG. 31.

FIG. 34 illustrates a typical example of the programmable logic device where the above-mentioned programmable function modules 40 are arranged in a two-dimensional array fashion.

Through the interconnecting wires 8 extending longitudinally, a column of a plurality of programmable function modules 40 arranged in a longitudinal direction are connected to each other. In addition, through other interconnecting wires 46 extending laterally, the interconnecting wires 8 in each column are connected to each other. Furthermore, other various circuits arranged on the same integrated circuit, such as memories 48, external input/output circuits 49 serving as interfaces for external circuit (not shown), or the like, are also connected to the interconnecting wires 8 and 46. Through an interconnecting wiring network comprising the interconnecting wires 8 and 64 extending longitudinally and laterally, transmission of signals is carried out between outputs and inputs of various circuits such as the programmable function modules 40, the memories 48, and the external input/output circuits 49 which are arranged on the integrated circuit.

In FIG. 34, intersection blocks 47 are arranged on intersections between the interconnecting wires 8 extending longitudinally and the interconnecting wires 46 and are for setting connection states therebetween.

Figure 35:
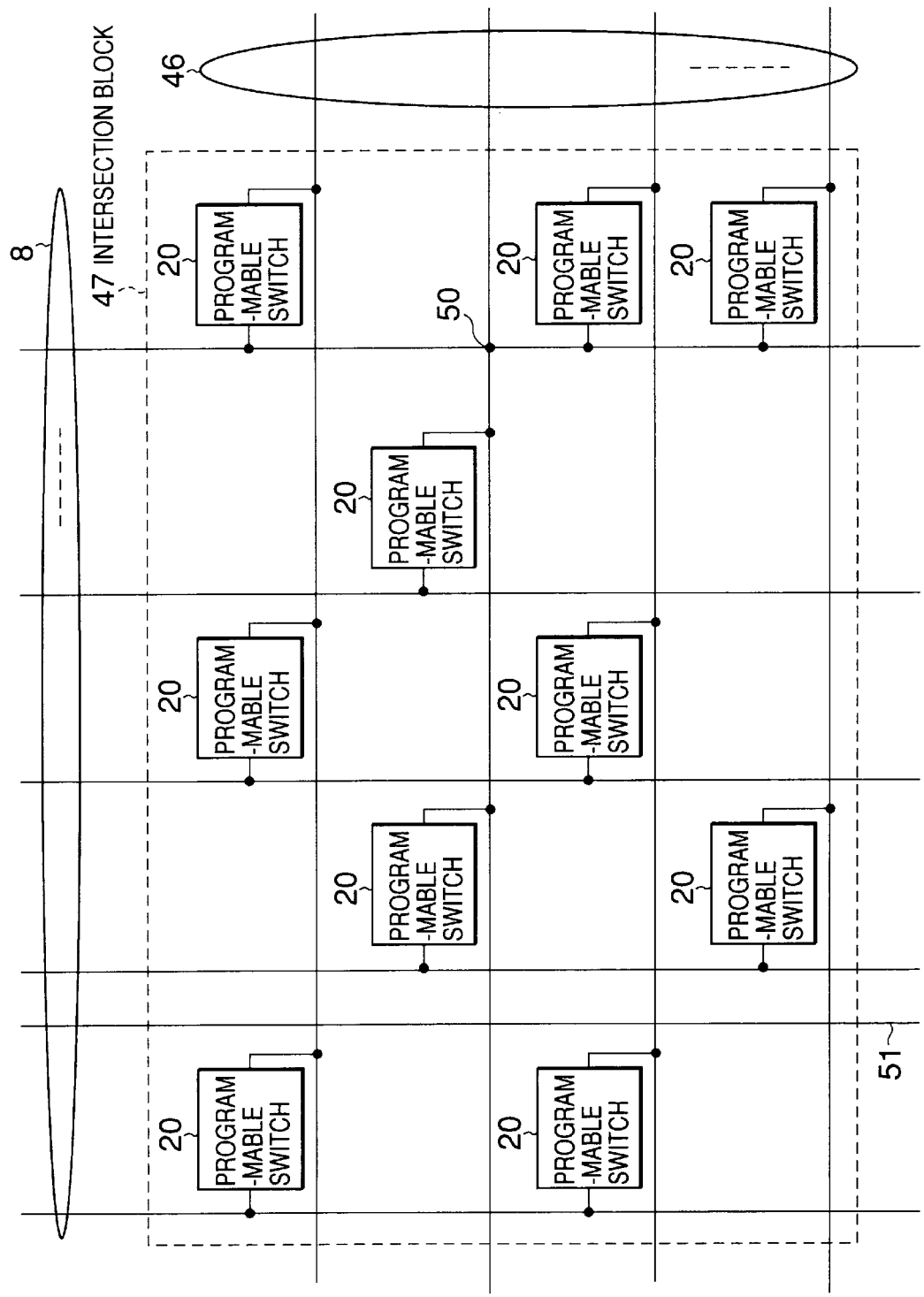
FIG. 35 is a block diagram of an intersection block for use in the programmable logic device illustrated in FIG. 34.

FIG. 35 illustrates a typical example of the intersection block 47 for use in the programmable logic device illustrated in FIG. 34. In the intersection block 47, programmable switches 20 are suitably arranged on intersections between respective lines of the interconnecting wires 8 and the interconnecting wires 46.

By setting the programmable switch 20 by a program, connection and disconnection is determined between the line extending longitudinally and the line extending laterally. The programmable switch 20 used in this example may use those illustrated in FIGS. 17 and 18. Although the programmable switches illustrated in FIGS. 17 and 18 have a small occupied area, those have no reproduction function for a signal or no buffer function.

Figure 36:
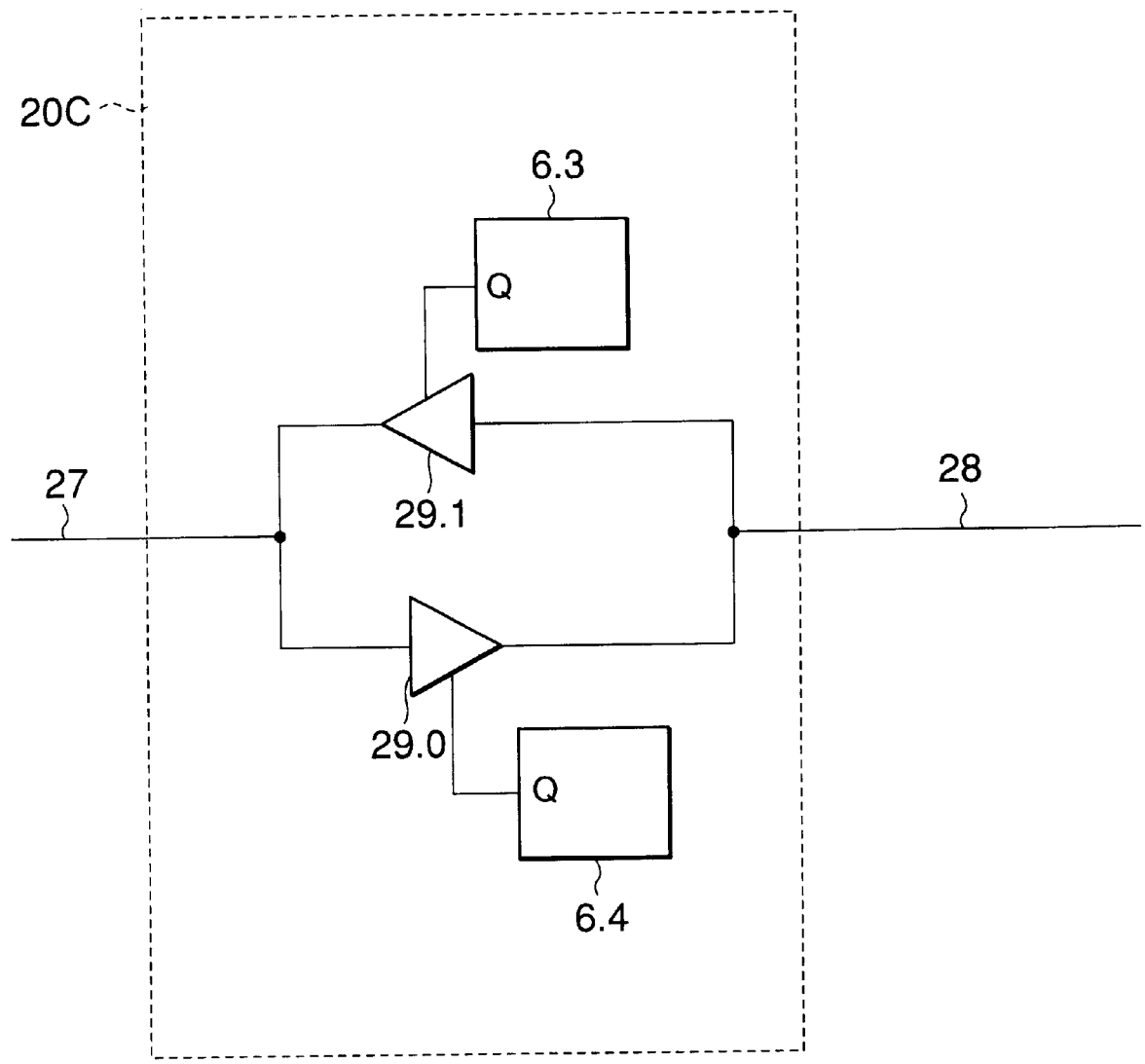
FIG. 36 is a block diagram of a programmable switch for use in the intersection block illustrated in FIG. 35.

When a buffer function is required, a programmable switch 20C with a buffer function illustrated in FIG. 36 is used. The programmable switch 20C with the buffer function comprises first and second tri-state buffers 29.0 and 29.1 and first and second configuration memory circuits 6.3 and 6.4.

The first tri-state buffer 29.0 has an output terminal which is connected to an input terminal of the second tri-state buffer 29.1 and which is connected to a first terminal 28 of the programmable switch 20C. In addition, the second tri-state buffer 29.1 has an output terminal which is connected to an input terminal of the first tri-state buffer 29.0 and which is connected to a second terminal 27 of the programmable switch 20C. The first tri-state buffer 29.0 has a control input terminal connected to an output terminal Q of the second configuration memory circuit 6.4 while the second tri-state buffer 29.1 has a control input terminal connected to an output terminal Q of the first configuration memory circuit 6.3.

When the output terminals Q of the first and second configuration memory circuits 6.3 and 6.4 take the logic values of "1" and "0", respectively, a signal is transferred from the first terminal 28 to the second terminal 27. When the output terminals Q of the first and second configuration memory circuits 6.3 and 6.4 take the logic values of "0" and "1", respectively, a signal is transferred from the second terminal 27 to the first terminal 28. When both of the output terminals Q of the first and second configuration memory circuits 6.3 and 6.4 take the logic value of "0", between the first and the second terminals 28 and 27 is put into a disconnected state.

Turning back to FIG. 35, in the intersection block 47 illustrated in FIG. 35, a part of the interconnecting wires 8 extending longitudinally and the interconnecting wires 46 extending laterally is directly connected to each other as depicted at 50. Such a direct connection 50 of the interconnecting wires without via the programmable switch is effective for a part requiring especially a high speed because the direction connection 50 has a little delay. In addition, the intersection block 47 may comprise a special interconnecting wire as depicted at 51 that passes through the intersection block 47 without stopping.

Turning back to FIG. 34, in the programmable logic device, the ripple carry output terminal RCO and the ripple carry input terminal RCI of adjacent programmable function modules 40 in each column are connected to each other via the ripple carry propagation path 7. The programmable logic device comprises a lot of programmable function modules 40 in each column and then the ripple carry propagation path 7 is a very long. In a case of using the programmable logic device as a ripple carry adder, although a column of the programmable function modules 40 as a whole is naturally used as a large adder, the column of the programmable function modules 40 may be used as a plurality of small adders in the manner which will presently be described.

Figure 37:
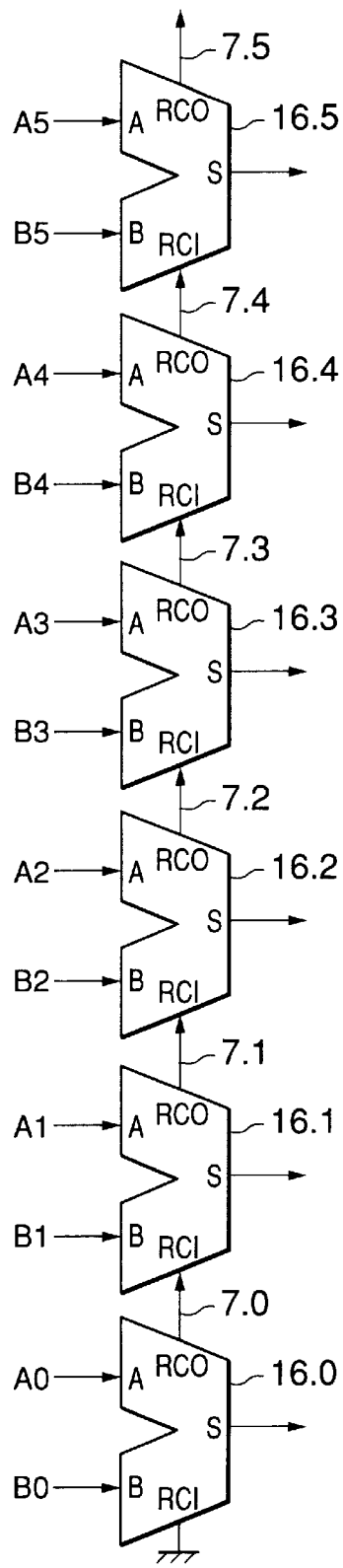
FIG. 37 is a block diagram of a multi-bit ripple carry adder.

Now, as illustrated in FIG. 37, attention will be directed to a multi-bit adder comprising a lot of one-bit full adders 16.i having the ripple carry input terminals RCI and the ripple carry output terminals RCO which are connected to ripple carry propagation paths 7.i, where i=0, 1, 2, . . . .

It will be assumed that a third one-bit full adder 16.3 has argument input terminals A3 and B3 in both of which the logic value of "0" is set. Under the circumstances, the third one-bit full adder 16.3 has the ripple carry output terminal RCO for always producing a ripple carry output signal of the logic value of "0" in spite of a ripple carry input signal supplied to the ripple carry input terminal RCI of the third one-bit full adder 16.3. As a result, ripple carry propagation is intercepted by the third one-bit full adder 16.3 and the column of the programmable function modules 40 is divided into a three-bit adder consisting of a zeroth one-bit full adder 16.0, a first one-bit bull adder 16.1 and a second one-bit full adder 16.2 and another multi-bit adder which comprises a fourth one-bit full adder 16.4, a fifth one-bit full adder 16.5, and so on. When the logic value of "1" is set in both of the argument input terminals A3 and B3 of the third one-bit full adder 16.3, the ripple carry output terminal RCO of the third one-bit full adder 16.3 always produces the ripple carry output signal of the logic value of "1". In the manner as described above, it is possible to use the large adder with the large adder divided into a plurality of small adders having various bit lengths without inserting an especial circuit in the ripple carry propagation path.

As described above, the programmable function block 1 according the first embodiment of this invention can perform high-speed arithmetic operations and a wide variety of logic functions. Each of the above-mentioned programmable logic devices where a lot of programmable function blocks are arranged on the integrated circuit with the programmable function blocks connected via the interconnecting wires is able to efficiently constitute very various circuits by setting the configuration memory circuits by a user. In addition, the above-mentioned programmable logic devices merely exemplify ones of many various examples devised, this invention is certainly not restricted to those.

Figure 38:
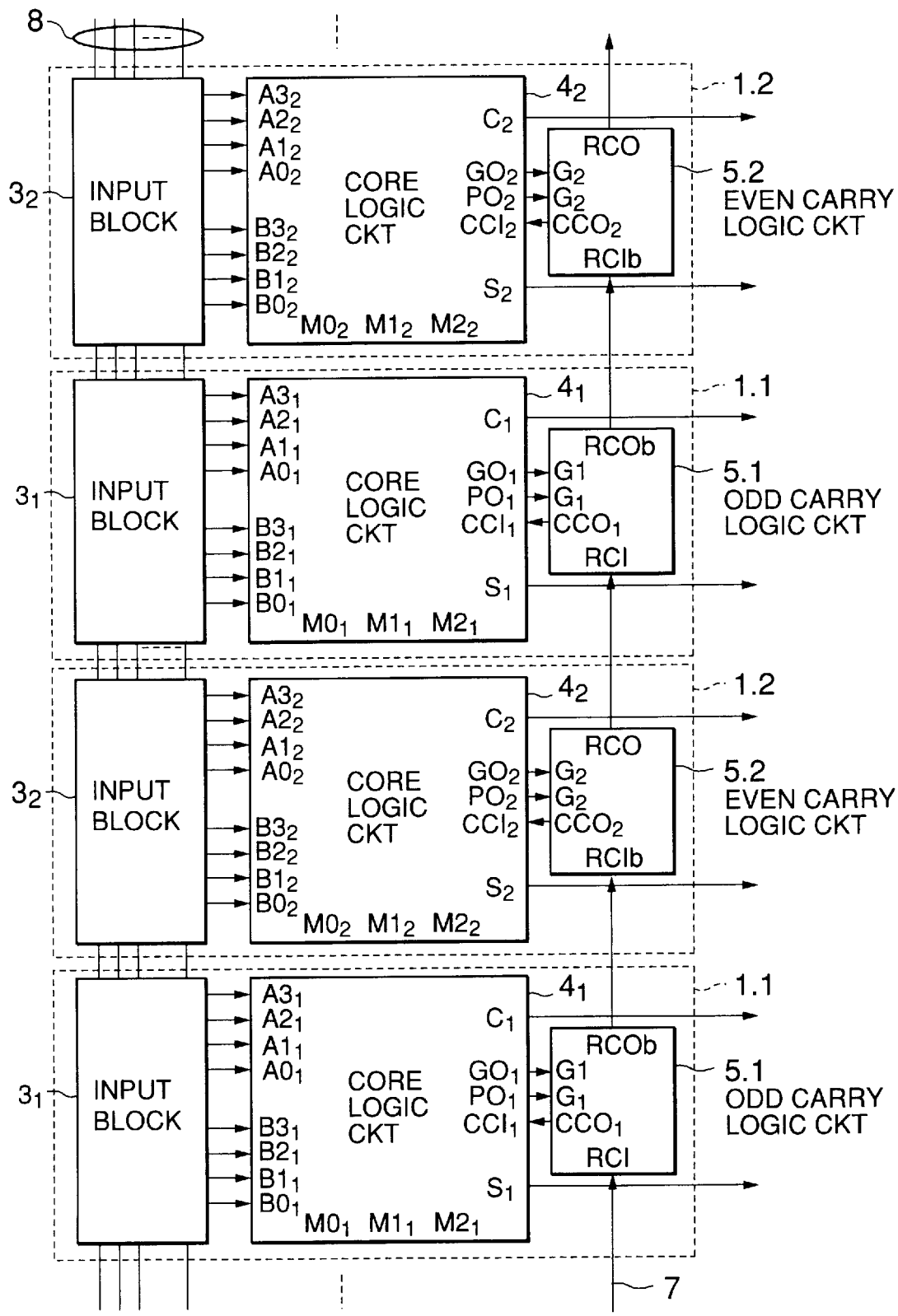
FIG. 38 is a block diagram of a programmable function device according a second embodiment of this invention.

Turning to FIG. 38, description will proceed to a programmable function device according to a second embodiment of this invention. The illustrated programmable function device comprises at least one programmable function block 1.1 of a first type and at least one programmable function block 1.2 a second type which are alternately arranged. The programmable function block 1.1 of the first type is called an odd programmable function block while the programmable function block 1.2 of the second type is called an even programmable function block.

The odd programmable function block 1.1 is similar in structure and operation to the programmable function block 1 illustrated in FIG. 3 except that the odd programmable function block 1.1 comprises an odd carry logic circuit 5.1 in lieu of the carry logic circuit 5. Likewise, the even programmable function block 1.2 is similar in structure and operation to the programmable function block 1 illustrated in FIG. 3 except that the even programmable function block 1.2 comprises an even carry logic circuit 5.2 in place of the carry logic circuit 5. In addition, the odd carry logic circuit 5.1 has a ripple carry input terminal RCI and a ripple carry inverted output terminal RCOb while the even carry logic circuit 5.2 has a ripple carry inverted input terminal RCIb and a ripple carry output terminal RCO. The ripple carry inverted output terminal RCOb of the odd carry logic circuit 5.1 is connected to the ripple carry inverted input terminal RCOb of an adjacent oven carry logic circuit 5.2. The ripple carry output terminal ROC of the even carry logic circuit 5.2 is connected to the ripple carry input terminal RCI of an adjacent odd carry logic circuit 5.1. In FIG. 38, for the purpose of simplification, configuration memory circuits accompanied with core logic circuits 41 and 42 are omitted from FIG. 38.

Specifically, the odd programmable function block 1.1 comprises a first core logic circuit 41, a first input block 31, first through third configuration memory circuits (not shown), and the odd carry logic circuit 5.1.

The first core logic circuit 41 has a first argument input group consisting of first through fourth argument input terminals A01, A11, A21, and A31, a second argument input group consisting of first though fourth argument input terminals B01, B11, B21, and B31, first through third configuration input terminals M01, M11, and M21, a first core logic carry output terminal Cl for outputting a first core logic carry output signal, a first core logic carry generation output terminal GO1 for outputting a first core logic carry generation output signal, a first core logic carry propagation output terminal PO1 for outputting a first core logic carry propagation output signal, a first ripple-core logic carry input terminal CCI1 for inputting a first ripple-core logic carry input signal, and a first sum output terminal Si for outputting a first summed output signal.

The first input block 31 is connected to the interconnecting wires 8 and the first and the second argument input groups of the first core logic circuit 41. The first input block circuit 31 comprises eight input selection units (not shown) for selecting eight input selected signals from signals on the interconnecting wires 8, a fixed logic value of "1", and a fixed logic value of "0" to supply the eight input selected signals to the first through the fourth argument input terminals A01, A11, A21, A31, B01, B11, B21, and B31 of the first and the second argument input groups in the first core logic circuit 41. The first through the third configuration memory circuits are connected to the first through the third configuration input terminals M01, M11, and M21 of the first core logic circuit 41, respectively. The first through the third configuration memory circuits store, as first through third stored signals, a logic value of one bit. The first through the third configuration memory circuits supplying the first through the third stored signals to the first through the third configuration input terminals M01, M11, and M21 of the first core logic circuit 41, respectively.

The odd carry logic circuit 5.1 has the ripple carry input terminal RCI for inputting a ripple carry input signal from the ripple carry propagation path 7, the ripple carry inverted output terminal RCOb for outputting a ripple carry inverted output signal to the ripple carry propagation path 7, a first ripple-core logic carry output terminal CCO1 for supplying the first ripple-core logic carry input terminal CCI1 with a first ripple-core logic carry output signal as the first ripple-core logic carry input signal, a first core logic carry generation input terminal GI for being supplied from the first core logic carry generation output terminal GO1 with the first core logic carry generation output signal as a first core logic carry generation input signal, and a first core logic carry propagation input terminal P1 for being supplied from the first core logic carry propagation output terminal PO1 with the first core logic carry propagation output signal as a first core logic carry propagation input signal.

Similarly, the even programmable function block 1.2 comprises a second core logic circuit 42, a second input block 32, fourth through sixth configuration memory circuits (not shown), and the even carry logic circuit 5.2.

The second core logic circuit 42 has a third argument input group consisting of first through fourth argument input terminals A02, A12, A22, and A32, a fourth argument input group consisting of first though fourth argument input terminals B02, B12, B22, and B32, fourth through sixth configuration input terminals M02, M12, and M22, a second core logic carry output terminal C2 for outputting a second core logic carry output signal, a second core logic carry generation output terminal G02 for outputting a second core logic carry generation output signal, a second core logic carry propagation output terminal PO2 for outputting a second core logic carry propagation output signal, a second ripple-core logic carry input terminal CCI2 for inputting a second ripple-core logic carry input signal, and a second sum output terminal S2 for outputting a second summed output signal.

The second input block 32 is connected to the interconnecting wires 8 and the third and the fourth argument input groups of said second core logic circuit 41. The second input block circuit comprising eight input selection units for selecting eight input selected signals from signals on the interconnecting wires 8, the fixed logic value of "1", and the fixed logic value of "0" to supply the eight input selected signals to the first through the fourth argument input terminals A02, A12, A22, A32, B02, B12, B22, and B32 of the third and the fourth argument input groups in the second core logic circuit 42.

The fourth through the sixth configuration memory circuits are connected to the fourth through the sixth configuration input terminals M02, M12, and M22 of the second core logic circuit 42, respectively. The fourth through the sixth configuration memory circuits store, as fourth through sixth stored signals, a logic value of one bit. The fourth through the sixth configuration memory circuits supply the fourth through the sixth stored signals to the fourth through the sixth configuration input terminals M02, M12, and M22 of the second core logic circuit 42, respectively.

The even carry logic circuit 5.2 has the ripple carry inverted input terminal (RCIb) for inputting a ripple carry inverted input signal from the ripple carry propagation path 7, the ripple carry output terminal RCO for outputting a ripple carry output signal to the ripple carry propagation path 7, a second ripple-core logic carry output terminal CCO2 for supplying the second ripple-core logic carry input terminal CCI2 with a second ripple-core logic carry output signal as the second ripple-core logic carry input signal, a second core logic carry generation input terminal G2 for being supplied from the second core logic carry generation output terminal G02 with the second core logic carry generation output signal as a second core logic carry generation input signal, and a second core logic carry propagation input terminal P2 for being supplied from the second core logic carry propagation output terminal PO2 with the second core logic carry propagation output signal as a second core logic carry propagation input signal.

FIG. 39(A) is a circuit diagram of the odd carry logic circuit 5.1. The odd carry logic circuit 5.1 comprises first and second inverters 15.1 and 15.2 and a NOR-AND circuit 52.

The ripple carry input terminal RCI is connected to a c-input terminal (a third input terminal) of the NOR-AND circuit 52. In addition, the ripple carry input terminal RCI is connected to the first ripple-core logic carry output terminal CCO1 via a first connection line cl51. That is, the first connection line c151 serves as a first connection arrangement for connecting the ripple carry input terminal RCI with the first ripple-core logic carry output terminal CCO1 to make the first ripple-core logic carry output terminal CCO1 produce the ripple carry input signal as the first ripple-core logic carry output signal.

The first inverter 15.1 has an input terminal connected to the first core logic carry generation input terminal G1. The first inverter 15.1 inverts the first core logic carry generation input signal to produce an inverted core logic carry generation signal. The first inverter 15.1 has an output terminal connected to an a-input terminal (a first input terminal) of the NOR-AND circuit 52. The second inverter 15.2 has an input terminal connected to the first core logic carry propagation input terminal P1. The second inverter 15.2 inverts the first core logic carry propagation input signal to produce an inverted core logic carry propagation signal. The second inverter 15.2 has an output terminal connected to a b-input terminal (a second input terminal) of the NOR-AND circuit 52.

The NOR-AND circuit 52 has the first input terminal connected to the output terminal of the first inverter 15.1, the second input terminal connected to the output input terminal of said second inverter 15.2, and the third input terminal connected to the ripple carry input terminal RCI in the manner which is described above. The NOR-AND circuit 52 ANDs the inverted core logic carry propagation input signal supplied to the second input terminal thereof and the ripple carry input signal supplied to the third input terminal thereof to obtain an ANDed result signal and NORs the ANDed result signal and the inverted core logic carry generation input signal supplied to the first input terminal thereof to produce an ANDed and NORed output signal. The NOR-AND circuit 52 has an output terminal connected to the ripple carry inverted output terminal RCOb of the odd carry logic circuit 5.1 via a second connection line c152. That is, the second connection line c152 acts as a second connection arrangement for connecting the output terminal of the NOR-AND circuit 52 with the ripple carry inverted output terminal RCOb to make the ripple carry inverted output terminal RCOb produce the ANDed and NORed output signal as the ripple carry inverted output signal.

FIG. 39(B) is a circuit diagram of the even carry logic circuit 5.2. The odd carry logic circuit 5.2 comprises a third inverter 15.3 and a NAND-OR circuit 14.1.

The ripple carry inverted input terminal RCIb is connected to a c-input terminal (a third input terminal) of the NAND-OR circuit 14.1 and to an input terminal of the third inverter 15.3. The third inverter 15.3 inverts the ripple carry inverted input signal to produce a ripple carry input signal.

The third inverter 15.3 has an output terminal connected to the second ripple-core logic carry output terminal CCO2 via a third connection line c153. That is, the third connection lien cl53 is operable as a third connection arrangement for connecting the output terminal of the third inverter 15.3 with the second ripple-core logic carry output terminal CCO2 to make the second ripple-core logic carry output terminal CCO2 produce the ripple carry input signal as the second ripple-core logic carry output signal.

The NAND-OR circuit 14.1 has an a-input terminal (a first input terminal) connected to the second core logic carry generation input terminal G2, a b-input terminal (a second input terminal) connected to the second core logic carry propagation input terminal P2, and the c-input terminal (the third input terminal connected to the ripple carry inverted input terminal RCIb. The NAND-OR circuit ORs the second core logic carry propagation input signal supplied to the second input terminal thereof and the ripple carry inverted signal supplied to the third input terminal thereof to obtain an ORed result signal and NANDs the ORed result signal and the first core logic carry generation input signal supplied to the first input terminal thereof to produce an ORed and NANDed output signal. The NAND-OR circuit 14.1 has an output terminal connected to the ripple carry output terminal RCO via a fourth connection line c154. That is, the fourth connection line c154 serves as a fourth connection arrangement for connecting the output terminal of the NAND-OR circuit 14.1 with the ripple carry output terminal RCO to make the ripple carry output terminal RCO produce the ORed and NANDed output signal as the ripple carry output signal.

The carry logic circuit 5 illustrated in FIG. 9 has a long propagation delay for the ripple carry signal because the NAND-OR circuit 14.1 and the inverter 15.1 are inserted between the ripple carry input terminal RCI and the ripple carry output terminal RCO which act as the propagation path for the ripple carry signal. In addition, the carry logic circuit 5A illustrated in FIG. 10 has a propagation delay for the ripple carry signal that is defined by a delay between the control input terminal and the output terminal of the two-input one-output inverting multiplexer 35.1 and that is about equal to that between the ripple carry input terminal RCI and the ripple carry output terminal RCO in the carry logic circuit 5 illustrated in FIG. 9. In contrast to this, each of the odd carry logic circuit 5.1 and the even carry logic circuit 5.2 can perform a high-speed ripple carry propagation. This is because only one logic circuit, namely, the NOR-AND circuit 52 or the NAND-OR circuit 14.1 is inserted in the propagation path for the ripple carry signal.

As described above, according to the second embodiment of this invention, it is possible to perform high-speed arithmetic operations. This is because the number of the logic circuit inserted in the ripple carry propagation path is decreased and a ripple carry propagation speed is fast.

Figure 40:
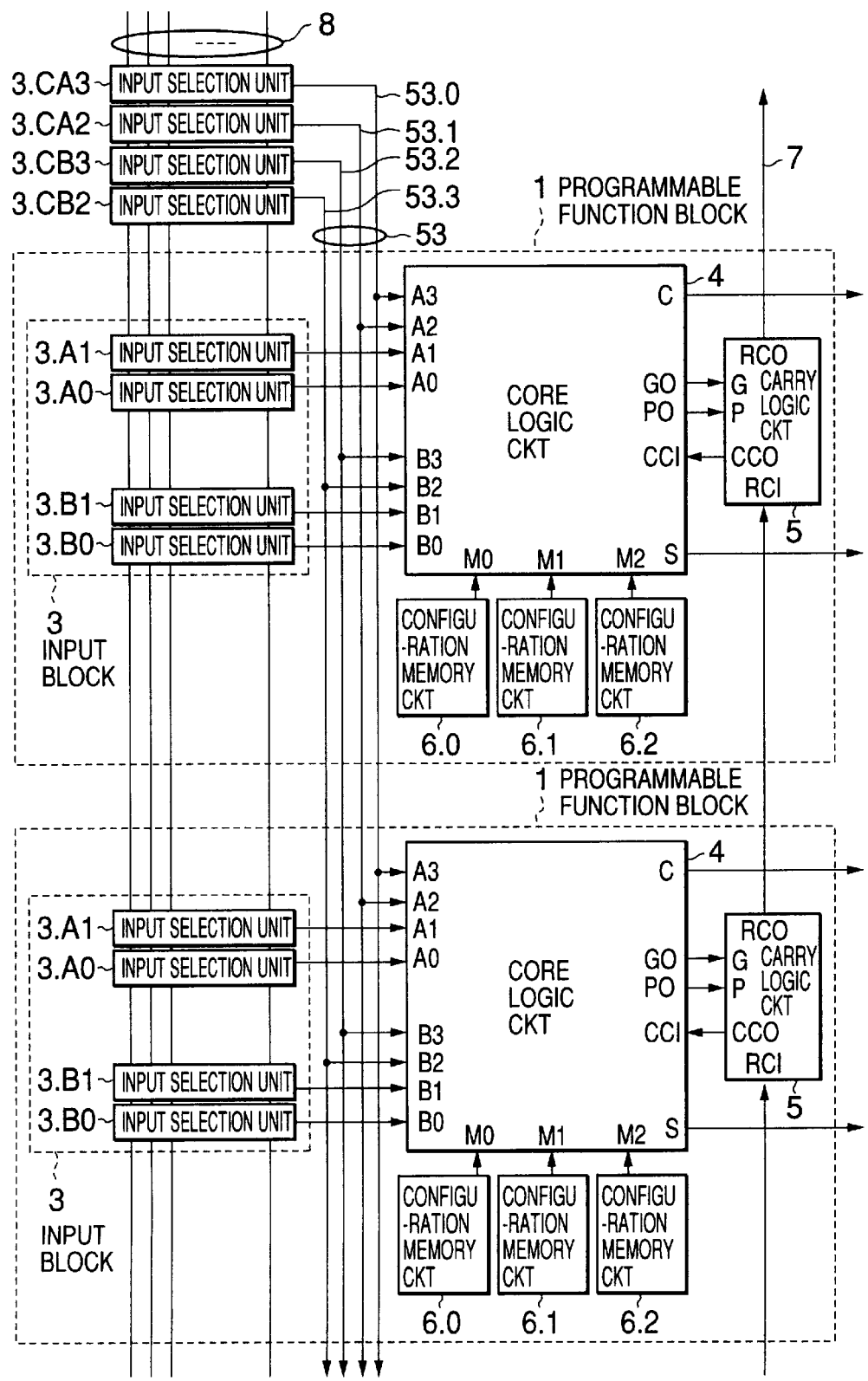
FIG. 40 is a block diagram of a programmable function device according a third embodiment of this invention.

Referring to FIG. 40, description will proceed to a programmable function device according to a third embodiment of this invention. The programmable function device comprises a plurality of programmable function blocks according to the first or the second embodiments that are arranged and has common input lines 53 connected to at least one of the argument input terminals of each core logic circuit 4 to cover all over a plurality of programmable function blocks. In the example being illustrated, the programmable function device comprises the programmable function blocks 1 illustrated in FIG. 3. The common input lines 53 are connected to the interconnecting wires 8 via first through fourth common input selection units 3.CA3, 3.CA2, 3.CB3, and 3.CB2.

In the example being illustrated in FIG. 40, the argument input terminals A3, A2, B3, and B2 of the core logic circuit 4 in the plurality of programmable function blocks 1 are connected to first through fourth common input lines 53.0, 53.1, 53.2, and 53.3, respectively, which are connected to output terminals of the first through the fourth common input selection units 3.CA3, 3.CA2, 3.CB3, and 3.CB2, respectively.

Although any one or ones of the argument input terminals in the core logic circuits may be connected to in common, in consideration of circuits having high frequency of use in actual applications in the manner which will later be described, selection from the fourth and the third argument input terminals A3 and A2 of the first argument input group or the fourth and the third argument input terminals B3 and B2 having similar functions to those may be useful in common.

Figure 41:
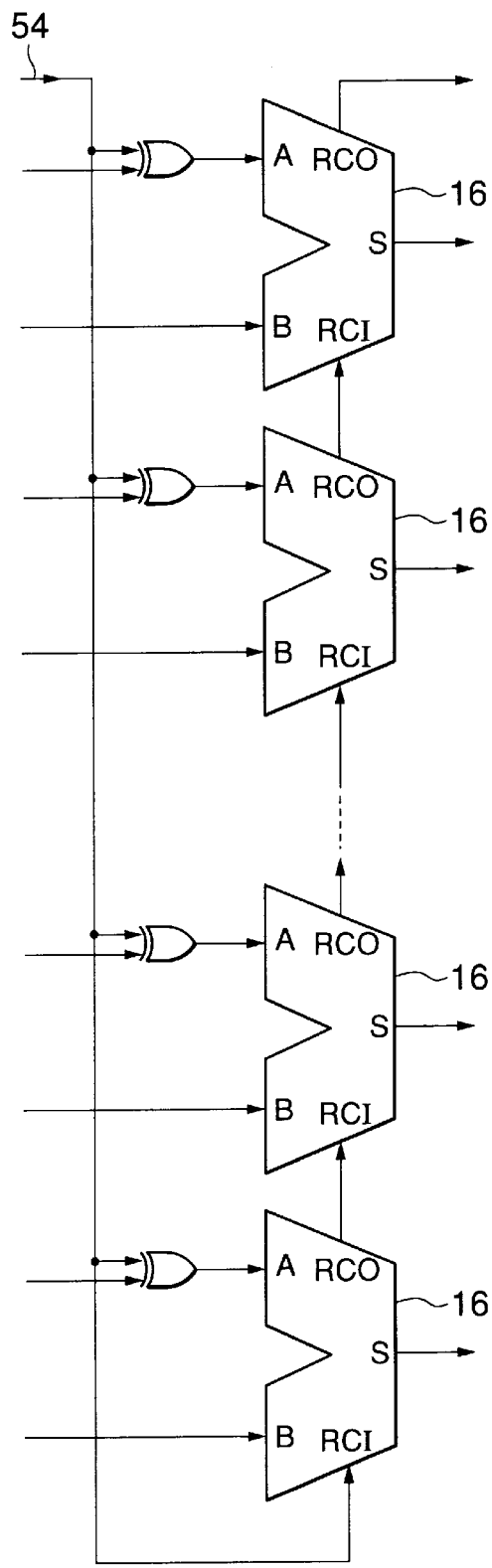
FIG. 41 is a block diagram of a multi-bit adder and subtracter.

FIG. 41 shows a multi-bit adder and subtracter as one of the circuits having the high frequency of use. The illustrated multi-bit adder and subtracter serves as a multi-bit adder when a multi-bit common input line 54 has a logic value of "0". In addition, the illustrated multi-bit adder and subtracter acts as a multi-bit subtracter when the multi-bit common input line 54 has a logic value of "1". The illustrated multi-bit adder and subtracter is implemented by the programmable function device illustrated in FIG. 40. In this event, the multi-bit common input line 54 in FIG. 41 corresponds to the first common input line 54.0 in FIG. 40.

Figure 42:
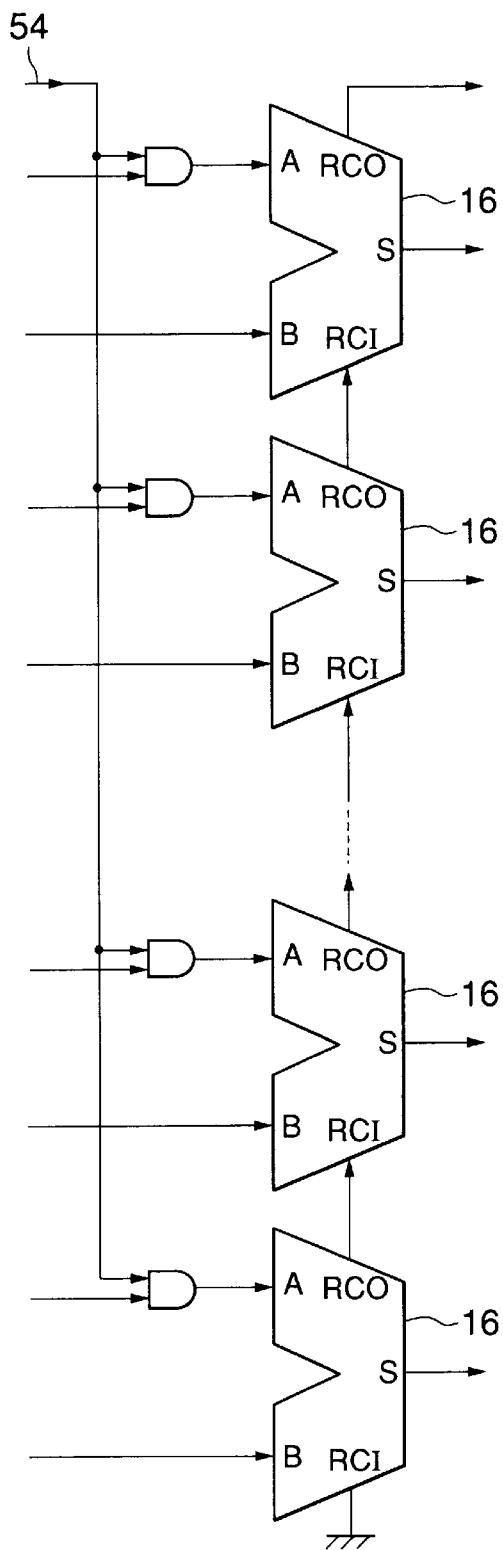
FIG. 42 is a block diagram of a multi-bit arithmetic circuit acting as a component of a multiplier.

FIG. 42 shows a multi-bit arithmetic circuit as a component of a multiplier which is another circuit having the high frequency of use. In the multi-bit arithmetic circuit, connected to the argument input terminal A of each adder 16, an AND gate is for calculating a partial product of multiplication. The illustrated multi-bit arithmetic circuit is implemented by the programmable function device illustrated in FIG. 40. In this event, the multi-bit common input line 54 in FIG. 42 corresponds to the second common input line 53.1 in FIG. 40.

In general, in many cases, a data path for a computer performs the same processing on a lot of bits. Accordingly, the programmable function device according to the third embodiment of this invention is suitable to constitute such a circuit.

The programmable function device according to the third embodiment of this invention has a merit where each programmable function block has a small occupied area. This is because it is possible to decrease the number of the input selection units requiring a large area by connecting a part of the argument inputs in each programmable function block in common to cover all over the plurality of programmable function blocks.

Figure 43:
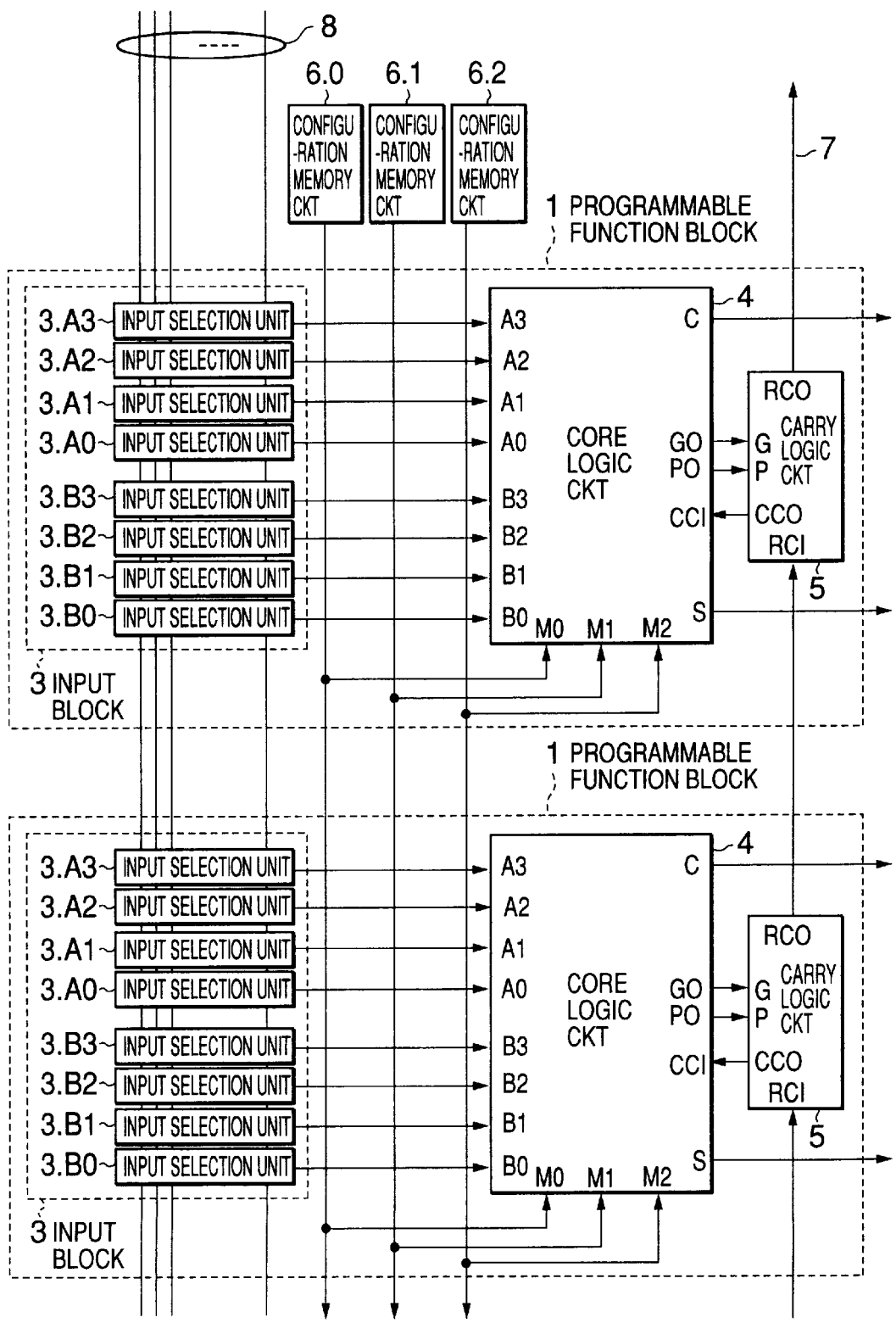
FIG. 43 is a block diagram of a programmable function device according a fourth embodiment of this invention.

Referring to FIG. 43, description will proceed to a programmable function device according to a fourth embodiment of this invention. The programmable function device comprises a plurality of programmable function blocks according to the first or the second embodiments that are arranged and configuration memory circuits a part or all of which is used in common to cover all over the programmable function blocks.

In the illustrated programmable function device, each core logic circuit 4 has the first through the third configuration input terminals M0, M1, and M2 which are connected to the output terminals of the first through the third configuration memory circuits 6.0, 6.1, and 6.2 in common, respectively.

Figure 44:
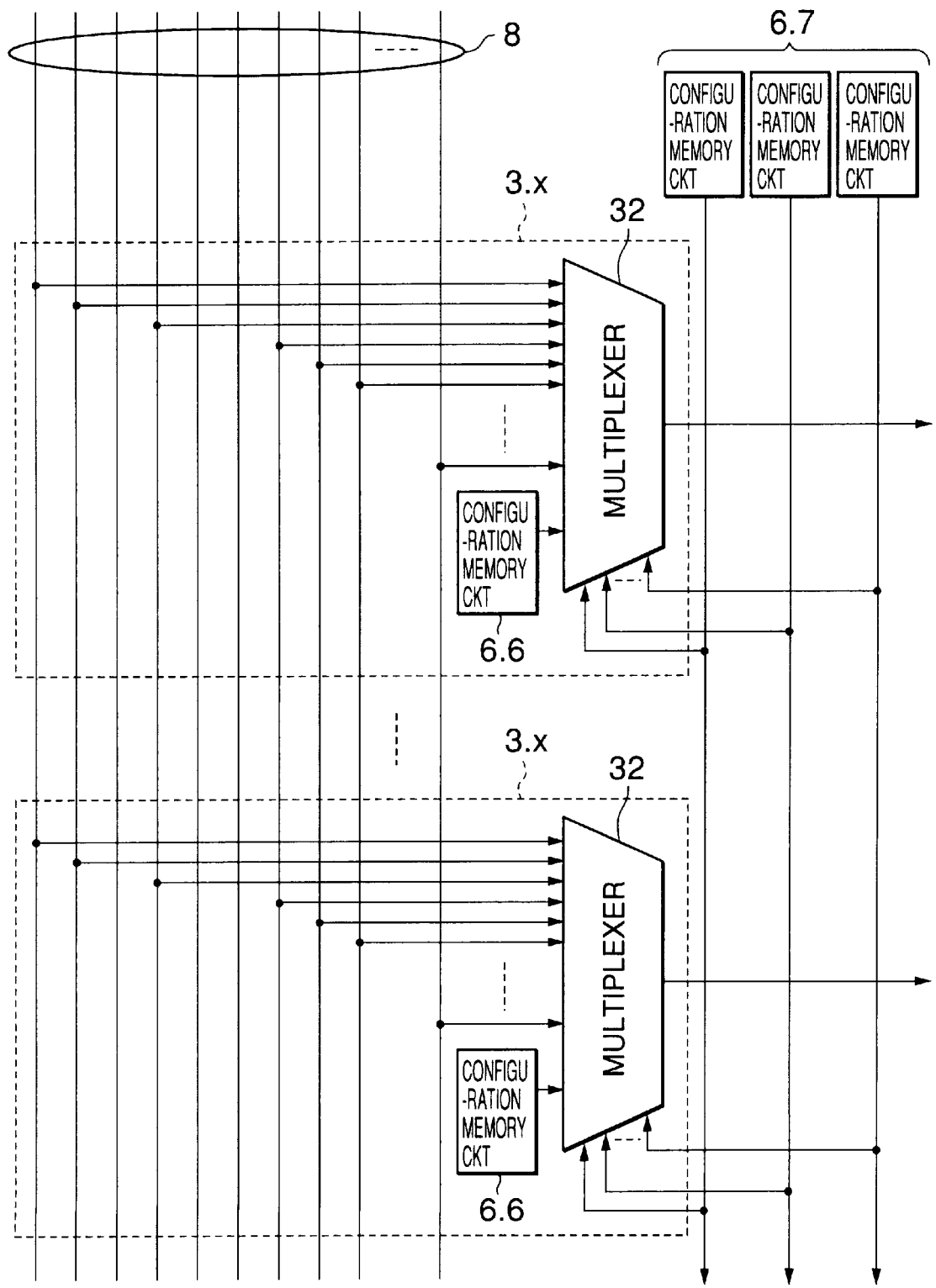
FIG. 44 is a block diagram of an example where configuration memory circuits of input selection units in the programmable function device illustrated in FIG. 43 are shared.

In addition, the configuration memory circuits in the input selection units included in the input block circuit 3 may be used in common. FIG. 44 shows this example. This is an example to use, as the input selection unit, that illustrated in FIG. 28 and control inputs of the multiplexer 32 of the input selection unit 3.x in the plurality of programmable function blocks are supplied by outputs of common configuration memory circuits 6.7.

The programmable function device according to the fourth embodiment of this invention is suitable to constitute the circuit such as a data path for a computer that performs the same processing on a lot of bits in many cases. The programmable function device according to the fourth embodiment of this invention has a merit where each programmable function block has a small occupied area. This is because it is possible to decrease the number of the configuration memory circuits by using a part or all of the configuration memory circuits included in the programmable function block in common to cover all over the plurality of programmable function blocks.

The description will proceed to a fifth embodiment of this invention. In the programmable function device according to the third or the fourth embodiments of this invention, the programmable function device comprising n programmable function blocks having common inputs or common configuration memories is called an n-bit arithmetic and logic unit (ALU), where n represents a natural number. Under the circumstances, the fifth embodiment of this invention is an integrated circuit comprising a plurality of ALUs having different bit lengths which are arranged on the same integrated circuit.

Figure 45:
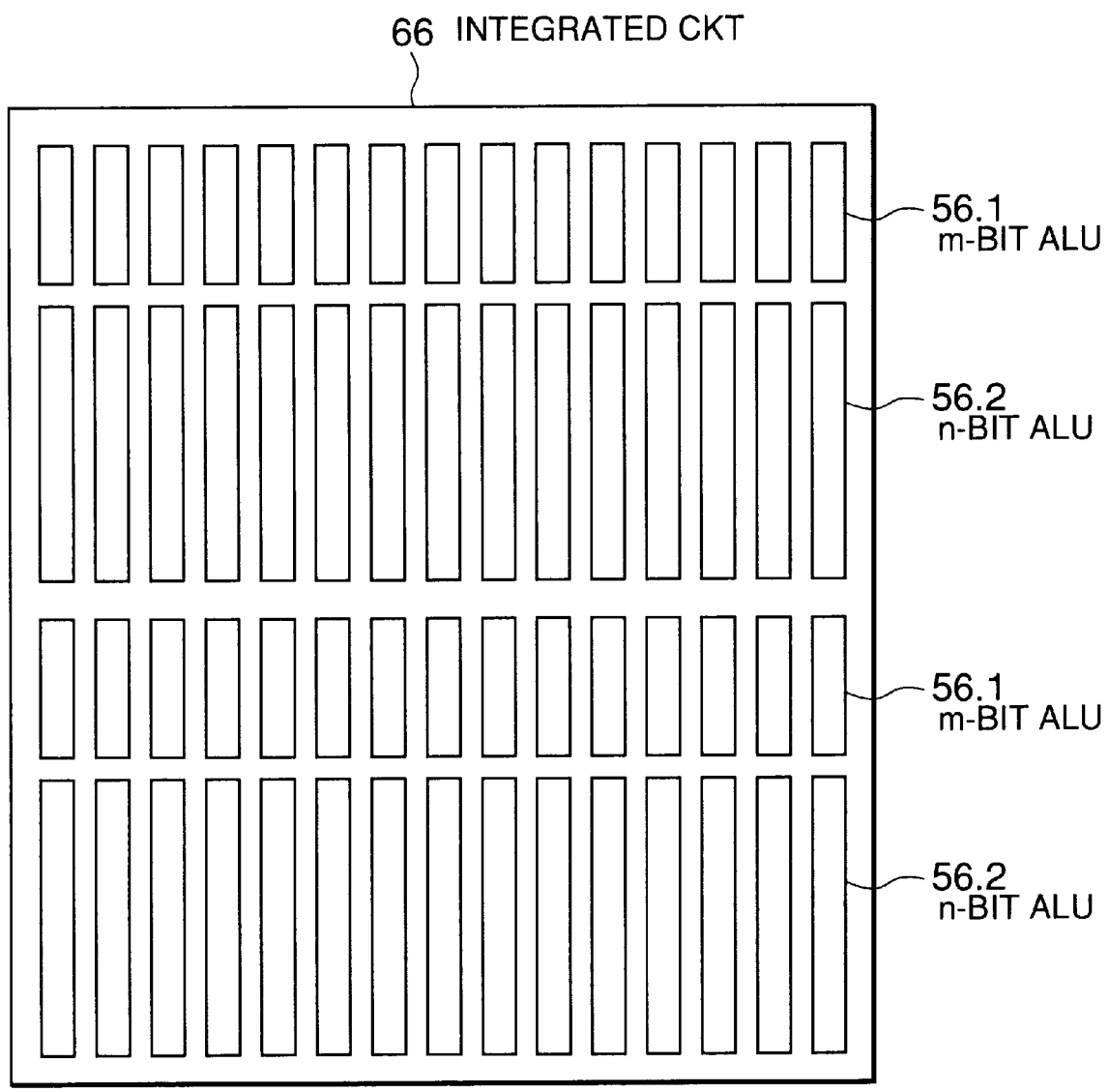
FIG. 45 is a layout showing an integrated circuit comprising a plurality of ALUs having different bit lengths which are arranged.

FIG. 45 shows a first example of the fifth embodiment of the present invention. As shown in FIG. 45, an integrated circuit 55 comprises a plurality of m-bit ALUs 56.1 and a plurality of n-bit ALUs 56.2 which are arranged on the integrated circuit 55, where m and n represent natural numbers and the natural number m is less than the natural number n, namely, m<n. It will be assumed that the integrated circuit comprises a plurality of m-bit ALUs 56.1 alone. In this event, a 2m-bit ALU is composed of two m-bit ALUs 56.1 connected to each other using the interconnecting wires and it results in a delay in a connecting portion and an increased area. In contrast with this, according to the first example of the fifth embodiment, in a case where the natural number n is twice as large as the natural number m, the 2m-bit ALU is effectively composed of one n-bit ALU 56.2 alone without any connecting portion. As described above, according to the first example of the fifth embodiment of the present invention, it is possible to provide the integrated circuit which is enable to efficiently constitute a circuit having various bit lengths by using ALUs having different bit lengths.

Figure 46:
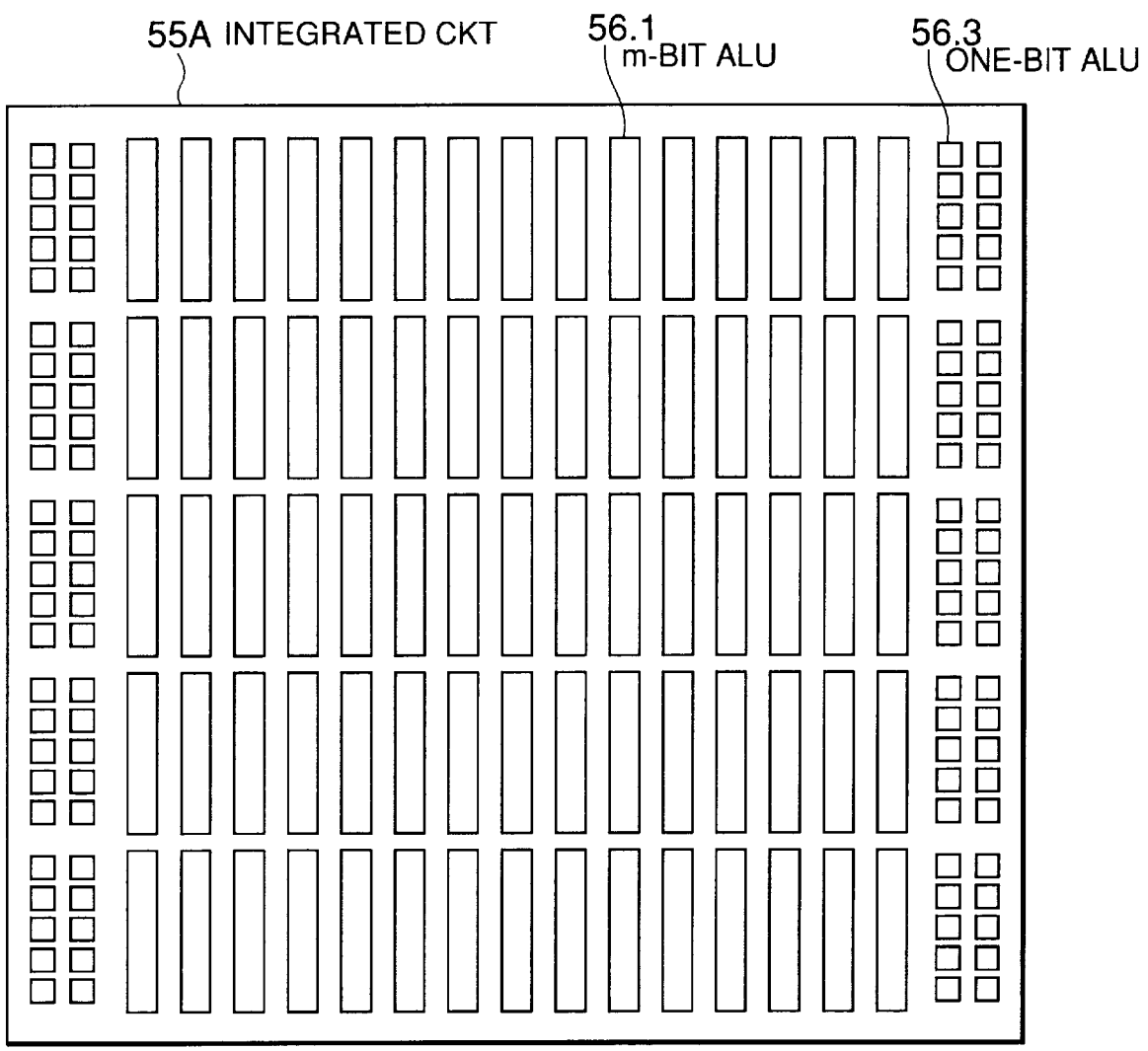
FIG. 46 is a layout showing another integrated circuit comprising a plurality of multi-bit ALUs and a plurality of one-bit ALUs which are disposed in the periphery of the multi-bit ALUs.

FIG. 46 shows a second example of the fifth embodiment of the present invention. As shown in FIG. 46, an integrated circuit 55A comprises a plurality of m-bit ALUs 56.1 and a plurality of one-bit ALUs 56.3 which are arranged on the integrated circuit 55A, where m represents a natural number which is not less than two. The one-bit ALU 56.3 is the programmable function block having no common input and no common configuration memory circuit. A two-dimensional array section comprising the m-bit ALUs 56.1 is a part which is suitable to constitute a data path. On the other hand, disposed on the periphery of the integrated circuit 55A, the one-bit ALUs 56.3 are suitable to assemble various random logic circuits because the individual programmable function block may be independently programmed and it results in useful to constitute a control system for the data path. In order to efficiently use the ALUs spread all over the integrated circuit as no useless as possible and to restrain delays, it may be desirable that the data path is collectively concentrated in a rectangular area on the integrated circuit and the control system is disposed on the periphery of the data path, as illustrated in FIG. 46. This example provides the integrated circuit suitable to achieve such a purpose.

While this invention has thus far been described in conjunction with preferred embodiments thereof, it will now be readily possible for those skilled in the art to put this invention into various other manners.

What is claimed is:

1. A core logic circuit having:
   a first argument input group consisting of first through fourth argument input terminals (A0, A1, A2, A3);
   a second argument input group consisting of first though fourth argument input terminals (B0, B1, B2, B3);
   first through third configuration input terminals (M0, M1, M2);
   a core logic carry output terminal (C) for outputting a core logic carry output signal;
   a core logic carry generation output terminal (GO) for outputting a core logic carry generation output signal;
   a core logic carry propagation output terminal (PO) for outputting a core logic carry propagation output signal;
   a ripple-core logic carry input terminal (CCI) for inputting a ripple-core logic carry input signal; and
   a sum output terminal (S) for outputting a summed output signal.

2. A core logic circuit as claimed in claim 1, wherein said core logic circuit (4) comprises:
   a first two-input one-output multiplexer (10.0) having a first input terminal connected to the first argument input terminal (A0) of said first argument input group, a second input terminal connected to the second argument input terminal (A1) of said first argument input group, and a control input terminal connected to the third argument input terminal (A2) of said first argument input group, said first two-input one-output multiplexer producing, as a first selected output signal, an input signal supplied to the first input terminal thereof when the control input terminal thereof is supplied with a control signal having a logic value of "0", said first two-input one-output multiplexer producing, as the first selected output signal, an input signal supplied to the second input terminal thereof when the control input terminal thereof is supplied with the control signal having a logic value of "1";
   a second two-input one-output multiplexer (10.1) having a first input terminal connected to the first argument input terminal (B0) of said second argument input group, a second input terminal connected to the second argument input terminal (Bi) of said second argument input group, and a control input terminal connected to the third argument input terminal (B2) of said second argument input group, said second two-input one-output multiplexer producing, as a second selected output signal, an input signal supplied to the first input terminal thereof when the control input terminal thereof is supplied with a control signal having a logic value of "0", said second two-input one-output multiplexer producing, as the second selected output signal, an input signal supplied to the second input terminal thereof when the control input terminal thereof is supplied with the control signal having a logic value of "1";

a third two-input one-output multiplexer (10.2) having a first input terminal connected to the fourth argument input terminal (B3) of said second argument input group, a second input terminal connected to said ripple-core logic carry input terminal (CCI), and a control input terminal connected to said first configuration input terminal (M0), said third two-input one-output multiplexer producing, as a third selected output signal, an input signal supplied to the first input terminal thereof when the control input terminal thereof is supplied with a control signal having a logic value of "0", said third two-input one-output multiplexer producing, as the third selected output signal, an input signal supplied to the second input terminal thereof when the control input terminal thereof is supplied with the control signal having a logic value of "1";

a first exclusive OR circuit (11.0) having a first input terminal connected to the fourth argument input terminal (A3) of said first argument input group and a second input terminal connected to an output terminal of said first two-input one-output multiplexer (10.0), said first exclusive OR circuit exclusively ORing an input signal supplied to the first input terminal thereof and the first selected output signal supplied to the second input terminal thereof to produce a first exclusively ORed output signal;

a second exclusive OR circuit (11.1) having a first input terminal connected to an output terminal of said second two-input one-output multiplexer (10.1) and a second input terminal connected to an output terminal of said third two-input one-output multiplexer (10.3), said second exclusive OR circuit exclusively ORing the second selected output signal supplied to the first input terminal thereof and the third selected output signal supplied to the second input terminal thereof to produce a second exclusively ORed output signal;

a fourth two-input one-output multiplexer (10.3) having a first input terminal connected to the output terminal of said second two-input one-output multiplexer (10.1), a second input terminal connected to an output terminal of said second exclusive OR circuit (11.1), and a control input terminal connected to said second configuration input terminal (M1), said fourth two-input one-output multiplexer producing, as a fourth selected output signal, the second selected output signal supplied to the first input terminal thereof when the control input terminal thereof is supplied with a control signal having a logic value of "0", said fourth two-input one-output multiplexer producing, as the fourth selected output signal, the second exclusively ORed output signal when the control input terminal thereof is supplied with the control signal having the logic value of "1";

a fifth two-input one-output multiplexer (10.4) having a first input terminal connected to the output terminal of said third two-input one-output multiplexer (10.2), a second input terminal connected to said third configuration input terminal (M2), and a control input terminal connected to said second configuration input terminal (M1), said fifth two-input one-output multiplexer producing, as a fifth selected output signal, the third selected output signal supplied to the first input terminal thereof when the control input terminal thereof is supplied with a control signal having a logic value of "0", said fifth two-input one-output multiplexer producing, as the fifth selected output signal, an input signal supplied to the second input terminal thereof when the control input terminal thereof is supplied with the control signal having the logic value of "1";

a NAND circuit (12) having a first input terminal connected to an output terminal of said first exclusive OR circuit (11.0) and a second input terminal connected to an output terminal of said fourth two-input one-output multiplexer (10.3), said NAND circuit NANDing the first exclusively ORed output signal supplied to the first input terminal thereof and the fourth selected output signal supplied to the second input terminal thereof to produce a NANDed output signal;

a NOR circuit (13) having a first input terminal connected to the output terminal of said first exclusive OR circuit (11.0) and a second input terminal connected to the output terminal of said fourth two-input one-output multiplexer (10.3), said NOR circuit NORing the first exclusively ORed output signal supplied to the first input terminal thereof and the fourth selected output signal supplied to the second input terminal thereof to produce a NORed output signal;

a third exclusive OR circuit (11.2) having a first input terminal connected to an output terminal of said first exclusive OR circuit (11.0) and a second input terminal connected to an output terminal of said second exclusive OR circuit (11.1), said third exclusive OR circuit exclusively ORing the first exclusively ORed output signal supplied to the first input terminal thereof and the second exclusively ORed output signal supplied to the second input terminal thereof to produce a third exclusively ORed output signal;

an inverter (15.0) having an input terminal connected to an output terminal of said fifth two-input one-output multiplexer (10.4), said inverter inverting the fifth selected output signal supplied to the input terminal thereof to produce an inverted output signal;

a NAND-OR circuit (14.0) having a first input terminal connected to an output terminal of said NAND circuit (12), a second input terminal connected to an output terminal of said NOR circuit (13), and a third input terminal connected to an output terminal of said inverter (15.0), said NAND-OR circuit ORing the NORed output signal supplied to the second input terminal thereof and the inverted output signal supplied to the third input terminal thereof to obtain an ORed result signal and NANDing the ORed result signal and the NANDed output signal supplied to the first input terminal thereof to produce an ORed and NANDed output signal;

first connecting means for connecting an output terminal of said NAND circuit (12) with said core logic carry generation output terminal (GO) to make said core logic carry generation output terminal (GO) produce the NANDed output signal as the core logic carry generation output signal;

second connecting means for connecting an output terminal of said NOR circuit (13) with said core logic carry propagation output terminal (PO) to make said core logic carry propagation output terminal (PO) produce the NORed output signal as the core logic carry propagation output signal;

third connecting means for connecting an output terminal of said NAND-OR circuit (14.0) with said core logic carry output terminal (C) to make said core logic carry output terminal (C) produce the ORed and NANDed output signal as the core logic carry output signal; and fourth connecting means for connecting an output terminal of said third exclusive OR circuit (11.2) with said sum output terminal (S) to make said sum output terminal (S) produce the third exclusively ORed output signal as the summed output signal.

3. A core logic circuit as claimed in claim 1, wherein said core logic circuit (4A) comprises:

a first two-input one-output multiplexer (10.0) having a first input terminal connected to the first argument input terminal (A0) of said first argument input group, a second input terminal connected to the second argument input terminal (A1) of said first argument input group, and a control input terminal connected to the third argument input terminal (A2) of said first argument input group, said first two-input one-output multiplexer producing, as a first selected output signal, an input signal supplied to the first input terminal thereof when the control input terminal thereof is supplied with a control signal having a logic value of "0", said first two-input one-output multiplexer producing, as the first selected output signal, an input signal supplied to the second input terminal thereof when the control input terminal thereof is supplied with the control signal having a logic value of "1";

a second two-input one-output multiplexer (10.1) having a first input terminal connected to the first argument input terminal (B0) of said second argument input group, a second input terminal connected to the second argument input terminal (B1) of said second argument input group, and a control input terminal connected to the third argument input terminal (B2) of said second argument input group, said second two-input one-output multiplexer producing, as a second selected output signal, an input signal supplied with the first input terminal thereof when the control input terminal thereof is supplied with a control signal having a logic value of "0", said second two-input one-output multiplexer producing, as the second selected output signal, an input signal supplied with the second input terminal thereof when the control input terminal thereof is supplied with the control signal having a logic value of "1";

a third two-input one-output multiplexer (10.2) having a first input terminal connected to the fourth argument input terminal (B3) of said second argument input group, a second input terminal connected to said ripple-core logic carry input terminal (CCI), and a control input terminal connected to said first configuration input terminal (M0), said third two-input one-output multiplexer producing, as a third selected output terminal, an input signal supplied to the first input terminal thereof when the control input terminal thereof is supplied with a control signal having a logic value of "0", said third two-input one-output multiplexer producing, as the third selected output terminal, an input signal supplied to the second input terminal thereof when the control input terminal thereof is supplied with the control signal having a logic value of "1";

a first exclusive OR circuit (11.0) having a first input terminal connected to the fourth argument input terminal (A3) of said first argument input group and a second input terminal connected to an output terminal of said first two-input one-output multiplexer (10.0), said first exclusive OR circuit exclusively ORing an input signal supplied with the first input terminal thereof and the first selected output signal supplied with the second input terminal thereof to produce a first exclusively ORed output signal;

a second exclusive OR circuit (11.1) having a first input terminal connected to an output terminal of said second two-input one-output multiplexer (10.1) and a second input terminal connected to an output terminal of said third two-input one-output multiplexer (10.2), said second exclusive OR circuit exclusively ORing the second selected output signal supplied to the first input terminal thereof and the third selected output signal supplied to the second input terminal thereof to produce a second exclusively ORed output signal;

a fourth two-input one-output multiplexer (10.3) having a first input terminal connected to the output terminal of said second two-input one-output multiplexer (10.1), a second input terminal connected to an output terminal of said second exclusive OR circuit (11.1), and a control input terminal connected to said second configuration input terminal (M1), said fourth two-input one-output multiplexer producing, as a fourth selected output signal, the second selected output signal supplied to the first input terminal thereof when the control input terminal thereof is supplied with a control signal having a logic value of "0", said fourth two-input one-output multiplexer producing, as the fourth selected output signal, the second exclusive ORed signal supplied to the second input terminal thereof when the control input terminal thereof is supplied with the control signal having the logic value of "1";

a fifth two-input one-output multiplexer (10.4) having a first input terminal connected to an output terminal of said third two-input one-output multiplexer (10.2), a second input terminal connected to said third configuration input terminal (M2), and a control input terminal connected to said second configuration input terminal (M1), said fifth two-input one-output multiplexer producing, as a fifth selected output signal, the third selected output signal supplied to the first input terminal thereof when the control input terminal thereof is supplied with a control signal having a logic value of "0", said fifth two-input one-output multiplexer producing, as the fifth selected output signal, an input signal supplied to the second input terminal thereof when the control input terminal thereof is supplied with the control signal having the logic value of "1";

a NAND circuit (12) having a first input terminal connected to an output terminal of said first exclusive OR circuit (11.0) and a second input terminal connected to an output terminal of said fourth two-input one-output multiplexer (10.3), said NAND circuit NANDing the first exclusively ORed output signal supplied to the first input terminal thereof and the fourth selected output signal supplied to the second input terminal thereof to produce a NANDed output signal;

a NOR circuit (13) having a first input terminal connected to the output terminal of said first exclusive OR circuit (11.0) and a second input terminal connected to the output terminal of said fourth two-input one-output multiplexer (10.3), said NOR circuit (13) NORing the first exclusively ORed output signal supplied to the first input terminal thereof and the fourth selected output signal supplied to the second input terminal thereof to produce a NORed output signal;

a third exclusive OR circuit (11.2) having a first input terminal connected to the output terminal of said first exclusive OR circuit (11.0) and a second input terminal connected to the output terminal of said second exclusive OR circuit (11.1), said third exclusive OR circuit exclusively ORing the first exclusively ORed output signal supplied to the first input terminal thereof and the second exclusively ORed output signal supplied to the second input terminal thereof to produce a third exclusively ORed output signal;

a two-input one-output inverting multiplexer (35.0) having a first input terminal connected to an output terminal of said NAND circuit (12), a second input terminal connected to an output terminal of said NOR circuit (13), and a control input terminal connected to an output terminal of said fifth two-input one-output multiplexer, said two-input one-output inverting multiplexer producing, as an inverted selected output signal, a signal obtaining by inverting the NANDed output signal supplied to the first input terminal thereof when the control input terminal thereof is supplied with a control signal having a logic value of "0", said two-input one-output inverting multiplexer producing, as the inverted selected output signal, a signal obtained by inverting the NORed output signal supplied to the second input terminal thereof when the control input terminal thereof is supplied with the control signal having the logic value first connecting means for connecting the output terminal of said NAND circuit (12) with said core logic carry generation output terminal (GO) to make said core logic carry generation output terminal (GO) produce the NANDed output signal as the core logic carry generation output signal;

second connecting means for connecting the output terminal of said NOR circuit (13) with said core logic carry propagation output terminal (PO) to make said core logic carry propagation output terminal (PO) produce the NORed output signal as the core logic carry propagation output signal;

third connecting means for connecting an output terminal of said two-input one-output inverting multiplexer (35.0) with said core logic carry output terminal (C) to make said core logic carry output terminal (C) produce the inverted selected output signal as the core logic carry output signal; and fourth connecting means for connecting an output terminal of said third exclusive OR circuit with said sum output terminal (S) to make said sum output terminal (S) produce the third exclusively ORed output signal as the summed output signal.

4. A core logic circuit as claimed in claim 1, wherein said core logic circuit (4B) comprises:

a first two-input one-output multiplexer (10.0) having a first input terminal connected to the first argument input terminal (A0) of said first argument input group, a second input terminal connected to the second argument input terminal (A1) of said first argument input group, and a control input terminal connected to the third argument input terminal (A2) of said first argument input group, said first two-input one-output multiplexer producing, as a first selected output signal, an input signal supplied to the first input terminal thereof when the control input terminal thereof is supplied with a control signal having a logic value of "0", said first two-input one-output multiplexer producing, as the first selected output signal, an input signal supplied to the second input terminal thereof when the control input terminal thereof is supplied with the control signal having a logic value of "1";

a second two-input one-output multiplexer (10.1) having a first input terminal connected to the first argument input terminal (B0) of said second argument input group, a second input terminal connected to the second argument input terminal (B1) of said second argument input group, and a control input terminal connected to the third argument input terminal (B2) of said second argument input group, said second two-input one-output multiplexer producing, as a second selected output signal, an input signal supplied to the first input terminal thereof when the control input terminal thereof is supplied with a control signal having a logic value of "0", said second two-input one-output multiplexer producing, as the second selected output signal, an input signal supplied to the second input terminal thereof when the control input terminal thereof is supplied with the control signal having a logic value of "1";

a third two-input one-output multiplexer (10.2) having a first input terminal connected to the fourth argument input terminal (B3) of said second argument input group, a second input terminal connected to said ripple-core logic carry input terminal (CCI), and a control input terminal connected to said first configuration input terminal (M0), said third two-input one-output multiplexer producing, as a third selected output signal, an input signal supplied to the first input terminal thereof when the control input terminal thereof is supplied with a control signal having a logic value of "0", said third two-input one-output multiplexer producing, as the third selected output signal, an input signal supplied to the second input terminal thereof when the control input terminal thereof is supplied with the control signal having a logic value of "1";

a first exclusive OR circuit (11.0) having a first input terminal connected to the fourth argument input terminal (A3) of said first argument input group and a second input terminal connected to an output terminal of said first two-input one-output multiplexer (10.0), said first exclusive OR circuit exclusively ORing an input signal supplied to the first input terminal thereof and the first selected output signal supplied to the second input terminal thereof to produce a first exclusively ORed output signal;

a second exclusive OR circuit (11.1) having a first input terminal connected to an output terminal of said second two-input one-output multiplexer (10.1) and a second input terminal connected to an output terminal of said third two-input one-output multiplexer (10.2), said second exclusive OR circuit exclusively ORing the second selected output signal supplied to the first input terminal thereof and the third selected output signal supplied to the second input terminal thereof to produce a second exclusively ORed output signal;

a fourth two-input one-output multiplexer (10.3A) having a first input terminal connected to an output terminal of said second exclusive OR circuit (11.1), a second input terminal connected to the output terminal of said second two-input one-output multiplexer (10.1), and a control input terminal connected to said second configuration input terminal (M1), said fourth two-input one-output multiplexer producing, as a fourth selected output signal, the second exclusively ORed output signal supplied to the first input terminal thereof when the control input terminal thereof is supplied with a control signal having a logic value of "0", said fourth two-input one-output multiplexer producing, as the fourth selected output signal, the second selected output signal supplied to the second input terminal thereof when the control input terminal thereof is supplied with the control signal having the logic value of "1";

a fifth two-input one-output multiplexer (10.4A) having a first input terminal connected to said third configuration input terminal (M2), a second input terminal connected to the output terminal of said third two-input one-output multiplexer (10.2), and a control input terminal connected to said second configuration input terminal (M1), said fifth two-input one-output multiplexer producing, as a fifth selected output signal, an input signal supplied to the first input terminal thereof when the control input terminal thereof is supplied with a control signal having a logic value of "0", said fifth two-input one-output multiplexer producing, as the fifth selected output signal, the third selected output signal supplied to the second input terminal thereof when the control input terminal thereof is supplied with the control signal having the logic value of "1";

a NAND circuit (12) having a f irst input terminal connected to an output terminal of said first exclusive OR circuit (11.0) and a second input terminal connected to an output terminal of said fourth two-input one-output multiplexer (10.3A), said NAND circuit NANDing the first exclusively ORed output signal supplied to the first input terminal thereof and the fourth selected output signal supplied to the second input terminal thereof to produce a NANDed output signal;

a NOR circuit (13) having a first input terminal connected to the output terminal of said first exclusive OR circuit (11.0) and a second input terminal connected to the output terminal of Isaid fourth two-input one-output multiplexer (10.3A), said NOR circuit (13) NORing the first exclusively ORed output signal supplied to the first input terminal thereof and the fourth selected output signal supplied to the second input terminal thereof to produce a NORed output signal;

a third exclusive OR circuit (11.2) having a first input terminal connected to the output terminal of said first exclusive OR circuit (11.0) and a second input terminal connected to the output terminal of said second exclusive OR circuit (11.1), said third exclusive OR circuit exclusively ORing the first exclusively ORed output signal supplied to the first input terminal thereof and the second exclusively ORed output signal supplied to the second input terminal thereof to produce a third exclusively ORed output signal;

an inverter (15.0) having an input terminal connected to an output terminal of said fifth two-input one-output multiplexer (10.4A), said inverter inverting the fifth selected output signal supplied to the input terminal thereof to produce an inverted output signal;

a NAND-OR circuit (14.0) having a first input terminal connected to the output terminal of said NAND circuit (12), a second input terminal connected to the output terminal of said NOR circuit (13), and a third input terminal connected to an output terminal of said inverter, said NAND-OR circuit ORing the NORed output signal supplied to the second input terminal thereof and the inverted output signal supplied to the third input terminal thereof to obtain an ORed result signal and NANDing the ORed result signal and the NANDed output signal supplied to the first input terminal thereof to produce an ORed and NANDed output signal;

first connecting means for connecting the output terminal of said NAND circuit (12) with said core logic carry generation output terminal (GO) to make said core logic carry generation output terminal (GO) produce the NANDed output signal as the core logic carry generation output signal;

second connecting means for connecting the output terminal of said NOR circuit (13) with said core logic carry propagation output terminal (PO) to make said core logic carry propagation output terminal (PO) produce the NORed output signal as the core logic carry propagation output signal;

third connecting means for connecting an output terminal of said NAND-OR circuit (14.0) with said core logic carry output terminal (C) to make said core logic carry output terminal (C) produce the ORed and NANDed output signal as the core logic carry output signal; and fourth connecting means for connecting an output terminal of said third exclusive OR circuit with said sum output terminal (S) to make said sum output terminal (S) produce the third exclusively ORed output signal as the summed output signal.

5. A core logic circuit as claimed in claim 1, wherein said core logic circuit (4C) comprises:

a first two-input one-output multiplexer (10.0) having a first input terminal connected to the first argument input terminal (A0) of said first argument input group, a second input terminal connected to the second argument input terminal (A1) of said first argument input group, and a control input terminal connected to the third argument input terminal (A2) of said first argument input group, said first two-input one-output multiplexer producing, as a first selected output signal, an input signal supplied to the first input terminal thereof when the control input terminal thereof is supplied with a control signal having a logic value of "0", said first two-input one-output multiplexer producing, as the first selected output signal, an input signal supplied to the second input terminal thereof when the control input terminal thereof is supplied with the control signal having a logic value of "1";

a second two-input one-output multiplexer (10.1) having a first input terminal connected to the first argument input terminal (B0) of said second argument input group, a second input terminal connected to the second argument input terminal (B1) of said second argument input group, and a control input terminal connected to the third argument input terminal (B2) of said second argument input group, said second two-input one-output multiplexer producing, as a second selected output signal, an input signal supplied to the first input terminal thereof when the control input terminal thereof is supplied with a control signal having a logic value of "0", said second two-input one-output multiplexer producing, as the second selected output signal, an input signal supplied to the second input terminal thereof when the control input terminal thereof is supplied with the control signal having a logic value of "1";

a third two-input one-output multiplexer (10.2) having a first input terminal connected to the fourth argument input terminal (B3) of said second argument input group, a second input terminal connected to said ripple-core logic carry input terminal (CCI), and a control input terminal connected to said first configuration input terminal (M0), said third two-input one-output multiplexer producing, as a third selected output terminal, an input signal supplied to the first input terminal thereof when the control input terminal thereof is supplied with a control signal having a logic value of "0", said third two-input one-output multiplexer producing, as the third selected output terminal, an input signal supplied to the second input terminal thereof when the control input terminal thereof is supplied with the control signal having a logic value of "1";

a first exclusive OR circuit (11.0) having a first input terminal connected to the fourth argument input terminal (A3) of said first argument input group and a second input terminal connected to an output terminal of said first two-input one-output multiplexer (10.0), said first exclusive OR circuit exclusively ORing an input signal supplied to the first input terminal thereof and the first selected output signal supplied to the second input terminal thereof to produce a first exclusively ORed output signal;

a second exclusive OR circuit (11.1) having a first input terminal connected to an output terminal of said second two-input one-output multiplexer (10.1) and a second input terminal connected to an output terminal of said third two-input one-output multiplexer (10.2), said second exclusive OR circuit exclusively ORing the second selected output signal supplied to the first input terminal thereof and the third selected output signal supplied to the second input terminal thereof to produce a second exclusively ORed output signal;

a fourth two-input one-output multiplexer (10.3A) having a first input terminal connected to an output terminal of said second exclusive OR circuit (11.1), a second input terminal connected to the output terminal of said second two-input one-output multiplexer (10.1), and a control input terminal connected to said second configuration input terminal (M1), said fourth two-input one-output multiplexer producing, as a fourth selected output signal, the second exclusively ORed output signal supplied to the first input terminal thereof when the control input terminal thereof is supplied with a control signal having a logic value of "0", said fourth two-input one-output multiplexer producing, as the fourth selected output signal, the second selected output signal supplied to the second input terminal thereof when the control input terminal thereof is supplied with the control signal having the logic value of "1";

a fifth two-input one-output multiplexer (10.4A) having a first input terminal connected to said third configuration input terminal (M2), a second input terminal connected to the output terminal of said third two-input one-output multiplexer (10.2), and a control input terminal connected to said second configuration input terminal (M1), said fifth two-input one-output multiplexer producing, as a fifth selected output signal, an input signal supplied to the first input terminal thereof when the control input terminal thereof is supplied with a control signal having a logic value of "0", said fifth two-input one-output multiplexer producing, as the fifth selected output signal, the third selected output signal supplied to the second input terminal thereof when the control input terminal thereof is supplied with the control signal having the logic value of "1";

a NAND circuit (12) having a first input terminal connected to an output terminal of said first exclusive OR circuit (11.0) and a second input terminal connected to an output terminal of said fourth two-input one-output multiplexer (10.3A), said NAND circuit NANDing the first exclusively ORed output signal supplied to the first input terminal thereof and the fourth selected output signal supplied to the second input terminal thereof to produce a NANDed output signal;

a NOR circuit (13) having a first input terminal connected to the output terminal of said first exclusive OR circuit (11.0) and a second input terminal connected to the output terminal of said fourth two-input one-output multiplexer (10.3A), said NOR circuit (13) NORing the first exclusively ORed output signal supplied to the first input terminal thereof and the fourth selected output signal supplied to the second input terminal thereof to produce a NORed output signal;

a third exclusive OR circuit (11.2) having a first input terminal connected to the output terminal of said first exclusive OR circuit (11.0) and a second input terminal connected to the output terminal of said second exclusive OR circuit (11.1), said third exclusive OR circuit exclusively ORing the first exclusively ORed output signal supplied to the first input terminal thereof and the second exclusively ORed output signal supplied to the second input terminal thereof to produce a third exclusively ORed output signal;

a two-input one-output inverting multiplexer (35.0) having a first input terminal connected to an output terminal of said NAND circuit (12), a second input terminal connected to an output terminal of said NOR circuit (13), and a control input terminal connected to an output terminal of said fifth two-input one-output multiplexer (10.4A), said two-input one-output inverting multiplexer producing, as an inverted selected output signal, a signal obtaining by inverting the NANDed output signal supplied to the first input terminal thereof when the control input terminal thereof is supplied with a control signal having a logic value of "0", said two-input one-output inverting multiplexer producing, as the inverted selected output signal, a signal obtained by inverting the NORed output signal supplied to the second input terminal thereof when the control input terminal thereof is supplied with the control signal having the logic value "1";

first connecting means for connecting the output terminal of said NAND circuit (12) with said core logic carry generation output terminal (GO) to make said core logic carry generation output terminal (GO) produce the NANDed output signal as the core logic carry generation output signal;

second connecting means for connecting the output terminal of said NOR circuit (13) with said core logic carry propagation output terminal (PO) to make said core logic carry propagation output terminal (PO) produce the NORed output signal as the core logic carry propagation output signal;

third connecting means for connecting an output terminal of said two-input one-output inverting multiplexer (35.0) with said core logic carry output terminal (C) to make said core logic carry output terminal (C) produce the inverted selected output signal as the core logic carry output signal; and fourth connecting means for connecting an output terminal of said third exclusive OR circuit with said sum output terminal (S) to make said sum output terminal (S) produce the third exclusively ORed output signal as the summed output signal.

6. A programmable core logic circuit comprising:

a core logic circuit (4, 4A, 4B, 4C) having a first argument input group consisting of first through fourth argument input terminals (A0, A1, A2, A3), a second argument input group consisting of first though fourth argument input terminals (B0, B1, B2, B3), first through third configuration input terminals (M0, M1, M2), a core logic carry output terminal (C) for outputting a core logic carry output signal, a core logic carry generation output terminal (GO) for outputting a core logic carry generation output signal, a core logic carry propagation output terminal (PO) for outputting a core logic carry propagation output signal, a ripple-core logic carry input terminal (CCI) for inputting a ripple-core logic carry input signal, and a sum output terminal (S) for outputting a summed output signal; and an input block (3) connected to said core logic circuit and to interconnecting wires (8), said input block including first through fourth input selection units (3.A0, 3.A1, 3.A2, 3.A3) connected to the first through the fourth argument input terminals (A0, A1, A2, A3) in said first argument input group, respectively, and fifth through eighth input selection units (3.B0, 3.B1, 3.B2, 3.B3) connected to the first through the fourth argument input terminals (B0, B1, B2, B3) in said second argument input group, said first through said fourth input selection units selecting, as first through fourth input selected signals, one of signals on said interconnecting wires, a fixed logic value of "1", and a fixed logic value of "0" to supply the first through the fourth input selected signals to the first through the fourth argument input terminals (A0, A1, A2, A3) in said first argument input group, respectively, said fifth through eighth input selection units selecting, as fifth through eighth input selected signals, one of signals on said interconnecting wires, the fixed logic value of "1", and the fixed logic value of "0" to supply the fifth through the eighth input selected signals to the first through the fourth argument input terminals (B0, B1, B2, B3) in said second argument input group, respectively.

7. A programmable core logic circuit as claimed in claim 6, wherein said core logic circuit (4) comprises:

a first two-input one-output multiplexer (10.0) having a first input terminal connected to the first argument input terminal (A0) of said first argument input group, a second input terminal connected to the second argument input terminal (A1) of said first argument input group, and a control input terminal connected to the third argument input terminal (A2) of said first argument input group, said first two-input one-output multiplexer producing, as a first selected output signal, an input signal supplied to the first input terminal thereof when the control input terminal thereof is supplied with a control signal having a logic value of "0", said first two-input one-output multiplexer producing, as the first selected output signal, an input signal supplied to the second input terminal thereof when the control input terminal thereof is supplied with the control signal having a logic value of "1";

a second two-input one-output multiplexer (10.1) having a first input terminal connected to the first argument input terminal (B0) of said second argument input group, a second input terminal connected to the second argument input terminal (B1) of said second argument input group, and a control input terminal connected to the third argument input terminal (B2) of said second argument input group, said second two-input one-output multiplexer producing, as a second selected output signal, an input signal supplied to the first input terminal thereof when the control input terminal thereof is supplied with a control signal having a logic value of "0", said second two-input one-output multiplexer producing, as the second selected output signal, an input signal supplied to the second input terminal thereof when the control input terminal thereof is supplied with the control signal having a logic value of "1";

a third two-input one-output multiplexer (10.2) having a first input terminal connected to the fourth argument input terminal (B3) of said second argument input group, a second input terminal connected to said ripple-core logic carry input terminal (CCI), and a control input terminal connected to said first configuration input terminal (M0), said third two-input one-output multiplexer producing, as a third selected output signal, an input signal supplied to the first input terminal thereof when the control input terminal thereof is supplied with a control signal having a logic value of "0", said third two-input one-output multiplexer producing, as the third selected output signal, an input signal supplied to the second input terminal thereof when the control input terminal thereof is supplied with the control signal having a logic value of "1";

a first exclusive OR circuit (11.0) having a first input terminal connected to the fourth argument input terminal (A3) of said first argument input group and a second input terminal connected to an output terminal of said first two-input one-output multiplexer (10.0), said first exclusive OR circuit exclusively ORing an input signal supplied to the first input terminal thereof and the first selected output signal supplied to the second input terminal thereof to produce a first exclusively ORed output signal;

a second exclusive OR circuit (11.1) having a first input terminal connected to an output terminal of said second two-input one-output multiplexer (10.1) and a second input terminal connected to an output terminal of said third two-input one-output multiplexer (10.3), said second exclusive OR circuit exclusively ORing the second selected output signal supplied to the first input terminal thereof and the third selected output signal supplied to the second input terminal thereof to produce a second exclusively ORed output signal;

a fourth two-input one-output multiplexer (10.3) having a first input terminal connected to the output terminal of said second two-input one-output multiplexer (10.1), a second input terminal connected to an output terminal of said second exclusive OR circuit (11.1), and a control input terminal connected to said second configuration input terminal (M1), said fourth two-input one-output multiplexer producing, as a fourth selected output signal, the second selected output signal supplied to the first input terminal thereof when the control input terminal thereof is supplied with a control signal having a logic value of "0", said fourth two-input one-output multiplexer producing, as the fourth selected output signal, the second exclusively ORed output signal when the control input terminal thereof is supplied with the control signal having the logic value of "1";

a fifth two-input one-output multiplexer (10.4) having a first input terminal connected to the output terminal of said third two-input one-output multiplexer (10.2), a second input terminal connected to said third configuration input terminal (M2), and a control input terminal connected to said second configuration input terminal (M1), said fifth two-input one-output multiplexer producing, as a fifth selected output signal, the third selected output signal supplied to the first input terminal thereof when the control input terminal thereof is supplied with a control signal having a logic value of "0", said fifth two-input one-output multiplexer producing, as the fifth selected output signal, an input signal supplied to the second input terminal thereof when the control input terminal thereof is supplied with the control signal having the logic value of "1";

a NAND circuit (12) having a first input terminal connected to an output terminal of said first exclusive OR circuit (11.0) and a second input terminal connected to an output terminal of said fourth two-input one-output multiplexer (10.3), said NAND circuit NANDing the first exclusively ORed output signal supplied to the first input terminal thereof and the fourth selected output signal supplied to the second input terminal thereof to produce a NANDed output signal;

a NOR circuit (13) having a first input terminal connected to the output terminal of said first exclusive OR circuit (11.0) and a second input terminal connected to the output terminal of said fourth two-input one-output multiplexer (10.3), said NOR circuit (13) NORing the first exclusively ORed output signal supplied to the first input terminal thereof and the fourth selected output signal supplied to the second input terminal thereof to produce a NORed output signal;

a third exclusive OR circuit (11.2) having a first input terminal connected to an output terminal of said first exclusive OR circuit (11.0) and a second input terminal connected to an output terminal of said second exclusive OR circuit (11.1), said third exclusive OR circuit exclusively ORing the first exclusively ORed output signal supplied to the first input terminal thereof and the second exclusively ORed output signal supplied to the second input terminal thereof to produce a third exclusively ORed output signal;

an inverter (15.0) having an input terminal connected to an output terminal of said fifth two-input one-output multiplexer (10.4), said inverter inverting the fifth selected output signal supplied to the input terminal thereof to produce an inverted output signal;

a NAND-OR circuit (14.0) having a first input terminal connected to an output terminal of said NNND circuit (12), a second input terminal connected to an output terminal of said NOR circuit (13), and a third input terminal connected to an output terminal of said inverter (15.0), said NAND-OR circuit ORing the NORed output signal supplied to the second input terminal thereof and the inverted output signal supplied to the third input terminal thereof to obtain an ORed result signal and NANDing the ORed result signal and the NANDed output signal supplied to the first input terminal thereof to produce an ORed and NANDed output signal;

first connecting means for connecting an output terminal of said NAND circuit (12) with said core logic carry generation output terminal (GO) to make said core logic carry generation output terminal (GO) produce the NANDed output signal as the core logic carry generation output signal;

second connecting means for connecting an output terminal of said NOR circuit (13) with said core logic carry propagation output terminal (PO) to make said core logic carry propagation output terminal (PO) produce the NORed output signal as the core logic carry propagation output signal;

third connecting means for connecting an output terminal of said NAND-OR circuit (14.0) with said core logic carry output terminal (C) to make said core logic carry output terminal (C) produce the ORed and NANDed output signal as the core logic carry output signal; and fourth connecting means for connecting an output terminal of said third exclusive OR circuit (11.2) with said sum output terminal (S) to make said sum output terminal (S) produce the third exclusively ORed output signal as the summed output signal.

8. A programmable core logic circuit as claimed in claim 6, wherein said core logic circuit (4A) comprises:

a first two-input one-output multiplexer (10.0) having a first input terminal connected to the first argument input terminal (A0) of said first argument input group, a second input terminal connected to the second argument input terminal (A1) of said first argument input group, and a control input terminal connected to the third argument input terminal (A2) of said first argument input group, said first two-input one-output multiplexer producing, as a first selected output signal, an input signal supplied to the first input terminal thereof when the control input terminal thereof is supplied with a control signal having a logic value of "0", said first two-input one-output multiplexer producing, as the first selected output signal, an input signal supplied to the second input terminal thereof when the control input terminal thereof is supplied with the control signal having a logic value of "1";

a second two-input one-output multiplexer (10.1) having a first input terminal connected to the first argument input terminal (B0) of said second argument input group, a second input terminal connected to the second argument input terminal (B1) of said second argument input group, and a control input terminal connected to the third argument input terminal (B2) of said second argument input group, said second two-input one-output multiplexer producing, as a second selected output signal, an input signal supplied with the first input terminal thereof when the control input terminal thereof is supplied with a control signal having a logic value of "0", said second two-input one-output multiplexer producing, as the second selected output signal, an input signal supplied with the second input terminal thereof when the control input terminal thereof is supplied with the control signal having a logic value of "1";

a third two-input one-output multiplexer (10.2) having a first input terminal connected to the fourth argument input terminal (B3) of said second argument input group, a second input terminal connected to said ripple-core logic carry input terminal (CCI), and a control input terminal connected to said first configuration input terminal (M0), said third two-input one-output multiplexer producing, as a third selected output terminal, an input signal supplied to the first input terminal thereof when the control input terminal thereof is supplied with a control signal having a logic value of "0", said third two-input one-output multiplexer producing, as the third selected output terminal, an input signal supplied to the second input terminal thereof when the control input terminal thereof is supplied with the control signal having a logic value of "1";

a first exclusive OR circuit (11.0) having a first input terminal connected to the fourth argument input terminal (A3) of said first argument input group and a second input terminal connected to an output terminal of said first two-input one-output multiplexer (10.0), said first exclusive OR circuit exclusively ORing an input signal supplied with the first input terminal thereof and the first selected output signal supplied with the second input terminal thereof to produce a first exclusively ORed output signal;

a second exclusive OR circuit (11.1) having a first input terminal connected to an output terminal of said second two-input one-output multiplexer (10.1) and a second input terminal connected to an output terminal of said third two-input one-output multiplexer (10.2), said second exclusive OR circuit exclusively ORing the second selected output signal supplied to the first a input terminal thereof and the third selected output signal supplied to the second input terminal thereof to produce a second exclusively ORed output signal;

a fourth two-input one-output multiplexer (10.3) having a first input terminal connected to the output terminal of said second two-input one-output multiplexer (10.1), a second input terminal connected to an output terminal of said second exclusive OR circuit (11.1), and a control input terminal connected to said second configuration input terminal (M1), said fourth two-input one-output multiplexer producing, as a fourth selected output signal, the second selected output signal supplied to the first input terminal thereof when the control input terminal thereof is supplied with a control signal having a logic value of "0", said fourth two-input one-output multiplexer producing, as the fourth selected output signal, the second exclusive ORed signal supplied to the second input terminal thereof when the control input terminal thereof is supplied with the control signal having the logic value of "1";

a fifth two-input one-output multiplexer (10.4) having a first input terminal connected to an output terminal of said third two-input one-output multiplexer (10.2), a second input terminal connected to said third configuration input terminal (M2), and a control input terminal connected to said second configuration input terminal (M1), said fifth two-input one-output multiplexer producing, as a fifth selected output signal, the third selected output signal supplied to the first input terminal thereof when the control input terminal thereof is supplied with a control signal having a logic value of "0", said fifth two-input one-output multiplexer producing, as the fifth selected output signal, an input signal supplied to the second input terminal thereof when the control input terminal thereof is supplied with the control signal having the logic value of "1";

a NAND circuit (12) having a first input terminal connected to an output terminal of said first exclusive OR circuit (11.0) and a second input terminal connected to an output terminal of said fourth two-input one-output multiplexer (10.3), said NAND circuit NANDing the first exclusively ORed output signal supplied to the first input terminal thereof and the fourth selected output signal supplied to the second input terminal thereof to produce a NANDed output signal;

a NOR circuit (13) having a first input terminal connected to the output terminal of said first exclusive OR circuit (11.0) and a second input terminal connected to the output terminal of said fourth two-input one-output multiplexer (10.3), said NOR circuit (13) NORing the first exclusively ORed output signal supplied to the first input terminal thereof and the fourth selected output signal supplied to the second input terminal thereof to produce a NORed output signal;

a third exclusive OR circuit (11.2) having a first input terminal connected to the output terminal of said first exclusive OR circuit (11.0) and a second input terminal connected to the output terminal of said second exclusive OR circuit (11.1), said third exclusive OR circuit exclusively ORing the first exclusively ORed output signal supplied to the first input terminal thereof and the second exclusively ORed output signal supplied to the second input terminal thereof to produce a third exclusively ORed output signal;

a two-input one-output inverting multiplexer (35.0) having a first input terminal connected to an output terminal of said NAND circuit (12), a second input terminal connected to an output terminal of said NOR circuit (13), and a control input terminal connected to an output terminal of said fifth two-input one-output multiplexer, said two-input one-output inverting multiplexer producing, as an inverted selected output signal, a signal obtaining by inverting the NANDed output signal supplied to the first input terminal thereof when the control input terminal thereof is supplied with a control signal having a logic value of "0", said two-input one-output inverting multiplexer producing, as the inverted selected output signal, a signal obtained by inverting the NORed output signal supplied to the second input terminal thereof when the control input terminal thereof is supplied with the control signal having the logic value "1";

first connecting means for connecting the output terminal of said N circuit (12) with said core logic carry generation output terminal (GO) to make said core logic carry generation output terminal (GO) produce the NANDed output signal as the core logic carry generation output signal;

second connecting means for connecting the output terminal of said NOR circuit (13) with said core logic carry propagation output terminal (PO) to make said core logic carry propagation output terminal (PO) produce the NORed output signal as the core logic carry propagation output signal;

third connecting means for connecting an output terminal of said two-input one-output inverting multiplexer (35.0) with said core logic carry output terminal (C) to make said core logic carry output terminal (C) produce the inverted selected output signal as the core logic carry output signal; and fourth connecting means for connecting an output terminal of said third exclusive OR circuit with said sum output terminal (S) to make said sum output terminal (S) produce the third exclusively ORed output signal as the summed output signal.

9. A programmable core logic circuit as claimed in claim 6, wherein said core logic circuit (4B) comprises:

a first two-input one-output multiplexer (10.0) having a first input terminal connected to the first argument input terminal (A0) of said first argument input group, a second input terminal connected to the second argument input terminal (A1) of said first argument input group, and a control input terminal connected to the third argument input terminal (A2) of said first argument input group, said first two-input one-output multiplexer producing, as a first selected output signal, an input signal supplied to the first input terminal thereof when the control input terminal thereof is supplied with a control signal having a logic value of "0", said first two-input one-output multiplexer producing, as the first selected output signal, an input signal supplied to the second input terminal thereof when the control input terminal thereof is supplied with the control signal having a logic value of "1";

a second two-input one-output multiplexer (10.1) having a first input terminal connected to the first argument input terminal (B0) of said second argument input group, a second input terminal connected to the second argument input terminal (B1) of said second argument input group, and a control input terminal connected to the third argument input terminal (B2) of said second argument input group, said second two-input one-output multiplexer producing, as a second selected output signal, an input signal supplied to the first input terminal thereof when the control input terminal thereof is supplied with a control signal having a logic value of "0", said second two-input one-output multiplexer producing, as the second selected output signal, an input signal supplied to the second input terminal thereof when the control input terminal thereof is supplied with the control signal having a logic value of "1";

a third two-input one-output multiplexer (10.2) having a first input terminal connected to the fourth argument input terminal (B3) of said second argument input group, a second input terminal connected to said ripple-core logic carry input terminal (CCI), and a control input terminal connected to said first configuration input terminal (M0), said third two-input one-output multiplexer producing, as a third selected output signal, an input signal supplied to the first input terminal thereof when the control input terminal thereof is supplied with a control signal having a logic value of "0", said third two-input one-output multiplexer producing, as the third selected output signal, an input signal supplied to the second input terminal thereof when the control input terminal thereof is supplied with the control signal having a logic value of "1";

a first exclusive OR circuit (11.0) having a first input terminal connected to the fourth argument input terminal (A3) of said first argument input group and a second input terminal connected to an output terminal of said first two-input one-output multiplexer (10.0), said first exclusive OR circuit exclusively ORing an input signal supplied to the first input terminal thereof and the first selected output signal supplied to the second input terminal thereof to produce a first exclusively ORed output signal;

a second exclusive OR circuit (11.1) having a first input terminal connected to an output terminal of said second two-input one-output multiplexer (10.1) and a second input terminal connected to an output terminal of said third two-input one-output multiplexer (10.2), said second exclusive OR circuit exclusively ORing the second selected output signal supplied to the first input terminal thereof and the third selected output signal supplied to the second input terminal thereof to produce a second exclusively ORed output signal;

a fourth two-input one-output multiplexer (10.3A) having a first input terminal connected to an output terminal of said second exclusive OR circuit (11.1), a second input terminal connected to the output terminal of said second two-input one-output multiplexer (10.1), and a control input terminal connected to said second configuration input terminal (M1), said fourth two-input one-output multiplexer producing, as a fourth selected output signal, the second exclusively ORed output signal supplied to the first input terminal thereof when the control input terminal thereof is supplied with a control signal having a logic value of "0", said fourth two-input one-output multiplexer producing, as the fourth selected output signal, the second selected output signal supplied to the second input terminal thereof when the control input terminal thereof is supplied with the control signal having the logic value of "1";

a fifth two-input one-output multiplexer (10.4A) having a first input terminal connected to said third configuration input terminal (M2), a second input terminal connected to the output terminal of said third two-input one-output multiplexer (10.2), and a control input terminal connected to said second configuration input terminal (M1), said fifth two-input one-output multiplexer producing, as a fifth selected output signal, an input signal supplied to the first input terminal thereof when the control input terminal thereof is supplied with a control signal having a logic value of "0", said fifth two-input one-output multiplexer producing, as the fifth selected output signal, the third selected output signal supplied to the second input terminal thereof when the control input terminal thereof is supplied with the control signal having the logic value of "1";

a NAND circuit (12) having a first input terminal connected to an output terminal of said first exclusive OR circuit (11.0) and a second input terminal connected to an output terminal of said fourth two-input one-output multiplexer (10.3A), said NAND circuit NANDing the first exclusively ORed output signal supplied to the first input terminal thereof and the fourth selected output signal supplied to the second input terminal thereof to produce a NANDed output signal;

a NOR circuit (13) having a first input terminal connected to the output terminal of said first exclusive OR circuit (11.0) and a second input terminal connected to the output terminal of said fourth two-input one-output multiplexer (10.3A), said NOR circuit (13) NORing the first exclusively ORed output signal supplied to the first input terminal thereof and the fourth selected output signal supplied to the second input terminal thereof to produce a NORed output signal;

a third exclusive OR circuit (11.2) having a first input terminal connected to the output terminal of said first exclusive OR circuit (11.0) and a second input terminal connected to the output terminal of said second exclusive OR circuit (11.1), said third exclusive OR circuit exclusively ORing the first exclusively ORed output signal supplied to the first input terminal thereof and the second exclusively ORed output signal supplied to the second input terminal thereof to produce a third exclusively ORed output signal;

an inverter (15.0) having an input terminal connected to an output terminal of said fifth two-input one-output multiplexer (10.4A), said inverter inverting the fifth selected output signal supplied to the input terminal thereof to produce an inverted output signal;

a NAND-OR circuit (14.0) having a first input terminal connected to the output terminal of said NAND circuit (12), a second input terminal connected to the output terminal of said NOR circuit (13),and a third input terminal connected to an output terminal of said inverter, said NAND-OR circuit ORing the NORed output signal supplied to the second input terminal thereof and the inverted output signal supplied to the third input terminal thereof to obtain an ORed result signal and NANDing the ORed result signal and the NANDed output signal supplied to the first input terminal thereof to produce an ORed and NANDed output signal;

first connecting means for connecting the output terminal of said NAND circuit (12) with said core logic carry generation output terminal (GO) to make said core logic carry generation output terminal (GO) produce the NANDed output signal as the core logic carry generation output signal;

second connecting means for connecting the output terminal of said NOR circuit (13) with said core logic carry propagation output terminal (PO) to make said core logic carry propagation output terminal (PO) produce the NORed output signal as the core logic carry propagation output signal;

third connecting means for connecting an output terminal of said NAND-OR circuit (14.0) with said core logic carry output terminal (C) to make said core logic carry output terminal (C) produce the ORed and NANDed output signal as the core logic carry output signal; and fourth connecting means for connecting an output terminal of said third exclusive OR circuit with said sum output terminal (S) to make said sum output terminal (S) produce the third exclusively ORed output signal as the summed output signal.

10. A programmable core logic circuit as claimed in claim 6, wherein said core logic circuit (4C) comprises:

a first two-input one-output multiplexer (10.0) having a first input terminal connected to the first argument input terminal (A0) of said first argument input group, a second input 3-terminal connected to the second argument input terminal (A1) of said first argument input group, and a control input terminal connected to the third argument input terminal (A2) of said first argument input group, said first two-input one-output multiplexer producing, as a first selected output signal, an input signal supplied to the first input terminal thereof when the control input terminal thereof is supplied with a control signal having a logic value of "0", said first two-input one-output multiplexer producing, as the first selected output signal, an input signal supplied to the second input terminal thereof when the control input terminal thereof is supplied with the control signal having a logic value of "1";

a second two-input one-output multiplexer (10.1) having a first input terminal connected to the first argument input terminal (B0) of said second argument input group, a second input terminal connected to the second argument input terminal (B1) of said second argument input group, and a control input terminal connected to the third argument input terminal (B2) of said second argument input group, said second two-input one-output multiplexer producing, as a second selected output signal, an input signal supplied to the first input terminal thereof when the control input terminal thereof is supplied with a control signal having a logic value of "0", said second two-input one-output multiplexer producing, as the second selected output signal, an input signal supplied to the second input terminal thereof when the control input terminal thereof is supplied with the control signal having a logic value of "1";

a third two-input one-output multiplexer (10.2) having a first input terminal connected to the fourth argument input terminal (B3) of said second argument input group, a second input terminal connected to said ripple-core logic carry input terminal (CCI), and a control input terminal connected to said first configuration input terminal (M0), said third two-input one-output multiplexer producing, as a third selected output terminal, an input signal supplied to the first input terminal thereof when the control input terminal thereof is supplied with a control signal having a logic value of "0", said third two-input one-output multiplexer producing, as the third selected output terminal, an input signal supplied to the second input terminal thereof when the control input terminal thereof is supplied with the control signal having a logic value of "1";

a first exclusive OR circuit (11.0) having a first input terminal connected to the fourth argument input terminal (A3) of said first argument input group and a second input terminal connected to an output terminal of said first two-input one-output multiplexer (10.0), said first exclusive OR circuit exclusively ORing an input signal supplied to the first input terminal thereof and the first selected output signal supplied to the second input terminal thereof to produce a first exclusively ORed output signal;

a second exclusive OR circuit (11.1) having a first input terminal connected to an output terminal of said second two-input one-output multiplexer (10.1) and a second input terminal connected to an output terminal of said third two-input one-output multiplexer (10.2), said second exclusive OR circuit exclusively ORing the second selected output signal supplied to the first input terminal thereof and the third selected output signal supplied to the second input terminal thereof to produce a second exclusively ORed output signal;

a fourth two-input one-output multiplexer (10.3A) having a first input terminal connected to an output terminal of said second exclusive OR circuit (11.1), a second input terminal connected to the output terminal of said second two-input one-output multiplexer (10.1), and a control input terminal connected to said second configuration input terminal (M1), said fourth two-input one-output multiplexer producing, as a fourth selected output signal, the second exclusively ORed output signal supplied to the first input terminal thereof when the control input terminal thereof is supplied with a control signal having a logic value of "0", said fourth two-input one-output multiplexer producing, as the fourth selected output signal, the second selected output signal supplied to the second input terminal thereof when the control input terminal thereof is supplied with the control signal having the logic value of "1";

a fifth two-input one-output multiplexer (10.4A) having a first input terminal connected to said third configuration input terminal (M2), a second input terminal connected to the output terminal of said third two-input one-output multiplexer (10.2), and a control input terminal connected to said second configuration input terminal (M1), said fifth two-input one-output multiplexer producing, as a fifth selected output signal, an input signal supplied to the first input terminal thereof when the control input terminal thereof is supplied with a control zip signal having a logic value of "0", said fifth two-input one-output multiplexer producing, as the fifth selected output signal, the third selected output signal supplied to the second input terminal thereof when the control input terminal thereof is supplied with the control signal having the logic value of "1";

a NAND circuit (12) having a first input terminal connected to an output terminal of said first exclusive OR circuit (11.0) and a second input terminal connected to an output terminal of said fourth two-input one-output multiplexer (10.3A), said NAND circuit NANDing the first exclusively ORed output signal supplied to the first input terminal thereof and the fourth selected output signal supplied to the second input terminal thereof to produce a NANDed output signal;

a NOR circuit (13) having a first input terminal connected to the output terminal of said first exclusive OR circuit (11.0) and a second input terminal connected to the output terminal of said fourth two-input one-output multiplexer (10.3A), said NOR circuit (13) NORing the first exclusively ORed output signal supplied to the first input terminal thereof and the fourth selected output signal supplied to the second input terminal thereof to produce a NORed output signal;

a third exclusive OR circuit (11.2) having a first input terminal connected to the output terminal of said first exclusive OR circuit (11.0) and a second input terminal connected to the output terminal of said second exclusive OR circuit (11.1), said third exclusive OR circuit exclusively ORing the first exclusively ORed output signal supplied to the first input terminal thereof and the second exclusively ORed output signal supplied to the second input terminal thereof to produce a third exclusively ORed output signal;

a two-input one-output inverting multiplexer (35.0) having a first input terminal connected to an output terminal of said NAND circuit (12), a second input terminal connected to an output terminal of said NOR circuit (13), and a control input terminal connected to an output terminal of said fifth two-input one-output multiplexer (10.4A), said two-input one-output inverting multiplexer producing, as an inverted selected output signal, a signal obtaining by inverting the NANDed output signal supplied to the first input terminal thereof when the control input terminal thereof is supplied with a control signal having a logic value of "0", said two-input one-output inverting multiplexer producing, as the inverted selected output signal, a signal obtained by inverting the NORed output signal supplied to the second input terminal thereof when the control input terminal thereof is supplied with the control signal having the logic value "1";

first connecting means for connecting the output terminal of said NAND circuit (12) with said core logic carry generation output terminal (GO) to make said core logic carry generation output terminal (GO) produce the NANDed output signal as the core logic carry generation output signal;

second connecting means for connecting the output terminal 41 of said NOR circuit (13) with said core logic carry propagation output terminal (PO) to make said core logic carry propagation output terminal (PO) produce the NORed output signal as the core logic carry propagation output signal;

third connecting means for connecting an output terminal of said two-input one-output inverting multiplexer (35.0) with said core logic carry output terminal (C) to make said core logic carry output terminal (C) produce the inverted selected output signal as the core logic carry output signal; and fourth connecting means for connecting an output terminal of said third exclusive OR circuit with said sum output terminal (S) to make said sum output terminal (S) produce the third exclusively ORed output signal as the summed output signal.

11. A programmable core logic circuit as claimed in claim 6, wherein an n-th input selection unit comprises a memory circuit for storing a logic value to produce the logic value as an output value, where n represents each of 1 through 8, said n-th input selection unit determining an n-th input selected signal in accordance with the output value of said memory circuit.

12. A programmable core logic circuit as claimed in claim 6, wherein an n-th input selection unit, where n represents each of 1 through 8, comprises:

a memory circuit (6.6) acting as means for supplying the fixed logic value, said memory circuit storing a logic value of one bit to produce a stored signal;

a multiplexer (32) connected to said interconnecting wires (8) and said memory circuit, said multiplexer having M input terminals and N control input terminals, where M and N represents first and second positive numbers, the first positive number M being larger than the second positive number N, one of the M input terminals being connected to an output terminal of said memory circuit, said multiplexer selecting one of the stored signal and i the signals on said interconnecting wires as an n-th input selected signal.

13. A programmable core logic circuit as claimed in claim 6, wherein each of said first through said eighth input selection units includes means (22B) for supplying the fixed logic value of "0", said means for supplying the fixed logic value of "0" comprising:

a memory circuit (6.5) for storing a logic value of one bit to produce a stored signal; and an NMOS transistor (24) having a source electrode connected to a ground terminal, a gate electrode connected to an output terminal of said memory circuit, and a drain electrode as an output terminal of said means for supplying the fixed logic value of "0"

14. A programmable core logic circuit as claimed in claim 6, wherein each of said first through said eighth input selection units includes means (22C) for supplying the fixed logic value of "1", said means for supplying the fixed logic value of "1" comprising:

a memory circuit (6.4) for storing a logic value of one bit to produce a stored signal; and a PMOS transistor (25) having a source electrode connected to a power source terminal, a gate electrode connected to an output terminal of said memory circuit, and a drain electrode as an output terminal of said means for supplying the fixed logic value of "1".

15. A programmable core logic circuit as claimed in claim 6, wherein each of said first through said eighth input selection units includes means (22A) for supplying the fixed logic value, said means for supplying the fixed logic value comprising:

a memory circuit (6.5) for storing a logic value of one bit to produce a stored signal;

a resistor (31) having high-resistance, said resistor having an end connected to a power source terminal; and an NMOS transistor (24) having a source electrode connected to a ground terminal, a gate electrode connected to an output terminal of said memory circuit, and a drain electrode connected to another end of said high resistor, the drain electrode of said NMOS transistor being connected to an output terminal of said means for supplying the fixed logic value.

16. A logic block comprising:

a core logic circuit (4, 4A, 4B, 4C) having a first argument input group consisting of first through fourth argument input terminals (A0, A1, A2, A3), a second argument input group consisting of first though fourth argument input terminals (B0, B1, B2, B3), first through third configuration input terminals (M0, M1, M2), a core logic carry output terminal (C) for outputting a core logic carry output signal, a core logic carry generation output terminal (GO) for outputting a core logic carry generation output signal, a core logic carry propagation output terminal (PO) for outputting a core logic carry propagation output signal, a ripple-core logic carry input terminal (CCI) for inputting a ripple-core logic carry input signal, and a sum output terminal (S) for outputting a summed output signal;

first through third memory circuits (6.0, 6.1, 6.2) connected to said first through said third configuration input terminals (M0, M1, M2), respectively, said first through said third memory circuits storing a logic value of one bit as first through third stored signals, said first through said third memory circuits supplying the first through the third stored signals to said first through said third configuration input terminals, respectively; and a carry logic circuit (5, 5A) having a ripple carry input terminal (RCI) for inputting a ripple carry input signal, a ripple carry output terminal (RCO) for outputting a ripple carry output signal, a ripple-core logic carry output terminal (CCO) for supplying said ripple-core logic carry input terminal (CCI) with a ripple-core logic carry output signal as the ripple-core logic carry input signal, a core logic carry generation input terminal (G) for being supplied from said core logic carry generation output terminal (GO) with the core logic carry generation output signal as a core logic carry generation input signal, and a core logic carry propagation input terminal (P) for being supplied from said core logic carry propagation output terminal (PO) with the core logic carry propagation output signal as a core logic carry propagation input signal.

17. A logic block as claimed in claim 16, wherein said core logic circuit (4) comprises:

a first two-input one-output multiplexer (10.0) having a first input terminal connected to the first argument input terminal (A0) of said first argument input group, a second input terminal connected to the second argument input terminal (A1) of said first argument input group, and a control input terminal connected to the third argument input terminal (A2) of said first argument input group, said first two-input one-output multiplexer producing, as a first selected output signal, an input signal supplied to the first input terminal thereof when the control input terminal thereof is supplied with a control signal having a logic value of "0", said first two-input one-output multiplexer producing, as the first selected output signal, an input signal supplied to the second input terminal thereof when the control input terminal thereof is supplied with the control signal having a logic value of "1";

a second two-input one-output multiplexer (10.1) having a first input terminal connected to the first argument input terminal (B0) of said second argument input group, a second input terminal connected to the second argument input terminal (B1) of said second argument input group, and a control input terminal connected to the third argument input terminal (B2) of said second argument input group, said second two-input one-output multiplexer producing, as a second selected output signal, an input signal supplied to the first input terminal thereof when the control input terminal thereof is supplied with a control signal having a logic value of "0", said second two-input one-output multiplexer producing, as the second selected output signal, an input signal supplied to the second input terminal thereof when the control input terminal thereof is supplied with the control signal having a logic value of "1";

a third two-input one-output multiplexer (10.2) having a first input terminal connected to the fourth argument input terminal (B3) of said second argument input group, a second input terminal connected to said ripple-core logic carry input terminal (CCI), and a control input terminal connected to said first configuration input terminal (M0), said third two-input one-output multiplexer producing, as a third selected output signal, an input signal supplied to the first input terminal thereof when the control input terminal thereof is supplied with a control signal having a logic value of "0", said third two-input one-output multiplexer producing, as the third selected output signal, an input signal supplied to the second input terminal thereof when the control input terminal thereof is supplied with the control signal having a logic value of "1";

a first exclusive OR circuit (11.0) having a first input terminal connected to the fourth argument input terminal (A3) of said first argument input group and a second input terminal connected to an output terminal of said first two-input one-output multiplexer (10.0), said first exclusive OR circuit exclusively ORing an input signal supplied to the first input terminal thereof and the first selected output signal supplied to the second input terminal thereof to produce a first exclusively ORed output signal;

a second exclusive OR circuit (11.1) having a first input terminal connected to an output terminal of said second two-input one-output multiplexer (10.1) and a second input terminal connected to an output terminal of said third two-input one-output multiplexer (10.3), said second exclusive OR circuit exclusively ORing the second selected output signal supplied to the first input terminal thereof and the third selected output signal supplied to the second input terminal thereof to produce a second exclusively ORed output signal;

a fourth two-input one-output multiplexer (10.3) having a first input terminal connected to the output terminal of said second two-input one-output multiplexer (10.1), a second input terminal connected to an output terminal of said second exclusive OR circuit (11.1), and a control input terminal connected to said second configuration input terminal (M1), said fourth two-input one-output multiplexer producing, as a fourth selected output signal, the second selected output signal supplied to the first input terminal thereof when the control input terminal thereof is supplied with a control signal having a logic value of "0", said fourth two-input one-output multiplexer producing, as the fourth selected output signal, the second exclusively ORed output signal when the control input terminal thereof is supplied with the control signal having the logic value of "1";

a fifth two-input one-output multiplexer (10.4) having a first input terminal connected to the output terminal of said third two-input one-output multiplexer (10.2), a second input terminal connected to said third configuration input terminal (M2), and a control input terminal connected to said second configuration input terminal (M1), said fifth two-input one-output multiplexer producing, as a fifth selected output signal, the third selected output signal supplied to the first input terminal thereof when the control input terminal thereof is supplied with a control signal having a logic value of "0", said fifth two-input one-output multiplexer producing, as the fifth selected output signal, an input signal supplied to the second input terminal thereof when the control input terminal thereof is supplied with the control signal having the logic value of "1";

a NAND circuit (12) having a first input terminal connected to an output terminal of said first exclusive OR circuit (11.0) and a second input terminal connected to an output terminal of said fourth two-input one-output multiplexer (10.3), said NAND circuit NANDing the first exclusively ORed output signal supplied to the first input terminal thereof and the fourth selected output signal supplied to the second input terminal thereof to produce a NANDed output signal;

a NOR circuit (13) having a first input terminal connected to the output terminal of said first exclusive OR circuit (11.0) and a second input terminal connected to the output terminal of said fourth two-input one-output multiplexer (10.3), said NOR circuit (13) NORing the first exclusively ORed output signal supplied to the first input terminal thereof and the fourth selected output signal supplied to the second input terminal thereof to produce a NORed output signal;

a third exclusive OR circuit (11.2) having a first input terminal connected to an output terminal of said first exclusive OR circuit (11.0) and a second input terminal connected to an output terminal of said second exclusive OR circuit (11.1), said third exclusive OR circuit exclusively ORing the first exclusively ORed output signal supplied to the first input terminal thereof and the second exclusively ORed output signal supplied to the second input terminal thereof to produce a third exclusively ORed output signal;

an inverter (15.0) having an input terminal connected to an output terminal of said fifth two-input one-output multiplexer (10.4), said inverter inverting the fifth selected output signal supplied to the input terminal thereof to produce an inverted output signal;

a NAND-OR circuit (14.0) having a first input terminal connected to an output terminal of said NAND circuit (12), a second input terminal connected to an output terminal of said NOR circuit (13), and a third input terminal connected to an output terminal of said inverter (15.0), said NAND-OR circuit ORing the NORed output signal supplied to the second input terminal thereof and the inverted output signal supplied to the third input terminal thereof to obtain an ORed result signal and NANDing the ORed result signal and the NANDed output signal supplied to the first input terminal thereof to produce an ORed and NANDed output signal;

first connecting means for connecting an output terminal of said NAND circuit (12) with said core logic carry generation output terminal (GO) to make said core logic carry generation output terminal (GO) produce the NANDed output signal as the core logic carry generation output signal;

second connecting means for connecting an output terminal of said NOR circuit (13) with said core logic carry propagation output terminal (PO) to make said core logic carry propagation output terminal (PO) produce the NORed output signal as the core logic carry propagation output signal;

third connecting means for connecting an output terminal of said NAND-OR circuit (14.0) with said core logic carry output terminal (C) to make said core logic carry output terminal (C) produce the ORed and NANDed output signal as the core logic carry output signal; and fourth connecting means for connecting an output terminal of said third exclusive OR circuit (11.2) with said sum output terminal (S) to make said sum output terminal (S) produce the third exclusively ORed output signal as the summed output signal.

18. A logic block as claimed in claim 16, wherein said core logic circuit (4A) comprises:

a first two-input one-output multiplexer (10.0) having a first input terminal connected to the first argument input terminal (A0) of said first argument input group, a second input terminal connected to the second argument input terminal (A1) of said first argument input group, and a control input terminal connected to the third argument input terminal (A2) of said first argument input group, said first two-input one-output multiplexer producing, as a first selected output signal, an input signal supplied to the first input terminal thereof when the control input terminal thereof is supplied with a control signal having a logic value of "0", said first two-input one-output multiplexer producing, as the first selected output signal, an input signal supplied to the second input terminal thereof when the control input terminal thereof is supplied with the control signal having a logic value of "1";

a second two-input one-output multiplexer (10.1) having a first input terminal connected to the first argument input terminal (B0) of said second argument input group, a second input terminal connected to the second argument input terminal (B1) of said second argument input group, and a control input terminal connected to the third argument input terminal (B2) of said second argument input group, said second two-input one-output multiplexer producing, as a second selected output signal, an input signal supplied with the first input terminal thereof when the control input terminal thereof is supplied with a control signal having a logic value of "0", said second two-input one-output multiplexer producing, as the second selected output signal, an input signal supplied with the second input terminal thereof when the control input terminal thereof is supplied with the control signal having a logic value of "1";

a third two-input one-output multiplexer (10.2) having a first input terminal connected to the fourth argument input terminal (B3) of said second argument input group, a second input terminal connected to said ripple-core logic carry input terminal (CCI), and a control input terminal connected to said first configuration input terminal (M0), said third two-input one-output multiplexer producing, as a third selected output terminal, an input signal supplied to the first input terminal thereof when the control input terminal thereof is supplied with a control signal having a logic value of "0", said third two-input one-output multiplexer producing, as the third selected output terminal, an input signal supplied to the second input terminal thereof when the control input terminal thereof is supplied with the control signal having a logic value of "1";

a first exclusive OR circuit (11.0) having a first input terminal connected to the fourth argument input terminal (A3) of said first argument input group and a second input terminal connected to an output terminal of said first two-input one-output multiplexer (10.0), said first exclusive OR circuit exclusively ORing an input signal supplied with the first input terminal thereof and the first selected output signal supplied with the second input terminal thereof to produce a first exclusively ORed output signal;

a second exclusive OR circuit (11.1) having a first input terminal connected to an output terminal of said second two-input one-output multiplexer (10.1) and a second input terminal connected to an output terminal of said third two-input one-output multiplexer (10.2), said second exclusive OR circuit exclusively ORing the second selected output signal supplied to the first input terminal thereof and the third selected output signal supplied to the second input terminal thereof to produce a second exclusively ORed output signal;

a fourth two-input one-output multiplexer (10.3) having a first input terminal connected to the output terminal of said second two-input one-output multiplexer (10.1), a second input terminal connected to an output terminal of said second exclusive OR circuit (11.1), and a control input terminal connected to said second configuration input terminal (M1), said fourth two-input one-output multiplexer producing, as a fourth selected output signal, the second selected output signal supplied to the first input terminal thereof when the control input terminal thereof is supplied with a control signal having a logic value of "0", said fourth two-input one-output multiplexer producing, as the fourth selected output signal, the second exclusive ORed signal supplied to the second input terminal thereof when the control input terminal thereof is supplied with the control signal having the logic value of "1";

a fifth two-input one-output multiplexer (10.4) having a first input terminal connected to an output terminal of said third two-input one-output multiplexer (10.2), a second input terminal connected to said third configuration input terminal (M2), and a control input terminal connected to said second configuration input terminal (M1), said fifth two-input one-output multiplexer producing, as a fifth selected output signal, the third selected output signal supplied to the first input terminal thereof when the control input terminal thereof is supplied with a control signal having a logic value of "0", said fifth two-input one-output multiplexer producing, as the fifth selected output signal, an input signal supplied to the second input terminal thereof when the control input terminal thereof is supplied with the control signal having the logic value of "1";

a NAND circuit (12) having a first input terminal connected to an output terminal of said first exclusive OR circuit (11.0) and a second input terminal connected to an output terminal of said fourth two-input one-output multiplexer (10.3), said NAND circuit NANDing the first exclusively ORed output signal supplied to the first input terminal thereof and the fourth selected output signal supplied to the second input terminal thereof to produce a NANDed output signal;

a NOR circuit (13) having a first input terminal connected to the output terminal of said first exclusive OR circuit (11.0) and a second input terminal connected to the output terminal of said fourth two-input one-output multiplexer (10.3), said NOR circuit (13) NORing the first exclusively ORed output signal supplied to the first input terminal thereof and the fourth selected output signal supplied to the second input terminal thereof to produce a NORed output signal;

a third exclusive OR circuit (11.2) having a first input terminal connected to the output terminal of said first exclusive OR circuit (11.0) and a second input terminal connected to the output terminal of said second exclusive OR circuit (11.1), said third exclusive OR circuit exclusively ORing the first exclusively ORed output signal supplied to the first input terminal thereof and the second exclusively ORed output signal supplied to the second input terminal thereof to produce a third exclusively ORed output signal;

a two-input one-output inverting multiplexer (35.0) having a first input terminal connected to an output terminal of said NAND circuit (12), a second input terminal connected to an output terminal of said NOR circuit (13), and a control input terminal connected to an output terminal of said fifth two-input one-output multiplexer, said two-input one-output inverting multiplexer producing, as an inverted selected output signal, a signal obtaining by inverting the NANDed output signal supplied to the first input terminal thereof when the control input terminal thereof is supplied with a control signal having a logic value of "0", said two-input one-output inverting multiplexer producing, as the inverted selected output signal, a signal obtained by inverting the NORed output signal supplied to the second input terminal thereof when the control input terminal thereof is supplied with the control signal having the logic value "1";

first connecting means for connecting the output terminal of said NAND circuit (12) with said core logic carry generation output terminal (GO) to make said core logic carry generation output terminal (GO) produce the NANDed output signal as the core logic carry generation output signal;

second connecting means for connecting the output terminal of said NOR circuit (13) with said core logic carry propagation output terminal (PO) to make said core logic carry propagation output terminal (PO) produce the NORed output signal as the core logic carry propagation output signal;

third connecting means for connecting an output terminal of said two-input one-output inverting multiplexer (35.0) with said core logic carry output terminal (C) to make said core logic carry output terminal (C) produce the inverted selected output signal as the core logic carry output signal; and fourth connecting means for connecting an output terminal of said third exclusive OR circuit with said sum output terminal (S) to make said sum output terminal (S) produce the third exclusively ORed output signal as the summed output signal.

19. A logic block as claimed in claim 16, wherein said core logic circuit (4B) comprises:

a first two-input one-output multiplexer (10.0) having a first input terminal connected to the first argument input terminal (A0) of said first argument input group, a second input terminal connected to the second argument input terminal (A1) of said first argument input group, and a control input terminal connected to the third argument input terminal (A2) of said first argument input group, said first two-input one-output multiplexer producing, as a first selected output signal, an input signal supplied to the first input terminal thereof when the control —input terminal thereof is supplied with a control signal having a logic value of "0", said first two-input one-output multiplexer producing, as the first selected output signal, an input signal supplied to the second input terminal thereof when the control input terminal thereof is supplied with the control signal having a logic value of "1";

a second two-input one-output multiplexer (10.1) having a first input terminal connected to the first argument input terminal (B0) of said second argument input group, a second input terminal connected to the second argument input terminal (B1) of said second argument input group, and a control input terminal connected to the third argument input terminal (B2) of said second argument input group, said second two-input one-output multiplexer producing, as a second selected output signal, an input signal supplied to the first input terminal thereof when the control input terminal thereof is supplied with a control signal having a logic value of "0", said second two-input one-output multiplexer producing, as the second selected output signal, an input signal supplied to the second input terminal thereof when the control input terminal thereof is supplied with the control signal having a logic value of "1";

a third two-input one-output multiplexer (10.2) having a first input terminal connected to the fourth argument input terminal (B3) of said second argument input group, a second input terminal connected to said ripple-core logic carry input terminal (CCI), and a control input terminal connected to said first configuration input terminal (M0), said third two-input one-output multiplexer producing, as a third selected output signal, an input signal supplied to the first input terminal thereof when the control input terminal thereof is supplied with a control signal having a logic value of "0", said third two-input one-output multiplexer producing, as the third selected output signal, an input signal supplied to the second input terminal thereof when the control input terminal thereof is supplied with the control signal having a logic value of "1";

a first exclusive OR circuit (11.0) having a first input terminal connected to the fourth argument input terminal (A3) of said first argument input group and a second input terminal connected to an output terminal of said first two-input one-output multiplexer (10.0), said first exclusive OR circuit exclusively ORing an input signal supplied to the first input terminal thereof and the first selected output signal supplied to the second input terminal thereof to produce a first exclusively ORed output signal;

a second exclusive OR circuit (11.1) having a first input terminal connected to an output terminal of said second two-input one-output multiplexer (10.1) and a second input terminal connected to an output terminal of said third two-input one-output multiplexer (10.2), said second exclusive OR circuit exclusively ORing the second selected output signal supplied to the first input terminal thereof and the third selected output signal supplied to the second input terminal thereof to produce a second exclusively ORed output signal;

a fourth two-input one-output multiplexer (10.3A) having a first input terminal connected to an output terminal of said second exclusive OR circuit (11.1), a second input terminal connected to the output terminal of said second two-input one-output multiplexer (10.1), and a control input terminal connected to said second configuration input terminal (M1), said fourth two-input one-output multiplexer producing, as a fourth selected output signal, the second exclusively ORed output signal supplied to the first input terminal thereof when the control input terminal thereof is supplied with a control signal having a logic value of "0", said fourth two-input one-output multiplexer producing, as the fourth selected output signal, the second selected output signal supplied to the second input terminal thereof when the control input terminal thereof is supplied with the control signal having the logic value of "1";

a fifth two-input one-output multiplexer (10.4A) having a first input terminal connected to said third configuration input terminal (M2), a second input terminal connected to the output terminal of said third two-input one-output multiplexer (10.2), and a control input terminal connected to said second configuration input terminal (M1), said fifth two-input one-output multiplexer producing, as a fifth selected output signal, an input signal supplied to the first input terminal thereof when the control input terminal thereof is supplied with a control signal having a logic value of "0", said fifth two-input one-output multiplexer producing, as the fifth selected output signal, the third selected output signal supplied to the second input terminal thereof when the control input terminal thereof is supplied with the control signal having the logic value of "1";

a NAND circuit (12) having a first input terminal connected to an output terminal of said first exclusive OR circuit (11.0) and a second input terminal connected to an output terminal of said fourth two-input one-output multiplexer (10.3A), said NAND circuit NANDing the first exclusively ORed output signal supplied to the first input terminal thereof and the fourth selected output signal supplied to the second input terminal thereof to produce a NANDed output signal;

a NOR circuit (13) having a first input terminal connected to the output terminal of said first exclusive OR circuit (11.0) and a second input terminal connected to the output terminal of said fourth two-input one-output multiplexer (10.3A), said NOR circuit (13) NORing the first exclusively ORed output signal supplied to the first input terminal thereof and the fourth selected output signal supplied to the second input terminal thereof to produce a NORed output signal;

a third exclusive OR circuit (11.2) having a first input terminal connected to the output terminal of said first exclusive OR circuit (11.0) and a second input terminal connected to the output terminal of said second exclusive OR circuit (11.1), said third exclusive OR circuit exclusively ORing the first exclusively ORed output signal supplied to the first input terminal thereof and the second exclusively ORed output signal supplied to the second input terminal thereof to produce a third exclusively ORed output signal;

an inverter (15.0) having an input terminal connected to an output terminal of said fifth two-input one-output multiplexer (10. 4A), said inverter inverting the fifth selected output signal supplied to the input terminal thereof to produce an inverted output signal;

a NAND-OR circuit (14.0) having a first input terminal connected to the output terminal of said NAND circuit (12), a second input terminal connected to the output terminal of said NOR circuit (13), and a third input terminal connected to an output terminal of said inverter, said NAND-OR circuit ORing the NORed output signal supplied to the second input terminal thereof and the inverted output signal supplied to the third input terminal thereof to obtain an ORed result signal and NANDing the ORed result signal and the NANDed output signal supplied to the first input terminal thereof to produce an ORed and NANDed output signal;

first connecting means for connecting the output terminal of said NAND circuit (12) with said core logic carry generation output terminal (GO) to make said core logic carry generation output terminal (GO) produce the NANDed output signal as the core logic carry generation output signal;

second connecting means for connecting the output terminal of said NOR circuit (13) with said core logic carry propagation output terminal (PO) to make said core logic carry propagation output terminal (PO) produce the NORed output signal as the core logic carry propagation output signal;

third connecting means for connecting an output terminal of said NAND-OR circuit (14.0) with said core logic carry output terminal (C) to make said core logic carry output terminal (C) produce the ORed and NANDed output signal as the core logic carry output signal; and fourth connecting means for connecting an output terminal of said third exclusive OR circuit with said sum output terminal (S) to make said sum output terminal (S) produce the third exclusively ORed output signal as the summed output signal.

20. A logic block as claimed in claim 16, wherein said core logic circuit (4C) comprises:

a first two-input one-output multiplexer (10.0) having a first input terminal connected to the first argument input terminal (A0) of said first argument input group, a second input terminal connected to the second argument input terminal (A1) of said first argument input group, and a control input terminal connected to the third argument input terminal (A2) of said first argument input group, said first two-input one-output multiplexer producing, as a first selected output signal, an input signal supplied to the first input terminal thereof when the control input terminal thereof is supplied with a control signal having a logic value of "0", said first two-input one-output multiplexer producing, as the first selected output signal, an input signal supplied to the second input terminal thereof when the control input terminal thereof is supplied with the control signal having a logic value of "1";

a second two-input one-output multiplexer (10.1) having a first input terminal connected to the first argument input terminal (B0) of said second argument input group, a second input terminal connected to the second argument input terminal (B1) of said second argument input group, and a control input terminal connected to the third argument input terminal (B2) of said second argument input group, said second two-input one-output multiplexer producing, as a second selected output signal, an input signal supplied to the first input terminal thereof when the control input terminal thereof is supplied with a control signal having a logic value of "0", said second two-input one-output multiplexer producing, as the second selected output signal, an input signal supplied to the second input terminal thereof when the control input terminal thereof is supplied with the control signal having a logic value of "1";

a third two-input one-output multiplexer (10.2) having a first input terminal connected to the fourth argument input terminal (B3) of said second argument input group, a second input terminal connected to said ripple-core logic carry input terminal (CCI), and a control input terminal connected to said first configuration input terminal (M0), said third two-input one-output multiplexer producing, as a third selected output terminal, an input signal supplied to the first input terminal thereof when the control input terminal thereof is supplied with a control signal having a logic value of "0", said third two-input one-output multiplexer producing, as the third selected output terminal, an input signal supplied to the second input terminal thereof when the control input terminal thereof is supplied with the control signal having a logic value of "1";

a first exclusive OR circuit (11.0) having a first input terminal connected to the fourth argument input terminal (A3) of said first argument input group and a second input terminal connected to an output terminal of said first two-input one-output multiplexer (10.0), said first exclusive OR circuit exclusively ORing an input signal supplied to the first input terminal thereof and the first selected output signal supplied to the second input terminal thereof to produce a first exclusively ORed output signal;

a second exclusive OR circuit (11.1) having a first input terminal connected to an output terminal of said second two-input one-output multiplexer (10.1) and a second input terminal connected to an output terminal of said third two-input one-output multiplexer (10.2), said second exclusive OR circuit exclusively ORing the second selected output signal supplied to the first input terminal thereof and the third selected output signal supplied to the second input terminal thereof to produce a second exclusively ORed output signal;

a fourth two-input one-output multiplexer (10.3A) having a first input terminal connected to an output terminal of said second exclusive OR circuit (11.1), a second input terminal connected to the output terminal of said second two-input one-output multiplexer (10.1), and a control input terminal connected to said second configuration input terminal (M1), said fourth two-input one-output multiplexer producing, as a fourth selected output signal, the second exclusively ORed output signal supplied to the first input terminal thereof when the control input terminal thereof is supplied with a control signal having a logic value of "0", said fourth two-input one-output multiplexer producing, as the fourth selected output signal, the second selected output signal supplied to the second input terminal thereof when the control input terminal thereof is supplied with the control signal having the logic value of "1";

a fifth two-input one-output multiplexer (10.4A) having a first input terminal connected to said third configuration input terminal (M2), a second input terminal connected to the output terminal of said third two-input one-output multiplexer (10.2), and a control input terminal connected to said second configuration input terminal (M1), said fifth two-input one-output multiplexer producing, as a fifth selected output signal, an input signal supplied to the first input terminal thereof when the control input terminal thereof is supplied with a control signal having a logic value of "0", said fifth two-input one-output multiplexer producing, as the fifth selected output signal, the third selected output signal supplied to the second input terminal thereof when the control input terminal thereof is supplied with the control signal having the logic value of "1";

a NAND circuit (12) having a first input terminal connected to an output terminal of said first exclusive OR circuit (11.0) and a second input terminal connected to an output terminal of said fourth two-input one-output multiplexer (10. 3A), said NAND circuit NANDing the first exclusively ORed output signal supplied to the first input terminal thereof and the fourth selected output signal supplied to the second input terminal thereof to produce a NANDed output signal;

a NOR circuit (13) having a first input terminal connected to the output terminal of said first exclusive OR circuit (11.0) and a second input terminal connected to the output terminal of said fourth two-input one-output multiplexer (10.3A), said NOR circuit (13) NORing the first exclusively ORed output signal supplied to the first input terminal thereof and the fourth selected output signal supplied to the second input terminal thereof to produce a NORed output signal;

a third exclusive OR circuit (11.2) having a first input terminal connected to the output terminal of said first exclusive OR circuit (11.0) and a second input terminal connected to the output terminal of said second exclusive OR circuit (11.1), said third exclusive OR circuit exclusively ORing the first exclusively ORed output signal supplied to the first input terminal thereof and the second exclusively ORed output signal supplied to the second input terminal thereof to produce a third exclusively ORed output signal;

a two-input one-output inverting multiplexer (35.0) having a first input terminal connected to an output terminal of said NAND circuit (12), a second input terminal connected to an output terminal of said NOR circuit (13), and a control input terminal connected to an output terminal of said fifth two-input one-output multiplexer (10.4A), said two-input one-output inverting multiplexer producing, as an inverted selected output signal, a signal obtaining by inverting the NANDed output signal supplied to the first input terminal thereof when the control input terminal thereof is supplied with a control signal having a logic value of "0", said two-input one-output inverting multiplexer producing, as the inverted selected output signal, a signal obtained by inverting the NORed output signal supplied to the second input terminal thereof when the control input terminal thereof is supplied with the control signal having the logic value "1";

first connecting means for connecting the output terminal of said NAND circuit (12) with said core logic carry generation output terminal (GO) to make said core logic carry generation output terminal (GO) produce the NANDed output signal as the core logic carry generation output signal;

second connecting means for connecting the output terminal of said NOR circuit (13) with said core logic carry propagation output terminal (PO) to make said core logic carry propagation output terminal (PO) produce the NORed output signal as the core logic carry propagation output signal;

third connecting means for connecting an output terminal of said two-input one-output inverting multiplexer (35.0) with said core logic carry output terminal (C) to make said core logic carry output terminal (C) produce the inverted selected output signal as the core logic carry output signal; and fourth connecting means for connecting an output terminal of said third exclusive OR circuit with said sum output terminal (S) to make said sum output terminal (S) produce the third exclusively ORed output signal as the summed output signal.

21. A logic block as claimed in claim 16, wherein said carry logic circuit (5) comprises:

first connection means for connecting said ripple carry input terminal (RCI) with said ripple-core logic carry output terminal (CCO) to make said ripple-core logic carry output terminal produce the ripple carry input signal as the ripple-core logic carry output signal;

an inverter (15.1) having an input terminal connected to said ripple carry input terminal (RCI), said inverter inverting the ripple carry input signal to produce an inverted ripple carry signal;

a NAND-OR circuit (14.1) having a first input terminal connected to said core logic carry generation input terminal (G), a second input terminal connected to said core logic carry propagation input terminal (P), and a third input terminal connected to an output terminal of said inverter (15.1), said NAND-OR circuit ORing the core logic carry propagation input signal supplied to the second input terminal thereof and the inverted ripple carry signal supplied to the third input terminal thereof to obtain an ORed result signal and NANDing the ORed result signal and the core logic carry generation input signal supplied to the first input terminal thereof to produce an ORed and NANDed output signal; and second connection means for connecting an output terminal of said NAND-OR circuit (14.1) with said ripple carry output terminal (RCO) to make said ripple carry output terminal produce the ORed and NANDed output signal as the ripple carry output signal.

22. A logic block as claimed in claim 16, wherein said carry logic circuit (5A) comprises:

first connection means for connecting said ripple carry input terminal (RCI) with said ripple-core logic carry output terminal (CCO) to make said ripple-core logic carry output terminal produce the ripple carry input signal as the ripple-core logic carry output signal;

a two-input one-output inverting multiplexer (35.1) having a first input terminal connected to said core logic carry generation input terminal (G), a second input terminal connected to said core logic carry propagation input terminal (P), and a control input terminal connected to said ripple carry input terminal (RCI), said two-input one-output inverting multiplexer producing, as an inverted selected output signal, a signal obtaining by inverting the core logic carry generation input signal supplied to the first input terminal thereof when the control input terminal thereof is supplied with a control signal having a logic value of "0", said two-input one-output inverting multiplexer producing, as the inverted selected output signal, a signal obtained by inverting the core logic carry propagation input signal supplied to the second input terminal thereof when the control input terminal thereof is supplied with the control signal having the logic value "1"; and second connecting means for connecting an output terminal of said two-input inverting multiplexer (35.1) with said ripple carry output terminal (RCO) to make said ripple carry output terminal (RCO) produce the inverted selected output signal as the ripple carry output signal.

23. A Function device comprising a plurality of logic blocks, each of said logic blocks comprising:

a core logic circuit (4, 4A, 4B, 4C) having a first argument input group consisting of first through fourth argument input terminals (A0, A1, A2, A3), a second argument input group consisting of first though fourth argument input terminals (B0, B1, B2, B3), first through third configuration input terminals (M0, M1, M2), a core logic carry output terminal (C) for outputting a core logic carry output signal, a core logic carry generation output terminal (GO) for outputting a core logic carry generation output signal, a core logic carry propagation output terminal (PO) for outputting a core logic carry propagation output signal, a ripple-core logic carry input terminal (CCI) for inputting a ripple-core logic carry input signal, and a sum output terminal (S) for outputting a summed output signal;

first through third memory circuits (6.0, 6.1, 6.2) connected to said first through said third configuration input terminals (M0, M1, M2), respectively, said first through said third memory circuits storing, as first through third stored signals, a logic value of one bit, said first through said third memory circuits supplying the first through the third stored signals to said first through said third configuration input terminals, respectively; and a carry logic circuit (5, 5A) having a ripple carry input terminal (RCI) for inputting a ripple carry input signal, a ripple carry output terminal (RCO) for outputting a ripple carry output signal, a ripple-core logic carry output terminal (CCO) for supplying said ripple-core logic carry input terminal (CCI) with a ripple-core logic carry output signal as the ripple-core logic carry input signal, a core logic carry generation input terminal (G) for being supplied from said core logic carry generation output terminal (GO) with the core logic carry generation output signal as a core logic carry generation input signal, and a core logic carry propagation input terminal (P) for being supplied from said core logic carry propagation output terminal (PO) with the core logic carry propagation output signal as a core logic carry propagation input signal, said ripple carry output terminal (RCO) of at least one of said logic blocks being connected to the ripple carry input terminal (RCI) of another one of said logic blocks.

24. A function device as claimed in claim 23, wherein said core logic circuit (4) comprises:

a first two-input one-output multiplexer (10.0) having a first input terminal connected to the first argument input terminal (A0) of said first argument input group, a second input terminal connected to the second argument input terminal (A1) of said first argument input group, and a control input terminal connected to the third argument input terminal (A2) of said first argument input group, said first two-input one-output multiplexer producing, as a first selected output signal, an input signal supplied to the first input terminal thereof when the control input terminal thereof is supplied with a control signal having a logic value of "0", said first two-input one-output multiplexer producing, as the first selected output signal, an input signal supplied to the second input terminal thereof when the control input terminal thereof is supplied with the control signal having a logic value of "1";

a second two-input one-output multiplexer (10.1) having a first input terminal connected to the first argument input terminal (B0) of said second argument input group, a second input terminal connected to the second argument input terminal (B1) of said second argument input group, and a control input terminal connected to the third argument input terminal (B2) of said second argument input group, said second two-input one-output multiplexer producing, as a second selected output signal, an input signal supplied to the first input terminal thereof when the control input terminal thereof is supplied with a control signal having a logic value of "0", said second two-input one-output multiplexer producing, as the second selected output signal, an input signal supplied to the second input terminal thereof when the control input terminal thereof is supplied with the control signal having a logic value of "1";

a third two-input one-output multiplexer (10.2) having a first input terminal connected to the fourth argument input terminal (B3) of said second argument input group, a second input terminal connected to said ripple-core logic carry input terminal (CCI), and a control input terminal connected to said first configuration input terminal (M0), said third two-input one-output multiplexer producing, as a third selected output signal, an input signal supplied to the first input terminal thereof when the control input terminal thereof is supplied with a control signal having a logic value of "0", said third two-input one-output multiplexer producing, as the third selected output signal, an input signal supplied to the second input terminal thereof when the control input terminal thereof is supplied with the control signal having a logic value of "1";

a first exclusive OR circuit (11.0) having a first input terminal connected to the fourth argument input terminal (A3) of said first argument input group and a second input terminal connected to an output terminal of said first two-input one-output multiplexer (10.0), said first exclusive OR circuit exclusively ORing an input signal supplied to the first input terminal thereof and the first selected output signal supplied to the second input terminal thereof to produce a first exclusively ORed output signal;

a second exclusive OR circuit (11.1) having a first input terminal connected to an output terminal of said second two-input one-output multiplexer (10.1) and a second input terminal connected to an output terminal of said third two-input one-output multiplexer (10.3), said second exclusive OR circuit exclusively ORing the second selected output signal supplied to the first input terminal thereof and the third selected output signal supplied to the second input terminal thereof to produce a second exclusively ORed output signal;

a fourth two-input one-output multiplexer (10.3) having a first input terminal connected to the output terminal of said second two-input one-output multiplexer (10.1), a second input terminal connected to an output terminal of said second exclusive OR circuit (11.1), and a control input terminal connected to said second configuration input terminal (M1), said fourth two-input one-output multiplexer producing, as a fourth selected output signal, the second selected output signal supplied to the first input terminal thereof when the control input terminal thereof is supplied with a control signal having a logic value of "0", said fourth two-input one-output multiplexer producing, as the fourth selected output signal, the second exclusively ORed output signal when the control input terminal thereof is supplied with the control signal having the logic value of "1";

a fifth two-input one-output multiplexer (10.4) having a first input terminal connected to the output terminal of said third two-input one-output multiplexer (10.2), a second input terminal connected to said third configuration input terminal (M2), and a control input terminal connected to said second configuration input terminal (M1), said fifth two-input one-output multiplexer producing, as a fifth selected output signal, the third selected output signal supplied to the first input terminal thereof when the control input terminal thereof is supplied with a control signal having a logic value of "0", said fifth two-input one-output multiplexer producing, as the fifth selected output signal, an input signal supplied to the second input terminal thereof when the control input terminal thereof is supplied with the control signal having the logic value of "1";

a NAND circuit (12) having a first input terminal connected to an output terminal of said first exclusive OR circuit (11.0) and a second input terminal connected to an output terminal of said fourth two-input one-output multiplexer (10.3), said NAND circuit NANDing the first exclusively ORed output signal supplied to the first input terminal thereof and the fourth selected output signal supplied to the second input terminal thereof to produce a NANDed output signal;

a NOR circuit (13) having a first input terminal connected to the output terminal of said first exclusive OR circuit (11.0) and a second input terminal connected to the output terminal of said fourth two-input one-output multiplexer (10.3), said NOR circuit (13) NORing the first exclusively ORed output signal supplied to the first input terminal thereof and the fourth selected output signal supplied to the second input terminal thereof to produce a NORed output signal;

a third exclusive OR circuit (11.2) having a first input terminal connected to an output terminal of said first exclusive OR circuit (11.0) and a second input terminal connected to an Loutput terminal of said second exclusive OR circuit (11.1), said third exclusive OR circuit exclusively ORing the first exclusively ORed output signal supplied to the first input terminal thereof and the second exclusively ORed output signal supplied to the second input terminal thereof to produce a third exclusively ORed output signal;

an inverter (15.0) having an input terminal connected to an output terminal of said fifth two-input one-output multiplexer (10.4), said inverter inverting the fifth selected output signal supplied to the input terminal thereof to produce an inverted output signal;

a NAND-OR circuit (14.0) having a first input terminal connected to an output terminal of said NAND circuit (12), a second input terminal connected to an output terminal of said NOR circuit (13), and a third input terminal connected to an output terminal of said inverter (15.0), said NAND-OR circuit ORing the NORed output signal supplied to the second input terminal thereof and the inverted output signal supplied to the third input terminal thereof to obtain an ORed result signal and NANDing the ORed result signal and the NANDed output signal supplied to the first input terminal thereof to produce an ORed and NANDed output signal;

first connecting means for connecting an output terminal of said NAND circuit (12) with said core logic carry generation output terminal (GO) to make said core logic carry generation output terminal (GO) produce the NANDed output signal as the core logic carry generation output signal;

second connecting means for connecting an output terminal of said NOR circuit (13) with said core logic carry propagation output terminal (PO) to make said core logic carry propagation output terminal (PO) produce the NORed output signal as the core logic carry propagation output signal;

third connecting means for connecting an output terminal of said NAND-OR circuit (14.0) with said core logic carry output terminal (C) to make said core logic carry output terminal (C) produce the ORed and NANDed output signal as the core logic carry output signal; and fourth connecting means for connecting an output terminal of said third exclusive OR circuit (11.2) with said sum output terminal (S) to make said sum output terminal (S) produce the third exclusively ORed output signal as the summed output signal.

25. A function device as claimed in claim 23, wherein said core logic circuit (4A) comprises:

a first two-input one-output multiplexer (10.0) having a first input terminal connected to the first argument input terminal (A0) of said first argument input group, a second input terminal connected to the second argument input terminal (A1) of said first argument input group, and a control input terminal connected to the third argument input terminal (A2) of said first argument input group, said first two-input one-output multiplexer producing, as a first selected output signal, an input signal supplied to the first input terminal thereof when the control input terminal thereof is supplied with a control signal having a logic value of "0", said first two-input one-output multiplexer producing, as the first selected output signal, an input signal supplied to the second input terminal thereof when the control input terminal thereof is supplied with the control signal having a logic value of "1";

a second two-input one-output multiplexer (10.1) having a first input terminal connected to the first argument input terminal (B0) of said second argument input group, a second input terminal connected to the second argument input terminal (B1) of said second argument input group, and a control input terminal connected to the third argument input terminal (B2) of said second argument input group, said second two-input one-output multiplexer producing, as a second selected output signal, an input signal supplied with the first input terminal thereof when the control input terminal thereof is supplied with a control signal having a logic value of "0", said second two-input one-output multiplexer producing, as the second selected output signal, an input signal supplied with the second input terminal thereof when the control input terminal thereof is supplied with the control signal having a logic value of "1";

a third two-input one-output multiplexer (10.2) having a first input terminal connected to the fourth argument input terminal (B3) of said second argument input group, a second input terminal connected to said ripple-core logic carry input terminal (CCI), and a control input terminal connected to said first configuration input terminal (M0), said third two-input one-output multiplexer producing, as a third selected output terminal, an input signal supplied to the first input terminal thereof when the control input terminal thereof is supplied with a control signal having a logic value of "0", said third two-input one-output multiplexer producing, as the third selected output terminal, an input signal supplied to the second input terminal thereof when the control input terminal thereof is supplied with the control signal having a logic value of "1";

a first exclusive OR circuit (11.0) having a first input terminal connected to the fourth argument input terminal (A3) of said first argument input group and a second input terminal connected to an output terminal of said first two-input one-output multiplexer (10.0), said first exclusive OR circuit exclusively ORing an input signal supplied with the first input terminal thereof and the first selected output signal supplied with the second input terminal thereof to produce a first exclusively ORed output signal;

a second exclusive OR circuit (11.1) having a first input terminal connected to an output terminal of said second two-input one-output multiplexer (10.1) and a second input terminal connected to an output terminal of said third two-input one-output multiplexer (10.2), said second exclusive OR circuit exclusively ORing the second selected output signal supplied to the first input terminal thereof and the third selected output signal supplied to the second input terminal thereof to produce a second exclusively ORed output signal;

a fourth two-input one-output multiplexer (10.3) having a first input terminal connected to the output terminal of said second two-input one-output multiplexer (10.1), a second input terminal connected to an output terminal of said second exclusive OR circuit (11.1), and a control input terminal connected to said second configuration input terminal (M1), said fourth two-input one-output multiplexer producing, as a fourth selected output signal, the second selected output signal supplied to the first input terminal thereof when the control input terminal thereof is supplied with a control signal having a logic value of "0", said fourth two-input one-output multiplexer producing, as the fourth selected output signal, the second exclusive ORed signal supplied to the second input terminal thereof when the control input terminal thereof is supplied with the control signal having the logic value of "1";

a fifth two-input one-output multiplexer (10.4) having a first input terminal connected to an output terminal of said third two-input one-output multiplexer (10.2), a second input terminal connected to said third configuration input terminal (M2), and a control input terminal connected to said second configuration input terminal (M1), said fifth two-input one-output multiplexer producing, as a fifth selected output signal, the third selected output signal supplied to the first input terminal thereof when the control input terminal thereof is supplied with a control signal having a logic value of "0", said fifth two-input one-output multiplexer producing, as the fifth selected output signal, an input signal supplied to the second input terminal thereof when the control input terminal thereof is supplied with the control signal having the logic value of "1";

a NAND circuit (12) having a first input terminal connected to an output terminal of said first exclusive OR circuit (11.0) and a second input terminal connected to an output terminal of said fourth two-input one-output multiplexer (10.3), said NAND circuit NANDing the first exclusively ORed output signal supplied to the first input terminal thereof and the fourth selected output signal supplied to the second input terminal thereof to produce a NANDed output signal;

a NOR circuit (13) having a first input terminal connected to the output terminal of said first exclusive OR circuit (11.0) and a second input terminal connected to the output terminal of said fourth two-input one-output multiplexer (10.3), said NOR circuit NORing the first exclusively ORed output signal supplied to the first input terminal thereof and the fourth selected output signal supplied to the second input terminal thereof to produce a NORed output signal;

a third exclusive OR circuit (11.2) having a first input terminal connected to the output terminal of said first exclusive OR circuit (11.0) and a second input terminal connected to the output terminal of said second exclusive OR circuit (11.1), said third exclusive OR circuit exclusively ORing the first exclusively ORed output signal supplied to the first input terminal thereof and the second exclusively ORed output signal supplied to the second input terminal thereof to produce a third exclusively ORed output signal;

a two-input one-output inverting multiplexer (35.0) having a first input terminal connected to an output terminal of said NAND circuit (12), a second input terminal connected to an output terminal of said NOR circuit (13), and a control input terminal connected to an output terminal of said fifth two-input one-output multiplexer, said two-input one-output inverting multiplexer producing, as an inverted selected output signal, a signal obtaining by inverting the NANDed output signal supplied to the first input terminal thereof when the control input terminal thereof is supplied with a control signal having a logic value of "0", said two-input one-output inverting multiplexer producing, as the inverted selected output signal, a signal obtained by inverting the NORed output signal supplied to the second input terminal thereof when the control input terminal thereof is supplied with the control signal having the logic value "1";

first connecting means for connecting the output terminal of said NAND circuit (12) with said core logic carry generation output terminal (GO) to make said core logic carry generation output terminal (GO) produce the NANDed output signal as the core logic carry generation output signal;

second connecting means for connecting the output terminal of said NOR circuit (13) with said core logic carry propagation output terminal (PO) to make said core logic carry propagation output terminal (PO) produce the NORed output signal as the core logic carry propagation output signal;

third connecting means for connecting an output terminal of said two-input one-output inverting multiplexer (35.0) with said core logic carry output terminal (C) to make said core logic carry output terminal (C) produce the inverted selected output signal as the core logic carry output signal; and fourth connecting means for connecting an output terminal of said third exclusive OR circuit with said sum output terminal (S) to make said sum output terminal (S) produce the third exclusively ORed output signal as the summed output signal.

26. A function device as claimed in claim 23, wherein said core logic circuit (4B) comprises:

a first two-input one-output multiplexer (10.0) having a first input terminal connected to the first argument input terminal (A0) of said first argument input group, a second input terminal connected to the second argument input terminal (A1) of said first argument input group, and a control input terminal connected to the third argument input terminal (A2) of said first argument input group, said first two-input one-output multiplexer producing, as a first selected output signal, an input signal supplied to the first input terminal thereof when the control input terminal thereof is supplied with a control signal having a logic value of "0", said first two-input one-output multiplexer producing, as the first selected output signal, an input signal supplied to the second input terminal thereof when the control input terminal thereof is supplied with the control signal having a logic value of "1";

a second two-input one-output multiplexer (10.1) having a first input terminal connected to the first argument input terminal (B0) of said second argument input group, a second input terminal connected to the second argument input terminal (B1) of said second argument input group, and a control input terminal connected to the third argument input terminal (B2) of said second argument input group, said second two-input one-output multiplexer producing, as a second selected output signal, an input signal supplied to the first input terminal thereof when the control input terminal thereof is supplied with a control signal having a logic value of "0", said second two-input one-output multiplexer producing, as the second selected output signal, an input signal supplied to the second input terminal thereof when the control input terminal thereof is supplied with the control signal having a logic value of "1";

a third two-input one-output multiplexer (10.2) having a first input terminal connected to the fourth argument input terminal (B3) of said second argument input group, a second input terminal connected to said ripple-core logic carry input terminal (CCI), and a control input terminal connected to said first configuration input terminal (M0), said third two-input one-output multiplexer producing, as a third selected output signal, an input signal supplied to the first input terminal thereof when the control input terminal thereof is supplied with a control signal having a logic value of "0", said third two-input one-output multiplexer producing, as the third selected output signal, an input signal supplied to the second input terminal thereof when the control input terminal thereof is supplied with the control signal having a logic value of "1";

a first exclusive OR circuit (11.0) having a first input terminal connected to the fourth argument input terminal (A3) of said first argument input group and a second input terminal connected to an output terminal of said first two-input one-output multiplexer (10.0), said first exclusive OR circuit exclusively ORing an input signal supplied to the first input terminal thereof and the first selected output signal supplied to the second input terminal thereof to produce a first exclusively ORed output signal;

a second exclusive OR circuit (11.1) having a first input terminal connected to an output terminal of said second two-input one-output multiplexer (10.1) and a second input terminal connected to an output terminal of said third two-input one-output multiplexer (10.2), said second exclusive OR circuit exclusively ORing the second selected output signal supplied to the first input terminal thereof and the third selected output signal supplied to the second input terminal thereof to produce a second exclusively ORed output signal;

a fourth two-input one-output multiplexer (10.3A) having a first input terminal connected to an output terminal of said second exclusive OR circuit (11.1), a second input terminal connected to the output terminal of said second two-input one-output multiplexer (10.1), and a control input terminal connected to said second configuration input terminal (M1), said fourth two-input one-output multiplexer producing, as a fourth selected output signal, the second exclusively ORed output signal supplied to the first input terminal thereof when the control input terminal thereof is supplied with a control signal having a logic value of "0", said fourth two-input one-output multiplexer producing, as the fourth selected output signal, the second selected output signal supplied to the second input terminal thereof when the control input terminal thereof is supplied with the control signal having the logic value of "1";

a fifth two-input one-output multiplexer (10.4A) having a first input terminal connected to said third configuration input terminal (M2), a second input terminal connected to the output terminal of said third two-input one-output multiplexer (10.2), and a control input terminal connected to said second configuration input terminal (M1), said fifth two-input one-output multiplexer producing, as a fifth selected output signal, an input signal supplied to the first input terminal thereof when the control input terminal thereof is supplied with a control signal having a logic value of "0", said fifth two-input one-output multiplexer producing, as the fifth selected output signal, the third selected output signal supplied to the second input terminal thereof when the control input terminal thereof is supplied with the control signal having the logic value of "1";

a NAND circuit (12) having a first input terminal connected to an output terminal of said first exclusive OR circuit (11.0) and a second input terminal connected to an output terminal of said fourth two-input one-output multiplexer (10.3A), said NAND circuit NANDing the first exclusively ORed output signal supplied to the first input terminal thereof and the fourth selected output signal supplied to the second input terminal thereof to produce a NANDed output signal;

a NOR circuit (13) having a first input terminal connected to the output terminal of said first exclusive OR circuit (11.0) and a second input terminal connected to the output terminal of said fourth two-input one-output multiplexer (10.3A), said NOR circuit (13) NORing the first exclusively ORed output signal supplied to the first input terminal thereof and the fourth selected output signal supplied to the second input terminal thereof to produce a NORed output signal;

a third exclusive OR circuit (11.2) having a first input terminal connected to the output terminal of said first exclusive OR circuit (11.0) and a second input terminal connected to the output terminal of said second exclusive OR circuit (11.1), said third exclusive OR circuit exclusively ORing the first exclusively ORed output signal supplied to the first input terminal thereof and the second exclusively ORed output signal supplied to the second input terminal thereof to produce a third exclusively ORed output signal;

an inverter (15.0) having an input terminal connected to an output terminal of said fifth two-input one-output multiplexer (10. 4A), said inverter inverting the fifth selected output signal supplied to the input terminal thereof to produce an inverted output signal;

a NAND-OR circuit (14.0) having a first input terminal connected to the output terminal of said NAND circuit (12), a second input terminal connected to the output terminal of said NOR circuit (13), and a third input terminal connected to an output terminal of said inverter, said NAND-OR circuit ORing the NORed output signal supplied to the second input terminal thereof and the inverted output signal supplied to the third input terminal thereof to obtain an ORed result signal and NANDing the ORed result signal and the NANDed output signal supplied to the first input terminal thereof to produce an ORed and NANDed output signal;

first connecting means for connecting the output terminal of said NAND circuit (12) with said core logic carry generation output terminal (GO) to make said core logic carry generation output terminal (GO) produce the NANDed output signal as the core logic carry generation output signal;

second connecting means for connecting the output terminal of said NOR circuit (13) with said core logic carry propagation output terminal (PO) to make said core logic carry propagation output terminal (PO) produce the NORed output signal as the core logic carry propagation output signal;

third connecting means for connecting an output terminal of said NAND-OR circuit (14.0) with said core logic carry output terminal (C) to make said core logic carry output terminal (C) produce the ORed and NANDed output signal as the core logic carry output signal; and fourth connecting means for connecting an output terminal of said third exclusive OR circuit with said sum output terminal (S) to make said sum output terminal (S) produce the third exclusively ORed output signal as the summed output signal.

27. A function device as claimed in claim 23, wherein said core logic circuit (4C) comprises:

a first two-input one-output multiplexer (10.0) having a first input terminal connected to the first argument input terminal (A0) of said first argument input group, a second input terminal connected to the second argument input terminal (A1) of said first argument input group, and a control input terminal connected to the third argument input terminal (A2) of said first argument input group, said first two-input one-output multiplexer producing, as a first selected output signal, an input signal supplied to the first input terminal thereof when the control input terminal thereof is supplied with a control signal having a logic value of "0", said first two-input one-output multiplexer producing, as the first selected output signal, an input signal supplied to the second input terminal thereof when the control input terminal thereof is supplied with the control signal having a logic value of "1";

a second two-input one-output multiplexer (10.1) having a first input terminal connected to the first argument input terminal (B0) of said second argument input group, a second input terminal connected to the second argument input terminal (B1) of said second argument input group, and a control input terminal connected to the third argument input terminal (B2) of said second argument input group, said second two-input one-output multiplexer producing, as a second selected output signal, an input signal supplied to the first input terminal thereof when the control input terminal thereof is supplied with a control signal having a logic value of "0", said second two-input one-output multiplexer producing, as the second selected output signal, an input signal supplied to the second input terminal thereof when the control input terminal thereof is supplied with the control signal having a logic value of "1";

a third two-input one-output multiplexer (10.2) having a first input terminal connected to the fourth argument input terminal (B3) of said second argument input group, a second input terminal connected to said ripple-core logic carry input terminal (CCI), and a control input terminal connected to said first configuration input terminal (M0), said third two-input one-output multiplexer producing, as a third selected output terminal, an input signal supplied to the first input terminal thereof when the control input terminal thereof is supplied with a control signal having a logic value of "0", said third two-input one-output multiplexer producing, as the third selected output terminal, an input signal supplied to the second input terminal thereof when the control input terminal thereof is supplied with the control signal having a logic value of "1";

a first exclusive OR circuit (11.0) having a first input terminal connected to the fourth argument input terminal (A3) of said first argument input group and a second input terminal connected to an output terminal of said first two-input one-output multiplexer (10.0), said first exclusive OR circuit exclusively ORing an input signal supplied to the first input terminal thereof and the first selected output signal supplied to the second input terminal thereof to produce a first exclusively ORed output signal;

a second exclusive OR circuit (11.1) having a first input terminal connected to an output terminal of said second two-input one-output multiplexer (10.1) and a second input terminal connected to an output terminal of said third two-input one-output multiplexer (10.2), said second exclusive OR circuit exclusively ORing the second selected output signal supplied to the first input terminal thereof and the third selected output signal supplied to the second input terminal thereof to produce a second exclusively ORed output signal;

a fourth two-input one-output multiplexer (10.3A) having a first input terminal connected to an output terminal of said second exclusive OR circuit (11.1), a second input terminal connected to the output terminal of said second two-input one-output multiplexer (10.1), and a control input terminal connected to said second configuration input terminal (M1), said fourth two-input one-output multiplexer producing, as a fourth selected output signal, the second exclusively ORed output signal supplied to the first input terminal thereof when the control input terminal thereof is supplied with a control signal having a logic value of "0", said fourth two-input one-output multiplexer producing, as the fourth selected output signal, the second selected output signal supplied to the second input terminal thereof when the control input terminal thereof is supplied with the control signal having the logic value of "1";

a fifth two-input one-output multiplexer (10.4A) having a first input terminal connected to said third configuration input terminal (M2), a second input terminal connected to the output terminal of said third two-input one-output multiplexer (10.2), and a control input terminal connected to said second configuration input terminal (M1), said fifth two-input one-output multiplexer producing, as a fifth selected output signal, an input signal supplied to the first input terminal thereof when the control input terminal thereof is supplied with a control signal having a logic value of "0", said fifth two-input one-output multiplexer producing, as the fifth selected output signal, the third selected output signal supplied to the second input terminal thereof when the control input terminal thereof is supplied with the control signal having the logic value of "1";

a NAND circuit (12) having a first input terminal connected to an output terminal of said first exclusive OR circuit (11.0) and a second input terminal connected to an output terminal of said fourth two-input one-output multiplexer (10.3A), said NAND circuit NANDing the first exclusively ORed output signal supplied to the first input terminal thereof and the fourth selected output signal supplied to the second input terminal thereof to produce a NANDed output signal;

a NOR circuit (13) having a first input terminal connected to the output terminal of said first exclusive OR circuit (11.0) Atand a second input terminal connected to the output terminal of said fourth two-input one-output multiplexer (10.3A), said NOR circuit (13) NORing the first exclusively ORed output signal supplied to the first input terminal thereof and the fourth selected output signal supplied to the second input terminal thereof to produce a NORed output signal;

a third exclusive OR circuit (11.2) having a first input terminal connected to the output terminal of said first exclusive OR circuit (11.0) and a second input terminal connected to the output terminal of said second exclusive OR circuit (11.1), said third exclusive OR circuit exclusively ORing the first exclusively ORed output signal supplied to the first input terminal thereof and the second exclusively ORed output signal supplied to the second input terminal thereof to produce a third exclusively ORed output signal;

a two-input one-output inverting multiplexer (35.0) having a first input terminal connected to an output terminal of said NAND circuit (12), a second input terminal connected to an output terminal of said NOR circuit (13), and a control input terminal connected to an output terminal of said fifth two-input one-output multiplexer (10.4A), said two-input one-output inverting multiplexer producing, as an inverted selected output signal, a signal obtaining by inverting the NANDed output signal supplied to the first input terminal thereof when the control input terminal thereof is supplied with a control signal having a logic value of "0", said two-input one-output inverting multiplexer producing, as the inverted selected output signal, a signal obtained by inverting the NORed output signal supplied to the second input terminal thereof when the control input terminal thereof is supplied with the control signal having the logic value "1";

first connecting means for connecting the output terminal of said NAND circuit (12) with said core logic carry generation output terminal (GO) to make said core logic carry generation output terminal (GO) produce the NANDed output signal as the core logic carry generation output signal;

second connecting means for connecting the output terminal of said NOR circuit (13) with said core logic carry propagation output terminal (PO) to make said core logic carry propagation output terminal (PO) produce the NORed output signal as the core logic carry propagation output signal;

third connecting means for connecting an output terminal of said two-input one-output inverting multiplexer (35.0) with said core logic carry output terminal (C) to make said core logic carry output terminal (C) produce the inverted selected output signal as the core logic carry output signal; and fourth connecting means for connecting an output terminal of said third exclusive OR circuit with said sum output terminal (S) to make said sum output terminal (S) produce the third exclusively ORed output signal as the summed output signal.

28. A function device as claimed in claim 23, wherein said carry logic circuit (5) comprises:

first connection means for connecting said ripple carry input terminal (RCI) with said ripple-core logic carry output terminal (CCO) to make said ripple-core logic carry output terminal produce the ripple carry input signal as the ripple-core logic carry output signal;

an inverter (15.1) having an input terminal connected to said ripple carry input terminal (RCI), said inverter inverting the ripple carry input signal to produce an inverted ripple carry signal;

a NAND-OR circuit (14.1) having a first input terminal connected to said core logic carry generation input terminal (G), a second input terminal connected to said core logic carry propagation input terminal (P), and a third input terminal connected to an output terminal of said inverter (15.1), said NAND-OR circuit ORing the core logic carry propagation input signal supplied to the second input terminal thereof and the inverted ripple carry signal supplied to the third input terminal thereof to obtain an ORed result signal and NANDing the ORed result signal and the core logic carry generation input signal supplied to the first input terminal thereof to produce an ORed and NANDed output signal; and second connection means for connecting an output terminal of said NAND-OR circuit (14.1) with said ripple carry output terminal (RCO) to make said ripple carry output terminal produce the ORed and NANDed output signal as the ripple carry output signal.

29. A function device as claimed in claim 23, wherein said carry logic circuit (5A) comprises:

first connection means for connecting said ripple carry input terminal (RCI) with said ripple-core logic carry output terminal (CCO) to make said ripple-core logic carry output terminal produce the ripple carry input signal as the ripple-core logic carry output signal;

a two-input one-output inverting multiplexer (35.1) having a first input terminal connected to said core logic carry generation input terminal (G), a second input terminal connected to said core logic carry propagation input terminal (P), and a control input terminal connected to said ripple carry input terminal (RCI), said two-input one-output inverting multiplexer producing, as an inverted selected output signal, a signal obtaining by inverting the core logic carry generation input signal supplied to the first input terminal thereof when the control input terminal thereof is supplied with a control signal having a logic value of "0", said two-input one-output inverting multiplexer producing, as the inverted selected output signal, a signal obtained by inverting the core logic carry propagation input signal supplied to the second input terminal thereof when the control input terminal thereof is supplied with the control signal having the logic value "1"; and second connecting means for connecting an output terminal of said two-input inverting multiplexer (35.1) with said ripple carry output terminal (RCO) to make said ripple carry output terminal (RCO) produce the inverted selected output signal as the ripple carry output signal.

30. A function device comprising at least one odd logic block and at least one even logic block which are alternately arranged, said odd logic block comprising:

a first core logic circuit (41) having a first argument input group consisting of first through fourth argument input terminals (A01, A11, A21, A31), a second argument input group consisting of first though fourth argument input terminals (B01, B11, B21, B31), first through third configuration input terminals (M01, M11, M21), a first core logic carry output terminal (C1) for outputting a first core logic carry output signal, a first core logic carry generation output terminal (GO1) for outputting a first core logic carry generation output signal, a first core logic carry propagation output terminal (PO1) for outputting a first core logic carry propagation output signal, a first ripple-core logic carry input terminal (CCI1) for inputting a first ripple-core logic carry input signal, and a first sum output terminal (S1) for outputting a first summed output signal;

first through third memory circuits connected to said first through said third configuration input terminals (M01, M11, M21), respectively, each of said first through said third memory circuits storing a logic value of one bit, said first through said third memory circuits supplying first through third stored signals to said first through said third configuration input terminals, respectively; and an odd carry logic circuit (5.1) having a ripple carry input terminal (RCI) for inputting a ripple carry input signal from a ripple carry propagation path (7), a ripple carry inverted output terminal (RCOb) for outputting a ripple carry inverted output signal to said ripple carry propagation path (7), a first ripple-core logic carry output terminal (CCO1) for supplying said first ripple-core logic carry input terminal (CCI1) with a first ripple-core logic carry output signal as the first ripple-core logic carry input signal, a first core logic carry generation input terminal (G1) for being supplied from said first core logic carry generation output terminal (GO1) with the first core logic carry generation output signal as a first core logic carry generation input signal, and a first core logic carry propagation input terminal (P1) for being supplied from said first core logic carry propagation output terminal (PO) with the first core logic carry propagation output signal as a first core logic carry propagation input signal, said even logic block comprising:

a second core logic circuit (42) having a third argument input group consisting of first through fourth argument input terminals (A02, A12, A22, A32), a fourth argument input group consisting of first though fourth argument input terminals (B02, B12, B22, B32), fourth through sixth configuration input terminals (M02, M12, M22), a second core logic carry output terminal (C2) for outputting a second core logic carry output signal, a second core logic carry generation output terminal (G02) for outputting a second core logic carry generation output signal, a second core logic carry propagation output terminal (P02) for outputting a second core logic carry propagation output signal, a second ripple-core logic carry input terminal (CCI2) for inputting a second ripple-core logic carry input signal, and a second sum output terminal (S2) for outputting a second summed output signal;

fourth through sixth memory circuits connected to said fourth through said sixth configuration input terminals (M02, M12, M22), respectively, each of said fourth through said sixth memory circuits storing a logic value of one bit, said fourth through said sixth memory circuits supplying fourth through sixth stored signals to said fourth through said sixth configuration input terminals, respectively; and an even carry logic circuit (5.2) having a ripple carry inverted input terminal (RCIb) for inputting a ripple carry inverted input signal from said ripple carry propagation path (7), a ripple carry output terminal (RCO) for outputting a ripple carry output signal to said ripple carry propagation path (7), a second ripple-core logic carry output terminal (CCO2) for supplying said second ripple-core logic carry input terminal (CCI2) with a second ripple-core logic carry output signal as the second ripple-core logic carry input signal, a second core logic carry generation input terminal (G2) for being supplied from said second core logic carry generation output terminal (G02) with the second core logic carry generation output signal as a second core logic carry generation input signal, and a second core logic carry propagation input terminal (P2) for being supplied from said second core logic carry propagation output terminal (PO2) with the second core logic carry propagation output signal as a second core logic carry propagation input signal.

31. A function device as claimed in claim 30, wherein further comprises supplying means for connecting the ripple carry inverted output terminal (RCOb) of said odd carry logic carry circuit (5.1) with the ripple carry inverted input terminal (RCIb) of said even carry logic circuit (5.2) to supply the ripple carry inverted output signal as the ripple carry inverted input signal.

32. A function device as claimed in claim 30, wherein further comprises supplying means for connecting the ripple carry output terminal (RCO) of said even carry logic carry circuit (5.2) with the ripple carry input terminal (RCI) of said odd carry logic circuit (5.1) to supply the ripple carry output signal as the ripple carry input signal.

33. A function device as claimed in claim 30, wherein further comprises:

first supplying means for connecting the ripple carry inverted output terminal (RCOb) of said odd carry logic carry circuit (5.1) with the ripple carry inverted input terminal (RCIb) of said even carry logic circuit (5.2) to supply the ripple carry inverted output signal as the ripple carry inverted input signal; and second supplying means for connecting the ripple carry output terminal (RCO) of said even carry logic carry circuit (5.2) with the ripple carry input terminal (RCI) of said odd carry logic circuit (5.1) to supply the ripple carry output signal as the ripple carry input signal.

34. A function device as claimed in claim 30, wherein said first core logic circuit comprises:

a first two-input one-output multiplexer (10.0) having a first input terminal connected to the first argument input terminal (A01) of said first argument input group, a second input terminal connected to the second argument input terminal (A11) of said first argument input group, and a control input terminal connected to the third argument input terminal (A21) of said first argument input group, said first two-input one-output multiplexer producing, as a first selected output signal, an input signal supplied to the first input terminal thereof when the control input terminal thereof is supplied with a control signal having a logic value of "0", said first two-input one-output multiplexer producing, as the first selected output signal, an input signal supplied to the second input terminal thereof when the control input terminal thereof is supplied with the control signal having a logic value of "1";

a second two-input one-output multiplexer (10.1) having a first input terminal connected to the first argument input terminal (B01) of said second argument input group, a second input terminal connected to the second argument input terminal (B11) of said second argument input group, and a control input terminal connected to the third argument input terminal (B21) of said second argument input group, said second two-input one-output multiplexer producing, as a second selected output signal, an input signal supplied to the first input terminal thereof when the control input terminal thereof is supplied with a control signal having a logic value of "0", said second two-input one-output multiplexer producing, as the second selected output signal, an input signal supplied to the second input terminal thereof when the control input terminal thereof is supplied with the control signal having a logic value of "1";

a third two-input one-output multiplexer (10.2) having a first input terminal connected to the fourth argument input terminal (B31) of said second argument input group, a second input terminal connected to said first ripple-core logic carry input terminal (CCI1), and a control input terminal connected to said first configuration input terminal (M01), said third two-input one-output multiplexer producing, as a third selected output signal, an input signal supplied to the first input terminal thereof when the control input terminal thereof is supplied with a control signal having a logic value of "0", said third two-input one-output multiplexer producing, as the third selected output signal, an input signal supplied to the second input terminal thereof when the control input terminal thereof is supplied with the control signal having a logic value of "1";

a first exclusive OR circuit (11.0) having a first input terminal connected to the fourth argument input terminal (A31) of said first argument input group and a second input terminal connected to an output terminal of said first two-input one-output multiplexer (10.0), said first exclusive OR circuit exclusively ORing an input signal supplied to the first input terminal thereof and the first selected output signal supplied to the second input terminal thereof to produce a first exclusively ORed output signal;

a second exclusive OR circuit (11.1) having a first input terminal connected to an output terminal of said second two-input one-output multiplexer (10.1) and a second input terminal connected to an output terminal of said third two-input one-output multiplexer (10.3), said second exclusive OR circuit exclusively ORing the second selected output signal supplied to the first input terminal thereof and the third selected output signal supplied to the second input terminal thereof to produce a second exclusively ORed output signal;

a fourth two-input one-output multiplexer (10.3) having a first input terminal connected to the output terminal of said second two-input one-output multiplexer (10.1), a second input terminal connected to an output terminal of said second exclusive OR circuit (11.1), and a control input terminal connected to said second configuration input terminal (M1), said fourth two-input one-output multiplexer producing, as a fourth selected output signal, the second selected output signal supplied to the first input terminal thereof when the control input terminal thereof is supplied with a control signal having a logic value of "0", said fourth two-input one-output multiplexer producing, as the fourth selected output signal, the second exclusively ORed output signal when the control input terminal thereof is supplied with the control signal having the logic value of "1";

a fifth two-input one-output multiplexer (10.4) having a first input terminal connected to the output terminal of said third two-input one-output multiplexer (10.2), a second input terminal connected to said third configuration input terminal (M21), and a control input terminal connected to said second configuration input terminal (M11), said fifth two-input one-output multiplexer producing, as a fifth selected output signal, the third selected output signal supplied to the first input terminal thereof when the control input terminal thereof is supplied with a control signal having a logic value of "0", said fifth two-input one-output multiplexer producing, as the fifth selected output signal, an input signal supplied to the second input terminal thereof when the control input terminal thereof is supplied with the control signal having the logic value of "1";

a NAND circuit (12) having a first input terminal connected to an output terminal of said first exclusive OR circuit (11.0) and a second input terminal connected to an output terminal of said fourth two-input one-output multiplexer (10.3), said NAND circuit NANDing the first exclusively ORed output signal supplied to the first input terminal thereof and the fourth selected output signal supplied to the second input terminal thereof to produce a NANDed output signal;

a NOR circuit (13) having a first input terminal connected to the output terminal of said first exclusive OR circuit (11.0) and a second input terminal connected to the output terminal of said fourth two-input one-output multiplexer (10.3), said NOR circuit (13) NoRing the first exclusively ORed output signal supplied to the first input terminal thereof and the fourth selected output signal supplied to the second input terminal thereof to produce a NORed output signal;

a third exclusive OR circuit (11.2) having a first input terminal connected to an output terminal of said first exclusive OR circuit (11.0) and a second input terminal connected to an output terminal of said second exclusive OR circuit (11.1), said third exclusive OR circuit exclusively ORing the first exclusively ORed output signal supplied to the first input terminal thereof and the second exclusively ORed output signal supplied to the second input terminal thereof to produce a third exclusively ORed output signal;

an inverter (15.0) having an input terminal connected to an output terminal of said fifth two-input one-output multiplexer (10.4), said inverter inverting the fifth selected output signal supplied to the input terminal thereof to produce an inverted output signal;

a NAND-OR circuit (14.0) having a first input terminal connected to an output terminal of said NAND circuit (12), a second input terminal connected to an output terminal of said NOR circuit (13), and a third input terminal connected to an output terminal of said inverter (15.0), said NAND-OR circuit ORing the NORed output signal supplied to the second input terminal thereof and the inverted output signal supplied to the third input terminal thereof to obtain an ORed result signal and NANDing the ORed result signal and the NANDed output signal supplied to the first input terminal thereof to produce an ORed and NANDed output signal;

first connecting means for connecting an output terminal of said NAND circuit (12) with said first core logic carry generation output terminal (GO1) to make said first core logic carry generation output terminal (GO1) produce the NANDed output signal as the first core logic carry generation output signal;

second connecting means for connecting an output terminal of said NOR circuit (13) with said first core logic carry propagation output terminal (PO) to make said first core logic carry propagation output terminal (PO1) produce the NORed output signal as the first core logic carry propagation output signal;

third connecting means for connecting an output terminal of said NAND-OR circuit (14.0) with said first core logic carry output terminal (C1) to make said first core logic carry output terminal (C1) produce the ORed and NANDed output signal as the first core logic carry output signal; and fourth connecting means for connecting an output terminal of said third exclusive OR circuit (11.2) with said first sum output terminal (S1) to make said first sum output terminal (S1) produce the third exclusively ORed output signal as the first summed output signal.

35. A function device as claimed in claim 30, wherein said first core logic circuit comprises:

a first two-input one-output multiplexer (10.0) having a first input terminal connected to the first argument input terminal (A01) of said first argument input group, a second input terminal connected to the second argument input terminal (A11) of said first argument input group, and a control input terminal connected to the third argument input terminal (A21) of said first argument input group, said first two-input one-output multiplexer producing, as a first selected output signal, an input signal supplied to the first input terminal thereof when the control input terminal thereof is supplied with a control signal having a logic value of "0", said first two-input one-output multiplexer producing, as the first selected output signal, an input signal supplied to the second input terminal thereof when the control input terminal thereof is supplied with the control signal having a logic value of "1";

a second two-input one-output multiplexer (10.1) having a first input terminal connected to the first argument input terminal (B01) of said second argument input group, a second input terminal connected to the second argument input terminal (B11) of said second argument input group, and a control input terminal connected to the third argument input terminal (B21) of said second argument input group, said second two-input one-output multiplexer producing, as a second selected output signal, an input signal supplied with the first input terminal thereof when the control input terminal thereof is supplied with a control signal having a logic value of "0", said second two-input one-output multiplexer producing, as the second selected output signal, an input signal supplied with the second input terminal thereof when the control input terminal thereof is supplied with the control signal having a logic value of "1";

a third two-input one-output multiplexer (10.2) having a first input terminal connected to the fourth argument input terminal (B31) of said second argument input group, a second input terminal connected to said first ripple-core logic carry input terminal (CCI1), and a control input terminal connected to said first configuration input terminal (M01), said third two-input one-output multiplexer producing, as a third selected output terminal, an input signal supplied to the first input terminal thereof when the control input terminal thereof is supplied with a control signal having a logic value of "0", said third two-input one-output multiplexer producing, as the third selected output terminal, an input signal supplied to the second input terminal thereof when the control input terminal thereof is supplied with the control signal having a logic value of "1";

a first exclusive OR circuit (11.0) having a first input terminal connected to the fourth argument input terminal (A31) of said first argument input group and a second input terminal connected to an output terminal of said first two-input one-output multiplexer (10.0), said first exclusive OR circuit exclusively ORing an input signal supplied with the first input terminal thereof and the first selected output signal supplied with the second input terminal thereof to produce a first exclusively ORed output signal;

a second exclusive OR circuit (11.1) having a first input terminal connected to an output terminal of said second two-input one-output multiplexer (10.1) and a second input terminal connected to an output terminal of said third two-input one-output multiplexer (10.2), said second exclusive OR circuit exclusively ORing the second selected output signal supplied to the first input terminal thereof and the third selected output signal supplied to the second input terminal thereof to produce a second exclusively ORed output signal;

a fourth two-input one-output multiplexer (10.3) having a first input terminal connected to the output terminal of said second two-input one-output multiplexer (10.1), a second input terminal connected to an output terminal of said second exclusive OR circuit (11.1), and a control input terminal connected to said second configuration input terminal (M11), said fourth two-input one-output multiplexer producing, as a fourth selected output signal, the second selected output signal supplied to the first input terminal thereof when the control input terminal thereof is supplied with a control signal having a logic value of "0", said fourth two-input one-output multiplexer producing, as the fourth selected output signal, the second exclusive ORed signal supplied to the second input terminal thereof when the control input terminal thereof is supplied with the control signal having the logic value of "1";

a fifth two-input one-output multiplexer (10.4) having a first input terminal connected to an output terminal of said third two-input one-output multiplexer (10.2), a second input terminal connected to said third configuration input terminal (M21), and a control input terminal connected to said second configuration input terminal (M11), said fifth two-input one-output multiplexer producing, as a fifth selected output signal, the third selected output signal supplied to the first input terminal thereof when the control input terminal thereof is supplied with a control signal having a logic value of "0", said fifth two-input one-output multiplexer producing, as the fifth selected output signal, an input signal supplied to the second input terminal thereof when the control input terminal thereof is supplied with the control signal having the logic value of "1";

a NAND circuit (12) having a first input terminal connected to an output terminal of said first exclusive OR circuit (11.0) and a second input terminal connected to an output terminal of said fourth two-input one-output multiplexer (10.3), said NAND circuit NANDing the first exclusively ORed output signal supplied to the first input terminal thereof and the fourth selected output signal supplied to the second input terminal thereof to produce a NANDed output signal;

a NOR circuit (13) having a first input terminal connected to the output terminal of said first exclusive OR circuit (11.0) and a second input terminal connected to the output terminal of said fourth two-input one-output multiplexer (10.3), said NOR circuit (13) NORing the first exclusively ORed output signal supplied to the first input terminal thereof and the fourth selected output signal supplied to the second input terminal thereof to produce a NORed output signal;

a third exclusive OR circuit (11.2) having a first input terminal connected to the output terminal of said first exclusive OR circuit (11.0) and a second input terminal connected to the output terminal of said second exclusive OR circuit (11.1), said third exclusive OR circuit exclusively ORing the first exclusively ORed output signal supplied to the first input terminal thereof and the second exclusively ORed output signal supplied to the second input terminal thereof to produce a third exclusively ORed output signal;

a two-input one-output inverting multiplexer (35.0) having a first input terminal connected to an output terminal of said NAND circuit (12), a second input terminal connected to an output terminal of said NOR circuit (13), and a control input terminal connected to an output terminal of said fifth two-input one-output multiplexer, said two-input one-output inverting multiplexer producing, as an inverted selected output signal, a signal obtaining by inverting the NANDed output signal supplied to the first input terminal thereof when the control input terminal thereof is supplied with a control signal having a logic value of "0", said two-input one-output inverting multiplexer producing, as the inverted selected output signal, a signal obtained by inverting the NORed output signal supplied to the second input terminal thereof when the control input terminal thereof is supplied with the control signal having the logic value "1";

first connecting means for connecting the output terminal of said NAND circuit (12) with said first core logic carry generation output terminal (GO1) to make said first core logic carry generation output terminal (GO1) produce the NUNDed output signal as the first core logic carry generation output signal;

second connecting means for connecting the output terminal of said NOR circuit (13) with said first core logic carry propagation output terminal (PO1) to make said first core logic carry propagation output terminal (PO1) produce the NORed output signal as the first core logic carry propagation output signal;

third connecting means for connecting an output terminal of said two-input one-output inverting multiplexer (35.0) with said first core logic carry output terminal (C1) to make said first core logic carry output terminal (C1) produce the inverted selected output signal as the first core logic carry output signal; and fourth connecting means for connecting an output terminal of said third exclusive OR circuit with said first sum output terminal (Si) to make said first sum output terminal (S1) produce the third exclusively ORed output signal as the first summed output signal.

36. A function device as claimed in claim 30, wherein said first core logic circuit comprises:

a first two-input one-output multiplexer (10.0) having a first input terminal connected to the first argument input terminal (A01) of said first argument input group, a second input terminal connected to the second argument input terminal (A11) of said first argument input group, and a control input terminal connected to the third argument input terminal (A21) of said first argument input group, said first two-input one-output multiplexer producing, as a first selected output signal, an input signal supplied to the first input terminal thereof when the control input terminal thereof is supplied with a control signal having a logic value of "0", said first two-input one-output multiplexer producing, as the first selected output signal, an input signal supplied to the second input terminal thereof when the control input terminal thereof is supplied with the control signal having a logic value of "1";

a second two-input one-output multiplexer (10.1) having a first input terminal connected to the first argument input terminal (B01) of said second argument input group, a second input terminal connected to the second argument input terminal (B11) of said second argument input group, and a control input terminal connected to the third argument input terminal (B21) of said second argument input group, said second two-input one-output multiplexer producing, as a second selected output signal, an input signal supplied to the first input terminal thereof when the control input terminal thereof is supplied with a control signal having a logic value of "0", said second two-input one-output multiplexer producing, as the second selected output signal, an input signal supplied to the second input terminal thereof when the control input terminal thereof is supplied with the control signal having a logic value of "1";

a third two-input one-output multiplexer (10.2) having a first input terminal connected to the fourth argument input terminal (B31) of said second argument input group, a second input terminal connected to said first ripple-core logic carry input terminal (CCI1), and a control input terminal connected to said first configuration input terminal (MO1), said third two-input one-output multiplexer producing, as a third selected output signal, an input signal supplied to the first input terminal thereof when the control input terminal thereof is supplied with a control signal having a logic value of "0", said third two-input one-output multiplexer producing, as the third selected output signal, an input signal supplied to the second input terminal thereof when the control input terminal thereof is supplied with the control signal having a logic value of "1";

a first exclusive OR circuit (11.0) having a first input terminal connected to the fourth argument input terminal (A31) of said first argument input group and a second input terminal connected to an output terminal of said first two-input one-output multiplexer (10.0), said first exclusive OR circuit exclusively ORing an input signal supplied to the first input terminal thereof and the first selected output signal supplied to the second input terminal thereof to produce a first exclusively ORed output signal;

a second exclusive OR circuit (11.1) having a first input terminal connected to an output terminal of said second two-input one-output multiplexer (10.1) and a second input terminal connected to an output terminal of said third two-input one-output multiplexer (10.2), said second exclusive OR circuit exclusively ORing the second selected output signal supplied to the first input terminal thereof and the third selected output signal supplied to the second input terminal thereof to produce a second exclusively ORed output signal;

a fourth two-input one-output multiplexer (10. 3A) having a first input terminal connected to an output terminal of said second exclusive OR circuit (11.1), a second input terminal connected to the output terminal of said second two-input one-output multiplexer (10.1), and a control input terminal connected to said second configuration input terminal (M11), said fourth two-input one-output multiplexer producing, as a fourth selected output signal, the second exclusively ORed output signal supplied to the first input terminal thereof when the control input terminal thereof is supplied with a control signal having a logic value of "0", said fourth two-input one-output multiplexer producing, as the fourth selected output signal, the second selected output signal supplied to the second input terminal thereof when the control input terminal thereof is supplied with the control signal having the logic value of "1";

a fifth two-input one-output multiplexer (10.4A) having a first input terminal connected to said third configuration input terminal (M21), a second input terminal connected to the output terminal of said third two-input one-output multiplexer (10.2), and a control input terminal connected to said second configuration input terminal (M11), said fifth two-input one-output multiplexer producing, as a fifth selected output signal, an input signal supplied to the first input terminal thereof when the control input terminal thereof is supplied with a control signal having a logic value of "0", said fifth two-input one-output multiplexer producing, as the fifth selected output signal, the third selected output signal supplied to the second input terminal thereof when the control input terminal thereof is supplied with the control signal having the logic value of "1";

a NAND circuit (12) having a first input terminal connected to an output terminal of said first exclusive OR circuit (11.0) and a second input terminal connected to an output terminal of said fourth two-input one-output multiplexer (10.3A), said NAND circuit NANDing the first exclusively ORed output signal supplied to the first input terminal thereof and the fourth selected output signal supplied to the second input terminal thereof to produce a NANDed output signal;

a NOR circuit (13) having a first input terminal connected to the output terminal of said first exclusive OR circuit (11.0) and a second input terminal connected to the output terminal of said fourth two-input one-output multiplexer (10.3A), said NOR circuit (13) NORing the first exclusively ORed output signal supplied to the first input terminal thereof and the fourth selected output signal supplied to the second input terminal thereof to produce a NORed output signal;

a third exclusive OR circuit (11.2) having a first input terminal connected to the output terminal of said first exclusive OR circuit (11.0) and a second input terminal connected to the output terminal of said second exclusive OR circuit (11.1), said third exclusive OR circuit exclusively ORing the first exclusively ORed output signal supplied to the first input terminal thereof and the second exclusively ORed output signal supplied to the second input terminal thereof to produce a third exclusively ORed output signal;

an inverter (15.0) having an input terminal connected to an output terminal of said fifth two-input one-output multiplexer (10. 4A), said inverter inverting the fifth selected output signal supplied to the input terminal thereof to produce an inverted output signal;

a NAND-OR circuit (14.0) having a first input terminal connected to the output terminal of said NAND circuit (12), a second input terminal connected to the output terminal of said NOR circuit (13), and a third input terminal connected to an output terminal of said inverter, said NAND-OR circuit ORing the NORed output signal supplied to the second input terminal thereof and the inverted output signal supplied to the third input terminal thereof to obtain an ORed result signal and NANDing the ORed result signal and the NANDed output signal supplied to the first input terminal thereof to produce an ORed and NANDed output signal;

first connecting means for connecting the output terminal of said NAND circuit (12) with said first core logic carry generation output terminal (GO1) to make said first core logic carry generation output terminal (GOI) produce the NANDed output signal as the first core logic carry generation output signal;

second connecting means for connecting the output terminal of said NOR circuit (13) with said first core logic carry propagation output terminal (PO1) to make said first core logic carry propagation output terminal (PO1) produce the NORed output signal as the first core logic carry propagation output signal;

third connecting means for connecting an output terminal of said NAND-OR circuit (14.0) with said first core logic carry output terminal (C1) to make said first core logic carry output terminal (C1) produce the ORed and NANDed output signal as the first core logic carry output signal; and fourth connecting means for connecting an output terminal of said third exclusive OR circuit with said first sum output terminal (S1) to make said first sum output terminal (S1) produce the third exclusively ORed output signal as the first summed output signal.

37. A function device as claimed in claim 30, wherein said first core logic circuit comprises:

a first two-input one-output multiplexer (10.0) having a first input terminal connected to the first argument input terminal (A01) of said first argument input group, a second input terminal connected to the second argument input terminal (A11) of said first argument input group, and a control input terminal connected to the third argument input terminal (A21) of said first argument input group, said first two-input one-output multiplexer producing, as a first selected output signal, an input signal supplied to the first input terminal thereof when the control input terminal thereof is supplied with a control signal having a logic value of "0", said first two-input one-output multiplexer producing, as the first selected output signal, an input signal supplied to the second input terminal thereof when the control input terminal thereof is supplied with the control signal having a logic value of "1";

a second two-input one-output multiplexer (10.1) having a first input terminal connected to the first argument input terminal (B01) of said second argument input group, a second input terminal connected to the second argument input terminal (B11) of said second argument input group, and a control input terminal connected to the third argument input terminal (B21) of said second argument input group, said second two-input one-output multiplexer producing, as a second selected output signal, an input signal supplied to the first input terminal thereof when the control input terminal thereof is supplied with a control signal having a logic value of "0", said second two-input one-output multiplexer producing, as the second selected output signal, an input signal supplied to the second input terminal thereof when the control input terminal thereof is supplied with the control signal having a logic value of "1";

a third two-input one-output multiplexer (10.2) having a first input terminal connected to the fourth argument input terminal (B31) of said second argument input group, a second input terminal connected to said first ripple-core logic carry input terminal (CCI1), and a control input terminal connected to said first configuration input terminal (M01), said third two-input one-output multiplexer producing, as a third selected output terminal, an input signal supplied to the first input terminal thereof when the control input terminal thereof is supplied with a control signal having a logic value of "0", said third two-input one-output multiplexer producing, as the third selected output terminal, an input signal supplied to the second input terminal thereof when the control input terminal thereof is supplied with the control signal having a logic value of "1";

a first exclusive OR circuit (11.0) having a first input terminal connected to the fourth argument input terminal (A31) of said first argument input group and a second input terminal connected to an output terminal of said first two-input one-output a multiplexer (10.0), said first exclusive OR circuit exclusively ORing an input signal supplied to the first input terminal thereof and the first selected output signal supplied to the second input terminal thereof to produce a first exclusively ORed output signal;

a second exclusive OR circuit (11.1) having a first input terminal connected to an output terminal of said second two-input one-output multiplexer (10.1) and a second input terminal connected to an output terminal of said third two-input one-output multiplexer (10.2), said second exclusive OR circuit exclusively ORing the second selected output signal supplied to the first input terminal thereof and the third selected output signal supplied to the second input terminal thereof to produce a second exclusively ORed output signal;

a fourth two-input one-output multiplexer (10.3A) having a first input terminal connected to an output terminal of said second exclusive OR circuit (11.1), a second input terminal connected to the output terminal of said second two-input one-output multiplexer (10.1), and a control input terminal connected to said second configuration input terminal (M11), said fourth two-input one-output multiplexer producing, as a fourth selected output signal, the second exclusively ORed output signal supplied to the first input terminal thereof when the control input terminal thereof is supplied with a control signal having a logic value of "0", said fourth two-input one-output multiplexer producing, as the fourth selected output signal, the second selected output signal supplied to the second input terminal thereof when the control input terminal thereof is supplied with the control signal having the logic value of "1";

a fifth two-input one-output multiplexer (10.4A) having a first input terminal connected to said third configuration input terminal (M21), a second input terminal connected to the output terminal of said third two-input one-output multiplexer (10.2), and a control input terminal connected to said second configuration input terminal (M11), said fifth two-input one-output multiplexer producing, as a fifth selected output signal, an input signal supplied to the first input terminal thereof when the control input terminal thereof is supplied with a control signal having a logic value of "0", said fifth two-input one-output multiplexer producing, as the fifth selected output signal, the third selected output signal supplied to the second input terminal thereof when the control input terminal thereof is supplied with the control signal having the logic value of "1";

a NAND circuit (12) having a first input terminal connected to an output terminal of said first exclusive OR circuit (11.0) and a second input terminal connected to an output terminal of said fourth two-input one-output multiplexer (10.3A), said NAND circuit NANDing the first exclusively ORed output signal supplied to the first input terminal thereof and the fourth selected output signal supplied to the second input terminal thereof to produce a NANDed output signal;

a NOR circuit (13) having a first input terminal connected to the output terminal of said first exclusive OR circuit (11.0) and a second input terminal connected to the output terminal of said fourth two-input one-output multiplexer (10.3A), said NOR circuit (13) NORing the first exclusively ORed output signal a. supplied to the first input terminal thereof and the fourth selected output signal supplied to the second input terminal thereof to produce a NORed output signal;

a third exclusive OR circuit (11.2) having a first input terminal connected to the output terminal of said first exclusive OR circuit (11.0) and a second input terminal connected to the output terminal of said second exclusive OR circuit (11.1), said third exclusive OR circuit exclusively ORing the first exclusively ORed output signal supplied to the first input terminal thereof and the second exclusively ORed output signal supplied to the second input terminal thereof to produce a third exclusively ORed output signal;

a two-input one-output inverting multiplexer (35.0) having a first input terminal connected to an output terminal of said NAND circuit (12), a second input terminal connected to an output terminal of said NOR circuit (13), and a control input terminal connected to an output terminal of said fifth two-input one-output multiplexer (10.4A), said two-input one-output inverting multiplexer producing, as an inverted selected output signal, a signal obtaining by inverting the NANDed output signal supplied to the first input terminal thereof when the control input terminal thereof is supplied with a control signal having a logic value of "0", said two-input one-output inverting multiplexer producing, as the inverted selected output signal, a signal obtained by inverting the NORed output signal supplied to the second input terminal thereof when the control input terminal thereof is supplied with the control signal having the logic value "1";

first connecting means for connecting the output terminal of said NAND circuit (12) with said first core logic carry generation output terminal (GO1) to make said first core logic carry generation output terminal (GO1) produce the NANDed output signal as the first core logic carry generation output signal;

second connecting means for connecting the output terminal of said NOR circuit (13) with said first core logic carry propagation output terminal (PO1) to make said first core logic carry propagation output terminal (PO1) produce the NORed output signal as the first core logic carry propagation output signal;

third connecting means for connecting an output terminal of said two-input one-output inverting multiplexer (35.0) with said first core logic carry output terminal (C1) to make said first core logic carry output terminal (C1) produce the inverted selected output signal as the first core logic carry output signal; and fourth connecting means for connecting an output terminal of said third exclusive OR circuit with said first sum output terminal (Si) to make said first sum output terminal (Si) produce the third exclusively ORed output signal as the first summed output signal.

38. A function device as claimed in claim 30, wherein said second core logic circuit comprises:

a first two-input one-output multiplexer (10.0) having a first input terminal connected to the first argument input terminal (A02) of said third argument input group, a second input terminal connected to the second argument input terminal (A12) of said third argument input group, and a control input terminal connected to the third argument input terminal (A22) of said third argument input group, said first two-input one-output multiplexer producing, as a first selected output signal, an input signal supplied to the first input terminal thereof when the control input terminal thereof is supplied with a control signal having a logic value of "0", said first two-input one-output multiplexer producing, as the first selected output signal, an input signal supplied to the second input terminal thereof when the control input terminal thereof is supplied with the control signal having a logic value of "1";

a second two-input one-output multiplexer (10.1) having a first input terminal connected to the first argument input terminal (B02) of said fourth argument input group, a second input terminal connected to the second argument input terminal (B12) of said fourth argument input group, and a control input terminal connected to the third argument input terminal (B22) of said fourth argument input group, said second two-input one-output multiplexer producing, as a second selected output signal, an input signal supplied to the first input terminal thereof when the control input terminal thereof is supplied with a control signal having a logic value of "0", said second two-input one-output multiplexer producing, as the second selected output signal, an input signal supplied to the second input terminal thereof when the control input terminal thereof is supplied with the control signal having a logic value of "1";

a third two-input one-output multiplexer (10.2) having a first input terminal connected to the fourth argument input terminal (B32) of said fourth argument inputgroup, a second input terminal connected to said second ripple-core logic carry input terminal (CCI2), and a control input terminal connected to said fourth configuration input terminal (M02), said third two-input one-output multiplexer producing, as a third selected output signal, an input signal supplied to the first input terminal thereof when the control input terminal thereof is supplied with a control signal having a logic value of "0", said third two-input one-output multiplexer producing, as the third selected output signal, an input signal supplied to the second input terminal thereof when the control input terminal thereof is supplied with the control signal having a logic value of "1";

a first exclusive OR circuit (11.0) having a first input terminal connected to the fourth argument input terminal (A32) of said third argument input group and a second input terminal connected to an output terminal of said first two-input one-output multiplexer (10.0), said first exclusive OR circuit exclusively ORing an input signal supplied to the first input terminal thereof and the first selected output signal supplied to the second input terminal thereof to produce a first exclusively ORed output signal;

a second exclusive OR circuit (11.1) having a first input terminal connected to an output terminal of said second two-input one-output multiplexer (10.1) and a second input terminal connected to an output terminal of said third two-input one-output multiplexer (10.3) said second exclusive OR circuit exclusively ORing the second selected output signal supplied to the first input terminal thereof and the third selected output signal supplied to the second input terminal thereof to produce a second exclusively ORed output signal;

a fourth two-input one-output multiplexer (10.3) having a first input terminal connected to the output terminal of said second two-input one-output multiplexer (10.1), a second input terminal connected to an output terminal of said second exclusive OR circuit (11.1), and a control input terminal connected to said fifth configuration input terminal (M12), said fourth two-input one-output multiplexer producing, as a fourth selected output signal, the second selected output signal supplied to the first input terminal thereof when the control input terminal thereof is supplied with a control signal having a logic value of "0", said fourth two-input one-output multiplexer producing, as the fourth selected output signal, the second exclusively ORed output signal when the control input terminal thereof is supplied with the control signal having the logic value of "1";

a fifth two-input one-output multiplexer (10.4) having a first input terminal connected to the output terminal of said third two-input one-output multiplexer (10.2), a second input terminal connected to said sixth configuration input terminal (M22), and a control input terminal connected to said fifth configuration input terminal (M12), said fifth two-input one-output multiplexer producing, as a fifth selected output signal, the third selected output signal supplied to the first input terminal thereof when the control input terminal thereof is supplied with a control signal having a logic value of "0", said fifth two-input one-output multiplexer producing, as the fifth selected output signal, an input signal supplied to the second input terminal thereof when the control input terminal thereof is supplied with the control signal having the logic value of "1";

a NAND circuit (12) having a first input terminal connected to an output terminal of said first exclusive OR circuit (11.0) and a second input terminal connected to an output terminal of said fourth two-input one-output multiplexer (10.3), said NAND circuit NANDing the first exclusively ORed output signal supplied to the first input terminal thereof and the fourth selected output signal supplied to the second input terminal thereof to produce a NANDed output signal;

a NOR circuit (13) having a first input terminal connected to the output terminal of said first exclusive OR circuit (11.0) and a second input terminal connected to the output terminal of said fourth two-input one-output multiplexer (10.3), said NOR circuit (13) NORing the first exclusively ORed output signal supplied to the first input terminal thereof and the fourth selected output signal supplied to the second input terminal thereof to produce a NORed output signal;

a third exclusive OR circuit (11.2) having a first input terminal connected to an output terminal of said first exclusive OR circuit (11.0) and a second input terminal connected to an output terminal of said second exclusive OR circuit (11.1), said third exclusive OR circuit exclusively ORing the first exclusively ORed output signal supplied to the first input terminal thereof and the second exclusively ORed output signal supplied to the second input terminal thereof to produce a third exclusively ORed output signal;

an inverter (15.0) having an input terminal connected to an output terminal of said fifth two-input one-output multiplexer (10.4), said inverter inverting the fifth selected output signal supplied to the input terminal thereof to produce an inverted output signal;

a NAND-OR circuit (14.0) having a first input terminal connected to an output terminal of said NAND circuit (12), a second input terminal connected to an output terminal of said NOR circuit (13), and a third input terminal connected to an output terminal of said inverter (15.0), said NAND-OR circuit ORing the NORed output signal supplied to the second input terminal thereof and the inverted output signal supplied to the third input terminal thereof to obtain an ORed result signal and NANDing the ORed result signal and the NANDed output signal supplied to the first input terminal thereof to produce an ORed and NANDed output signal;

first connecting means for connecting an output terminal of said NAND circuit (12) with said second core logic carry generation output terminal (GO2) to make said second core logic carry generation output terminal (GO2) produce the NANDed output signal as the second core logic carry generation output signal;

second connecting means for connecting an output terminal of said NOR circuit (13) with said second core logic carry propagation output terminal (PO2) to make said second core logic carry propagation output terminal (PO2) produce the NORed output signal as the second core logic carry propagation output signal;

third connecting means for connecting an output terminal of said NAND-OR circuit (14.0) with said second core logic carry output terminal (C2) to make said second core logic carry output terminal (C2) produce the ORed and NANDed output signal as the second core logic carry output signal; and fourth connecting means for connecting an output terminal of said third exclusive OR circuit (11.2) with said second sum output terminal (S2) to make said second sum output terminal (S2) produce the third exclusively ORed output signal as the second summed output signal.

39. A function device as claimed in claim 30, wherein said second core logic circuit comprises:

a first two-input one-output multiplexer (10.0) having a first input terminal connected to the first argument input terminal (A02) of said third argument input group, a second input terminal connected to the second argument input terminal (A12) of said third argument input group, and a control input terminal connected to the third argument input terminal (A22) of said third argument input group, said first two-input one-output multiplexer producing, as a first selected output signal, an input signal supplied to the first input terminal thereof when the control input terminal thereof is supplied with a control signal having a logic value of "0", said first two-input one-output multiplexer producing, as the first selected output signal, an input signal supplied to the second input terminal thereof when the control input terminal thereof is supplied with the control signal having a logic value of "1";

a second two-input one-output multiplexer (10.1) having a first input terminal connected to the first argument input terminal (B02) of said fourth argument input group, a second input terminal connected to the second argument input terminal (B12) of said fourth argument input group, and a control input terminal connected to the third argument input terminal (B22) of said fourth argument input group, said second two-input one-output multiplexer producing, as a second selected output signal, an input signal supplied with the first input terminal thereof when the control input terminal thereof is supplied with a control signal having a logic value of "0", said second two-input one-output multiplexer producing, as the second selected output signal, an input signal supplied with the second input terminal thereof when the control input terminal thereof is supplied with the control signal having a logic value of "1";

a third two-input one-output multiplexer (10.2) having a first input terminal connected to the fourth argument input terminal (B32) of said fourth argument input group, a second input terminal connected to said second ripple-core logic carry input terminal (CCI2), and a control input terminal connected to said fourth configuration input terminal (M02), said third two-input one-output multiplexer producing, as a third selected output terminal, an input signal supplied to the first input terminal thereof when the control input terminal thereof is supplied with a control signal having a logic value of "0", said third two-input one-output multiplexer producing, as the third selected output terminal, an input signal supplied to the second input terminal thereof when the control input terminal thereof is supplied with the control signal having a logic value of "1";

a first exclusive OR circuit (11.0) having a first input terminal connected to the fourth argument input terminal (A32) of said fourth argument input group and a second input terminal connected to an output terminal of said first two-input one-output multiplexer (10.0), said first exclusive OR circuit exclusively ORing an input signal supplied with the first input terminal thereof and the first selected output signal supplied with the second input terminal thereof to produce a first exclusively ORed output signal;

a second exclusive OR circuit (11.1) having a first input terminal connected to an output terminal of said second two-input one-output multiplexer (10.1) and a second input terminal connected to an output terminal of said third two-input one-output multiplexer (10.2), said second exclusive OR circuit exclusively ORing the second selected output signal supplied to the first input terminal thereof and the third selected output signal supplied to the second input terminal thereof to produce a second exclusively ORed output signal;

a fourth two-input one-output multiplexer (10.3) having a first input terminal connected to the output terminal of said second two-input one-output multiplexer (10.1), a second input terminal connected to an output terminal of said second exclusive OR circuit (11.1), and a control input terminal connected to said fifth configuration input terminal (M12), said fourth two-input one-output multiplexer producing, as a fourth selected output signal, the second selected output signal supplied to the first input terminal thereof when the control input terminal thereof is supplied with a control signal having a logic value of "0", said fourth two-input one-output multiplexer producing, as the fourth selected output signal, the second exclusive ORed signal supplied to the second input terminal thereof when the control input terminal thereof is supplied with the control signal having the logic value of "1";

a fifth two-input one-output multiplexer (10.4) having a first input terminal connected to an output terminal of said third two-input one-output multiplexer (10.2), a second input terminal connected to said sixth configuration input terminal (M22), and a control input terminal connected to said fifth configuration input terminal (M12), said fifth two-input one-output multiplexer producing, as a fifth selected output signal, the third selected output signal supplied to the first input terminal thereof when the control input terminal thereof is supplied with a control signal having a logic value of "0", said fifth two-input one-output multiplexer producing, as the fifth selected output signal, an input signal supplied to the second input terminal thereof when the control input terminal thereof is supplied with the control signal having the logic value of "1";

a NAND circuit (12) having a first input terminal connected to an output terminal of said first exclusive OR circuit (11.0) and a second input terminal connected to an output terminal of said fourth two-input one-output multiplexer (10.3), said NAND circuit NANDing the first exclusively ORed output signal supplied to the first input terminal thereof and the fourth selected output signal supplied to the second input terminal thereof to produce a NANDed output signal;

a NOR circuit (13) having a first input terminal connected to the output terminal of said first exclusive OR circuit (11.0) and a second input terminal connected to the output terminal of said fourth two-input one-output multiplexer (10.3), said NOR circuit (13) NORing the first exclusively ORed output signal supplied to the first input terminal thereof and the fourth selected output signal supplied to the second input terminal thereof to produce a NORed output signal;

a third exclusive OR circuit (11.2) having a first input terminal connected to the output terminal of said first exclusive OR circuit (11.0) and a second input terminal connected to the output terminal of said second exclusive OR circuit (11.1), said third exclusive OR circuit exclusively ORing the first exclusively ORed output signal supplied to the first input terminal thereof and the second exclusively ORed output signal supplied to the second input terminal thereof to produce a third exclusively ORed output signal;

a two-input one-output inverting multiplexer (35.0) having a first input terminal connected to an output terminal of said NAND circuit (12), a second input terminal connected to an output terminal of said NOR circuit (13), and a control input terminal connected to an output terminal of said fifth two-input one-output multiplexer, said two-input one-output inverting multiplexer producing, as an inverted selected output signal, a signal obtaining by inverting the NANDed output signal supplied to the first input terminal thereof when the control input terminal thereof is supplied with a control signal having a logic value of "0", said two-input one-output inverting multiplexer producing, as the inverted selected output signal, a signal obtained by inverting the NORed output signal supplied to the second input terminal thereof when the control input terminal thereof is supplied with the control signal having the logic value "1";

first connecting means for connecting the output terminal of said NAND circuit (12) with said second core logic carry generation output terminal (GO2) to make said second core logic carry generation output terminal (GO2) produce the NANDed output signal as the second core logic carry generation output signal;

second connecting means for connecting the output terminal of said NOR circuit (13) with said second core logic carry propagation output terminal (PO2) to make said second core logic carry propagation output terminal (PO2) produce the NORed output signal as the second core logic carry propagation output signal;

third connecting means for connecting an output terminal of said two-input one-output inverting multiplexer (35.0) with said second core logic carry output terminal (C2) to make said second core logic carry output terminal (C2) produce the inverted selected output signal as the second core logic carry output signal; and fourth connecting means for connecting an output terminal of said third exclusive OR circuit with said second sum output terminal (S2) to make said second sum output terminal (S2) produce the third exclusively ORed output signal as the second summed output signal.

40. A function device as claimed in claim 30, wherein said second core logic circuit comprises:

a first two-input one-output multiplexer (10.0) having a first input terminal connected to the first argument input terminal (A02) of said third argument input group, a second input terminal connected to the second argument input terminal (A12) of said third argument input group, and a control input terminal connected to the third argument input terminal (A22) of said third argument input group, said first two-input one-output multiplexer producing, as a first selected output signal, an input signal supplied to the first input terminal thereof when the control input terminal thereof is supplied with a control signal having a logic value of "0", said first two-input one-output multiplexer producing, as the first selected output signal, an input signal supplied to the second input terminal thereof when the control input terminal thereof is supplied with the control signal having a logic value of "1";

a second two-input one-output multiplexer (10.1) having a first input terminal connected to the first argument input terminal (B02) of said fourth argument input group, a second input terminal connected to the second argument input terminal (B12) of said fourth argument input group, and a control input terminal connected to the third argument input terminal (B22) of said fourth argument input group, said second two-input one-output multiplexer producing, as a second selected output signal, an input signal supplied to the first input terminal thereof when the control input terminal thereof is supplied with a control signal having a logic value of "0", said second two-input one-output multiplexer producing, as the second selected output signal, an input signal supplied to the second input terminal thereof when the control input terminal thereof is supplied with the control signal having a logic value of "1";

a third two-input one-output multiplexer (10.2) having a first input terminal connected to the fourth argument input terminal (B32) of said fourth argument input group, a second input terminal connected to said second ripple-core logic carry input terminal (CCI2), and a control input terminal connected to said fourth configuration input terminal (M02), said third two-input one-output multiplexer producing, as a third selected output signal, an input signal supplied to the first input terminal thereof when the control input terminal thereof is supplied with a control signal having a logic value of "0" said third two-input one-output multiplexer producing, as the third selected output signal, an input signal supplied to the second input terminal thereof when the control input terminal thereof is supplied with the control signal having a logic value of "1";

a first exclusive OR circuit (11.0) having a first input terminal connected to the fourth argument input terminal (A32) of said third argument input group and a second input terminal connected to an output terminal of said first two-input one-output multiplexer (10.0), said first exclusive OR circuit exclusively ORing an input signal supplied to the first input terminal thereof and the first selected output signal supplied to the second input terminal thereof to produce a first exclusively ORed output signal;

a second exclusive OR circuit (11.1) having a first input terminal connected to an output terminal of said second two-input one-output multiplexer (10.1) and a second input terminal connected to an output terminal of said third two-input one-output multiplexer (10.2), said second exclusive OR circuit exclusively ORing the second selected output signal supplied to the first input terminal thereof and the third selected output signal supplied to the second input terminal thereof to produce a second exclusively ORed output signal;

a fourth two-input one-output multiplexer (10.3A) having a first input terminal connected to an output terminal of said second exclusive OR circuit (11.1), a second input terminal connected to the output terminal of said second two-input one-output multiplexer (10.1), and a control input terminal connected to said fifth configuration input terminal (M12), said fourth two-input one-output multiplexer producing, as a fourth selected output signal, the second exclusively ORed output signal supplied to the first input terminal thereof when the control input terminal thereof is supplied with a control signal having a logic value of "0", said fourth two-input one-output multiplexer producing, as the fourth selected output signal, the second selected output signal supplied to the second input terminal thereof when the control input terminal thereof is supplied with the control signal having the logic value of "1";

a fifth two-input one-output multiplexer (10.4A) having a first input terminal connected to said sixth configuration input terminal (M22), a second input terminal connected to the output terminal of said third two-input one-output multiplexer (10.2), and a control input terminal connected to said fifth configuration input terminal (M12), said fifth two-input one-output multiplexer producing, as a fifth selected output signal, an input signal supplied to the first input terminal thereof when the control input terminal thereof is supplied with a control signal having a logic value of "0" said fifth two-input one-output multiplexer producing, as the fifth selected output signal, the third selected output signal supplied to the second input terminal thereof when the control input terminal thereof is supplied with the control signal having the logic value of "1";

a NAND circuit (12) having a first input terminal connected to an output terminal of said first exclusive OR circuit (11.0) and a second input terminal connected to an output terminal of said fourth two-input one-output multiplexer (10.3A), said NAND circuit NANDing the first exclusively ORed output signal supplied to the first input terminal thereof and the fourth selected output signal supplied to the second input terminal thereof to produce a NANDed output signal;

a NOR circuit (13) having a first input terminal connected to the output terminal of said first exclusive OR circuit (11.0) and a second input terminal connected to the output terminal of said fourth two-input one-output multiplexer (10.3A), said NOR circuit (13) NORing the first exclusively ORed output signal supplied to the first input terminal thereof and the fourth selected output signal supplied to the second input terminal thereof to produce a NORed output signal;

a third exclusive OR circuit (11.2) having a first input terminal connected to the output terminal of said first exclusive OR circuit (11.0) and a second input terminal connected to the output terminal of said second exclusive OR circuit (11.1), said third exclusive OR circuit exclusively ORing the first exclusively ORed output signal supplied to the first input terminal thereof and the second exclusively ORed output signal supplied to the second input terminal thereof to produce a third exclusively ORed output signal;

an inverter (15.0) having an input terminal connected to an output terminal of said fifth two-input one-output multiplexer (10.4A), said inverter inverting the fifth selected output signal supplied to the input terminal thereof to produce an inverted output signal;

a NAND-OR circuit (14.0) having a first input terminal connected to the output terminal of said NAND circuit (12), a second input terminal connected to the output terminal of said NOR circuit (13), and a third input terminal connected to an output terminal of said inverter (15.0), said NAND-OR circuit ORing the NORed output signal supplied to the second input terminal thereof and the inverted output signal supplied to the third input terminal thereof to obtain an ORed result signal and NANDing the ORed result signal and the NANDed output signal supplied to the first input terminal thereof to produce an ORed and NANDed output signal;

first connecting means for connecting the output terminal of said NAND circuit (12) with said second core logic carry generation output terminal (GO2) to make said second core logic carry generation output terminal (GO2) produce the NANDed output signal as the second core logic carry generation output signal;

second connecting means for connecting the output terminal of said NOR circuit (13) with said second core logic carry propagation output terminal (PO2) to make said second core logic carry propagation output terminal (PO2) produce the NORed output signal as the second core logic carry propagation output signal;

third connecting means for connecting an output terminal of said NAND-OR circuit (14.0) with said second core logic carry output terminal (C2) to make said second core logic carry output terminal (C2) produce the ORed and NANDed output signal as the second core logic carry output signal; and fourth connecting means for connecting an output terminal of said third exclusive OR circuit with said second sum output terminal (S2) to make said second sum output terminal (S2) produce the third exclusively ORed output signal as the second summed output signal.

41. A function device as claimed in claim 30, wherein said second core logic circuit comprises:

a first two-input one-output multiplexer (10.0) having a first input terminal connected to the first argument input terminal (A02) of said third argument input group, a second input terminal connected to the second argument input terminal (A12) of said third argument input group, and a control input terminal connected to the third argument input terminal (A22) of said third argument input group, said first two-input one-output multiplexer producing, as a first selected output signal, an input signal supplied to the first input terminal thereof when the control input terminal thereof is supplied with a control signal having a logic value of "0", said first two-input one-output multiplexer producing, as the first selected output signal, an input signal supplied to the second input terminal thereof when the control input terminal thereof is supplied with the control signal having a logic value of "1";

a second two-input one-output multiplexer (10.1) having a first input terminal connected to the first argument input terminal (B02) of said fourth argument input group, a second input terminal connected to the second argument input terminal (B12) of said fourth argument input group, and a control input terminal connected to the third argument input terminal (B22) of said fourth argument input group, said second two-input one-output multiplexer producing, as a second selected output signal, an input signal supplied to the first input terminal thereof when the control input terminal thereof is supplied with a control signal having a logic value of "0", said second two-input one-output multiplexer producing, as the second selected output signal, an input signal supplied to the second input terminal thereof when the control input terminal thereof is supplied with the control signal having a logic value of "1";

a third two-input one-output multiplexer (10.2) having a first input terminal connected to the fourth argument input terminal (B32) of said fourth argument input group, a second input terminal connected to said second ripple-core logic carry input terminal (CCI2), and a control input terminal connected to said fourth configuration input terminal (M02), said third two-input one-output multiplexer producing, as a third selected output terminal, an input signal supplied to the first input terminal thereof when the control input terminal thereof is supplied with a control signal having a logic value of "0", said third two-input one-output multiplexer producing, as the third selected output terminal, an input signal supplied to the second input terminal thereof when the control input terminal thereof is supplied with the control signal having a logic value of "1";

a first exclusive OR circuit (11.0) having a first input terminal connected to the fourth argument input terminal (A32) of said third argument input group and a second input terminal connected to an output terminal of said first two-input one-output multiplexer (10.0), said first exclusive OR circuit exclusively ORing an input signal supplied to the first input terminal thereof and the first selected output signal supplied to the second input terminal thereof to produce a first exclusively ORed output signal;

a second exclusive OR circuit (11.1) having a first input terminal connected to an output terminal of said second two-input one-output multiplexer (10.1) and a second input terminal connected to an output terminal of said third two-input one-output multiplexer (10.2), said second exclusive OR circuit exclusively ORing the second selected output signal supplied to the first input terminal thereof and the third selected output signal supplied to the second input terminal thereof to produce a second exclusively ORed output signal;

a fourth two-input one-output multiplexer (10.3A) having a first input terminal connected to an output terminal of said second exclusive OR circuit (11.1), a second input terminal connected to the output terminal of said second two-input one-output multiplexer (10.1), and a control input terminal connected to said fifth configuration input terminal (M12), said fourth two-input one-output multiplexer producing, as a fourth selected output signal, the second exclusively ORed output signal supplied to the first input terminal thereof when the control input terminal thereof is supplied with a control signal having a logic value of "0", said fourth two-input one-output multiplexer producing, as the fourth selected output signal, the second selected output signal supplied to the second input terminal thereof when the control input terminal thereof is supplied with the control signal having the logic value of "1";

a fifth two-input one-output multiplexer (10.4A) having a first input terminal connected to said sixth configuration input terminal (M22), a second input terminal connected to the output terminal of said third two-input one-output multiplexer (10.2), and a control input terminal connected to said fifth configuration input terminal (M12), said fifth two-input one-output multiplexer producing, as a fifth selected output signal, an input signal supplied to the first input terminal thereof when the control input terminal thereof is supplied with a control signal having a logic value of "0", said fifth two-input one-output multiplexer producing, as the fifth selected output signal, the third selected output signal supplied to the second input terminal thereof when the control input terminal thereof is supplied with the control signal having the logic value of "1";

a NAND circuit (12) having a first input terminal connected to an output terminal of said first exclusive OR circuit (11.0) and a second input terminal connected to an output terminal of said fourth two-input one-output multiplexer (10.3A), said NAND circuit NANDing the first exclusively ORed output signal supplied to the first input terminal thereof and the fourth selected output signal supplied to the second input terminal thereof to produce a NANDed output signal;

a NOR circuit (13) having a first input terminal connected to the output terminal of said first exclusive OR circuit (11.0) and a second input terminal connected to the output terminal of said fourth two-input one-output multiplexer (10.3A), said NOR circuit (13) NORing the first exclusively ORed output signal supplied to the first input terminal thereof and the fourth selected output signal supplied to the second input terminal thereof to produce a NORed output signal;

a third exclusive OR circuit (11.2) having a first input terminal connected to the output terminal of said first exclusive OR circuit (11.0) and a second input terminal connected to the output terminal of said second exclusive OR circuit (11.1), said third exclusive OR circuit exclusively ORing the first exclusively ORed output signal supplied to the first input terminal thereof and the second exclusively ORed output signal supplied to the second input terminal thereof to produce a third exclusively ORed output signal;

a two-input one-output inverting multiplexer (35.0) having a first input terminal connected to an output terminal of said NAND circuit (12), a second input terminal connected to an output terminal of said NOR circuit (13), and a control input terminal connected to an output terminal of said fifth two-input one-output multiplexer (10.4A), said two-input one-output inverting multiplexer producing, as an inverted selected output signal, a signal obtaining by inverting the NANDed output signal supplied to the first input terminal thereof when the control input terminal thereof is supplied with a control signal having a logic value of "0", said two-input one-output inverting multiplexer producing, as the inverted selected output signal, a signal obtained by inverting the NORed output signal supplied to the second input terminal thereof when the control input terminal thereof is supplied with the control signal having the logic value "1";

first connecting means for connecting the output terminal of said NAND circuit (12) with said second core logic carry generation output terminal (GO2) to make said second core logic carry generation output terminal (GO2) produce the NANDed output signal as the second core logic carry generation output signal;

second connecting means for connecting the output terminal of said NOR circuit (13) with said second core logic carry propagation output terminal (PO2) to make said second core logic carry propagation output terminal (PO2) produce the NORed output signal as the second core logic carry propagation output signal;

third connecting means for connecting an output terminal of said two-input one-output inverting multiplexer (35.0) with said second core logic carry output terminal (C2) to make said second core logic carry output terminal (C2) produce the inverted selected output signal as the second core logic carry output signal; and fourth connecting means for connecting an output terminal of said third exclusive OR circuit with said second sum output terminal (S2) to make said second sum output terminal (S2) produce the third exclusively ORed output signal as the second summed output signal.

42. A function device as claimed in claim 30, wherein said odd carry logic circuit (5.1) comprises:

first connection means for connecting said ripple carry input terminal (RCI) with said first ripple-core logic carry output terminal (CCO1) to make said first ripple-core logic carry output terminal produce the ripple carry input signal as the first ripple-core logic carry output signal;

a first inverter (15.1) having an input terminal connected to said first core logic carry generation input terminal (G1), said first inverter inverting the first core logic carry generation input signal to produce an inverted core logic carry generation signal;

a second inverter (15.2) having an input terminal connected to said first core logic carry propagation input terminal (P1), said second inverter inverting the first core logic carry propagation input signal to produce an inverted core logic carry propagation signal;

a NOR-AND circuit (52) having a first input terminal connected to an output terminal of said first inverter (15.1), a second input terminal connected to an output terminal of said second inverter (15.2), and a third input terminal connected to said ripple carry input terminal (RCI), said NOR-AND circuit ANDing the inverted core logic carry propagation input signal supplied to the second input terminal thereof and the ripple carry signal supplied to the third input terminal thereof to obtain an ANDed result signal and NORing the ANDed result signal and the inverted core logic carry generation input signal supplied to the first input terminal thereof to produce an ANDed and NORed output signal; and second connection means for connecting an output terminal of said NOR-AND circuit (52) with said ripple carry inverted output terminal (RCOb) to make said ripple carry inverted output terminal produce the ANDed and NORed output signal as the ripple carry inverted output signal, said even carry logic circuit (5.2) comprising:

a third inverter (15.3) having an input terminal connected to said ripple carry inverted input terminal (RCIb), said third inverter inverting the ripple carry inverted input signal to produce a ripple carry input signal;

third connection means for connecting an output terminal of said third inverter (15.3) with said second ripple-core logic carry output terminal (CCO2) to make said second ripple-core logic carry output terminal produce the ripple carry input signal as the second ripple-core logic carry output signal;

a NAND-OR circuit (14.1) having a first input terminal connected to said second core logic carry generation input terminal (G2), a second input terminal connected to said second core logic carry propagation input terminal (P2), and a third input terminal connected to said ripple carry inverted input terminal (RCIb), said NAND-OR circuit ORing the second core logic carry propagation input signal supplied to the second input terminal thereof and the ripple carry inverted signal supplied to the third input terminal thereof to obtain an ORed result signal and NANDing the ORed result signal and the first core logic carry generation input signal supplied to the first input terminal thereof to produce an ORed and NANDed output signal; and fourth connection means for connecting an output terminal of said NAND-OR circuit (14.1) with said ripple carry output terminal (RCO) to make said ripple carry output terminal produce the ORed and NANDed output signal as the ripple carry output signal.

43. A programmable function block comprising:

a core logic circuit (4, 4A, 4B, 4C) having a first argument input group consisting of first through fourth argument input terminals (A0, A1, A2, A4), a second argument input group consisting of first through fourth argument input terminals (B0, B1, B2, B3), first through third configuration input terminals (M0, M1, M2), a core logic carry output terminal (C) for outputting a core logic carry output signal, a core logic carry generation output terminal (GO) for outputting a core logic carry generation output signal, a core logic carry propagation output terminal (PO) for outputting a core logic carry propagation output signal, a ripple-core logic carry input terminal (CCI) for inputting a ripple-core logic carry input terminal, and a sum output terminal (S) for outputting a summed output signal;

an input block (3) connected to interconnection wires and the first and the second argument input groups, said input block including eighth input selection units for selecting, as eight input selected signals, eight ones of signals on the interconnection wires, a fixed logic value of "1", and a fixed logic value of "0", said input selection units supplying the eight input selected signals to said first through said fourth argument input terminals of the first and the second argument input groups;

first through third memory circuits (6.0, 6.1, 6.3), connected to the first through the third configuration input terminals (M0, M1, M2), respectively, for storing, as first through third stored logic values, a logic value of one bit, said first through said third memory circuits supplying the first through the third stored logic values to the first through the third configuration input terminals, respectively; and a carry logic circuit (5, 5A) having a ripple carry input terminal (RCI) for inputting a ripple carry input signal from a ripple carry propagation path (7), a ripple carry output terminal (RCO) for outputting a ripple carry output signal to said ripple carry propagation path (7), a ripple-core logic carry output terminal (CCO) for supplying the ripple-core logic carry input terminal (CCI) with a ripple-core logic carry output signal as the ripple-core logic carry input signal, a core logic carry generation input terminal (G) for inputting the core logic carry generation output signal as a core logic carry generation input signal from the core logic carry output terminal (GO), and a core logic carry propagation input terminal (P) for inputting the core logic carry propagation output signal as a core logic carry propagation input signal from the core logic carry propagation output terminal (PO).

44. A programmable function block as claimed in claim 43, wherein said core logic circuit (4) comprises:

a first two-input one-output multiplexer (10.0) having a first input terminal connected to the first argument input terminal (A0) of said first argument input group, a second input terminal connected to the second argument input terminal (A1) of said first argument input group, and a control input terminal connected to the third argument input terminal (A2) of said first argument input group, said first two-input one-output multiplexer producing, as a first selected output signal, an input signal supplied to the first input terminal thereof when the control input terminal thereof is supplied with a control signal having a logic value of "0", said first two-input one-output multiplexer producing, as the first selected output signal, an input signal supplied to the second input terminal thereof when the control input terminal thereof is supplied with the control signal having a logic value of "1";

a second two-input one-output multiplexer (10.1) having a first input terminal connected to the first argument input terminal (B0) of said second argument input group, a second input terminal connected to the second argument input terminal (B1) of said second argument input group, and a control input terminal connected to the third argument input terminal (B2) of said second argument input group, said second two-input one-output multiplexer producing, as a second selected output signal, an input signal supplied to the first input terminal thereof when the control input terminal thereof is supplied with a control signal having a logic value of "0", said second two-input one-output multiplexer producing, as the second selected output signal, an input signal supplied to the second input terminal thereof when the control input terminal thereof is supplied with the control signal having a logic value of "1";

a third two-input one-output multiplexer (10.2) having a first input terminal connected to the fourth argument input terminal (B3) of said second argument input group, a second input terminal connected to said ripple-core logic carry input terminal (CCI), and a control input terminal connected to said first configuration input terminal (M0), said third two-input one-output multiplexer producing, as a third selected output signal, an input signal supplied to the first input terminal thereof when the control input terminal thereof is supplied with a control signal having a logic value of "0", said third two-input one-output multiplexer producing, as the third selected output signal, an input signal supplied to the second input terminal thereof when the control input terminal thereof is supplied with the control signal having a logic value of "1";

a first exclusive OR circuit (11.0) having a first input terminal connected to the fourth argument input terminal (A3) of said first argument input group and a second input terminal connected to an output terminal of said first two-input one-output multiplexer (10.0), said first exclusive OR circuit exclusively ORing an input signal supplied to the first input terminal thereof and the first selected output signal supplied to the second input terminal thereof to produce a first exclusively ORed output signal;

a second exclusive OR circuit (11.1) having a first input terminal connected to an output terminal of said second two-input one-output multiplexer (10.1) and a second input terminal connected to an output terminal of said third two-input one-output multiplexer (10.3), said second exclusive OR circuit exclusively ORing the second selected output signal supplied to the first input terminal thereof and the third selected output signal supplied to the second input terminal thereof to produce a second exclusively ORed output signal;

a fourth two-input one-output multiplexer (10.3) having a first input terminal connected to the output terminal of said second two-input one-output multiplexer (10.1), a second input terminal connected to an output terminal of said second exclusive OR circuit (11.1), and a control input terminal connected to said second configuration input terminal (M1), said fourth two-input one-output multiplexer producing, as a fourth selected output signal, the second selected output signal supplied to the first input terminal thereof when the control input terminal thereof is supplied with a control signal having a logic value of "0", said fourth two-input one-output multiplexer producing, as the fourth selected output signal, the second exclusively ORed output signal when the control input terminal thereof is supplied with the control signal having the logic value of "1";

a fifth two-input one-output multiplexer (10.4) having a first input terminal connected to the output terminal of said third two-input one-output multiplexer (10.2), a second input terminal connected to said third configuration input terminal (M2), and a control input terminal connected to said second configuration input terminal (M1), said fifth two-input one-output multiplexer producing, as a fifth selected output signal, the third selected output signal supplied to the first input terminal thereof when the control input terminal thereof is supplied with a control signal having a logic value of "0", said fifth two-input one-output multiplexer producing, as the fifth selected output signal, an input signal supplied to the second input terminal thereof when the control input terminal thereof is supplied with the control signal having the logic value of "1";

a NAND circuit (12) having a first input terminal connected to an output terminal of said first exclusive OR circuit (11.0) and a second input terminal connected to an output terminal of said fourth two-input one-output multiplexer (10.3), said NAND circuit NANDing the first exclusively ORed output signal supplied to the first input terminal thereof and the fourth selected output signal supplied to the second input terminal thereof to produce a NANDed output signal;

a NOR circuit (13) having a first input terminal connected to the output terminal of said first exclusive OR circuit (11.0) and a second input terminal connected to the output terminal of said fourth two-input one-output multiplexer (10.3), said NOR circuit (13) NORing the first exclusively ORed output signal supplied to the first input terminal thereof and the fourth selected output signal supplied to the second input terminal thereof to produce a NORed output signal;

a third exclusive OR circuit (11.2) having a first input terminal connected to an output terminal of said first exclusive OR circuit (11.0) and a second input terminal connected to an output terminal of said second exclusive OR circuit (11.1), said third exclusive OR circuit exclusively ORing the first exclusively ORed output signal supplied to the first input terminal thereof and the second exclusively ORed output signal supplied to the second input terminal thereof to produce a third exclusively ORed output signal;

an inverter (15.0) having an input terminal connected to an output terminal of said fifth two-input one-output multiplexer (10.4), said inverter inverting the fifth selected output signal supplied to the input terminal thereof to produce an inverted output signal;

a NAND-OR circuit (14.0) having a first input terminal connected to an output terminal of said NAND circuit (12), a second input terminal connected to an output terminal of said NOR circuit (13), and a third input terminal connected to an output terminal of said inverter (15.0), said NAND-OR circuit ORing the NORed output signal supplied to the second input terminal thereof and the inverted output signal supplied to the third input terminal thereof to obtain an ORed result signal and NANDing the ORed result signal and the NANDed output signal supplied to the first input terminal thereof to produce an ORed and NANDed output signal;

first connecting means for connecting an output terminal of said NAND circuit (12) with said core logic carry generation output terminal (GO) to make said core logic carry generation output terminal (GO) produce the NANDed output signal as the core logic carry generation output signal;

second connecting means for connecting an output terminal of said NOR circuit (13) with said core logic carry propagation output terminal (PO) to make said core logic carry propagation output terminal (PO) produce the NORed output signal as the core logic carry propagation output signal;

third connecting means for connecting an output terminal of said NAND-OR circuit (14.0) with said core logic carry output terminal (C) to make said core logic carry output terminal (C) produce the ORed and ENDed output signal as the core logic carry output signal; and fourth connecting means for connecting an output terminal of said third exclusive OR circuit (11.2) with said sum output terminal (S) to make said sum output terminal (S) produce the third exclusively ORed output signal as the summed output signal.

45. A programmable function block as claimed in claim 43, wherein said core logic circuit (4A) comprises:

a first two-input one-output multiplexer (10.0) having a first input terminal connected to the first argument input terminal (A0) of said first argument input group, a second input terminal connected to the second argument input terminal (A1) of said first argument input group, and a control input terminal connected to the third argument input terminal (A2) of said first argument input group, said first two-input one-output multiplexer producing, as a first selected output signal, an input signal supplied to the first input terminal thereof when the control input terminal thereof is supplied with a control signal having a logic value of "0", said first two-input one-output multiplexer producing, as the first selected output signal, an input signal supplied to the second input terminal thereof when the control input terminal thereof is supplied with the control signal having a logic value of "1";

a second two-input one-output multiplexer (10.1) having a first input terminal connected to the first argument input terminal (B0) of said second argument input group, a second input terminal connected to the second argument input terminal (B1) of said second argument input group, and a control input terminal connected to the third argument input terminal (B2) of said second argument input group, said second two-input one-output multiplexer producing, as a second selected output signal, an input signal supplied with the first input terminal thereof when the control input terminal thereof is supplied with a control signal having a logic value of "0", said second two-input A-one-output multiplexer producing, as the second selected output signal, an input signal supplied with the second input terminal thereof when the control input terminal thereof is supplied with the control signal having a logic value of "1";

a third two-input one-output multiplexer (10.2) having a first input terminal connected to the fourth argument input terminal (B3) of said second argument input group, a second input terminal connected to said ripple-core logic carry input terminal (CCI), and a control input terminal connected to said first configuration input terminal (M0), said third two-input one-output multiplexer producing, as a third selected output terminal, an input signal supplied to the first input terminal thereof when the control input terminal thereof is supplied with a control signal having a logic value of "0", said third two-input one-output multiplexer producing, as the third selected output terminal, an input signal supplied to the second input terminal thereof when the control input terminal thereof is supplied with the control signal having a logic value of "1";

a first exclusive OR circuit (11.0) having a first input terminal connected to the fourth argument input terminal (A3) of said first argument input group and a second input terminal connected to an output terminal of said first two-input one-output multiplexer (10.0), said first exclusive OR circuit exclusively ORing an input signal supplied with the first input terminal thereof and the first selected output signal supplied with the second input terminal thereof to produce a first exclusively ORed output signal;

a second exclusive OR circuit (11.1) having a first input terminal connected to-an output terminal of said second two-input one-output multiplexer (10.1) and a second input terminal connected to an output terminal of said third two-input one-output multiplexer (10.2), said second exclusive OR circuit exclusively ORing the second selected output signal supplied to the first input terminal thereof and the third selected output signal supplied to the second input terminal thereof to produce a second exclusively ORed output signal;

a fourth two-input one-output multiplexer (10.3) having a first input terminal connected to the output terminal of said second two-input one-output multiplexer (10.1), a second input terminal connected to an output terminal of said second exclusive OR circuit (11.1), and a control input terminal connected to said second configuration input terminal (M1), said fourth two-input one-output multiplexer producing, as a fourth selected output signal, the second selected output signal supplied to the first input terminal thereof when the control input terminal thereof is supplied with a control signal having a logic value of "0", said fourth two-input one-output multiplexer producing, as the fourth selected output signal, the second exclusive ORed signal supplied to the second input terminal thereof when the control input terminal thereof is supplied with the control signal having the logic value of "1";

a fifth two-input one-output multiplexer (10.4) having a first input terminal connected to an output terminal of said third two-input one-output multiplexer (10.2), a second input terminal connected to said third configuration input terminal (M2), and a control input terminal connected to said second configuration input terminal (M1), said fifth two-input one-output multiplexer producing, as a fifth selected output signal, the third selected output signal supplied to the first input terminal thereof when the control input terminal thereof is supplied with a control signal having a logic value of "0", said fifth two-input one-output multiplexer producing, as the fifth selected output signal, an input signal supplied to the second input terminal thereof when the control input terminal thereof is supplied with the control signal having the logic value of "1";

a NAND circuit (12) having a first input terminal connected to an output terminal of said first exclusive OR circuit (11.0) and a second input terminal connected to an output terminal of said fourth two-input one-output multiplexer (10.3), said NAND circuit NANDing the first exclusively ORed output signal supplied to the first input terminal thereof and the fourth selected output signal supplied to the second input terminal thereof to produce a NANDed output signal;

a NOR circuit (13) having a first input terminal connected to the output terminal of said first exclusive OR circuit (11.0) and a second input terminal connected to the output terminal of said fourth two-input one-output multiplexer (10.3), said NOR circuit (13) NORing the first exclusively ORed output signal supplied to the first input terminal thereof and the fourth selected output signal supplied to the second input terminal thereof to produce a NORed output signal;

a third exclusive OR circuit (11.2) having a first input terminal connected to the output terminal of said first exclusive OR circuit (11.0) and a second input terminal connected to the output terminal of said second exclusive OR circuit (11.1), said third exclusive OR circuit exclusively ORing the first exclusively ORed output signal supplied to the first input terminal thereof and the second exclusively ORed output signal supplied to the second input terminal thereof to produce a third exclusively ORed output signal;

a two-input one-output inverting multiplexer (35.0) having a first input terminal connected to an output terminal of said NAND circuit (12), a second input terminal connected to an output terminal of said NOR circuit (13), and a control input terminal connected to an output terminal of said fifth two-input one-output multiplexer, said two-input one-output inverting multiplexer producing, as an inverted selected output signal, a signal obtaining by inverting the NANDed output signal supplied to the first input terminal thereof when the control input terminal thereof is supplied with a control signal having a logic value of "0", said two-input one-output inverting multiplexer producing, as the inverted selected output signal, a signal obtained by inverting the NORed output signal supplied to the second input terminal thereof when the control input terminal thereof is supplied with the control signal having the logic value "1";

first connecting means for connecting the output terminal of said NAND circuit (12) with said core logic carry generation output terminal (GO) to make said core logic carry generation output terminal (GO) produce the NANDed output signal as the core logic carry generation output signal;

second connecting means for connecting the output terminal of said NOR circuit (13) with said core logic carry propagation output terminal (PO) to make said core logic carry propagation output terminal (PO) produce the NORed output signal as the core logic carry propagation output signal;

third connecting means for connecting an output terminal of said two-input one-output inverting multiplexer (35.0) with said core logic carry output terminal (C) to make said core logic carry output terminal (C) produce the inverted selected output signal as the core logic carry output signal; and fourth connecting means for connecting an output terminal of said third exclusive OR circuit with said sum output terminal (S) to make said sum output terminal (S) produce the third exclusively ORed output signal as the summed output signal.

46. A programmable function block as claimed in claim 43, wherein said core logic circuit (4B) comprises:

a first two-input one-output multiplexer (10.0) having a first input terminal connected to the first argument input terminal (A0) of said first argument input group, a second input terminal connected to the second argument input terminal (A1) of said first argument input group, and a control input terminal connected to the third argument input terminal (A2) of said first argument input group, said first two-input one-output multiplexer producing, as a first selected output signal, an input signal supplied to the first input terminal thereof when the control input terminal thereof is supplied with a control signal having a logic value of "0", said first two-input one-output multiplexer producing, as the first selected output signal, an input signal supplied to the second input terminal thereof when the control input terminal thereof is supplied with the control signal having a logic value of "1";

a second two-input one-output multiplexer (10.1) having a first input terminal connected to the first argument input terminal (B0) of said second argument input group, a second input terminal connected to the second argument input terminal (B1) of said second argument input group, and a control input terminal connected to the third argument input terminal (B2) of said second argument input group, said second two-input one-output multiplexer producing, as a second selected output signal, an input signal supplied to the first input terminal thereof when the control input terminal thereof is supplied with a control signal having a logic value of "0", said second two-input one-output multiplexer producing, as the second selected output signal, an input signal supplied to the second input terminal thereof when the control input terminal thereof is supplied with the control signal having a logic value of "1";

a third two-input one-output multiplexer (10.2) having a first input terminal connected to the fourth argument input terminal (B3) of said second argument input group, a second input terminal connected to said ripple-core logic carry input terminal (CCI), and a control input terminal connected to said first configuration input terminal (M0), said third two-input one-output multiplexer producing, as a third selected output signal, an input signal supplied to the first input terminal thereof when the control input terminal thereof is supplied with a control signal having a logic value of "0", said third two-input one-output multiplexer producing, as the third selected output signal, an input signal supplied to the second input terminal thereof when the control input terminal thereof is supplied with the control signal having a logic value of "1";

a first exclusive OR circuit (11.0) having a first input terminal connected to the fourth argument input terminal (A3) of said first argument input group and a second input terminal connected to an output terminal of said first two-input one-output multiplexer (10.0), said first exclusive OR circuit exclusively ORing an input signal supplied to the first input terminal thereof and the first selected output signal supplied to the second input terminal thereof to produce a first exclusively ORed output signal;

a second exclusive OR circuit (11.1) having a first input terminal connected to an output terminal of said second two-input one-output multiplexer (10.1) and a second input terminal connected to an output terminal of said third two-input one-output multiplexer (10.2), said second exclusive OR circuit exclusively ORing the second selected output signal supplied to the first input terminal thereof and the third selected output signal supplied to the second input terminal thereof to produce a second exclusively ORed output signal;

a fourth two-input one-output multiplexer (10.3A) having a first input terminal connected to an output terminal of said second exclusive OR circuit (11.1), a second input terminal connected to the output terminal of said second two-input one-output multiplexer (10.1), and a control input terminal connected to said second configuration input terminal (M1), said fourth two-input one-output multiplexer producing, as a fourth selected output signal, the second exclusively ORed output signal supplied to the first input terminal thereof when the control input terminal thereof is supplied with a control signal having a logic value of "0", said fourth two-input one-output multiplexer producing, as the fourth selected output signal, the second selected output signal supplied to the second input terminal thereof when the control input terminal thereof is supplied with the control signal having the logic value of "1";

a fifth two-input one-output multiplexer (10.4A) having a first input terminal connected to said third configuration input terminal (M2), a second input terminal connected to the output terminal of said third two-input one-output multiplexer (10.2), and a control input terminal connected to said second configuration input terminal (M1), said fifth two-input one-output multiplexer producing, as a fifth selected output signal, an input signal supplied to the first input terminal thereof when the control input terminal thereof is supplied with a control signal having a logic value of "z0", said fifth two-input one-output multiplexer producing, as the fifth selected output signal, the third selected output signal supplied to the second input terminal thereof when the control input terminal thereof is supplied with the control signal having the logic value of "1";

a NAND circuit (12) having a first input terminal connected to an output terminal of said first exclusive OR circuit (11.0) and a second input terminal connected to an output terminal of said fourth two-input one-output multiplexer (10.3A), said NAND circuit NANDing the first exclusively ORed output signal supplied to the first input terminal thereof and the fourth selected output signal supplied to the second input terminal thereof to produce a NANDed output signal;

a NOR circuit (13) having a first input terminal connected to the output terminal of said first exclusive OR circuit (11.0) and a second input terminal connected to the output terminal of said fourth two-input one-output multiplexer (10.3A), said NOR circuit (13) NORing the first exclusively ORed output signal supplied to the first input terminal thereof and the fourth selected output signal supplied to the second input terminal thereof to produce a NORed output signal;

a third exclusive OR circuit (11.2) having a first input terminal connected to the output terminal of said first exclusive OR circuit (11.0) and a second input terminal connected to the output terminal of said second exclusive OR circuit (11.1), said third exclusive OR circuit exclusively ORing the first exclusively ORed output signal supplied to the first input terminal thereof and the second exclusively ORed output signal supplied to the second input terminal thereof to produce a third exclusively ORed output signal;

an inverter (15.0) having an input terminal connected to an output terminal of said fifth two-input one-output multiplexer (10. 4A), said inverter inverting the fifth selected output signal supplied to the input terminal thereof to produce an inverted output signal;

a NAND-OR circuit (14.0) having a first input terminal connected to the output terminal of said NAND circuit (12), a second input terminal connected to the output terminal of said NOR circuit (13), and a third input terminal connected to an output terminal of said inverter, said NAND-OR circuit ORing the NORed output signal supplied to the second input terminal thereof and the inverted output signal supplied to the third input terminal thereof to obtain an ORed result signal and NANDing the ORed result signal and the NANDed output signal supplied to the first input terminal thereof to produce an ORed and NANDed output signal;

first connecting means for connecting the output terminal of said NAND circuit (12) with said core logic carry generation output terminal (GO) to make said core logic carry generation output terminal (GO) produce the NANDed output signal as the core logic carry generation output signal;

second connecting means for connecting the output terminal of said NOR circuit (13) with said core logic carry propagation output terminal (PO) to make said core logic carry propagation output terminal (PO) produce the NORed output signal as the core logic carry propagation output signal;

third connecting means for connecting an output terminal of said NAD-OR circuit (14.0) with said core logic carry output terminal (C) to make said core logic carry output terminal (C) produce the ORed and NANDed output signal as the core logic carry output signal; and fourth connecting means for connecting an output terminal of said third exclusive OR circuit with said sum output terminal (S) to make said sum output terminal (S) produce the third exclusively ORed output signal as the summed output signal.

47. A programmable function block as claimed in claim 43, wherein said core logic circuit (4C) comprises:

a first two-input one-output multiplexer (10.0) having a first input terminal connected to the first argument input terminal (A0) of said first argument input group, a second input terminal connected to the second argument input terminal (A1) of said first argument input group, and a control input terminal connected to the third argument input terminal (A2) of said first argument input group, said first two-input one-output multiplexer producing, as a first selected output signal, an input signal supplied to the first input terminal thereof when the control input terminal thereof is supplied with a control signal having a logic value of "0", said first two-input one-output multiplexer producing, as the first selected output signal, an input signal supplied to the second input terminal thereof when the control input terminal thereof is supplied with the control signal having a logic value of "1";

a second two-input one-output multiplexer (10.1) having a first input terminal connected to the first argument input terminal (B0) of said second argument input group, a second input terminal connected to the second argument input terminal (B1) of said second argument input group, and a control input terminal connected to the third argument input terminal (B2) of said second argument input group, said second two-input one-output multiplexer producing, as a second selected output signal, an input signal supplied to the first input terminal thereof when the control input terminal thereof is supplied with a control signal having a logic value of "0", said second two-input one-output multiplexer producing, as the second selected output signal, an input signal supplied to the second input terminal thereof when the control input terminal thereof is supplied with the control signal having a logic value of "1";

a third two-input one-output multiplexer (10.2) having a first input terminal connected to the fourth argument input terminal (B3) of said second argument input group, a second input terminal connected to said ripple-core logic carry input terminal (CCI), and a control input terminal connected to said first configuration input terminal (M0), said third two-input one-output multiplexer producing, as a third selected output terminal, an input signal supplied to the first input terminal thereof when the control input terminal thereof is supplied with a control signal having a logic value of "0", said third two-input one-output multiplexer producing, as the third selected output terminal, an input signal supplied to the second input terminal thereof when the control input terminal thereof is supplied with the control signal having a logic value of "1";

a first exclusive OR circuit (11.0) having a first input terminal connected to the fourth argument input terminal (A3) of said first argument input group and a second input terminal connected to an output terminal of said first two-input one-output multiplexer (10.0), said first exclusive OR circuit exclusively ORing an input signal supplied to the first input terminal thereof and the first selected output signal supplied to the second input terminal thereof to produce a first exclusively ORed output signal;

a second exclusive OR circuit (11.1) having a first input terminal connected to an output terminal of said second two-input one-output multiplexer (10.1) and a second input terminal connected to an output terminal of said third two-input one-output multiplexer (10.2), said second exclusive OR circuit exclusively ORing the second selected output signal supplied to the first input terminal thereof and the third selected output signal supplied to the second input terminal thereof to produce a second exclusively ORed output signal;

a fourth two-input one-output multiplexer (10.3A) having a first input terminal connected to an output terminal of said second exclusive OR circuit (11.1), a second input terminal connected to the output terminal of said second two-input one-output multiplexer (10.1), and a control input terminal connected to said second configuration input terminal (M1), said fourth two-input one-output multiplexer producing, as a fourth selected output signal, the second exclusively ORed output signal supplied to the first input terminal thereof when the control input terminal thereof is supplied with a control signal having a logic value of "0", said fourth two-input one-output multiplexer producing, as the fourth selected output signal, the second selected output signal supplied to the second input terminal thereof when the control input terminal thereof is supplied with the control signal having the logic value of "1";

a fifth two-input one-output multiplexer (10.4A) having a first input terminal connected to said third configuration input terminal (M2), a second input terminal connected to the output terminal of said third two-input one-output multiplexer (10.2), and a control input terminal connected to said second configuration input terminal (M1), said fifth two-input one-output multiplexer producing, as a fifth selected output signal, an input signal supplied to the first input terminal thereof when the control input terminal thereof is supplied with a control signal having a logic value of "0", said fifth two-input one-output multiplexer producing, as the fifth selected output signal, the third selected output signal supplied to the second input terminal thereof when the control input terminal thereof is supplied with the control signal having the logic value of "1";

a NAND circuit (12) having a first input terminal connected to an output terminal of said first exclusive OR circuit (11.0) and a second input terminal connected to an output terminal of said fourth two-input one-output multiplexer (10.3A), said NAND circuit NANDing the first exclusively ORed output signal supplied to the first input terminal thereof and the fourth selected output signal supplied to the second input terminal thereof to produce a NANDed output signal;

a NOR circuit (13) having a first input terminal connected to the output terminal of said first exclusive OR circuit (11.0) and a second input terminal connected to the output terminal of said fourth two-input one-output multiplexer (10.3A), said NOR circuit (13) NORing the first exclusively ORed output signal supplied to the first input terminal thereof and the fourth selected output signal supplied to the second input terminal thereof to produce a NORed output signal;

a third exclusive OR circuit (11.2) having a first input terminal connected to the output terminal of said first exclusive OR circuit (11.0) and a second input terminal connected to the output terminal of said second exclusive OR circuit (11.1), said third exclusive OR circuit exclusively ORing the first exclusively ORed output signal supplied to the first input terminal thereof and the second exclusively ORed output signal supplied to the second input terminal thereof to produce a third exclusively ORed output signal;

a two-input one-output inverting multiplexer (35.0) having a first input terminal connected to an output terminal of said NAND circuit (12), a second input terminal connected to an output terminal of said NOR circuit (13), and a control input terminal connected to an output terminal of said fifth two-input one-output multiplexer (10.4A), said two-input one-output inverting multiplexer producing, as an inverted selected output signal, a signal obtaining by inverting the NANDed output signal supplied to the first input terminal thereof when the control input terminal thereof is supplied with a control signal having a logic value of "0", said two-input one-output inverting multiplexer producing, as the inverted selected output signal, a signal obtained by inverting the NORed output signal supplied to the second input terminal thereof when the control input terminal thereof is supplied with the control signal having the logic value "1";

first connecting means for connecting the output terminal of said NAND circuit (12) with said core logic carry generation output terminal (GO) to make said core logic carry generation output terminal (GO) produce the NANDed output signal as the core logic carry generation output signal;

second connecting means for connecting the output terminal of said NOR circuit (13) with said core logic carry propagation output terminal (PO) to make said core logic carry propagation output terminal (PO) produce the NORed output signal as the core logic carry propagation output signal;

third connecting means for connecting an output terminal of said two-input one-output inverting multiplexer (35.0) with said core logic carry output terminal (C) to make said core logic carry output terminal (C) produce the inverted selected output signal as the core logic carry output signal; and fourth connecting means for connecting an output terminal of said third exclusive OR circuit with said sum output terminal (S) to make said sum output terminal (S) produce the third exclusively ORed output signal as the summed output signal.

48. A programmable function block as claimed in claim 43, wherein said carry logic circuit (5) comprises:

first connection means for connecting said ripple carry input terminal (RCI) with said ripple-core logic carry output terminal (CCO) to make said ripple-core logic carry output terminal produce the ripple carry input signal as the ripple-core logic carry output signal;

an inverter (15.1) having an input terminal connected to said ripple carry input terminal (RCI), said inverter inverting the ripple carry input signal to produce an inverted ripple carry signal;

a NAND-OR circuit (14.1) having a first input terminal connected to said core logic carry generation input terminal (G), a second input terminal connected to said core logic carry propagation input terminal (P), and a third input terminal connected to an output terminal of said inverter (15.1), said NAND-OR circuit ORing the core logic carry propagation input signal supplied to the second input terminal thereof and the inverted ripple carry signal supplied to the third input terminal thereof to obtain an ORed result signal and NANDing the ORed result signal and the core logic carry generation input signal supplied to the first input terminal thereof to produce an ORed and NANDed output signal; and second connection means for connecting an output terminal of said NAND-OR circuit (14.1) with said ripple carry output terminal (RCO) to make said ripple carry output terminal produce the ORed and NANDed output signal as the ripple carry output signal.

49. A programmable function block as claimed in claim 43, wherein said carry logic circuit (5A) comprises:
first connection means for connecting said ripple carry input terminal (RCI) with said ripple-core logic carry output terminal (CCO) to make said ripple-core logic carry output terminal produce the ripple carry input signal as the ripple-core logic carry output signal;
a two-input one-output inverting multiplexer (35.1) having a first input terminal connected to said core logic carry generation input terminal (G), a second input terminal connected to said core logic carry propagation input terminal (P), and a control input terminal connected to said ripple carry input terminal (RCI), said two-input one-output inverting multiplexer producing, as an inverted selected output signal, a signal obtaining by inverting the core logic carry generation input signal supplied to the first input terminal thereof when the control input terminal thereof is supplied with a control signal having a logic value of "0", said two-input one-output inverting multiplexer producing, as the inverted selected output signal, a signal obtained by inverting the core logic carry propagation input signal supplied to the second input terminal thereof when the control input terminal thereof is supplied with the control signal having the logic value "1"; and
second connecting means for connecting an output terminal of said two-input inverting multiplexer (35.1) with said ripple carry output terminal (RCO) to make said ripple carry output terminal produce the inverted selected output signal as the ripple carry output signal.

50. A programmable function block as claimed in claim 43, wherein each of said input selection units comprises a memory circuit for storing a logic value to produce the logic value as an output value, each of said input selection units determining the input selected signal in accordance with the output value of said memory circuit.

51. A programmable function block as claimed in claim 43, wherein each of said input selection units comprises:
a memory circuit (6.6) acting as means for supplying the fixed logic value, said memory circuit storing a logic value of one bit to produce a stored signal; and
a multiplexer (32) connected to said interconnecting wires and said memory circuit, said multiplexer having M input terminals and N control input terminals, where M and N represents first and second positive numbers, the first positive number M being larger than the second positive number N, one of the M input terminals being connected to an output terminal of said memory circuit, said multiplexer selecting one of the stored signal and the signals on said interconnecting wires as the input selected signal.

52. A programmable function block as claimed in claim 43, wherein each of said input selection units includes means (22B) for supplying the fixed logic value of "0", said means for supplying the fixed logic value of "0" comprising:
a memory circuit (6.5) for storing a logic value of one bit to produce a stored signal; and
an NMOS transistor (24) having a source electrode connected to a ground terminal, a gate electrode connected to an output terminal of said memory circuit, and a drain electrode as an output terminal of said means for supplying the fixed logic value of "0".

53. A programmable function block as claimed in claim 43, wherein each of said input selection units includes means (22C) for supplying the fixed logic value of "1", said means for supplying the fixed logic value of "0" comprising:
a memory circuit (6.4) for storing a logic value of one bit to produce a stored signal; and
a PMOS transistor (25) having a source electrode connected to a power source terminal, a gate electrode connected to an output terminal of said memory circuit, and a drain electrode as an output terminal of said means for supplying the fixed logic value of "1".

54. A programmable function block as claimed in claim 43, wherein each of said input selection units includes means (22A) for supplying the fixed logic value, said means for supplying the fixed logic value comprising:
a memory circuit (6.5) for storing a logic value of one bit to produce a stored signal;
a resistor (31) having high-resistance, said resistor having an end connected to a power source terminal; and
an NMOS transistor (24) having a source electrode connected to a ground terminal, a gate electrode connected to an output terminal of said memory circuit, and a drain electrode connected to another end of said high resistor, the drain electrode of said NMOS transistor being connected to an output terminal of said means for supplying the fixed logic value.

55. A programmable function device comprising a plurality of programmable function blocks, each of said programmable function blocks comprising:
a core logic circuit (4, 4A, 4B, 4C) having a first argument input group consisting of first through fourth argument input terminals (A0, A1, A2, A4), a second argument input group consisting of first through fourth argument input terminals (B0, B1, B2, B3), first through third configuration input terminals (M0, M1, M2), a core logic carry output terminal (C) for outputting a core logic carry output signal, a core logic carry generation output terminal (GO) for outputting a core logic carry generation output signal, a core logic carry propagation output terminal (PO) for outputting a core logic carry propagation output signal, a ripple-core logic carry input terminal (CCI) for inputting a ripple-core logic carry input terminal, and a sum output terminal (S) for outputting a summed output signal;
an input block (3) connected to interconnection wires and the first and the second argument input groups, said input block including eighth input selection units for selecting, as eight input selected signals, eight ones of signals on the interconnection wires, a fixed logic value of "1", and a fixed logic value of "0", said input selection units supplying the eight input selected signals to said first through said fourth argument input terminals of the first and the second argument input groups;
first through third memory circuits (6.0, 6.1, 6.3), connected to the first through the third configuration input terminals (M0, M1, M2), respectively, for storing, as first through third stored logic values, a logic value of one bit, said first through said third memory circuits supplying the first through the third stored logic values to the first through the third configuration input terminals, respectively; and
a carry logic circuit (5, 5A) having a ripple carry input terminal (RCI) for inputting a ripple carry input signal from a ripple carry propagation path (7), a ripple carry output terminal (RCO) for outputting a ripple carry output signal to said ripple carry propagation path (7), a ripple-core logic carry output terminal (CCO) for supplying the ripple-core logic carry input terminal (CCI) with a ripple-core logic carry output signal as the ripple-core logic carry input signal, a core logic carry generation input terminal (G) for inputting the core logic carry generation output signal as a core logic carry generation input signal from the core logic carry output terminal (GO), and a core logic carry propagation input terminal (P) for inputting the core logic carry propagation output signal as a core logic carry propagation input signal from the core logic carry propagation output terminal (PO), said ripple carry output terminal (RCO) of at least one of said programmable function blocks being connected to the ripple carry input terminal (RCI) of another one of said programmable function blocks.

56. A programmable function device as claimed in claim 55, wherein said core logic circuit (4) comprises:

a first two-input one-output multiplexer (10.0) having a first input terminal connected to the first argument input terminal (A0) of said first argument input group, a second input terminal connected to the second argument input terminal (A1) of said first argument input group, and a control input terminal connected to the third argument input terminal (A2) of said first argument input group, said first two-input one-output multiplexer producing, as a first selected output signal, an input signal supplied to the first input terminal thereof when the control input terminal thereof is supplied with a control signal having a logic value of "0", said first two-input one-output multiplexer producing, as the first selected output signal, an input signal supplied to the second input terminal thereof when the control input terminal thereof is supplied with the control signal having a logic value of "1";

a second two-input one-output multiplexer (10.1) having a first input terminal connected to the first argument input terminal (B0) of said second argument input group, a second input terminal connected to the second argument input terminal (B1) of said second argument input group, and a control input terminal connected to the third argument input terminal (B2) of said second argument input group, said second two-input one-output multiplexer producing, as a second selected output signal, an input signal supplied to the first input terminal thereof when the control input terminal thereof is supplied with a control signal having a logic value of "0", said second two-input one-output multiplexer producing, as the second selected output signal, an input signal supplied to the second input terminal thereof when the control input terminal thereof is supplied with the control signal having a logic value of "1";

a third two-input one-output multiplexer (10.2) having a first input terminal connected to the fourth argument input terminal (B3) of said second argument input group, a second input terminal connected to said ripple-core logic carry input terminal (CCI), and a control input terminal connected to said first configuration input terminal (M0), said third two-input one-output multiplexer producing, as a third selected output signal, an input signal supplied to the first input terminal thereof when the control input terminal thereof is supplied with a control signal having a logic value of "0", said third two-input one-output multiplexer producing, as the third selected output signal, an input signal supplied to the second input terminal thereof when the control input terminal thereof is supplied with the control signal having a logic value of "1";

a first exclusive OR circuit (11.0) having a first input terminal connected to the fourth argument input terminal (A3) of said first argument input group and a second input terminal connected to an output terminal of said first two-input one-output multiplexer (10.0), said first exclusive OR circuit exclusively ORing an input signal supplied to the first input terminal thereof and the first selected output signal supplied to the second input terminal thereof to produce a first exclusively ORed output signal;

a second exclusive OR circuit (11.1) having a first input terminal connected to an output terminal of said second two-input one-output multiplexer (10.1) and a second input terminal connected to an output terminal of said third two-input one-output multiplexer (10.3), said second exclusive OR circuit exclusively ORing the second selected output signal supplied to the first input terminal thereof and the third selected output signal supplied to the second input terminal thereof to produce a second exclusively ORed output signal;

a fourth two-input one-output multiplexer (10.3) having a first input terminal connected to the output terminal of said second two-input one-output multiplexer (10.1), a second input terminal connected to an output terminal of said second exclusive OR circuit (11.1), and a control input terminal connected to said second configuration input terminal (M1), said fourth two-input one-output multiplexer producing, as a fourth selected output signal, the second selected output signal supplied to the first input terminal thereof when the control input terminal thereof is supplied with a control signal having a logic value of "0", said fourth two-input one-output multiplexer producing, as the fourth selected output signal, the second exclusively ORed output signal when the control input terminal thereof is supplied with the control signal having the logic value of "1";

a fifth two-input one-output multiplexer (10.4) having a first input terminal connected to the output terminal of said third two-input one-output multiplexer (10.2), a second input terminal connected to said third configuration input terminal (M2), and a control input terminal connected to said second configuration input terminal (M1), said fifth two-input one-output multiplexer producing, as a fifth selected output signal, the third selected output signal supplied to the first input terminal thereof when the control input terminal thereof is supplied with a control signal having a logic value of "0", said fifth two-input one-output multiplexer producing, as the fifth selected output signal, an input signal supplied to the second input terminal thereof when the control input terminal thereof is supplied with the control signal having the logic value of "1";

a NAND circuit (12) having a first input terminal connected to an output terminal of said first exclusive OR circuit (11.0) and a second input terminal connected to an output terminal of said fourth two-input one-output multiplexer (10.3), said NAND circuit NANDing the first exclusively ORed output signal supplied to the first input terminal thereof and the fourth selected output signal supplied to the second input terminal thereof to produce a NANDed output signal;

a NOR circuit (13) having a first input terminal connected to the output terminal of said first exclusive OR circuit (11.0) and a second input terminal connected to the output terminal of said fourth two-input one-output multiplexer (10.3), said NOR circuit (13) NORing the first exclusively ORed output signal supplied to the first input terminal thereof and the fourth selected output signal supplied to the second input terminal thereof to produce a NORed output signal;

a third exclusive OR circuit (11.2) having a first input terminal connected to an output terminal of said first exclusive OR circuit (11.0) and a second input terminal connected to an output terminal of said second exclusive OR circuit (11.1), said third exclusive OR circuit exclusively ORing the first exclusively ORed output signal supplied to the first input terminal thereof and the second exclusively ORed output signal supplied to the second input terminal thereof to produce a third exclusively ORed output signal;

an inverter (15.0) having an input terminal connected to an output terminal of said fifth two-input one-output multiplexer (10.4), said inverter inverting the fifth selected output signal supplied to the input terminal thereof to produce an inverted output signal;

a NAND-OR circuit (14.0) having a first input terminal connected to an output terminal of said NAND circuit (12), a second input terminal connected to an output terminal of said NOR circuit (13), and a third input terminal connected to an output terminal of said inverter (15.0), said NAND-OR circuit ORing the NORed output signal supplied to the second input terminal thereof and the inverted output signal supplied to the third input terminal thereof to obtain an ORed result signal and NANDing the ORed result signal and the NANDed output signal supplied to the first input terminal thereof to produce an ORed and NANDed output signal;

first connecting means for connecting an output terminal of said NAND circuit (12) with said core logic carry generation output terminal (GO) to make said core logic carry generation output terminal (GO) produce the NANDed output signal as the core logic carry generation output signal;

second connecting means for connecting an output terminal of said NOR circuit (13) with said core logic carry propagation output terminal (PO) to make said core logic carry propagation output terminal (PO) produce the NORed output signal as the core logic carry propagation output signal;

third connecting means for connecting an output terminal of said NAND-OR circuit (14.0) with said core logic carry output terminal (C) to make said core logic carry output terminal (C) produce the ORed and NANDed output signal as the core logic carry output signal; and fourth connecting means for connecting an output terminal of said third exclusive OR circuit (11.2) with said sum output terminal (S) to make said sum output terminal (S) produce the third exclusively ORed output signal as the summed output signal.

57. A programmable function device as claimed in claim 55, wherein said core logic circuit (4A) comprises:

a first two-input one-output multiplexer (10.0) having a first input terminal connected to the first argument input terminal (A0) of said first argument input group, a second input terminal connected to the second argument input terminal (A1) of said first argument input group, and a control input terminal connected to the third argument input terminal (A2) of said first argument input group, said first two-input one-output multiplexer producing, as a first selected output signal, an input signal supplied to the first input terminal thereof when the control input terminal thereof is supplied with a control signal having a logic value of "0", said first two-input one-output multiplexer producing, as the first selected output signal, an input signal supplied to the second input terminal thereof when the control input terminal thereof is supplied with the control signal having a logic value of "1";

a second two-input one-output multiplexer (10.1) having a first input terminal connected to the first argument input terminal (B0) of said second argument input group, a second input terminal connected to the second argument input terminal (B1) of said second argument input group, and a control input terminal connected to the third argument input terminal (B2) of said second argument input group, said second two-input one-output multiplexer producing, as a second selected output signal, an input signal supplied with the first input terminal thereof when the control input terminal thereof is supplied with a control signal having a logic value of "0", said second two-input one-output multiplexer producing, as the second selected output signal, an input signal supplied with the second input terminal thereof when the control input terminal thereof is supplied with the control signal having a logic value of "1";

a third two-input one-output multiplexer (10.2) having a first input terminal connected to the fourth argument input terminal (B3) of said second argument input group, a second input terminal connected to said ripple-core logic carry input terminal (CCI), and a control input terminal connected to said first configuration input terminal (M0), said third two-input one-output multiplexer producing, as a third selected output terminal, an input signal supplied to the first input terminal thereof when the control input terminal thereof is supplied with a control signal having a logic value of "0", said third two-input one-output multiplexer producing, as the third selected output terminal, an input signal supplied to the second input terminal thereof when the control input terminal thereof is supplied with the control signal having a logic value of "1";

a first exclusive OR circuit (11.0) having a first input terminal connected to the fourth argument input terminal (A3) of said first argument input group and a second input terminal connected to an output terminal of said first two-input one-output multiplexer (10.0), said first exclusive OR circuit exclusively ORing an input signal supplied with the first input terminal thereof and the first selected output signal supplied with the second input terminal thereof to produce a first exclusively ORed output signal;

a second exclusive OR circuit (11.1) having a first input terminal connected to an output terminal of said second two-input one-output multiplexer (10.1) and a second input terminal connected to an output terminal of said third two-input one-output multiplexer (10.2), said second exclusive OR circuit exclusively ORing the second selected output signal supplied to the first input terminal thereof and the third selected output signal supplied to the second input terminal thereof to produce a second exclusively ORed output signal;

a fourth two-input one-output multiplexer (10.3) having a first input terminal connected to the output terminal of said second two-input one-output multiplexer (10.1), a second input terminal connected to an output terminal of said second exclusive OR circuit (11.1), and a control input terminal connected to said second configuration input terminal (M1), said fourth two-input one-output multiplexer producing, as a fourth selected output signal, the second selected output signal supplied to the first input terminal thereof when the control input terminal thereof is supplied with a control signal having a logic value of "0", said fourth two-input one-output multiplexer producing, as the fourth selected output signal, the second exclusive ORed signal supplied to the second input terminal thereof when the control input terminal thereof is supplied with the control signal having the logic value of "1";

a fifth two-input one-output multiplexer (10.4) having a first input terminal connected to an output terminal of said third two-input one-output multiplexer (10.2), a second input terminal connected to said third configuration input terminal (M2), and a control input terminal connected to said second configuration input terminal (M1), said fifth two-input one-output multiplexer producing, as a fifth selected output signal, the third selected output signal supplied to the first input terminal thereof when the control input terminal thereof is supplied with a control signal having a logic value of "0", said fifth two-input one-output multiplexer producing, as the fifth selected output signal, an input signal supplied to the second input terminal thereof when the control input terminal thereof is supplied with the control signal having the logic value of "1";

a NAND circuit (12) having a first input terminal connected to an output terminal of said first exclusive OR circuit (11.0) and a second input terminal connected to an output terminal of said fourth two-input one-output multiplexer (10.3), said NAND circuit NANDing the first exclusively ORed output signal supplied to the first input terminal thereof and the fourth selected output signal supplied to the second input terminal thereof to produce a NANDed output signal;

a NOR circuit (13) having a first input terminal connected to the output terminal of said first exclusive OR circuit (11.0) and a second input terminal connected to the output terminal of said fourth two-input one-output multiplexer (10.3), said NOR circuit (13) NORing the first exclusively ORed output signal supplied to the first input terminal thereof and the fourth selected output signal supplied to the second input terminal thereof to produce a NORed output signal;

a third exclusive OR circuit (11.2) having a first input terminal connected to the output terminal of said first exclusive OR circuit (11.0) and a second input terminal connected to the output terminal of said second exclusive OR circuit (11.1), said third exclusive OR circuit exclusively ORing the first exclusively ORed output signal supplied to the first input terminal thereof and the second exclusively ORed output signal supplied to the second input terminal thereof to produce a third exclusively ORed output signal;

a two-input one-output inverting multiplexer (35.0) having a first input terminal connected to an output terminal of said NAND circuit (12), a second input terminal connected to an output terminal of said NOR circuit (13), and a control input terminal connected to an output terminal of said fifth two-input one-output multiplexer, said two-input one-output inverting multiplexer producing, as an inverted selected output signal, a signal obtaining by inverting the NANDed output signal supplied to the first input terminal thereof when the control input terminal thereof is supplied with a control signal having a logic value of "0", said two-input one-output inverting multiplexer producing, as the inverted selected output signal, a signal obtained by inverting the NORed output signal supplied to the second input terminal thereof when the control input terminal thereof is supplied with the control signal having the logic value "1";

first connecting means for connecting the output terminal of said NAND circuit (12) with said core logic carry generation output terminal (GO) to make said core logic carry generation output terminal (GO) produce the NANDed output signal as the core logic carry generation output signal;

second connecting means for connecting the output terminal of said NOR circuit (13) with said core logic carry propagation output terminal (PO) to make said core logic carry propagation output terminal (PO) produce the NORed output signal as the core logic carry propagation output signal;

third connecting means for connecting an output terminal of said two-input one-output inverting multiplexer (35.0) with said core logic carry output terminal (C) to make said core logic carry output terminal (C) produce the inverted selected output signal as the core logic carry output signal; and fourth connecting means for connecting an output terminal of said third exclusive OR circuit with said sum output terminal (S) to make said sum output terminal (S) produce the third exclusively ORed output signal as the summed output signal.

58. A programmable function device as claimed in claim 55, wherein said core logic circuit (4B) comprises:

a first two-input one-output multiplexer (10.0) having a first input terminal connected to the first argument input terminal (A0) of said first argument input group, a second input terminal connected to the second argument input terminal (A1) of said first argument input group, and a control input terminal connected to the third argument input terminal (A2) of said first argument input group, said first two-input one-output multiplexer producing, as a first selected output signal, an input signal supplied to the first input terminal thereof when the control input terminal thereof is supplied with a control signal having a logic value of "0", said first two-input one-output multiplexer producing, as the first selected output signal, an input signal supplied to the second input terminal thereof when the control input terminal thereof is supplied with the control signal having a logic value of "1";

a second two-input one-output multiplexer (10.1) having a first input terminal connected to the first argument input terminal (B0) of said second argument input group, a second input terminal connected to the second argument input terminal (B1) of said second argument input group, and a control input terminal connected to the third argument input terminal (B2) of said second argument input group, said second two-input one-output multiplexer producing, as a second selected output signal, an input signal supplied to the first input terminal thereof when the control input terminal thereof is supplied with a control signal having a logic value of "0", said second two-input one-output multiplexer producing, as the second selected output signal, an input signal supplied to the second input terminal thereof when the control input terminal thereof is supplied with the control signal having a logic value of "1";

a third two-input one-output multiplexer (10.2) having a first input terminal connected to the fourth argument input terminal (B3) of said second argument input group, a second input terminal connected to said ripple-core logic carry input terminal (CCI), and a control input terminal connected to said first configuration input terminal (M0), said third two-input one-output multiplexer producing, as a third selected output signal, an input signal supplied to the first input terminal thereof when the control input terminal thereof is supplied with a control signal having a logic value of "0", said third two-input one-output multiplexer producing, as the third selected output signal, an input signal supplied to the second input terminal thereof when the control input terminal thereof is supplied with the control signal having a logic value of "1";

a first exclusive OR circuit (11.0) having a first input terminal connected to the fourth argument input terminal (A3) of said first argument input group and a second input terminal connected to an output terminal of said first two-input one-output multiplexer (10.0), said first exclusive OR circuit exclusively ORing an input signal supplied to the first input terminal thereof and the first selected output signal supplied to the second input terminal thereof to produce a first exclusively ORed output signal;

a second exclusive OR circuit (11.1) having a first input terminal connected to an output terminal of said second two-input one-output multiplexer (10.1) and a second input terminal connected to an output terminal of said third two-input one-output multiplexer (10.2), said second exclusive OR circuit exclusively ORing the second selected output signal supplied to the first input terminal thereof and the third selected output signal supplied to the second input terminal thereof to produce a second exclusively ORed output signal;

a fourth two-input one-output multiplexer (10.3A) having a first input terminal connected to an output terminal of said second exclusive OR circuit (11.1), a second input terminal connected to the output terminal of said second two-input one-output multiplexer (10.1), and a control input terminal connected to said second configuration input terminal (M1), said fourth two-input one-output multiplexer producing, as a fourth selected output signal, the second exclusively ORed output signal supplied to the first input terminal thereof when the control input terminal thereof is supplied with a control signal having a logic value of "0", said fourth two-input one-output multiplexer producing, as the fourth selected output signal, the second selected output signal supplied to the second input terminal thereof when the control input terminal thereof is supplied with the control signal having the logic value of "1";

a fifth two-input one-output multiplexer (10.4A) having a first input terminal connected to said third configuration input terminal (M2), a second input terminal connected to the output terminal of said third two-input one-output multiplexer (10.2), and a control input terminal connected to said second configuration input terminal (M1), said fifth two-input one-output multiplexer producing, as a fifth selected output signal, an input signal supplied to the first input terminal thereof when the control input terminal thereof is supplied with a control signal having a logic value of "0", said fifth two-input one-output multiplexer producing, as the fifth selected output signal, the third selected output signal supplied to the second input terminal thereof when the control input terminal thereof is supplied with the control signal having the logic value of "1";

a NAND circuit (12) having a first input terminal connected to an output terminal of said first exclusive OR circuit (11.0) and a second input terminal connected to an output terminal of said fourth two-input one-output multiplexer (10.3A), said NAND circuit NANDing the first exclusively ORed output signal supplied to the first input terminal thereof and the fourth selected output signal supplied to the second input terminal thereof to produce a NANDed output signal;

a NOR circuit (13) having a first input terminal connected to the output terminal of said first exclusive OR circuit (11.0) and a second input terminal connected to the output terminal of said fourth two-input one-output multiplexer (10.3A), said NOR circuit (13) NORing the first exclusively ORed output signal supplied to the first input terminal thereof and the fourth selected output signal supplied to the second input terminal thereof to produce a NORed output signal;

a third exclusive OR circuit (11.2) having a first input terminal connected to the output terminal of said first exclusive OR circuit (11.0) and a second input terminal connected to the output terminal of said second exclusive OR circuit (11.1), said third exclusive OR circuit exclusively ORing the first exclusively ORed output signal supplied to the first input terminal thereof and the second exclusively ORed output signal supplied to the second input terminal thereof to produce a third exclusively ORed output signal;

an inverter (15.0) having an input terminal connected to an output terminal of said fifth two-input one-output multiplexer (10.4A), said inverter inverting the fifth selected output signal supplied to the input terminal thereof to produce an inverted output signal;

a NAND-OR circuit (14.0) having a first input terminal connected to the output terminal of said NAND circuit (12), a second input terminal connected to the output terminal of said NOR circuit (13), and a third input terminal connected to an output terminal of said inverter, said NAND-OR circuit ORing the NORed output signal supplied to the second input terminal thereof and the inverted output signal supplied to the third input terminal thereof to obtain an ORed result signal and NANDing the ORed result signal and the NANDed output signal supplied to the first input terminal thereof to produce an ORed and NANDed output signal;

first connecting means for connecting the output terminal of said NAND circuit (12) with said core logic carry generation output terminal (GO) to make said core logic carry generation output terminal (GO) produce the NANDed output signal as the core logic carry generation output signal;

second connecting means for connecting the output terminal of said NOR circuit (13) with said core logic carry propagation output terminal (PO) to make said core logic carry propagation output terminal (PO) produce the NORed output signal as the core logic carry propagation output signal;

third connecting means for connecting an output terminal of said NAND-OR circuit (14.0) with said core logic carry output terminal (C) to make said core logic carry output terminal (C) produce the ORed and NANDed output signal as the core logic carry output signal; and fourth connecting means for connecting an output terminal of said third exclusive OR circuit with said sum output terminal (S) to make said sum output terminal (S) produce the third exclusively ORed output signal as the summed output signal.

59. A programmable function device as claimed in claim 55, wherein said core logic circuit (4C) comprises:

a first two-input one-output multiplexer (10.0) having a first input terminal connected to the first argument input terminal (A0) of said first argument input group, a second input terminal connected to the second argument input terminal (A1) of said first argument input group, and a control input terminal connected to the third argument input terminal (A2) of said first argument input group, said first two-input one-output multiplexer producing, as a first selected output signal, an input signal supplied to the first input terminal thereof when the control input terminal thereof is supplied with a control signal having a logic value of "0", said first two-input one-output multiplexer producing, as the first selected output signal, an input signal supplied to the second input terminal thereof when the control input terminal thereof is supplied with the control signal having a logic value of "1";

a second two-input one-output multiplexer (10.1) having a first input terminal connected to the first argument input terminal (B0) of said second argument input group, a second input terminal connected to the second argument input terminal (B1) of said second argument input group, and a control input terminal connected to the third argument input terminal (B2) of said second argument input group, said second two-input one-output multiplexer producing, as a second selected output signal, an input signal supplied to the first input terminal thereof when the control input terminal thereof is supplied with a control signal having a logic value of "0", said second two-input one-output multiplexer producing, as the second selected output signal, an input signal supplied to the second input terminal thereof when the control input terminal thereof is supplied with the control signal having a logic value of "1";

a third two-input one-output multiplexer (10.2) having a first input terminal connected to the fourth argument input terminal (B3) of said second argument input group, a second input terminal connected to said ripple-core logic carry input terminal (CCI), and a control input terminal connected to said first configuration input terminal (M0), said third two-input one-output multiplexer producing, as a third selected output terminal, an input signal supplied to the first input terminal thereof when the control input terminal thereof is supplied with a control signal having a logic value of "0", said third two-input one-output multiplexer producing, as the third selected output terminal, an input signal supplied to the second input terminal thereof when the control input terminal thereof is supplied with the control signal having a logic value of "1";

a first exclusive OR circuit (11.0) having a first input terminal connected to the fourth argument input terminal (A3) of said first argument input group and a second input terminal connected to an output terminal of said first two-input one-output multiplexer (10.0), said first exclusive OR circuit exclusively ORing an input signal supplied to the first input terminal thereof and the first selected output signal supplied to the second input terminal thereof to produce a first exclusively ORed output signal;

a second exclusive OR circuit (11.1) having a first input terminal connected to an output terminal of said second two-input one-output multiplexer (10.1) and a second input terminal connected to an output terminal of said third two-input one-output multiplexer (10.2), said second exclusive OR circuit exclusively ORing the second selected output signal supplied to the first input terminal thereof and the third selected output signal supplied to the second input terminal thereof to produce a second exclusively ORed output signal;

a fourth two-input one-output multiplexer (10.3A) having a first input terminal connected to an output terminal of said second exclusive OR circuit (11.1), a second input terminal connected to the output terminal of said second two-input one-output multiplexer (10.1), and a control input terminal connected to said second configuration input terminal (M1), said fourth two-input one-output multiplexer producing, as a fourth selected output signal, the second exclusively ORed output signal supplied to the first input terminal thereof when the control input terminal thereof is supplied with a control signal having a logic value of "0", said fourth two-input one-output multiplexer producing, as the fourth selected output signal, the second selected output signal supplied to the second input terminal thereof when the control input terminal thereof is supplied with the control signal having the logic value of "1";

a fifth two-input one-output multiplexer (10.4A) having a first input terminal connected to said third configuration input terminal (M2), a second input terminal connected to the output terminal of said third two-input one-output multiplexer (10.2) and a control input terminal connected to said second configuration input terminal (M1), said fifth two-input one-output multiplexer producing, as a fifth selected output signal, an input signal supplied to the first input terminal thereof when the control input terminal thereof is supplied with a control signal having a logic value of "0", said fifth two-input one-output multiplexer producing, as the fifth selected output signal, the third selected output signal supplied to the second input terminal thereof when the control input terminal thereof is supplied with the control signal having the logic value of "1";

a NAND circuit (12) having a first input terminal connected to an output terminal of said first exclusive OR circuit (11.0) and a second input terminal connected to an output terminal of said fourth two-input one-output multiplexer (10.3A), said NAND circuit NANDing the first exclusively ORed output signal supplied to the first input terminal thereof and the fourth selected output signal supplied to the second input terminal thereof to produce a NANDed output signal;

a NOR circuit (13) having a first input terminal connected to the output terminal of said first exclusive OR circuit (11.0) and a second input terminal connected to the output terminal of said fourth two-input one-output multiplexer (10.3A), said NOR circuit (13) NORing the first exclusively ORed output signal supplied to the first input terminal thereof and the fourth selected output signal supplied to the second input terminal thereof to produce a NORed output signal;

a third exclusive OR circuit (11.2) having a first input terminal connected to the output terminal of said first exclusive OR circuit (11.0) and a second input terminal connected to the output terminal of said second exclusive OR circuit (11.1), said third exclusive OR circuit exclusively ORing the first exclusively ORed output signal supplied to the first input terminal thereof and the second exclusively ORed output signal supplied to the second input terminal thereof to produce a third exclusively ORed output signal;

a two-input one-output inverting multiplexer (35.0) having a first input terminal connected to an output terminal of said NAND circuit (12), a second input terminal connected to an output terminal of said NOR circuit (13), and a control input terminal connected to an output terminal of said fifth two-input one-output multiplexer (10.4A), said two-input one-output inverting multiplexer producing, as an inverted selected output signal, a signal obtaining by inverting the NANDed output signal supplied to the first input terminal thereof when the control input terminal thereof is supplied with a control signal having a logic value of "0", said two-input one-output inverting multiplexer producing, as the inverted selected output signal, a signal obtained by inverting the NORed output signal supplied to the second input terminal thereof when the control input terminal thereof is supplied with the control signal having the logic value "1";

first connecting means for connecting the output terminal of said NAND circuit (12) with said core logic carry generation output terminal (GO) to make said core logic carry generation output terminal (GO) produce the NANDed output signal as the core logic carry generation output signal;

second connecting means for connecting the output terminal of said NOR circuit (13) with said core logic carry propagation output terminal (PO) to make said core logic carry propagation output terminal (PO) produce the NORed output signal as the core logic carry propagation output signal;

third connecting means for connecting an output terminal of said two-input one-output inverting multiplexer (35.0) with said core logic carry output terminal (C) to make said core logic carry output terminal (C) produce the inverted selected output signal as the core logic carry output signal; and fourth connecting means for connecting an output terminal of said third exclusive OR circuit with said sum output terminal (S) to make said sum output terminal (S) produce the third exclusively ORed output signal as the summed output signal.

60. A programmable function device as claimed in claim 55, wherein said carry logic circuit (5) comprises:

first connection means for connecting said ripple carry input terminal (RCI) with said ripple-core logic carry output terminal (CCO) to make said ripple-core logic carry output terminal produce the ripple carry input signal as the ripple-core logic carry output signal;

an inverter (15.1) having an input terminal connected to said ripple carry input terminal (RCI), said inverter inverting the ripple carry input signal to produce an inverted ripple carry signal;

a NAND-OR circuit (14.1) having a first input terminal connected to said core logic carry generation input terminal (G), a second input terminal connected to said core logic carry propagation input terminal (P), and a third input terminal connected to an output terminal of said inverter (15.1), said NAND-OR circuit ORing the core logic carry propagation input signal supplied to the second input terminal thereof and the inverted ripple carry signal supplied to the third input terminal thereof to obtain an ORed result signal and NANDing the ORed result signal and the core logic carry generation input signal supplied to the first input terminal thereof to produce an ORed and NANDed output signal; and second connection means for connecting an output terminal of said NAND-OR circuit (14.1) with said ripple carry output terminal (RCO) to make said ripple carry output terminal produce the ORed and NANDed output signal as the ripple carry output signal.

61. A programmable function device as claimed in claim 55, wherein said carry logic circuit (5A) comprises:

first connection means for connecting said ripple carry input terminal (RCI) with said ripple-core logic carry output terminal (CCO) to make said ripple-core logic carry output terminal produce the ripple carry input signal as the ripple-core logic carry output signal;

a two-input one-output inverting multiplexer (35.1) having a first input terminal connected to said core logic carry generation input terminal (IG), a second input terminal connected to said core logic carry propagation input terminal (P), and a control input terminal connected to said ripple carry input terminal (RCI), said two-input one-output inverting multiplexer producing, as an inverted selected output signal, a signal obtaining by inverting the core logic carry generation input signal supplied to the first input terminal thereof when the control input terminal thereof is supplied with a control signal having a logic value of "0", said two-input one-output inverting multiplexer producing, as the inverted selected output signal, a signal obtained by inverting the core logic carry propagation input signal supplied to the second input terminal thereof when the control input terminal thereof is supplied with the control signal having the logic value "1"; and second connecting means for connecting an output terminal of said two-input inverting multiplexer (35.1) with said ripple carry output terminal (RCO) to make said ripple carry output terminal produce the inverted selected output signal as the ripple carry output signal.

62. A programmable function device as claimed in claim 55, wherein each of said input selection units comprises a memory circuit for storing a logic value to produce the logic value as an output value, each of said input selection units determining the input selected signal in accordance with the output value of said memory circuit.

63. A programmable function device as claimed in claim 55, wherein each of said input selection units comprises:

a memory circuit (6.6) acting as means for supplying the fixed logic value, said memory circuit storing a logic value of one bit to produce a stored signal; and a multiplexer (32) connected to said interconnecting wires (8) and said memory circuit, said multiplexer having M input terminals and N control input terminals, where M and N represents first and second positive numbers, the first positive number M being larger than the second positive number N, one of the M input terminals being connected to an output terminal of said memory circuit, said multiplexer selecting one of the stored signal and the signals on said interconnecting wires as the input selected signal.

64. A programmable function device as claimed in claim 55, wherein each of said input selection units includes means (22B) for supplying the fixed logic value of "0", said means for supplying the fixed logic value of "0" comprising:
- a memory circuit (6.5) for storing a logic value of one bit to produce a stored signal; and
- an NMOS transistor (24) having a source electrode connected to a ground terminal, a gate electrode connected to an output terminal of said memory circuit, and a drain electrode as an output terminal of said means for supplying the fixed logic value of "0".

65. A programmable function device as claimed in claim 55, wherein each of said input selection units includes means (22C) for supplying the fixed logic value of "1", said means for supplying the fixed logic value of "1" comprising:
- a memory circuit (6.4) for storing a logic value ol bit to produce a stored signal; and
- a PMOS transistor (25) having a source electrode connected to a power source terminal, a gate electrode connected to an output terminal of said memory circuit, and a drain electrode as an output terminal of said means for supplying the fixed logic value of "1".

66. A programmable function device as claimed in claim 55, wherein each of said input selection units includes means (22A) for supplying the fixed logic value, said means for supplying the fixed logic value comprising:
- a memory circuit (6.5) for storing a logic value of one bit to produce a stored signal;
- a resistor (31) having high-resistance, said resistor having an end connected to a power source terminal; and
- an NMOS transistor (24) having a source electrode connected to a ground terminal, a gate electrode connected to an output terminal of said memory circuit, and a drain electrode connected to another end of said high resistor, the drain electrode of said NMOS transistor being connected to an output terminal of said means for supplying the fixed logic value.

67. A programmable function device as claimed in claim 55, wherein further comprises means for supplying the fixed logic value to at least one of said input selection units included in the respective programmable function blocks, said means for supplying the fixed logic value consisting of a single circuit for outputting the fixed logic value to cover all over the programmable function blocks included in said programmable function device.

68. A programmable function device as claimed in claim 55, wherein further has at least common line connected to at least one of said argument input terminals of each of said core logic circuits in said programmable function device to cover all over the core logic circuits in said programmable function device, said at least common line being connected to an output terminal of a common input selection unit.

69. A programmable function device as claimed in claim 55, wherein at least one of said memory circuits included in each of said programmable function blocks in said programmable function device is shared to cover all over the programmable function blocks included in said programmable function device.

70. A plurality of programmable function devices, each programmable function device as claimed in claim 68, wherein said plurality of programmable function devices are classified into a first group of programmable function devices, each comprising programmable function blocks equal in number to a first predetermined number and a second group of programmable function devices, each comprising programmable function blocks equal in number to a second predetermined number, the first and the second predetermined numbers being different from each other.

71. A plurality of programmable function devices, each programmable function device as claimed in claim 68, wherein said plurality of programmable function devices are close-packed and are disposed on a rectangular area, each of said programmable function devices comprising a plurality of programmable function blocks.

72. A programmable function device comprising at least one odd programmable function block (1.1) and at least one even programmable function block (1.2) which are alternately arranged, said odd programmable function block (1.1) comprising:
- a first core logic circuit (41) having a first argument input group consisting of first through fourth argument input terminals (A01, Al1, A21, A31), a second argument input group consisting of first though fourth argument input terminals (B01, B1, B21, B31), first through third configuration input terminals (M01, M11, M21), a first core logic carry output terminal (C1) for outputting a first core logic carry output signal, a first core logic carry generation output terminal (GO1) for outputting a first core logic carry generation output signal, a first core logic carry propagation output terminal (PO1) for outputting a first core logic carry propagation output signal, a first ripple-core logic carry input terminal (CCI1) for inputting a first ripple-core logic carry input signal, and a first sum output terminal (SI) for outputting a first summed output signal;
- a first input block circuit (31) connected to interconnecting wires and said first and said second argument input groups of said first core logic circuit (41), said first input block circuit comprising eight input selection units for selecting eight input selected signals from signals on said interconnecting wires, a fixed logic value of "1", and a fixed logic value of "0" to supply the eight input selected signals to the first through the fourth argument input terminals of said first and said second argument input groups in said first core logic circuit;
- first through third memory circuits connected to said first through said third configuration input terminals (M01, M11, M21), respectively, said first through said third memory circuits storing, as first through third stored signals, a logic value of one bit, said first through said third memory circuits supplying the first through the third stored signals to said first through said third configuration input terminals, respectively; and
- an odd carry logic circuit (5.1) having a ripple carry input terminal (RCI) for inputting a ripple carry input signal from a ripple carry propagation path (7), a ripple carry inverted output terminal (RCOb) for outputting a ripple carry inverted output signal to said ripple carry propagation path (7), a first ripple-core logic carry output terminal (CCO1) for supplying said first ripple-core logic carry input terminal (CCI1) with a first ripple-core logic carry output signal as the first ripple-core logic carry input signal, a first core logic carry generation input terminal (G1) for being supplied from said first core logic carry generation output terminal (GO1) with the first core logic carry generation output signal as a first core logic carry generation input signal, and a first core logic carry propagation input terminal (P1) for being supplied from said first core logic carry propagation output terminal (PO1) with the first core logic carry propagation output signal as a first core logic carry propagation input signal, said even programmable function block (1.2) comprising:

a second core logic circuit (42) having a third argument input group consisting of first through fourth argument input terminals (A02, A12, A22, A32), a fourth argument input group consisting of first though fourth argument input terminals (B02, B12, B22, B32), fourth through sixth configuration input terminals (M02, M12, M22), a second core logic carry output terminal (C2) for outputting a second core logic carry output signal, a second core logic carry generation output terminal (GO2) for outputting a second core logic carry generation output signal, a second core logic carry propagation output terminal (PO2) for outputting a second core logic carry propagation output signal, a second ripple-core logic carry input terminal (CCI2) for inputting a second ripple-core logic carry input signal, and a second sum output terminal (S2) for outputting a second summed output signal;

a second input block circuit (32) connected to interconnecting wires and said third and said fourth argument input groups of said second core logic circuit (42), said second input block circuit comprising eight input selection units for selecting eight input selected signals from signals on said interconnecting wires, a fixed logic value of "1", and a fixed logic value of "0" to supply the eight input selected signals to the first through the fourth argument input terminals of said third and said fourth argument input groups in said second core logic circuit;

fourth through sixth memory circuits connected to said fourth through said sixth configuration input terminals (M02, M12, M22), respectively, each of said fourth through said sixth memory circuits storing a logic value of one bit, said fourth through said sixth memory circuits supplying fourth through sixth stored signals to said fourth through said sixth configuration input terminals, respectively; and an even carry logic circuit (5.2) having a ripple carry inverted input terminal (RCIb) for inputting a ripple carry inverted input signal from said ripple carry propagation path (7), a ripple carry output terminal (RCO) for outputting a ripple carry output signal to said ripple carry propagation path (7), a second ripple-core logic carry output terminal (CCO2) for supplying said second ripple-core logic carry input terminal (CCI2) with a second ripple-core logic carry output signal as the second ripple-core logic carry input signal, a second core logic carry generation input terminal (G2) for being supplied from said second core logic carry generation output terminal (GO2) with the second core logic carry generation output signal as a second core logic carry generation input signal, and a second core logic carry propagation input terminal (P2) for being supplied from said second core logic carry propagation output terminal (PO2) with the second core logic carry propagation output signal as a second core logic carry propagation input signal.

73. A programmable function device as claimed in claim 72, wherein further comprises supplying means for connecting the ripple carry inverted output terminal (RCOb) of said odd carry logic carry circuit (5.1) with the ripple carry inverted input terminal (RCIb) of said even carry logic circuit (5.2) to supply the ripple carry inverted output signal as the ripple carry inverted input signal.

74. A programmable function device as claimed in claim 72, wherein further comprises supplying means for connecting the ripple carry output terminal (RCO) of said even carry logic carry circuit (5.2) with the ripple carry input terminal (RCI) of said odd carry logic circuit (5.1) to supply the ripple carry output signal as the ripple carry input signal.

75. A programmable function device as claimed in claim 72, wherein further comprises:

first supplying means for connecting the ripple carry inverted output terminal (RCOb) of said odd carry logic carry circuit (5.1) with the ripple carry inverted input terminal (RCIb) of said even carry logic circuit (5.2) to supply the ripple carry inverted output signal as the ripple carry inverted input signal; and second supplying means for connecting the ripple carry output terminal (RCO) of said even carry logic carry circuit (5.2) with the ripple carry input terminal (RCI) of said odd carry logic circuit (5.1) to supply the ripple carry output signal as the ripple carry input signal.

76. A programmable function device as claimed in claim 72, wherein said first core logic circuit comprises:

a first two-input one-output multiplexer (10.0) having a first input terminal connected to the first argument input terminal (A01) of said first argument input group, a second input terminal connected to the second argument input terminal (A11) of said first argument input group, and a control input terminal connected to the third argument input terminal (A21) of said first argument input group, said first two-input one-output multiplexer producing, as a first selected output signal, an input signal supplied to the first input terminal thereof when the control input terminal thereof is supplied with a control signal having a logic value of "0", said first two-input one-output multiplexer producing, as the first selected output signal, an input signal supplied to the second input terminal thereof when the control input terminal thereof is supplied with the control signal having a logic value of "1";

a second two-input one-output multiplexer (10.1) having a first input terminal connected to the first argument input terminal (B01) of said second argument input group, a second input terminal connected to the second argument input terminal (B11) of said second argument input group, and a control input terminal connected to the third argument input terminal (B21) of said second argument input group, said second two-input one-output multiplexer producing, as a second selected output signal, an input signal supplied to the first input terminal thereof when the control input terminal thereof is supplied with a control signal having a logic value of "0", said second two-input one-output multiplexer producing, as the second selected output signal, an input signal supplied to the second input terminal thereof when the control input terminal thereof is supplied with the control signal having a logic value of "1";

a third two-input one-output multiplexer (10.2) having a first input terminal connected to the fourth argument input terminal (B31) of said second argument input group, a second input terminal connected to said first ripple-core logic carry input terminal (CCI1), and a control input terminal connected to said first configuration input terminal (M01), said third two-input one-output multiplexer producing, as a third selected output signal, an input signal supplied to the first input terminal thereof when the control input terminal thereof is supplied with a control signal having a logic value of "0", said third two-input one-output multiplexer producing, as the third selected output signal, an input signal supplied to the second input terminal thereof when the control input terminal thereof is supplied with the control signal having a logic value of "1";

a first exclusive OR circuit (11.0) having a first input terminal connected to the fourth argument input terminal (A31) of said first argument input group and a second input terminal connected to an output terminal of said first two-input one-output multiplexer (10.0), said first exclusive OR circuit exclusively ORing an input signal supplied to the first input terminal thereof and the first selected output signal supplied to the second input terminal thereof to produce a first exclusively ORed output signal;

a second exclusive OR circuit (11.1) having a first input terminal connected to an output terminal of said second two-input one-output multiplexer (10.1) and a second input terminal connected to an output terminal of said third two-input one-output multiplexer (10.3), said second exclusive OR circuit exclusively ORing the second selected output signal supplied to the first input terminal thereof and the third selected output signal supplied to the second input terminal thereof to produce a second exclusively ORed output signal;

a fourth two-input one-output multiplexer (10.3) having a first input terminal connected to the output terminal of said second two-input one-output multiplexer (10.1), a second input terminal connected to an output terminal of said second exclusive OR circuit (11.1), and a control input terminal connected to said second configuration input terminal (MI), said fourth two-input one-output multiplexer producing, as a fourth selected output signal, the second selected output signal supplied to the first input terminal thereof when the control input terminal thereof is supplied with a control signal having a logic value of "0", said fourth two-input one-output multiplexer producing, as the fourth selected output signal, the second exclusively ORed output signal when the control input terminal thereof is supplied with the control signal having the logic value of "1";

a fifth two-input one-output multiplexer (10.4) having a first input terminal connected to the output terminal of said third two-input one-output multiplexer (10.2), a second input terminal connected to said third configuration input terminal (M21), and a control input terminal connected to said second configuration input terminal (M11), said fifth two-input one-output multiplexer producing, as a fifth selected output signal, the third selected output signal supplied to the first input terminal thereof when the control input terminal thereof is supplied with a control signal having a logic value of "0", said fifth two-input one-output multiplexer producing, as the fifth selected output signal, an input signal supplied to the second input terminal thereof when the control input terminal thereof is supplied with the control signal having the logic value of "1";

a NAND circuit (12) having a first input terminal connected to an output terminal of said first exclusive OR circuit (11.0) and a second input terminal connected to an output terminal of said fourth two-input one-output multiplexer (10.3), said NAND circuit NANDing the first exclusively ORed output signal supplied to the first input terminal thereof and the fourth selected output signal supplied to the second input terminal thereof to produce a NANDed output signal;

a NOR circuit (13) having a first input terminal connected to the output terminal of said first exclusive OR circuit (11.0) and a second input terminal connected to the output terminal of said fourth two-input one-output multiplexer (10.3), said NOR circuit (13) NORing the first exclusively ORed output signal supplied to the first input terminal thereof and the fourth selected output signal supplied to the second input terminal thereof to produce a NORed output signal;

a third exclusive OR circuit (11.2) having a first input terminal connected to an output terminal of said first exclusive OR circuit (11.0) and a second input terminal connected to an output terminal of said second exclusive OR circuit (11.1), said third exclusive OR circuit exclusively ORing the first exclusively ORed output signal supplied to the first input terminal thereof and the second exclusively ORed output signal supplied to the second input terminal thereof to produce a third exclusively ORed output signal;

an inverter (15.0) having an input terminal connected to an output terminal of said fifth two-input one-output multiplexer (10.4), said inverter inverting the fifth selected output signal supplied to the input terminal thereof to produce an inverted output signal;

a NAND-OR circuit (14.0) having a first input terminal connected to an output terminal of said NAND circuit (12), a second input terminal connected to an output terminal of said NOR circuit (13), and a third input terminal connected to an output terminal of said inverter (15.0), said NAND-OR circuit ORing the NORed output signal supplied to the second input terminal thereof and the inverted output signal supplied to the third input terminal thereof to obtain an ORed result signal and NANDing the ORed result signal and the NANDed output signal supplied to the first input terminal thereof to produce an ORed and NANDed output signal;

first connecting means for connecting an output terminal of said NAND circuit (12) with said first core logic carry generation output terminal (GO1) to make said first core logic carry generation output terminal (GO1) produce the NANDed output signal as the first core logic carry generation output signal;

second connecting means for connecting an output terminal of said NOR circuit (13) with said first core logic carry propagation output terminal (PO) to make said first core logic carry propagation output terminal (PO1) produce the NORed output signal as the first core logic carry propagation output signal;

third connecting means for connecting an output terminal of said NAND-OR circuit (14.0) with said first core logic carry output terminal (C1) to make said first core logic carry output terminal (C1) produce the ORed and NANDed output signal as the first core logic carry output signal; and fourth connecting means for connecting an output terminal of said third exclusive OR circuit (11.2) with said first sum output terminal (Si) to make said first sum output terminal (Si) produce the third exclusively ORed output signal as the first summed output signal.

77. A programmable function device as claimed in claim 72, wherein said first core logic circuit comprises:

a first two-input one-output multiplexer (10.0) having a first input terminal connected to the first argument input terminal (A01) of said first argument input group, a second input terminal connected to the second argument input terminal (A11) of said first argument input group, and a control input terminal connected to the third argument input terminal (A21) of said first argument input group, said first two-input one-output multiplexer producing, as a first selected output signal, an input signal supplied to the first input terminal thereof when the control input terminal thereof is supplied with a control signal having a logic value of "0", said first two-input one-output multiplexer producing, as the first selected output signal, an input signal supplied to the second input terminal thereof when the control input terminal thereof is supplied with the control signal having a logic value of "1";

a second two-input one-output multiplexer (10.1) having a first input terminal connected to the first argument input terminal (B10) of said second argument input group, a second input terminal connected to the second argument input terminal (B11) of said second argument input group, and a control input terminal connected to the third argument input terminal (B21) of said second argument input group, said second two-input one-output multiplexer producing, as a second selected output signal, an input signal supplied with the first input terminal thereof when the control input terminal thereof is supplied with a control signal having a logic value of "0", said second two-input one-output multiplexer producing, as the second selected output signal, an input signal supplied with the second input terminal thereof when the control input terminal thereof is supplied with the control signal having a logic value of "1";

a third two-input one-output multiplexer (10.2) having a first input terminal connected to the fourth argument input terminal (B31) of said second argument input group, a second input terminal connected to said first ripple-core logic carry input terminal (CCI1), and a control input terminal connected to said first configuration input terminal (M01), said third two-input one-output multiplexer producing, as a third selected output terminal, an input signal supplied to the first input terminal thereof when the control input terminal thereof is supplied with a control signal having a logic value of "0", said third two-input one-output multiplexer producing, as the third selected output terminal, an input signal supplied to the second input terminal thereof when the control input terminal thereof is supplied with the control signal having a logic value of "1";

a first exclusive OR circuit (11.0) having a first input terminal connected to the fourth argument input terminal (A31) of said first argument input group and a second input terminal connected to an output terminal of said first two-input one-output multiplexer (10.0), said first exclusive OR circuit exclusively ORing an input signal supplied with the first input terminal thereof and the first selected output signal supplied with the second input terminal thereof to produce a first exclusively ORed output signal;

a second exclusive OR circuit (11.1) having a first input terminal connected to an output terminal of said second two-input one-output multiplexer (10.1) and a second input terminal connected to an output terminal of said third two-input one-output multiplexer (10.2), said second exclusive OR circuit exclusively ORing the second selected output signal supplied to the first input terminal thereof and the third selected output signal supplied to the second input terminal thereof to produce a second exclusively ORed output signal;

a fourth two-input one-output multiplexer (10.3) having a first input terminal connected to the output terminal of said second two-input one-output multiplexer (10.1), a second input terminal connected to an output terminal of said second exclusive OR circuit (11.1), and a control input terminal connected to said second configuration input terminal (M11), said fourth two-input one-output multiplexer producing, as a fourth selected output signal, the second selected output signal supplied to the first input terminal thereof when the control input terminal thereof is supplied with a control signal having a logic value of "0", said fourth two-input one-output multiplexer producing, as the fourth selected output signal, the second exclusive ORed signal supplied to the second input terminal thereof when the control input terminal thereof is supplied with the control signal having the logic value of "1";

a fifth two-input one-output multiplexer (10.4) having a first input terminal connected to an output terminal of said third two-input one-output multiplexer (10.2), a second input terminal connected to said third configuration input terminal (M21), and a control input terminal connected to said second configuration input terminal (M11), said fifth two-input one-output multiplexer producing, as a fifth selected output signal, the third selected output signal supplied to the first input terminal thereof when the control input terminal thereof is supplied with a control signal having a logic value of "0", said fifth two-input one-output multiplexer producing, as the fifth selected output signal, an input signal supplied to the second input terminal thereof when the control input terminal thereof is supplied with the control signal having the logic value of "1";

a NAND circuit (12) having a first input terminal connected to an output terminal of said first exclusive OR circuit (11.0) and a second input terminal connected to an output terminal of said fourth two-input one-output multiplexer (10.3), said NAND circuit NANDing the first exclusively ORed output signal supplied to the first input terminal thereof and the fourth selected output signal supplied to the second input terminal thereof to produce a NANDed output signal;

a NOR circuit (13) having a first input terminal connected to the output terminal of said first exclusive OR circuit (11.0) and a second input terminal connected to the output terminal of said fourth two-input one-output multiplexer (10.3), said NOR circuit (13) NORing the first exclusively ORed output signal supplied to the first input terminal thereof and the fourth selected output signal supplied to the second input terminal thereof to produce a NORed output signal;

a third exclusive OR circuit (11.2) having a first input terminal connected to the output terminal of said first exclusive OR circuit (11.0) and a second input terminal connected to the output terminal of said second exclusive OR circuit (11.1), said third exclusive OR circuit exclusively ORing the first exclusively ORed output signal supplied to the first input terminal thereof and the second exclusively ORed output signal supplied to the second input terminal thereof to produce a third exclusively ORed output signal;

a two-input one-output inverting multiplexer (35.0) having a first input terminal connected to an output terminal of said NAND circuit (12), a second input terminal connected to an output terminal of said NOR circuit (13), and a control input terminal connected to an output terminal of said fifth two-input one-output multiplexer, said two-input one-output inverting multiplexer producing, as an inverted selected output signal, a signal obtaining by inverting the NANDed output signal supplied to the first input terminal thereof when the control input terminal thereof is supplied with a control signal having a logic value of "0", said two-input one-output inverting multiplexer producing, as the inverted selected output signal, a signal obtained by inverting the NORed output signal supplied to the second input terminal thereof when the control input terminal thereof is supplied with the control signal having the logic value "1";

first connecting means for connecting the output terminal of said NAND circuit (12) with said first core logic carry generation output terminal (GO1) to make said first core logic carry generation output terminal (GO1) produce the NANDed output signal as the first core logic carry generation output signal;

second connecting means for connecting the output terminal of said NOR circuit (13) with said first core logic carry propagation output terminal (PO1) to make said first core logic carry propagation output terminal (PO1) produce the NORed output signal as the first core logic carry propagation output signal;

third connecting means for connecting an output terminal of said two-input one-output inverting multiplexer (35.0) with said first core logic carry output terminal (C1) to make said first core logic carry output terminal (C1) produce the inverted selected output signal as the first core logic carry output signal; and fourth connecting means for connecting an output terminal of said third exclusive OR circuit with said first sum output terminal (S1) to make said first sum output terminal (S1) produce the third exclusively ORed output signal as the first summed output signal.

78. A programmable function device as claimed in claim 72, wherein said first core logic circuit comprises:

a first two-input one-output multiplexer (10.0) having a first input terminal connected to the first argument input terminal (A01) of said first argument input group, a second input terminal connected to the second argument input terminal (A11) of said first argument input group, and a control input terminal connected to the third argument input terminal (A21) of said first argument input group, said first two-input one-output multiplexer producing, as a first selected output signal, an input signal supplied to the first input terminal thereof when the control input terminal thereof is supplied with a control signal having a logic value of "0", said first two-input one-output multiplexer producing, as the first selected output signal, an input signal supplied to the second input terminal thereof when the control input terminal thereof is supplied with the control signal having a logic value of "1";

a second two-input one-output multiplexer (10.1) having a first input terminal connected to the first argument input terminal (B01) of said second argument input group, a second input terminal connected to the second argument input terminal (B11) of said second argument input group, and a control input terminal connected to the third argument input terminal (B21) of said second argument input group, said second two-input one-output multiplexer producing, as a second selected output signal, an input signal supplied to the first input terminal thereof when the control input terminal thereof is supplied with a control signal having a logic value of "0", said second two-input one-output multiplexer producing, as the second selected output signal, an input signal supplied to the second input terminal thereof when the control input terminal thereof is supplied with the control signal having a logic value of "1";

a third two-input one-output multiplexer (10.2) having a first input terminal connected to the fourth argument input terminal (B31) of said second argument input group, a second input terminal connected to said first ripple-core logic carry input terminal (CCI1), and a control input terminal connected to said first configuration input terminal (M01), said third two-input one-output multiplexer producing, as a third selected output signal, an input signal supplied to the first input terminal thereof when the control input terminal thereof is supplied with a control signal having a logic value of "0", said third two-input one-output multiplexer producing, as the third selected output signal, an input signal supplied to the second input terminal thereof when the control input terminal thereof is supplied with the control signal having a logic value of "1";

a first exclusive OR circuit (11.0) having a first input terminal connected to the fourth argument input terminal (A31) of said first argument input group and a second input terminal connected to an output terminal of said first two-input one-output multiplexer (10.0), said first exclusive OR circuit exclusively ORing an input signal supplied to the first input terminal thereof and the first selected output signal supplied to the second input terminal thereof to produce a first exclusively ORed output signal;

a second exclusive OR circuit (11.1) having a first input terminal connected to an output terminal of said second two-input one-output multiplexer (10.1) and a second input terminal connected to an output terminal of said third two-input one-output multiplexer (10.2), said second exclusive OR circuit exclusively ORing the second selected output signal supplied to the first input terminal thereof and the third selected output signal supplied to the second input terminal thereof to produce a second exclusively ORed output signal;

a fourth two-input one-output multiplexer (10.3A) having a first input terminal connected to an output terminal of said second exclusive OR circuit (11.1), a second input terminal connected to the output terminal of said second two-input one-output multiplexer (10.1), and a control input terminal connected to said second configuration input terminal (M11), said fourth two-input one-output multiplexer producing, as a fourth selected output signal, the second exclusively ORed output signal supplied to the first input terminal thereof when the control input terminal thereof is supplied with a control signal having a logic value of "0", said fourth two-input one-output multiplexer producing, as the fourth selected output signal, the second selected output signal supplied to the second input terminal thereof when the control input terminal thereof is supplied with the control signal having the logic value of "1";

a fifth two-input one-output multiplexer (10.4A) having a first input terminal connected to said third configuration input terminal (M21), a second input terminal connected to the output terminal of said third two-input one-output multiplexer (10.2), and a control input terminal connected to said second configuration input terminal (M11), said fifth two-input one-output multiplexer producing, as a fifth selected output signal, an input signal supplied to the first input terminal thereof when the control input terminal thereof is supplied with a control signal having a logic value of "0", said fifth two-input one-output multiplexer producing, as the fifth selected output signal, the third selected output signal supplied to the second input terminal thereof when the control input terminal thereof is supplied with the control signal having the logic value of "1";

a NAND circuit (12) having a first input terminal connected to an output terminal of said first exclusive OR circuit (11.0) and a second input terminal connected to an output terminal of said fourth two-input one-output multiplexer (20.3A), said NAND circuit NANDing the first exclusively ORed output signal supplied to the first input terminal thereof and the fourth selected output signal supplied to the second input terminal thereof to produce a NANDed output signal;

a NOR circuit (13) having a first input terminal connected to the output terminal of said first exclusive OR circuit (11.0) and a second input terminal connected to the output terminal of said fourth two-input one-output multiplexer (10.3A), said NOR circuit (13) NORing the first exclusively ORed output signal supplied to the first input terminal thereof and the fourth selected output signal supplied to the second input terminal thereof to produce a NORed output signal;

a third exclusive OR circuit (11.2) having a first input terminal connected to the output terminal of said first exclusive OR circuit (11.0) and a second input terminal connected to the output terminal of said second exclusive OR circuit (11.1), said third exclusive OR circuit exclusively ORing the first exclusively ORed output signal supplied to the first input terminal thereof and the second exclusively ORed output signal supplied to the second input terminal thereof to produce a third exclusively ORed output signal;

an inverter (15.0) having an input terminal connected to an output terminal of said fifth two-input one-output multiplexer (10.4A), said inverter inverting the fifth selected output signal supplied to the input terminal thereof to produce an inverted output signal;

a NAND-OR circuit (14.0) having a first input terminal connected to the output terminal of said NAND circuit (12), a second input terminal connected to the output terminal of said NOR circuit (13), and a third input terminal connected to an output terminal of said inverter, said NAND-OR circuit ORing the NORed output signal supplied to the second input terminal thereof and the inverted output signal supplied to the third input terminal thereof to obtain an ORed result signal and NANDing the ORed result signal and the NANDed output signal supplied to the first input terminal thereof to produce an ORed and NANDed output signal;

first connecting means for connecting the output terminal of said NAND circuit (12) with said first core logic carry generation output terminal (GO1) to make said first core logic carry generation output terminal (GO1) produce the NANDed output signal as the first core logic carry generation output signal;

second connecting means for connecting the output terminal of said NOR circuit (13) with said first core logic carry propagation output terminal (PO) to make said first core logic carry propagation output terminal (PO) produce the NORed output signal as the first core logic carry propagation output signal;

third connecting means for connecting an output terminal of said NAND-OR circuit (14.0) with said first core logic carry output terminal (C1) to make said first core logic carry output terminal (C1) produce the ORed and NANDed output signal as the first core logic carry output signal; and fourth connecting means for connecting an output terminal of said third exclusive OR circuit with said first sum output terminal (S1) to make said first sum output terminal (S1) produce the third exclusively ORed output signal as the first summed output signal.

79. A programmable function device as claimed in claim 72, wherein said first core logic circuit comprises:

a first two-input one-output multiplexer (10.0) having a first input terminal connected to the first argument input terminal (A01) of said first argument input group, a second input terminal connected to the second argument input terminal (A11) of said first argument input group, and a control input terminal connected to the third argument input terminal (A21) of said first argument input group, said first two-input one-output multiplexer producing, as a first selected output signal, an input signal supplied to the first input terminal thereof when the control input terminal thereof is supplied with a control signal having a logic value of "0", said first two-input one-output multiplexer producing, as the first selected output signal, an input signal supplied to the second input terminal thereof when the control input terminal thereof is supplied with the control signal having a logic value of "1";

a second two-input one-output multiplexer (10.1) having a first input terminal connected to the first argument input terminal (B01) of said second argument input group, a second input terminal connected to the second argument input terminal (B11) of said second argument input group, and a control input terminal connected to the third argument input terminal (B21) of said second argument input group, said second two-input one-output multiplexer producing, as a second selected output signal, an input signal supplied to the first input terminal thereof when the control input terminal thereof is supplied with a control signal having a logic value of "0", said second two-input one-output multiplexer producing, as the second selected output signal, an input signal supplied to the second input terminal thereof when the control input terminal thereof is supplied with the control signal having a logic value of "1";

a third two-input one-output multiplexer (10.2) having a first input terminal connected to the fourth argument input terminal (B31) of said second argument input group, a second input terminal connected to said first ripple-core logic carry input terminal (CCI1), and a control input terminal connected to said first configuration input terminal (M01), said third two-input one-output multiplexer producing, as a third selected output terminal, an input signal supplied to the first input terminal thereof when the control input terminal thereof is supplied with a control signal having a logic value of "0", said third two-input one-output multiplexer producing, as the third selected output terminal, an input signal supplied to the second input terminal thereof when the control input terminal thereof is supplied with the control signal having a logic value of "1";

a first exclusive OR circuit (11.0) having a first input terminal connected to the fourth argument input terminal (A31) of said first argument input group and a second input terminal connected to an output terminal of said first two-input one-output multiplexer (10.0), said first exclusive OR circuit exclusively ORing an input signal supplied to the first input terminal thereof and the first selected output signal supplied to the second input terminal thereof to produce a first exclusively ORed output signal;

a second exclusive OR circuit (11.1) having a first input terminal connected to an output terminal of said second two-input one-output multiplexer (10.1) and a second input terminal connected to an output terminal of said third two-input one-output multiplexer (10.2), said second exclusive OR circuit exclusively ORing the second selected output signal supplied to the first input terminal thereof and the third selected output signal supplied to the second input terminal thereof to produce a second exclusively ORed output signal;

a fourth two-input one-output multiplexer (10.3A) having a first input terminal connected to an output terminal of said second exclusive OR circuit (11.1), a second input terminal connected to the output terminal of said second two-input one-output multiplexer (10.1), and a control input terminal connected to said second configuration input terminal (M1), said fourth two-input one-output multiplexer producing, as a fourth selected output signal, the second exclusively ORed output signal supplied to the first input terminal thereof when the control input terminal thereof is supplied with a control signal having a logic value of "0", said fourth two-input one-output multiplexer producing, as the fourth selected output signal, the second selected output signal supplied to the second input terminal thereof when the control input terminal thereof is supplied with the control signal having the logic value of "1";

a fifth two-input one-output multiplexer (10.4A) having a first input terminal connected to said third configuration input terminal (M21), a second input terminal connected to the output terminal of said third two-input one-output multiplexer (10.2), and a control input terminal connected to said second configuration input terminal (M11), said fifth two-input one-output multiplexer producing, as a fifth selected output signal, an input signal supplied to the first input terminal thereof when the control input terminal thereof is supplied with a control signal having a logic value of "0", said fifth two-input one-output multiplexer producing, as the fifth selected output signal, the third selected output signal supplied to the second input terminal thereof when the control input terminal thereof is supplied with the control signal having the logic value of "1";

a NAND circuit (12) having a first input terminal connected to an output terminal of said first exclusive OR circuit (11.0) and a second input terminal connected to an output terminal of said fourth two-input one-output multiplexer (10 3A), said NAND circuit NANDing the first exclusively ORed output signal supplied to the first input terminal thereof and the fourth selected output signal supplied to the second input terminal thereof to produce a NANDed output signal;

a NOR circuit (13) having a first input terminal connected to the output terminal of said first exclusive OR circuit (11.0) and a second input terminal connected to the output terminal of said fourth two-input one-output multiplexer (10.3A), said NOR circuit (13) NORing the first exclusively ORed output signal supplied to the first input terminal thereof and the fourth selected output signal supplied to the second input terminal thereof to produce a NORed output signal;

a third exclusive OR circuit (11.2) having a first input terminal connected to the output terminal of said first exclusive OR circuit (11.0) and a second input terminal connected to the output terminal of said second exclusive OR circuit (11.1), said third exclusive OR circuit exclusively ORing the first exclusively ORed output signal supplied to the first input terminal thereof and the second exclusively ORed output signal supplied to the second input terminal thereof to produce a third exclusively ORed output signal;

a two-input one-output inverting multiplexer (35.0) having a first input terminal connected to an output terminal of said NAND circuit (12), a second input terminal connected to an output terminal of said NOR circuit (13), and a control input terminal connected to an output terminal of said fifth two-input one-output multiplexer (10.4A), said two-input one-output inverting multiplexer producing, as an inverted selected output signal, a signal obtaining by inverting the NANDed output signal supplied to the first input terminal thereof when the control input terminal thereof is supplied with a control signal having a logic value of "0", said two-input one-output inverting multiplexer producing, as the inverted selected output signal, a signal obtained by inverting the NORed output signal supplied to the second input terminal thereof when the control input terminal thereof is supplied with the control signal having the logic value "1";

first connecting means for connecting the output terminal of said NAND circuit (12) with said first core logic carry generation output terminal (GO1) to make said first core logic carry generation output terminal (GO1) produce the NANDed output signal as the first core logic carry generation output signal;

second connecting means for connecting the output terminal of said NOR circuit (13) with said first core logic carry propagation output terminal (PO1) to make said first core logic carry propagation output terminal (PO1) produce the NORed output signal as the first core logic carry propagation output signal;

third connecting means for connecting an output terminal of said two-input one-output inverting multiplexer (35.0) with said first core logic carry output terminal (C1) to make said first core logic carry output terminal (C1) produce the inverted selected output signal as the first core logic carry output signal; and fourth connecting means for connecting an output terminal of said third exclusive OR circuit with said first sum output terminal (S1) to make said first sum output terminal (S1) produce the third exclusively ORed output signal as the first summed output signal.

80. A programmable function device as claimed in claim 72, wherein said second core logic circuit comprises:

a first two-input one-output multiplexer (10.0) having a first input terminal connected to the first argument input terminal (A02) of said third argument input group, a second input terminal connected to the second argument input terminal (A12) of said third argument input group, and a control input terminal connected to the third argument input terminal (A22) of said third argument input group, said first two-input one-output multiplexer producing, as a first selected output signal, an input signal supplied to the first input terminal thereof when the control input terminal thereof is supplied with a control signal having a logic value of "0", said first two-input one-output multiplexer producing, as the first selected output signal, an input signal supplied to the second input terminal thereof when the control input terminal thereof is supplied with the control signal having a logic value of "1";

a second two-input one-output multiplexer (10.1) having a first input terminal connected to the first argument input terminal (B02) of said fourth argument input group, a second input terminal connected to the second argument input terminal (B12) of said fourth argument input group, and a control input terminal connected to the third argument input terminal (B22) of said fourth argument input group, said second two-input one-output multiplexer producing, as a second selected output signal, an input signal supplied to the first input terminal thereof when the control input terminal thereof is supplied with a control signal having a logic value of "0", said second two-input one-output multiplexer producing, as the second selected output signal, an input signal supplied to the second input terminal thereof when the control input terminal thereof is supplied with the control signal having a logic value of "1";

a third two-input one-output multiplexer (10.2) having a first input terminal connected to the fourth argument input terminal (B32) of said fourth argument input group, a second input terminal connected to said second ripple-core logic carry input terminal (CCI2), and a control input terminal connected to said fourth configuration input terminal (M02), said third two-input one-output multiplexer producing, as a third selected output signal, an input signal supplied to the first input terminal thereof when the control input terminal thereof is supplied with a control signal having a logic value of "0", said third two-input one-output multiplexer producing, as the third selected output signal, an input signal supplied to the second input terminal thereof when the control input terminal thereof is supplied with the control signal having a logic value of "1";

a first exclusive OR circuit (11.0) having a first input terminal connected to the fourth argument input terminal (A32) of said third argument input group and a second input terminal connected to an output terminal of said first two-input one-output multiplexer (10.0), said first exclusive OR circuit exclusively ORing an input signal supplied to the first input terminal thereof and the first selected output signal supplied to the second input terminal thereof to produce a first exclusively ORed output signal;

a second exclusive OR circuit (11.1) having a first input terminal connected to an output terminal of said second two-input one-output multiplexer (10.1) and a second input terminal connected to an output terminal of said third two-input one-output multiplexer (10.3), said second exclusive OR circuit exclusively ORing the second selected output signal supplied to the first input terminal thereof and the third selected output signal supplied to the second input terminal thereof to produce a second exclusively ORed output signal;

a fourth two-input one-output multiplexer (10.3) having a first input terminal connected to the output terminal of said second two-input one-output multiplexer (10.1), a second input terminal connected to an output terminal of said second exclusive OR circuit (11.1), and a control input terminal connected to said fifth configuration input terminal (M12), said fourth two-input one-output multiplexer producing, as a fourth selected output signal, the second selected output signal supplied to the first input terminal thereof when the control input terminal thereof is supplied with a control signal having a logic value of "0", said fourth two-input one-output multiplexer producing, as the fourth selected output signal, the second exclusively ORed output signal when the control input terminal thereof is supplied with the control signal having the logic value of "1";

a fifth two-input one-output multiplexer (10.4) having a first input terminal connected to the output terminal of said third two-input one-output multiplexer (10.2), a second input terminal connected to said sixth configuration input terminal (M22), and a control input terminal connected to said fifth configuration input terminal (M12), said fifth two-input one-output multiplexer producing, as a fifth selected output signal, the third selected output signal supplied to the first input terminal thereof when the control input terminal thereof is supplied with a control signal having a logic value of "0", said fifth two-input one-output multiplexer producing, as the fifth selected output signal, an input signal supplied to the second input terminal thereof when the control input terminal thereof is supplied with the control signal having the logic value of "1";

a NAND circuit (12) having a first input terminal connected to an output terminal of said first exclusive OR circuit (11.0) and a second input terminal connected to an output terminal of said fourth two-input one-output multiplexer (10.3), said NAND circuit NANDing the first exclusively ORed output signal supplied to the first input terminal thereof and the fourth selected output signal supplied to the second input terminal thereof to produce a NANDed output signal;

a NOR circuit (13) having a first input terminal connected to the output terminal of said first exclusive OR circuit (11.0) and a second input terminal connected to the output terminal of said fourth two-input one-output multiplexer (10.3), said NOR circuit (13) NORing the first exclusively ORed output signal supplied to the first input terminal thereof and the fourth selected output signal supplied to the second input terminal thereof to produce a NORed output signal;

a third exclusive OR circuit (11.2) having a first input terminal connected to an output terminal of said first exclusive OR circuit (11.0) and a second input terminal connected to an output terminal of said second exclusive OR circuit (11.1), said third exclusive OR circuit exclusively ORing the first exclusively ORed output signal supplied to the first input terminal thereof and the second exclusively ORed output signal supplied to the second input terminal thereof to produce a third exclusively ORed output signal;

an inverter (15.0) having an input terminal connected to an output terminal of said fifth two-input one-output multiplexer (10.4), said inverter inverting the fifth selected output signal supplied to the input terminal thereof to produce an inverted output signal;

a NAND-OR circuit (14.0) having a first input terminal connected to an output terminal of said NAND circuit (12), a second input terminal connected to an output terminal of said NOR circuit (13), and a third input terminal connected to an output terminal of said inverter (15.0), said NAND-OR circuit ORing the NORed output signal supplied to the second input terminal thereof and the inverted output signal supplied to the third input terminal thereof to obtain an ORed result signal and NANDing the ORed result signal and the NANDed output signal supplied to the first input terminal thereof to produce an ORed and NANDed output signal;

first connecting means for connecting an output terminal of said NAND circuit (12) with said second core logic carry generation output terminal (GO2) to make said second core logic carry generation output terminal (GO2) produce the NANDed output signal as the second core logic carry generation output signal;

second connecting means for connecting an output terminal of said NOR circuit (13) with said second core logic carry propagation output terminal (PO2) to make said second core logic carry propagation output terminal (PO2) produce the NORed output signal as the second core logic carry propagation output signal;

third connecting means for connecting an output terminal of said NAND-OR circuit (14.0) with said second core logic carry output terminal (C2) to make said second core logic carry output terminal (C2) produce the ORed and NANDed output signal as the second core logic carry output signal; and fourth connecting means for connecting an output terminal of said third exclusive OR circuit (11.2) with said second sum output terminal (S2) to make said second sum output terminal (S2) produce the third exclusively ORed output signal as the second summed output signal.

81. A programmable function device as claimed in claim 72, wherein said second core logic circuit comprises:

a first two-input one-output multiplexer (10.0) having a first input terminal connected to the first argument input terminal (A02) of said third argument input group, a second input terminal connected to the second argument input terminal (A12) of said third argument input group, and a control input terminal connected to the third argument input terminal (A22) of said third argument input group, said first two-input one-output multiplexer producing, as a first selected output signal, an input signal supplied to the first input terminal thereof when the control input terminal thereof is supplied with a control signal having a logic value of "0", said first two-input one-output multiplexer producing, as the first selected output signal, an input signal supplied to the second input terminal thereof when the control input terminal thereof is supplied with the control signal having a logic value of "1";

a second two-input one-output multiplexer (10.1) having a first input terminal connected to the first argument input terminal (B02) of said fourth argument input group, a second input terminal connected to the second argument input terminal (B12) of said fourth argument input group, and a control input terminal connected to the third argument input terminal (B22) of said fourth argument input group, said second two-input one-output multiplexer producing, as a second selected output signal, an input signal supplied with the first input terminal thereof when the control input terminal thereof is supplied with a control signal having a logic value of "0", said second two-input one-output multiplexer producing, as the second selected output signal, an input signal supplied with the second input terminal thereof when the control input terminal thereof is supplied with the control signal having a logic value of "1";

a third two-input one-output multiplexer (10.2) having a first input terminal connected to the fourth argument input terminal (B32) of said fourth argument input group, a second input terminal connected to said second ripple-core logic carry input terminal (CCI2), and a control input terminal connected to said fourth configuration input terminal (M02), said third two-input one-output multiplexer producing, as a third selected output terminal, an input signal supplied to the first input terminal thereof when the control input terminal thereof is supplied with a control signal having a logic value of "0", said third two-input one-output multiplexer producing, as the third selected output terminal, an input signal supplied to the second input terminal thereof when the control input terminal thereof is supplied with the control signal having a logic value of "1";

a first exclusive OR circuit (11.0) having a first input terminal connected to the fourth argument input terminal (A32) of said fourth argument input group and a second input terminal connected to an output terminal of said first two-input one-output multiplexer (10.0), said first exclusive OR circuit exclusively ORing an input signal supplied with the first input terminal thereof and the first selected output signal supplied with the second input terminal thereof to produce a first exclusively ORed output signal;

a second exclusive OR circuit (11.1) having a first input terminal connected to an output terminal of said second two-input one-output multiplexer (10.1) and a second input terminal connected to an output terminal of said third two-input one-output multiplexer (10.2), said second exclusive OR circuit exclusively ORing the second selected output signal supplied to the first input terminal thereof and the third selected output signal supplied to the second input terminal thereof to produce a second exclusively ORed output signal;

a fourth two-input one-output multiplexer (10.3) having a first input terminal connected to the output terminal of said second two-input one-output multiplexer (10.1), a second input terminal connected to an output terminal of said second exclusive OR circuit (11.1), and a control input terminal connected to said fifth configuration input terminal (M12), said fourth two-input one-output multiplexer producing, as a fourth selected output signal, the second selected output signal supplied to the first input terminal thereof when the control input terminal thereof is supplied with a control signal having a logic value of "0", said fourth two-input one-output multiplexer producing, as the fourth selected output signal, the second exclusive ORed signal supplied to the second input terminal thereof when the control input terminal thereof is supplied with the control signal having the logic value of "1";

a fifth two-input one-output multiplexer (10.4) having a first input terminal connected to an output terminal of said third two-input one-output multiplexer (10.2), a second input terminal connected to said sixth configuration input terminal (M22), and a control input terminal connected to said fifth configuration input terminal (M12), said fifth two-input one-output multiplexer producing, as a fifth selected output signal, the third selected output signal supplied to the first input terminal thereof when the control input terminal thereof is supplied with a control signal having a logic value of "0", said fifth two-input one-output multiplexer producing, as the fifth selected output signal, an input signal supplied to the second input terminal thereof when the control input terminal thereof is supplied with the control signal having the logic value of "1";

a NAND circuit (12) having a first input terminal connected to an output terminal of said first exclusive OR circuit (11.0) and a second input terminal connected to an output terminal of said fourth two-input one-output multiplexer (10.3), said NAND circuit NANDing the first exclusively ORed output signal supplied to the first input terminal thereof and the fourth selected output signal supplied to the second input terminal thereof to produce a NANDed output signal;

a NOR circuit (13) having a first input terminal connected to the output terminal of said first exclusive OR circuit (11.0) and a second input terminal connected to the output terminal of said fourth two-input one-output multiplexer (10.3), said NOR circuit NORing the first exclusively ORed output signal supplied to the first input terminal thereof and the fourth selected output signal supplied to the second input terminal thereof to produce a NORed output signal;

a third exclusive OR circuit (11.2) having a first input terminal connected to the output terminal of said first exclusive OR circuit (11.0) and a second input terminal connected to the output terminal of said second exclusive OR circuit (11.1), said third exclusive OR circuit exclusively ORing the first exclusively ORed output signal supplied to the first input terminal thereof and the second exclusively ORed output signal supplied to the second input terminal thereof to produce a third exclusively ORed output signal;

a two-input one-output inverting multiplexer (35.0) having a first input terminal connected to an output terminal of said NAND circuit (12), a second input terminal connected to an output terminal of said NOR circuit (13), and a control input terminal connected to an output terminal of said fifth two-input one-output multiplexer, said two-input one-output inverting multiplexer producing, as an inverted selected output signal, a signal obtaining by inverting the NANDed output signal supplied to the first input terminal thereof when the control input terminal thereof is supplied with a control signal having a logic value of "0", said two-input one-output inverting multiplexer producing, as the inverted selected output signal, a signal obtained by inverting the NORed output signal supplied to the second input terminal thereof when the control input terminal thereof is supplied with the control signal having the logic value "1";

first connecting means for connecting the output terminal of said NAND circuit (12) with said second core logic carry generation output terminal (GO2) to make said second core logic carry generation output terminal (GO2) produce the NANDed output signal as the second core logic carry generation output signal;

second connecting means for connecting the output terminal of said NOR circuit (13) with said second core logic carry propagation output terminal (P02) to make said second core logic carry propagation output terminal (P02) produce the NORed output signal as the second core logic carry propagation output signal;

third connecting means for connecting an output terminal of said two-input one-output inverting multiplexer (35.0) with said second core logic carry output terminal (C2) to make said second core logic carry output terminal (C2) produce the inverted selected output signal as the second core logic carry output signal; and fourth connecting means for connecting an output terminal of said third exclusive OR circuit with said second sum output terminal (S2) to make said second sum output terminal (S2) produce the third exclusively ORed output signal as the second summed output signal.

82. A programmable function device as claimed in claim 72, wherein said second core logic circuit comprises:

a first two-input one-output multiplexer (10.0) having a first input terminal connected to the first argument input terminal (A02) of said third argument input group, a second input terminal connected to the second argument input terminal (A12) of said third argument input group, and a control input terminal connected to the third argument input terminal (A22) of said third argument input group, said first two-input one-output multiplexer producing, as a first selected output signal, an input signal supplied to the first input terminal thereof when the control input terminal thereof is supplied with a control signal having a logic value of "0", said first two-input one-output multiplexer producing, as the first selected output signal, an input signal supplied to the second input terminal thereof when the control input terminal thereof is supplied with the control signal having a logic value of "1";

a second two-input one-output multiplexer (10.1) having a first input terminal connected to the first argument input terminal (B02) of said fourth argument input group, a second input terminal connected to the second argument input terminal (B12) of said fourth argument input group, and a control input terminal connected to the third argument input terminal (B22) of said fourth argument input group, said second two-input one-output multiplexer producing, as a second selected output signal, an input signal supplied to the first input terminal thereof when the control input terminal thereof is supplied with a control signal having a logic value of "0" said second two-input one-output multiplexer producing, as the second selected output signal, an input signal supplied to the second input terminal thereof when the control input terminal thereof is supplied with the control signal having a logic value of "1";

a third two-input one-output multiplexer (10.2) having a first input terminal connected to the fourth argument input terminal (B32) of said fourth argument input group, a second input terminal connected to said second ripple-core logic carry input terminal (CCI2), and a control input terminal connected to said fourth configuration input terminal (M02), said third two-input one-output multiplexer producing, as a third selected output signal, an input signal supplied to the first input terminal thereof when the control input terminal thereof is supplied with a control signal having a logic value of "0", said third two-input one-output multiplexer producing, as the third selected output signal, an input signal supplied to the second input terminal thereof when the control input terminal thereof is supplied with the control signal having a logic value of "1";

a first exclusive OR circuit (11.0) having a first input terminal connected to the fourth argument input terminal (A32) of said third argument input group and a second input terminal connected to an output terminal of said first two-input one-output multiplexer (10.0), said first exclusive OR circuit exclusively ORing an input signal supplied to the first input terminal thereof and the first selected output signal supplied to the second input terminal thereof to produce a first exclusively ORed output signal;

a second exclusive OR circuit (11.1) having a first input terminal connected to an output terminal of said second two-input one-output multiplexer (10.1) and a second input terminal connected to an output terminal of said third two-input one-output multiplexer (10.2), said second exclusive OR circuit exclusively ORing the second selected output signal supplied to the first input terminal thereof and the third selected output signal supplied to the second input terminal thereof to produce a second exclusively ORed output signal;

a fourth two-input one-output multiplexer (10. 3A) having a first input terminal connected to an output terminal of said second exclusive OR circuit (11.1), a second input terminal connected to the output terminal of said second two-input one-output multiplexer (10.1), and a control input terminal connected to said fifth configuration input terminal (M12), said fourth two-input one-output multiplexer producing, as a fourth selected output signal, the second exclusively ORed output signal supplied to the first input terminal thereof when the control input terminal thereof is supplied with a control signal having a logic value of "0", said fourth two-input one-output multiplexer producing, as the fourth selected output signal, the second selected output signal supplied to the second input terminal thereof when the control input terminal thereof is supplied with the control signal having the logic value of "1";

a fifth two-input one-output multiplexer (10.4A) having a first input terminal connected to said sixth configuration input terminal (M22), a second input terminal connected to the output terminal of said third two-input one-output multiplexer (10.2), and a control input terminal connected to said fifth configuration input terminal (M12), said fifth two-input one-output multiplexer producing, as a fifth selected output signal, an input signal supplied to the first input terminal thereof when the control input terminal thereof is supplied with a control signal having a logic value of "0", said fifth two-input one-output multiplexer producing, as the fifth selected output signal, the third selected output signal supplied to the second input terminal thereof when the control input terminal thereof is supplied with the control signal having the logic value of "1";

a NAND circuit (12) having a first input terminal connected to an output terminal of said first exclusive OR circuit (11.0) and a second input terminal connected to an output terminal of said fourth two-input one-output multiplexer (10.3A), said NAND circuit NANDing the first exclusively ORed output signal supplied to the first input terminal thereof and the fourth selected output signal supplied to the second input terminal thereof to produce a NANDed output signal;

a NOR circuit (13) having a first input terminal connected to the output terminal of said first exclusive OR circuit (11.0) and a second input terminal connected to the output terminal of said fourth two-input one-output multiplexer (10.3A), said NOR circuit (13) NORing the first exclusively ORed output signal supplied to the first input terminal thereof and the fourth selected output signal supplied to the second input terminal thereof to produce a NORed output signal;

a third exclusive OR circuit (11.2) having a first input terminal connected to the output terminal of said first exclusive OR circuit (11.0) and a second input terminal connected to the output terminal of said second exclusive OR circuit (11.1), said third exclusive OR circuit exclusively ORing the first exclusively ORed output signal supplied to the first input terminal thereof and the second exclusively ORed output signal supplied to the second input terminal thereof to produce a third exclusively ORed output signal;

an inverter (15.0) having an input terminal connected to an output terminal of said fifth two-input one-output multiplexer (10. 4A), said inverter inverting the fifth selected output signal supplied to the input terminal thereof to produce an inverted output signal;

a NAND-OR circuit (14.0) having a first input terminal connected to the output terminal of said NAND circuit (12), a second input terminal connected to the output terminal of said NOR circuit (13), and a third input terminal connected to an output terminal of said inverter (15.0), said NAND-OR circuit ORing the NORed output signal supplied to the second input terminal thereof and the inverted output signal supplied to the third input terminal thereof to obtain an ORed result signal and NANDing the ORed result signal and the NANDed output signal supplied to the first input terminal thereof to produce an ORed and NANDed output signal;

first connecting means for connecting the output terminal of said NAND circuit (12) with said second core logic carry generation output terminal (GO2) to make said second core logic carry generation output terminal (GO2) produce the NANDed output signal as the second core logic carry generation output signal;

second connecting means for connecting the output terminal of said NOR circuit (13) with said second core logic carry propagation output terminal (PO2) to make said second core logic carry propagation output terminal (PO2) produce the NORed output signal as the second core logic carry propagation output signal;

third connecting means for connecting an output terminal of said NAND-OR circuit (14.0) with said second core logic carry output terminal (C2) to make said second core logic carry output terminal (C2) produce the ORed and NANDed output signal as the second core logic carry output signal; and fourth connecting means for connecting an output terminal of said third exclusive OR circuit with said second sum output terminal (S2) to make said second sum output terminal (S2) produce the third exclusively ORed output signal as the second summed output signal.

83. A programmable function device as claimed in claim 72, wherein said second core logic circuit comprises:

a first two-input one-output multiplexer (10.0) having a first input terminal connected to the first argument input terminal (A02) of said third argument input group, a second input terminal connected to the second argument input terminal (A12) of said third argument input group, and a control input terminal connected to the third argument input terminal (A22) of said third argument input group, said first two-input one-output multiplexer producing, as a first selected output signal, an input signal supplied to the first input terminal thereof when the control input terminal thereof is supplied with a control signal having a logic value of "0", said first two-input one-output multiplexer producing, as the first selected output signal, an input signal supplied to the second input terminal thereof when the control input terminal thereof is supplied with the control signal having a logic value of "1";

a second two-input one-output multiplexer (10.1) having a first input terminal connected to the first argument input terminal (B02) of said fourth argument input group, a second input terminal connected to the second argument input terminal (B12) of said fourth argument input group, and a control input terminal connected to the third argument input terminal (B22) of said fourth argument input group, said second two-input one-output multiplexer producing, as a second selected output signal, an input signal supplied to the first input terminal thereof when the control input terminal thereof is supplied with a control signal having a logic value of "0", said second two-input one-output multiplexer producing, as the second selected output signal, an input signal supplied to the second input terminal thereof when the control input terminal thereof is supplied with the control signal having a logic value of "1";

a third two-input one-output multiplexer (10.2) having a first input terminal connected to the fourth argument input terminal (B32) of said fourth argument input group, a second input terminal connected to said second ripple-core logic carry input terminal (CCI2), and a control input terminal connected to said fourth configuration input terminal (M02), said third two-input one-output multiplexer producing, as a third selected output terminal, an input signal supplied to the first input terminal thereof when the control input terminal thereof is supplied with a control signal having a logic value of "0", said third two-input one-output multiplexer producing, as the third selected output terminal, an input signal supplied to the second input terminal thereof when the control input terminal thereof is supplied with the control signal having a logic value of "1";

a first exclusive OR circuit (11.0) having a first input terminal connected to the fourth argument input terminal (A32) of said third argument input group and a second input terminal connected to an output terminal of said first two-input one-output multiplexer (10.0), said first exclusive OR circuit exclusively ORing an input signal supplied to the first input terminal thereof and the first selected output signal supplied to the second input terminal thereof to produce a first exclusively ORed output signal;

a second exclusive OR circuit (11.1) having a first input terminal connected to an output terminal of said second two-input one-output multiplexer (10.1) and a second input terminal connected to an output terminal of said third two-input one-output multiplexer (10.2), said second exclusive OR circuit exclusively ORing the second selected output signal supplied to the first input terminal thereof and the third selected output signal supplied to the second input terminal thereof to produce a second exclusively ORed output signal;

a fourth two-input one-output multiplexer (10.3A) having a first input terminal connected to an output terminal of said second exclusive OR circuit (11.1), a second input terminal connected to the output terminal of said second two-input one-output multiplexer (10.1), and a control input terminal connected to said fifth configuration input terminal (M12), said fourth two-input one-output multiplexer producing, as a fourth selected output signal, the second exclusively ORed output signal supplied to the first input terminal thereof when the control input terminal thereof is supplied with a control signal having a logic value of "0", said fourth two-input one-output multiplexer producing, as the fourth selected output signal, the second selected output signal supplied to the second input terminal thereof when the control input terminal thereof is supplied with the control signal having the logic value of "1";

a fifth two-input one-output multiplexer (10.4A) having a first input terminal connected to said sixth configuration input terminal (M22), a second input terminal connected to the output terminal of said third two-input one-output multiplexer (10.2), and a control input terminal connected to said fifth configuration input terminal (M12), said fifth two-input one-output multiplexer producing, as a fifth selected output signal, an input signal supplied to the first input terminal thereof when the control input terminal thereof is supplied with a control signal having a logic value of "0", said fifth two-input one-output multiplexer producing, as the fifth selected output signal, the third selected output signal supplied to the second input terminal thereof when the control input terminal thereof is supplied with the control signal having the logic value of "1";

a NAND circuit (12) having a first input terminal connected to an output terminal of said first exclusive OR circuit (11.0) and a second input terminal connected to an output terminal of said fourth two-input one-output multiplexer (10.3A), said NAND circuit NANDing the first exclusively ORed output signal supplied to the first input terminal thereof and the fourth selected output signal supplied to the second input terminal thereof to produce a NANDed output signal;

a NOR circuit (13) having a first input terminal connected to the output terminal of said first exclusive OR circuit (11.0) and a second input terminal connected to the output terminal of said fourth two-input one-output multiplexer (10.3A), said NOR circuit (13) NORing the first exclusively ORed output signal supplied to the first input terminal thereof and the fourth selected output signal supplied to the second input terminal thereof to produce a NORed output signal;

a third exclusive OR circuit (11.2) having a first input terminal connected to the output terminal of said first exclusive OR circuit (11.0) and a second input terminal connected to the output terminal of said second exclusive OR circuit (11.1), said third exclusive OR circuit exclusively ORing the first exclusively ORed output signal supplied to the first input terminal thereof and the second exclusively ORed output signal supplied to the second input terminal thereof to produce a third exclusively ORed output signal;

a two-input one-output inverting multiplexer (35.0) having a first input terminal connected to an output terminal of said NAND circuit (12), a second input terminal connected to an output terminal of said NOR circuit (13), and a control input terminal connected to an output terminal of said fifth two-input one-output multiplexer (10.4A), said two-input one-output inverting multiplexer producing, as an inverted selected output signal, a signal obtaining by inverting the NANDed output signal supplied to the first input terminal thereof when the control input terminal thereof is supplied with a control signal having a logic value of "0", said two-input one-output inverting multiplexer producing, as the inverted selected output signal, a signal obtained by inverting the NORed output signal supplied to the second input terminal thereof when the control input terminal thereof is supplied with the control signal having the logic value "1";

first connecting means for connecting the output terminal of said NAND circuit (12) with said second core logic carry generation output terminal (GO2) to make said second core logic carry generation output terminal (GO2) produce the NANDed output signal as the second core logic carry generation output signal;

second connecting means for connecting the output terminal of said NOR circuit (13) with said second core logic carry propagation output terminal (PO2) to make said second core logic carry propagation output terminal (PO2) produce the NORed output signal as the second core logic carry propagation output signal;

third connecting means for connecting an output terminal of said two-input one-output inverting multiplexer (35.0) with said second core logic carry output terminal (C2) to make said second core logic carry output terminal (C2) produce the inverted selected output signal as the second core logic carry output signal; and fourth connecting means for connecting an output terminal of said third exclusive OR circuit with said second sum output terminal (S2) to make said second sum output terminal (S2) produce the third exclusively ORed output signal as the second summed output signal.

84. A programmable function device as claimed in claim 72, wherein said odd carry logic circuit (5.1) comprises:

first connection means for connecting said ripple carry input terminal (RCI) with said first ripple-core logic carry output terminal (CCO1) to make said first ripple-core logic carry output terminal produce the ripple carry input signal as the first ripple-core logic carry output signal;

a first inverter (15.1) having an input terminal connected to said first core logic carry generation input terminal (G1), said first inverter inverting the first core logic carry generation input signal to produce an inverted core logic carry generation signal;

a second inverter (15.2) having an input terminal connected to said first core logic carry propagation input terminal (P1) said second inverter inverting the first core logic carry propagation input signal to produce an inverted core logic carry propagation signal;

a NOR-AND circuit (52) having a first input terminal connected to an output terminal of said first inverter (15.1), a second input terminal connected to an output terminal of said second inverter (15.2), and a third input terminal connected to said ripple carry input terminal (RCI), said NOR-AND circuit ANDing the inverted core logic carry propagation input signal supplied to the second input terminal thereof and the ripple carry signal supplied to the third input terminal thereof to obtain an ANDed result signal and NORing the ANDed result signal and the inverted core logic carry generation input signal supplied to the first input terminal thereof to produce an ANDed and NORed output signal; and second connection means for connecting an output terminal of said NOR-AND circuit (52) with said ripple carry inverted output terminal (RCOb) to make said ripple carry inverted output terminal produce the ANDed and NORed output signal as the ripple carry inverted output signal, said even carry logic circuit (5.2) comprising:

a third inverter (15.3) having an input terminal connected to said ripple carry inverted input terminal (RCIb), said third inverter inverting the ripple carry inverted input signal to produce a ripple carry input signal;

third connection means for connecting an output terminal of said third inverter (15.3) with said second ripple-core logic carry output terminal (CCO2) to make said second ripple-core logic carry output terminal produce the ripple carry input signal as the second ripple-core logic carry output signal;

a NAND-OR circuit (14.1) having a first input terminal connected to said second core logic carry generation input terminal (G2), a second input terminal connected to said second core logic carry propagation input terminal (P2), and a third input terminal connected to said ripple carry inverted input terminal (RCIb), said NAND-OR circuit ORing the second core logic carry propagation input signal supplied to the second input E terminal thereof and the ripple carry inverted signal supplied to the third input terminal thereof to obtain an ORed result signal and NANDing the ORed result signal and the first core logic carry generation input signal supplied to the first input terminal thereof to produce an ORed and NANDed output signal; and fourth connection means for connecting an output terminal of said NAND-OR circuit (14.1) with said ripple carry output terminal (RCO) to make said ripple carry output terminal produce the ORed and NANDed output signal as the ripple carry output signal.

85. A programmable function device as claimed in claim 72, wherein each of said input selection units comprises a memory circuit for storing a logic value to produce the logic value as an output value, each of said input selection units determining the input selected signal in accordance with the output value of said memory circuit.

86. A programmable function device as claimed in claim 72, wherein each of said input selection units comprises:

a memory circuit (6.6) acting as means for supplying the fixed logic value, said memory circuit storing a logic value of one bit to produce a stored signal; and a multiplexer (32) connected to said interconnecting wires and said memory circuit, said multiplexer having M input terminals and N control input terminals, where M and N represents first and second positive numbers, the first positive number M being larger than the second positive number N, one of the M input terminals being connected to an output terminal of said memory circuit, said multiplexer selecting one of the stored signal and the signals a on said interconnecting wires as the input selected signal.

87. A programmable function device as claimed in claim 72, wherein each of said input selection units includes means (22B) for supplying the fixed logic value of "0", said means for supplying the fixed logic value of "0" comprising:

a memory circuit (6.5) for storing a logic value of one bit to produce a stored signal; and an NMOS transistor (24) having a source electrode connected to a ground terminal, a gate electrode connected to an output terminal of said memory circuit, and a drain electrode as an output terminal of said means for supplying the fixed logic value of "0".

88. A programmable function device as claimed in claim 72, wherein each of said input selection units includes means (22C) for supplying the fixed logic value of "1", said means for supplying the fixed logic value of "1" comprising:
   a memory circuit (6.4) for storing a logic value of one bit to produce a stored signal; and
   a PMOS transistor (25) having a source electrode connected to a power source terminal, a gate electrode connected to an output terminal of said memory circuit, and a drain electrode as an output terminal of said means for supplying the fixed logic value of "1".

89. A programmable function device as claimed in claim 72, wherein each of said input selection units includes means (22A) for supplying the fixed logic value, said means for supplying the fixed logic value comprising:
   a memory circuit (6.5) for storing a logic value of one bit to produce a stored signal;
   a resistor (31) having high-resistance, said resistor having an end connected to a power source terminal; and
   an NMOS transistor (24) having a source electrode connected to a ground terminal, a gate electrode connected to an output terminal of said memory circuit, and a drain electrode connected to another end of said high resistor, the drain electrode of said NMOS transistor being connected to an output terminal of said means for supplying the fixed logic value.

90. A programmable function device as claimed in claim 72, wherein further comprises means for supplying the fixed logic value to at least one of said input selection units included in the respective programmable function blocks, said means for supplying the fixed logic value consisting of a single circuit for outputting the fixed logic value to cover all over the programmable function blocks included in said programmable function device.

91. A programmable function device as claimed in claim 72, wherein further has at least common line connected to at least one of said argument input terminals of each of said core logic circuits in said programmable function device to cover all over the core logic circuits in said programmable function device, said at least common line being connected to an output terminal of a common input selection unit.

92. A programmable function device as claimed in claim 72, wherein at least one of said memory circuits included in each of said programmable function blocks in said programmable function device is shared to cover all over the programmable function blocks included in said programmable function device.

93. A plurality of programmable function devices, each programmable function device as claimed in claim 91, wherein said plurality of programmable function devices are classified into a first group of programmable function devices, each comprising odd and even programmable function blocks equal in number to a first predetermined number and a second group of programmable function devices each comprising odd and even programmable function blocks equal in number to a second predetermined number, the first and the second predetermined numbers being different from each other.

94. A plurality of programmable function devices, each programmable function device as claimed in claim 91, wherein said plurality of programmable function devices are close-packed and disposed on a rectangular area, each of said programmable function devices comprising at least one odd programmable function block and at least one even programmable function block.

95. A programmable function module comprising:
a programmable function block comprising a core logic circuit (4, 4A, 4B, 4C) having a first argument input group consisting of first through fourth argument input terminals (A0, A1, A2, A4), a second argument input group consisting of first through fourth argument input terminals (B0, B1, B2, B3), first through third configuration input terminals (M0, M1, M2), a core logic carry output terminal (C) for outputting a core logic carry output signal, a core logic carry generation output terminal (GO) for outputting a core logic carry generation output signal, a core logic carry propagation output terminal (PO) for outputting a core logic carry propagation output signal, a ripple-core logic carry input terminal (CCI) for inputting a ripple-core logic carry input terminal, and a sum output terminal (S) for outputting a summed output signal, an input block (3) connected to interconnection wires and the first and the second argument input groups, said input block including eighth input selection units for selecting, as eight input selected signals, eight ones of signals on the interconnection wires, a fixed logic value of "1", and a fixed logic value of "0", said input selection units supplying the eight input selected signals to said first through said fourth argument input terminals of the first and the second argument input groups, first through third memory circuits (6.0, 6.1, 6.3), connected to the first through the third configuration input terminals (M0, M1, M2), respectively, for storing, as first through third stored logic values, a logic value of one bit, said first through said third memory circuits supplying the first through the third stored logic values to the first through the third configuration input terminals, respectively, and a carry logic circuit (5, 5A) having a ripple carry input terminal (RCI) for inputting a ripple carry input signal from a ripple carry propagation path (7), a ripple carry output terminal (RCO) for outputting a ripple carry output signal to said ripple carry propagation path (7), a ripple-core logic carry output terminal (CCO) for supplying the ripple-core logic carry input terminal (CCI) with a ripple-core logic carry output signal as the ripple-core logic carry input signal, a core logic carry generation input terminal (G) for inputting the core logic carry generation output signal as a core logic carry generation input signal from the core logic carry output terminal (GO), and a core logic carry propagation input terminal (P) for inputting the core logic carry propagation output signal as a core logic carry propagation input signal from the core logic carry propagation output terminal (PO);
a first register block (41.0) having a first date input terminal (D11) connected to said sum output terminal (S), a first clock input terminal (CLK1) supplied with a clock signal, a first clock enable input terminal (E1) supplied with a first clock enable signal, a first set/reset input terminal (SRI) supplied with a first set/reset input signal, a fourth configuration input terminal (M31), and a first data output terminal (DO1);
a second register block (41.1) having a second date input terminal (D12) connected to said core logic carry output terminal (C), a second clock input terminal (CLK2) supplied with the clock signal, a second clock enable input terminal (E2) supplied with a second clock enable signal, a second set/reset input terminal (SR2) supplied with a second set/reset input signal, a fifth configuration input terminal (M32), and a second data output terminal (DO1);

a fourth memory circuit (6.80) connected to said fourth configuration input terminal (M31);

a fifth memory circuit (6.81) connected to said fifth configuration input terminal (M32);

a first clock enable input selection circuit (3.E0), connected to said interconnecting wires (8) and said first clock enable input terminal (E1), for supplying the first clock enable signal to said first clock enable input terminal (E1);

a second clock enable input selection circuit (3.E1), connected to said interconnecting wires (8) and said second clock enable input terminal (E2), for supplying the second clock enable signal to said second clock enable input terminal (E2);

a first set/reset input selection circuit (3.SR0), connected to said interconnecting wires (8) and said first set/reset input terminal (SR1), for the first set/reset input signal to said first set/reset input terminal (SR1);

a second set/reset input selection circuit (3.SR1), connected to said interconnecting wires (8) and said second set/reset input terminal (SR2), for the second set/reset input signal to said second set/reset input terminal (SR2);

a first output unit (42.0), connected to said first data output terminal (DO1) and said interconnecting wires (8), for supplying a first data output signal from said first data output terminal (DO1) to said interconnecting wires (8); and a second output unit (42.1), connected to said second data output terminal (DO2) and said interconnecting wires (8), for supplying a second data output signal from said second data output terminal (DO2) to said interconnecting wires (8).

96. A programmable function module as claimed in claim 95, wherein said core logic circuit (4) comprises:

a first two-input one-output multiplexer (10.0) having a first input terminal connected to the first argument input terminal (A0) of said first argument input group, a second input terminal connected to the second argument input terminal (A1) of said first argument input group, and a control input terminal connected to the third argument input terminal (A2) of said first argument input group, said first two-input one-output multiplexer producing, as a first selected output signal, an input signal supplied to the first input terminal thereof when the control input terminal thereof is supplied with a control signal having a logic value of "0", said first two-input one-output multiplexer producing, as the first selected output signal, an input signal supplied to the second input terminal thereof when the control input terminal thereof is supplied with the control signal having a logic value of "1";

a second two-input one-output multiplexer (10.1) having a first input terminal connected to the first argument input terminal (B0) of said second argument input group, a second input terminal connected to the second argument input terminal (B1) of said second argument input group, and a control input terminal connected to the third argument input terminal (B2) of said second argument input group, said second two-input one-output multiplexer producing, as a second selected output signal, an input signal supplied to the first input terminal thereof when the control input terminal thereof is supplied with a control signal having a logic value of "0", said second two-input one-output multiplexer producing, as the second selected output signal, an input signal supplied to the second input terminal thereof when the control input terminal thereof is supplied with the control signal having a logic value of "1";

a third two-input one-output multiplexer (10.2) having a first input terminal connected to the fourth argument input terminal (B3) of said second argument input group, a second input terminal connected to said ripple-core logic carry input terminal (CCI), and a control input terminal connected to said first configuration input terminal (M0), said third two-input one-output multiplexer producing, as a third selected output signal, an input signal supplied to the first input terminal thereof when the control input terminal thereof is supplied with a control signal having a logic value of "0", said third two-input one-output multiplexer producing, as the third selected output signal, an input signal supplied to the second input terminal thereof when the control input terminal thereof is supplied with the control signal having a logic value of "1";

a first exclusive OR circuit (11.0) having a first input terminal connected to the fourth argument input terminal (A3) of said first argument input group and a second input terminal connected to an output terminal of said first two-input one-output multiplexer (10.0), said first exclusive OR circuit exclusively ORing an input signal supplied to the first input terminal thereof and the first selected output signal supplied to the second input terminal thereof to produce a first exclusively ORed output signal;

a second exclusive OR circuit (11.1) having a first input terminal connected to an output terminal of said second two-input one-output multiplexer (10.1) and a second input terminal connected to an output terminal of said third two-input one-output multiplexer (10.3), said second exclusive OR circuit exclusively ORing the second selected output signal supplied to the first input terminal thereof and the third selected output signal supplied to the second input terminal thereof to produce a second exclusively ORed output signal;

a fourth two-input one-output multiplexer (10.3) having a first input terminal connected to the output terminal of said go second two-input one-output multiplexer (10.1), a second input terminal connected to an output terminal of said second exclusive OR circuit (11.1), and a control input terminal connected to said second configuration input terminal (M1), said fourth two-input one-output multiplexer producing, as a fourth selected output signal, the second selected output signal supplied to the first input terminal thereof when the control input terminal thereof is supplied with a control signal having a logic value of "0", said fourth two-input one-output multiplexer producing, as the fourth selected output signal, the second exclusively ORed output signal when the control input terminal thereof is supplied with the control signal having the logic value of "1";

a fifth two-input one-output multiplexer (10.4) having a first input terminal connected to the output terminal of said third two-input one-output multiplexer (10.2), a second input terminal connected to said third configuration input terminal (M2), and a control input terminal connected to said second configuration input terminal (M1), said fifth two-input one-output multiplexer producing, as a fifth selected output signal, the third selected output signal supplied to the first input terminal thereof when the control input terminal thereof is supplied with a control signal having a logic value of "0", said fifth two-input one-output multiplexer producing, as the fifth selected output signal, an input signal supplied to the second input terminal thereof when the control input terminal thereof is supplied with the control signal having the logic value of "1";

a NAND circuit (12) having a first input terminal connected to an output terminal of said first exclusive OR circuit (11.0) and a second input terminal connected to an output terminal of said fourth two-input one-output multiplexer (10.3), said NAND circuit NANDing the first exclusively ORed output signal supplied to the first input terminal thereof and the fourth selected output signal supplied to the second input terminal thereof to produce a NANDed output signal;

a NOR circuit (13) having a first input terminal connected to the output terminal of said first exclusive OR circuit (11.0) and a second input terminal connected to the output terminal of said fourth two-input one-output multiplexer (10.3), said NOR circuit NORing the first exclusively ORed output signal supplied to the first input terminal thereof and the fourth selected output signal supplied to the second input terminal thereof to produce a NORed output signal;

a third exclusive OR circuit (11.2) having a first input terminal connected to an output terminal of said first exclusive OR circuit (11.0) and a second input terminal connected to an output terminal of said second exclusive OR circuit (11.1), said third exclusive OR circuit exclusively ORing the first exclusively ORed output signal supplied to the first input terminal thereof and the second exclusively ORed output signal supplied to the second input terminal thereof to produce a third exclusively ORed output signal;

an inverter (15.0) having an input terminal connected to an output terminal of said fifth two-input one-output multiplexer (10.4), said inverter inverting the fifth selected output signal supplied to the input terminal thereof to produce an inverted output signal;

a NAND-OR circuit (14.0) having a first input terminal connected to an output terminal of said NAND circuit (12), a second input terminal connected to an output terminal of said NOR circuit (13), and a third input terminal connected to an output terminal of said inverter (15.0), said NAND-OR circuit ORing the NORed output signal supplied to the second input terminal thereof and the inverted output signal supplied to the third input terminal thereof to obtain an ORed result signal and NANDing the ORed result signal and the NANDed output signal supplied to the first input terminal thereof to produce an ORed and NANDed output signal;

first connecting means for connecting an output terminal of said NAND circuit (12) with said core logic carry generation output terminal (GO) to make said core logic carry generation output terminal (GO) produce the NANDed output signal as the core logic carry generation output signal;

second connecting means for connecting an output terminal of said NOR circuit (13) with said core logic carry propagation output terminal (PO) to make said core logic carry propagation output terminal (PO) produce the NORed output signal as the core logic carry propagation output signal;

third connecting means for connecting an output terminal of said NAND-OR circuit (14.0) with said core logic carry output terminal (C) to make said core logic carry output terminal (C) produce the ORed and NANDed output signal as the core logic carry output signal; and fourth connecting means for connecting an output terminal of said third exclusive OR circuit (11.2) with said sum output terminal (S) to make said sum output terminal (S) produce the third exclusively ORed output signal as the summed output signal.

97. A programmable function module as claimed in claim 95, wherein said core logic circuit (4A) comprises:

a first two-input one-output multiplexer (10.0) having a first input terminal connected to the first argument input terminal (A0) of said first argument input group, a second input terminal connected to the second argument input terminal (A1) of said first argument input group, and a control input terminal connected to the third argument input terminal (A2) of said first argument input group, said first two-input one-output multiplexer producing, as a first selected output signal, an input signal supplied to the first input terminal thereof when the control input terminal thereof is supplied with a control signal having a logic value of "0", said first two-input one-output multiplexer producing, as the first selected output signal, an input signal supplied to the second input terminal thereof when the control input terminal thereof is supplied with the control signal having a logic value of "1";

a second two-input one-output multiplexer (10.1) having a first input terminal connected to the first argument input terminal (B0) of said second argument input group, a second input terminal connected to the second argument input terminal (B1) of said second argument input group, and a control input terminal connected to the third argument input terminal (B2) of said second argument input group, said second two-input one-output multiplexer producing, as a second selected output signal, an input signal supplied with the first input terminal thereof when the control input terminal thereof is supplied with a control signal having a logic value of "0", said second two-input one-output multiplexer producing, as the second selected output signal, an input signal supplied with the second input terminal thereof when the control input terminal thereof is supplied with the control signal having a logic value of "1";

a third two-input one-output multiplexer (10.2) having a first input terminal connected to the fourth argument input terminal (B3) of said second argument input group, a second input terminal connected to said ripple-core logic carry input terminal (CCI), and a control input terminal connected to said first configuration input terminal (M0), said third two-input one-output multiplexer producing, as a third selected output terminal, an input signal supplied to the first input terminal thereof when the control input terminal thereof is supplied with a control signal having a logic value of "0", said third two-input one-output multiplexer producing, as the third selected output terminal, an input signal supplied to the second input terminal thereof when the control input terminal thereof is supplied with the control signal having a logic value of "1";

a first exclusive OR circuit (11.0) having a first input terminal connected to the fourth argument input terminal (A3) of said first argument input group and a second input terminal connected to an output terminal of said first two-input one-output multiplexer (10.0), said first exclusive OR circuit exclusively ORing an input signal supplied with the first input terminal thereof and the first selected output signal supplied with the second input terminal thereof to produce a first exclusively ORed output signal;

a second exclusive OR circuit (11.1) having a first input terminal connected to an output terminal of said second two-input one-output multiplexer (10.1) and a second input terminal connected to an output terminal of said third two-input one-output multiplexer (10.2), said second exclusive OR circuit exclusively ORing the second selected output signal supplied to the first input terminal thereof and the third selected output signal supplied to the second input terminal thereof to produce a second exclusively ORed output signal;

a fourth two-input one-output multiplexer (10.3) having a first input terminal connected to the output terminal of said second two-input one-output multiplexer (10.1), a second input terminal connected to an output terminal of said second exclusive OR circuit (11.1), and a control input terminal connected to said second configuration input terminal (M1), said fourth two-input one-output multiplexer producing, as a fourth selected output signal, the second selected output signal supplied to the first input terminal thereof when the control input terminal thereof is supplied with a control signal having a logic value of "0", said fourth two-input one-output multiplexer producing, as the fourth selected output signal, the second exclusive ORed signal supplied to the second input terminal thereof when the control input terminal thereof is supplied with the control signal having the logic value of "1";

a fifth two-input one-output multiplexer (10.4) having a first input terminal connected to an output terminal of said third two-input one-output multiplexer (10.2), a second input terminal connected to said third configuration input terminal (M2), and a control input terminal connected to said second configuration input terminal (M1), said fifth two-input one-output multiplexer producing, as a fifth selected output signal, the third selected output signal supplied to the first input terminal thereof when the control input terminal thereof is supplied with a control signal having a logic value of "0", said fifth two-input one-output multiplexer producing, as the fifth selected output signal, an input signal supplied to the second input terminal thereof when the control input terminal thereof is supplied with the control signal having the logic value of "1";

a NAND circuit (12) having a first input terminal connected to an output terminal of said first exclusive OR circuit (11.0) and a second input terminal connected to an output terminal of said fourth two-input one-output multiplexer (10.3), said NAND circuit NANDing the first exclusively ORed output signal supplied to the first input terminal thereof and the fourth selected output signal supplied to the second input terminal thereof to produce a NANDed output signal;

a NOR circuit (13) having a first input terminal connected to the output terminal of said first exclusive OR circuit (11.0) and a second input terminal connected to the output terminal of said fourth two-input one-output multiplexer (10.3), said NOR circuit (13) NORing the first exclusively ORed output signal supplied to the first input terminal thereof and the fourth selected output signal supplied to the second input terminal thereof to produce a NORed output signal;

a third exclusive OR circuit (11.2) having a first input terminal connected to the output terminal of said first exclusive OR circuit (11.0) and a second input terminal connected to the output terminal of said second exclusive OR circuit (11.1), said third exclusive OR circuit exclusively ORing the first exclusively ORed output signal supplied to the first input terminal thereof and the second exclusively ORed output signal supplied to the second input terminal thereof to produce a third exclusively ORed output signal;

a two-input one-output inverting multiplexer (35.0) having a first input terminal connected to an output terminal of said NAND circuit (12), a second input terminal connected to an output terminal of said NOR circuit (13), and a control input terminal connected to an output terminal of said fifth two-input one-output multiplexer, said two-input one-output inverting multiplexer producing, as an inverted selected output signal, a signal obtaining by inverting the NANDed output signal supplied to the first input terminal thereof when the control input terminal thereof is supplied with a control signal having a logic value of "0", said two-input one-output inverting multiplexer producing, as the inverted selected output signal, a signal obtained by inverting the NORed output signal supplied to the second input terminal thereof when the control input terminal thereof is supplied with the control signal having the logic value "1";

first connecting means for connecting the output terminal of said NAND circuit (12) with said core logic carry generation output terminal (GO) to make said core logic carry generation output terminal (GO) produce the NANDed output signal as the core logic carry generation output signal;

second connecting means for connecting the output terminal of said NOR circuit (13) with said core logic carry propagation output terminal (PO) to make said core logic carry propagation output terminal (PO) produce the NORed output signal as the core logic carry propagation output signal;

third connecting means for connecting an output terminal of said two-input one-output inverting multiplexer (35.0) with said core logic carry output terminal (C) to make said core logic carry output terminal (C) produce the inverted selected output signal as the core logic carry output signal; and fourth connecting means for connecting an output terminal of said third exclusive OR circuit with said sum output terminal (S) to make said sum output terminal (S) produce the third exclusively ORed output signal as the summed output signal.

98. A programmable function module as claimed in claim 95, wherein said core logic circuit (4B) comprises:

a first two-input one-output multiplexer (10.0) having a first input terminal connected to the first argument input terminal (A0) of said first argument input group, a second input terminal connected to the second argument input terminal (A1) of said first argument input group, and a control input terminal connected to the third argument input terminal (A2) of said first argument input group, said first two-input one-output multiplexer producing, as a first selected output signal, an input signal supplied to the first input terminal thereof when the control input terminal thereof is supplied with a control signal having a logic value of "0", said first two-input one-output multiplexer producing, as the first selected output signal, an input signal supplied to the second input terminal thereof when the control input terminal thereof is supplied with the control signal having a logic value of "1";

a second two-input one-output multiplexer (10.1) having a first input terminal connected to the first argument input terminal (B0) of said second argument input group, a second input terminal connected to the second argument input terminal (B1) of said second argument input group, and a control input terminal connected to the third argument input terminal (B2) of said second argument input group, said second two-input one-output multiplexer producing, as a second selected output signal, an input signal supplied to the first input terminal thereof when the control input terminal thereof is supplied with a control signal having a logic value of "0", said second two-input one-output multiplexer producing, as the second selected output signal, an input signal supplied to the second input terminal thereof when the control input terminal thereof is supplied with the control signal having a logic value of "1";

a third two-input one-output multiplexer (10.2) having a first input terminal connected to the fourth argument input terminal (B3) of said second argument input group, a second input terminal connected to said ripple-core logic carry input terminal (CCI), and a control input terminal connected to said first configuration input terminal (M0), said third two-input one-output multiplexer producing, as a third selected output signal, an input signal supplied to the first input terminal thereof when the control input terminal thereof is supplied with a control signal having a logic value of "0", said third two-input one-output multiplexer producing, as the third selected output signal, an input signal supplied to the second input terminal thereof when the control input terminal thereof is supplied with the control signal having a logic value of "1";

a first exclusive OR circuit (11.0) having a first input terminal connected to the fourth argument input terminal (A3) of said first argument input group and a second input terminal connected to an output terminal of said first two-input one-output multiplexer (10.0), said first exclusive OR circuit exclusively ORing an input signal supplied to the first input terminal thereof and the first selected output signal supplied to the second input terminal thereof to produce a first exclusively ORed output signal;

a second exclusive OR circuit (11.1) having a first input terminal connected to an output terminal of said second two-input one-output multiplexer (10.1) and a second input terminal connected to an output terminal of said third two-input one-output multiplexer (10.2), said second exclusive OR circuit exclusively ORing the second selected output signal supplied to the first input terminal thereof and the third selected output signal supplied to the second input terminal thereof to produce a second exclusively ORed output signal;

a fourth two-input one-output multiplexer (10.3A) having a first input terminal connected to an output terminal of said second exclusive OR circuit (11.1), a second input terminal connected to the output terminal of said second two-input one-output multiplexer (10.1), and a control input terminal connected to said second configuration input terminal (M1), said fourth two-input one-output multiplexer producing, as a fourth selected output signal, the second exclusively ORed output signal supplied to the first input terminal thereof when the control input terminal thereof is supplied with a control signal having a logic value of "0", said fourth two-input one-output multiplexer producing, as the fourth selected output signal, the second selected output signal supplied to the second input terminal thereof when the control input terminal thereof is supplied with the control signal having the logic value of "1";

a fifth two-input one-output multiplexer (10.4A) having a first input terminal connected to said third configuration input terminal (M2), a second input terminal connected to the output terminal of said third two-input one-output multiplexer (10.2), and a control input terminal connected to said second configuration input terminal (M1), said fifth two-input one-output multiplexer producing, as a fifth selected output signal, an input signal supplied to the first input terminal thereof when the control input terminal thereof is supplied with a control signal having a logic value of "0", said fifth two-input one-output multiplexer producing, as the fifth selected output signal, the third selected output signal supplied to the second input terminal thereof when the control input terminal thereof is supplied with the control signal having the logic value of "1";

a NAND circuit (12) having a first input terminal connected to an output terminal of said first exclusive OR circuit (11.0) and a second input terminal connected to an output terminal of said fourth two-input one-output multiplexer (10.3A), said NAND circuit NANDing the first exclusively ORed output signal supplied to the first input terminal thereof and the fourth selected output signal supplied to the second input terminal thereof to produce a NANDed output signal;

a NOR circuit (13) having a first input terminal connected to the output terminal of said first exclusive OR circuit (11.0) and a second input terminal connected to the output terminal of said fourth two-input one-output multiplexer (10.3A), said NOR circuit (13) NORing the first exclusively ORed output signal supplied to the first input terminal thereof and the fourth selected output signal supplied to the second input terminal thereof to produce a NORed output signal;

a third exclusive OR circuit (11.2) having a first input terminal connected to the output terminal of said first exclusive OR circuit (11.0) and a second input terminal connected to the output terminal of said second exclusive OR circuit (11.1), said third exclusive OR circuit exclusively ORing the first exclusively ORed output signal supplied to the first input terminal thereof and the second exclusively ORed output signal supplied to the second input terminal thereof to produce a third exclusively ORed output signal;

an inverter (15.0) having an input terminal connected to an output terminal of said fifth two-input one-output multiplexer (10.4A), said inverter inverting the fifth selected output signal supplied to the input terminal thereof to produce an inverted output signal;

a NAND-OR circuit (14.0) having a first input terminal connected to the output terminal of said NAND circuit (12), a second input terminal connected to the output terminal of said NOR circuit (13), and a third input terminal connected to an output terminal of said inverter, said NAND-OR circuit ORing the NORed output signal supplied to the second input terminal thereof and the inverted output signal supplied to the third input terminal thereof to obtain an ORed result signal and NANDing the ORed result signal and the NANDed output signal supplied to the first input terminal thereof to produce an ORed and NANDed output signal;

first connecting means for connecting the output terminal of said NAND circuit (12) with said core logic carry generation output terminal (GO) to make said core logic carry generation output terminal (GO) produce the NANDed output signal as the core logic carry generation output signal;

second connecting means for connecting the output terminal of said NOR circuit (13) with said core logic carry propagation output terminal (PO) to make said core logic carry propagation output terminal (PO) produce the NORed output signal as the core logic carry propagation output signal;

third connecting means for connecting an output terminal of said NAND-OR circuit (14.0) with said core logic carry output terminal (C) to make said core logic carry output terminal (C) produce the ORed and NANDed output signal as the core logic carry output signal; and fourth connecting means for connecting an output terminal of said third exclusive OR circuit with said sum output terminal (S) to make said sum output terminal (S) produce the third exclusively ORed output signal as the summed output signal.

99. A programmable function module as claimed in claim 95, wherein said core logic circuit (4C) comprises:

a first two-input one-output multiplexer (10.0) having a first input terminal connected to the first argument input terminal (A0) of said first argument input group, a second input terminal connected to the second argument input terminal (A1) of said first argument input group, and a control input terminal connected to the third argument input terminal (A2) of said first argument input group, said first two-input one-output multiplexer producing, as a first selected output signal, an input signal supplied to the first input terminal thereof when the control input terminal thereof is supplied with a control signal having a logic value of "0", said first two-input one-output multiplexer producing, as the first selected output signal, an input signal supplied to the second input terminal thereof when the control input terminal thereof is supplied with the control signal having a logic value of "1";

a second two-input one-output multiplexer (10.1) having a first input terminal connected to the first argument input terminal (B0) of said second argument input group, a second input terminal connected to the second argument input terminal (B1) of said second argument input group, and a control input terminal connected to the third argument input terminal (B2) of said second argument input group, said second two-input one-output multiplexer producing, as a second selected output signal, an input signal supplied to the first input terminal thereof when the control input terminal thereof is supplied with a control signal having a logic value of "0", said second two-input one-output multiplexer producing, as the second selected output signal, an input signal supplied to the second input terminal thereof when the control input terminal thereof is supplied with the control signal having a logic value of "1";

a third two-input one-output multiplexer (10.2) having a first input terminal connected to the fourth argument input terminal (B3) of said second argument input group, a second input terminal connected to said ripple-core logic carry input terminal (CCI), and a control input terminal connected to said first configuration input terminal (M0), said third two-input one-output multiplexer producing, as a third selected output terminal, an input signal supplied to the first input terminal thereof when the control input terminal thereof is supplied with a control signal having a logic value of "0", said third two-input one-output multiplexer producing, as the third selected output terminal, an input signal supplied to the second input terminal thereof when the control input terminal thereof is supplied with the control signal having a logic value of "1";

a first exclusive OR circuit (11.0) having a first input terminal connected to the fourth argument input terminal (A3) of said first argument input group and a second input terminal connected to an output terminal of said first two-input one-output multiplexer (10.0), said first exclusive OR circuit exclusively ORing an input signal supplied to the first input terminal thereof and the first selected output signal supplied to the second input terminal thereof to produce a first exclusively ORed output signal;

a second exclusive OR circuit (11.1) having a first input terminal connected to an output terminal of said second two-input one-output multiplexer (10.1) and a second input terminal connected to an output terminal of said third two-input one-output multiplexer (10.2), said second exclusive OR circuit exclusively ORing the second selected output signal supplied to the first input terminal thereof and the third selected output signal supplied to the second input terminal thereof to produce a second exclusively ORed output signal;

a fourth two-input one-output multiplexer (10.3A) having a first input terminal connected to an output terminal of said second exclusive OR circuit (11.1), a second input terminal connected to the output terminal of said second two-input one-output multiplexer (10.1), and a control input terminal connected to said second configuration input terminal (M1), said fourth two-input one-output multiplexer producing, as a fourth selected output signal, the second exclusively ORed output signal supplied to the first input terminal thereof when the control input terminal thereof is supplied with a control signal having a logic value of "0" said fourth two-input one-output multiplexer producing, as the fourth selected output signal, the second selected output signal supplied to the second input terminal thereof when the control input terminal thereof is supplied with the control signal having the logic value of "1";

a fifth two-input one-output multiplexer (10.4A) having a first input terminal connected to said third configuration input terminal (M2), a second input terminal connected to the output terminal of said third two-input one-output multiplexer (10.2), and a control input terminal connected to said second configuration input terminal (M1), said fifth two-input one-output multiplexer producing, as a fifth selected output signal, an input signal supplied to the first input terminal thereof when the control input terminal thereof is supplied with a control signal having a logic value of "0", said fifth two-input one-output multiplexer producing, as the fifth selected output signal, the third selected output signal supplied to the second input terminal thereof when the control input terminal thereof is supplied with the control signal having the logic value of "1";

a NAND circuit (12) having a first input terminal connected to an output terminal of said first exclusive OR circuit (11.0) and a second input terminal connected to an output terminal of said fourth two-input one-output multiplexer (10.3A), said NAND circuit NANDing the first exclusively ORed output signal supplied to the first input terminal thereof and the fourth selected output signal supplied to the second input terminal thereof to produce a NANDed output signal;

a NOR circuit (13) having a first input terminal connected to the output terminal of said first exclusive OR circuit (11.0) and a second input terminal connected to the output terminal of said fourth two-input one-output multiplexer (10.3A), said NOR circuit (13) NORing the first exclusively ORed output signal supplied to the first input terminal thereof and the fourth selected output signal supplied to the second input terminal thereof to produce a NORed output signal;

a third exclusive OR circuit (11.2) having a first input terminal connected to the output terminal of said first exclusive OR circuit (11.0) and a second input terminal connected to the output terminal of said second exclusive OR circuit (11.1), said third exclusive OR circuit exclusively ORing the first exclusively ORed output signal supplied to the first input terminal thereof and the second exclusively ORed output signal supplied to the second input terminal thereof to produce a third exclusively ORed output signal;

a two-input one-output inverting multiplexer (35.0) having a first input terminal connected to an output terminal of said NAND circuit (12), a second input terminal connected to an output terminal of said NOR circuit (13), and a control input terminal connected to an output terminal of said fifth two-input one-output multiplexer (10.4A), said two-input one-output inverting multiplexer producing, as an inverted selected output signal, a signal obtaining by inverting the NANDed output signal supplied to the first input terminal thereof when the control input terminal thereof is supplied with a control signal having a logic value of "0", said two-input one-output inverting multiplexer producing, as the inverted selected output signal, a signal obtained by inverting the NORed output signal supplied to the second input terminal thereof when the control input terminal thereof is supplied with the control signal having the logic value "1";

first connecting means for connecting the output terminal of said NAND circuit (12) with said core logic carry generation output terminal (GO) to make said core logic carry generation output terminal (GO) produce the NANDed output signal as the core logic carry generation output signal;

. second connecting means for connecting the output terminal of said NOR circuit (13) with said core logic carry propagation output terminal (PO) to make said core logic carry propagation output terminal (PO) produce the NORed output signal as the core logic carry propagation output signal;

third connecting means for connecting an output terminal of said two-input one-output inverting multiplexer (35.0) with said core logic carry output terminal (C) to make said core logic carry output terminal (C) produce the inverted selected output signal as the core logic carry output signal; and fourth connecting means for connecting an output terminal of said third exclusive OR circuit with said sum output terminal (S) to make said sum output terminal (S) produce the third exclusively ORed output signal as the summed output signal.

100. A programmable function module as claimed in claim 95, wherein said carry logic circuit (5) comprises:

first connection means for connecting said ripple carry input terminal (RCI) with said ripple-core logic carry output terminal (CCO) to make said ripple-core logic carry output terminal produce the ripple carry input signal as the ripple-core logic carry output signal;

an inverter (15.1) having an input terminal connected to said ripple carry input terminal (RCI), said inverter inverting the ripple carry input signal to produce an inverted ripple carry signal;

a NAND-OR circuit (14.1) having a first input terminal connected to said core logic carry generation input terminal (G), a second input terminal connected to said core logic carry propagation input terminal (P), and a third input terminal connected to an output terminal of said inverter (15.1), said NAND-OR circuit ORing the core logic carry propagation input signal supplied to the second input terminal thereof and the inverted ripple carry signal supplied to the third input terminal thereof to obtain an ORed result signal and NANDing the ORed result signal and the core logic carry generation input signal supplied to the first input terminal thereof to produce an ORed and NANDed output signal; and second connection means for connecting an output terminal of said NAND-OR circuit (14.1) with said ripple carry output terminal (RCO) to make said ripple carry output terminal produce the ORed and NANDed output signal as the ripple carry output signal.

101. A programmable function module as claimed in claim 95, wherein said carry logic circuit (5A) comprises:

first connection means for connecting said ripple carry input terminal (RCI) with said ripple-core logic carry output terminal (CCO) to make said ripple-core logic carry output terminal produce the ripple carry input signal as the ripple-core logic carry output signal;

a two-input one-output inverting multiplexer (35.1) having a first input terminal connected to said core logic carry generation input terminal (G), a second input terminal connected to said core logic carry propagation input terminal (P), and a control input terminal connected to said ripple carry input terminal (RCI), said two-input one-output inverting multiplexer producing, as an inverted selected output signal, a signal obtaining by inverting the core logic carry generation input signal supplied to the first input terminal thereof when the control input terminal thereof is supplied with a control signal having a logic value of "0", said two-input one-output inverting multiplexer producing, as the inverted selected output signal, a signal obtained by inverting the core logic carry propagation input signal supplied to the second input terminal thereof when the control input terminal thereof is supplied with the control signal having the logic value "1"; and second connecting means for connecting an output terminal of said two-input inverting multiplexer (35.1) with said ripple carry output terminal (RCO) to make said ripple carry output terminal produce the inverted selected output signal as the ripple carry output signal.

102. A programmable function module as claimed in claim 95, wherein each of said input selection units comprises a memory circuit for storing a logic value to produce the logic value as an output value, each of said input selection units determining the input selected signal in accordance with the output value of said memory circuit.

103. A programmable function module as claimed in claim 95, wherein each of said input selection units comprises:
- a memory circuit (6.6) acting as means for supplying the fixed logic value, said memory circuit storing a logic value of one bit to produce a stored signal; and
- a multiplexer (32) connected to said interconnecting wires (8) and said memory circuit, said multiplexer having M input terminals and N control input terminals, where M and N represents first and second positive numbers, the first positive number M being larger than the second positive number N, one of the M input terminals being connected to an output terminal of said memory circuit, said multiplexer selecting one of the stored signal and the signals on said interconnecting wires as the input selected signal.

104. A programmable function module as claimed in claim 95, wherein each of said input selection units includes means (22B) for supplying the fixed logic value of "0", said means for supplying the fixed logic value of "0" comprising:
- a memory circuit (6.5) for storing a logic value of one bit to produce a stored signal; and
- an NMOS transistor (24) having a source electrode connected to a ground terminal, a gate electrode connected to an output terminal of said memory circuit, and a drain electrode as an output terminal of said means for supplying the fixed logic value of "0".

105. A programmable function module as claimed in claim 95, wherein each of said input selection units includes means (22C) for supplying the fixed logic value of "1", said means for supplying the fixed logic value of "1" comprising:
- a memory circuit (6.4) for storing a logic value of one bit to produce a stored signal; and
- a PMOS transistor (25) having a source electrode connected to a power source terminal, a gate electrode connected to an output terminal of said memory circuit, and a drain electrode as an output terminal of said means for supplying the fixed logic value of "1".

106. A programmable function module as claimed in claim 95, wherein each of said input selection units includes means (22A) for supplying the fixed logic value, said means for supplying the fixed logic value comprising:
- a memory circuit (6.5) for storing a logic value of one bit to produce a stored signal;
- a resistor (31) having high-resistance, said resistor having an end connected to a power source terminal; and
- an NMOS transistor (24) having a source electrode connected to a ground terminal, a gate electrode connected to an output terminal of said memory circuit, and a drain electrode connected to another end of said high resistor, the drain electrode of said NMOS transistor being connected to an output terminal of said means for supplying the fixed logic value.

107. A plurality of programmable function devices, each programmable function device as claimed in claim 69, wherein said plurality of programmable function devices are classified into a first group of programmable function devices, each comprising programmable function blocks equal in number to a first predetermined number and a second group of programmable function devices, each comprising programmable function blocks equal in number to a second predetermined number, the first and the second predetermined numbers being different from each other.

108. A plurality of programmable function devices, each programmable function device as claimed in claim 69, wherein said plurality of programmable function devices are close-packed and are disposed on a rectangular area, each of said programmable function devices comprising a plurality of programmable function blocks.

109. A plurality of programmable function devices, each programmable function device as claimed in claim 92, wherein said plurality of programmable function devices are classified into a first group of programmable function devices, each comprising odd and even programmable function blocks equal in number to a first predetermined number and a second group of programmable function devices, each comprising odd and even programmable function blocks equal in number to a second predetermined number, the first and the second predetermined numbers being different from each other.

110. A plurality of programmable function devices, each programmable function device as claimed in claim 92, wherein said plurality of programmable function devices are close-packed and are disposed on a rectangular area, each of said programmable function devices comprising at least one odd programmable function block and at least one even programmable function block.

\* \* \* \* \*

UNITED STATES PATENT AND TRADEMARK OFFICE
CERTIFICATE OF CORRECTION

PATENT NO.    : 6,188,240 B1
DATED         : February 13, 2001
INVENTOR(S)   : Shogo Nakaya It is certified that error appears in the above-identified patent and that said Letters Patent is hereby corrected as shown below:

Column 1,
Line 7, delete "a".

Column 5,
Line 51, change "11" to -- 1 --.

Column 6,
Line 34, change "Ssignal" to -- signal --.

Column 7,
Line 30, change "1" to -- 0 --.

Column 15,
Line 34, (first occurrecne), change "B1" to -- B0 --.

Column 17,
Line 34, change "2-1MuX" to -- 2-1MUX --.

Column 18,
Line 39, change "o" insert -- 0 --.

Column 19,
Line 8, change "2-1Mux" to -- 2-1MUX --.
Line 60, change "c14" to -- c$\ell$4 --.

Column 20,
Line 35, delete "W".
Line 39, delete "I".

Column 21,
Lines 44 and 48, change "c151" to -- c$\ell$51 --.

Column 22,
Lines 1, 3, 35 and 36, change "c152" to -- c$\ell$52 --.

Column 24,
Lines 41 and 59, change "1I" to -- 1 --.

Column 26,
Line 32, change "Bi" to -- B1 --.

Column 27,
Line 50, delete "=".

UNITED STATES PATENT AND TRADEMARK OFFICE
CERTIFICATE OF CORRECTION

PATENT NO.    : 6,188,240 B1
DATED         : February 13, 2001
INVENTOR(S)   : Shogo Nakaya It is certified that error appears in the above-identified patent and that said Letters Patent is hereby corrected as shown below:

Column 34,
Line 44, change "Si" to -- S1 --.

Column 35,
Line 8, change "GI" to -- G1 --.
Line 67, change "G2" to -- G02 --.

Column 36,
Lines 17, 53 and 54, change "c151" to -- cℓ51 --.

Column 37,
Line 3, change "c153" to -- cℓ53 --.
Line 4, change "lien" to -- line --.
Lines 24 and 25, change "c154" to -- cℓ54 --.

Column 40,
Line 54, change "(Bi)" to -- (B1) --.

Column 45,
Line 23, after "value" insert -- "1" --.

Column 47,
Line 18, change "f irst" to -- first --.
Line 31, change "Isaid" to -- said --.

Column 53,
Line 46, change "NNND" to -- NAND --.

Column 56,
Line 35, change "N" to -- NAND --.

Column 62,
Line 30, delete "i".

Column 77,
Line 51, change "Loutput" to -- output --.

Column 85,
Line 30, change "Atand" to -- and --.

Column 87,
Line 61, change "(PO)" to -- (PO1) --.

UNITED STATES PATENT AND TRADEMARK OFFICE
CERTIFICATE OF CORRECTION

PATENT NO. : 6,188,240 B1
DATED : February 13, 2001
INVENTOR(S) : Shogo Nakaya

It is certified that error appears in the above-identified patent and that said Letters Patent is hereby corrected as shown below:

Column 90,
Line 56, change "NoRing" to -- NORing --.

Column 91,
Line 30, change "PO" to -- PO1 --.

Column 94,
Line 3, change "NUNDed" to -- NANDed --.
Line 20, change "(Si)" to -- (S1) --.

Column 96,
Line 45, change "GOI" to -- GO1 --.

Column 98,
Line 54, delete "a.".

Column 99,
Lines 39 and 40, change "Si" to -- S1 --.

Column 100,
Line 16, change "inputgroup" to -- input group --.

Column 114,
Line 42, change "ENDED" to -- NANDED --.

Column 115,
Line 13, delete "A".

Column 118,
Line 59, change "z0" to -- o --.

Column 130,
Line 1, change "obtaining" to -- obtained --.

Column 135,
Line 19, change "obtaining" to -- obtained --.

Column 136,
Line 24, change "(IG)" to -- (G) --.

Column 138,
Line 27, change "(SI)" to -- (S1) --.

UNITED STATES PATENT AND TRADEMARK OFFICE
CERTIFICATE OF CORRECTION

PATENT NO. : 6,188,240 B1
DATED : February 13, 2001
INVENTOR(S) : Shogo Nakaya

It is certified that error appears in the above-identified patent and that said Letters Patent is hereby corrected as shown below:

Column 142,
Lines 59 and 60, change "(Si)" to -- (S1) --.

Column 143,
Line 15, change "(B10)" to -- (B01) --.

Column 147,
Line 16, change "(20.3A)" to -- (10.3A) --.
Line 67, change "(PO)" to -- (PO1) --.

Column 148,
Line 1, change "(PO)" to -- (PO1) --.

Column 149,
Line 27, change "(M1)" to -- (M11) --.
Line 59, change "(10 3A)" to -- (103A) --.

Column 155,
Line 46, change "obtaining" to -- obtained --.

Column 164,
Line 56, change "(SRI)" to -- (SR1) --.

Column 166,
Line 44, delete "go".

Signed and Sealed this

Ninth Day of December, 2003

JAMES E. ROGAN
*Director of the United States Patent and Trademark Office*